US009966535B2

(12) United States Patent
Jung et al.

(10) Patent No.: US 9,966,535 B2

(45) **Date of Patent: *May 8, 2018**

(54) ORGANIC LIGHT-EMITTING DEVICE

(71) Applicant: SAMSUNG DISPLAY CO., LTD., Yongin, Gyeonggi-Do (KR)

(72) Inventors: Hyejin Jung, Yongin (JP); Seokhwan Hwang, Yongin (KR); Mieun Jun, Yongin (KR); Sanghyun Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 315 days.

This patent is subject to a terminal disclaimer.

(21) Appl. No.: 14/702,970

(22) Filed: May 4, 2015

(65) Prior Publication Data

US 2016/0133845 A1 May 12, 2016

(30) Foreign Application Priority Data

Nov. 6, 2014 (KR) ........................ 10-2014-0153736

(51) Int. Cl.

| | |
|---|---|
| ***C09K 11/06*** | (2006.01) |
| ***H01L 51/50*** | (2006.01) |
| ***H01L 51/00*** | (2006.01) |

(52) U.S. Cl.

CPC ........ *H01L 51/0058* (2013.01); *H01L 51/006* (2013.01); *H01L 51/0052* (2013.01); *H01L 51/0054* (2013.01); *H01L 51/0061* (2013.01); *H01L 51/0072* (2013.01); *H01L 51/0073* (2013.01); *H01L 51/5012* (2013.01)

(58) Field of Classification Search

None

See application file for complete search history.

(56) References Cited

U.S. PATENT DOCUMENTS

| | | | | |
|---|---|---|---|---|
| 7,053,255 | B2 | 5/2006 | Ikeda et al. | |
| 7,233,019 | B2 | 6/2007 | Ionkin et al. | |
| 2005/0064233 | A1 | 3/2005 | Matsuura et al. | |
| 2005/0156164 | A1 | 7/2005 | Sotoyama | |
| 2009/0004485 | A1 | 1/2009 | Zheng et al. | |
| 2010/0314615 | A1* | 12/2010 | Mizuki ................ | C07D 307/91 257/40 |
| 2011/0006289 | A1 | 1/2011 | Mizuki et al. | |
| 2011/0156016 | A1 | 6/2011 | Kawamura et al. | |
| 2013/0306958 | A1 | 11/2013 | Ito et al. | |

FOREIGN PATENT DOCUMENTS

| | | |
|---|---|---|
| KR | 10-2006-0006760 A | 1/2006 |
| KR | 10-2010-0097182 A | 9/2010 |
| KR | 10-2011-0043625 A | 4/2011 |
| KR | 10-2011-0047278 A | 5/2011 |
| WO | WO 2012/070226 A1 | 5/2012 |

* cited by examiner

*Primary Examiner* — Christopher M Rodd

(74) *Attorney, Agent, or Firm* — Lee & Morse, P.C.

(57) ABSTRACT

An organic light-emitting device including a first electrode; a second electrode; and an organic layer between the first electrode and the second electrode, the organic layer including an emission layer, wherein the emission layer includes a first compound represented by the following Formula 1, and a second compound represented by one of the following Formulae 2-1 to 2-4:

<Formula 1>

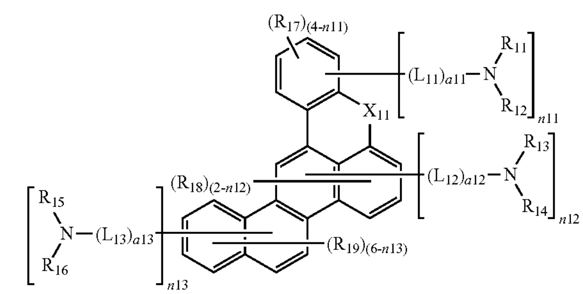

<Formula 2-1>

$$[(R_{212})_{b212}-(L_{213})_{a213}]_{n212}Ar_{211}-(L_{211})_{a211}-Ar_{212}-[(L_{212})_{a212}-(R_{211})_{b211}]_{n211}$$

<Formula 2-2>

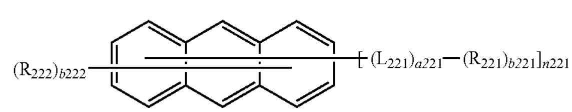

<Formula 2-3>

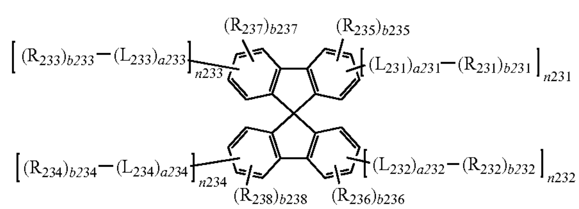

<Formula 2-4>

$$(R_{242})_{b242}-Ar_{241}-[(L_{241})_{a241}-(R_{241})_{b241}]_{n241}.$$

20 Claims, 1 Drawing Sheet

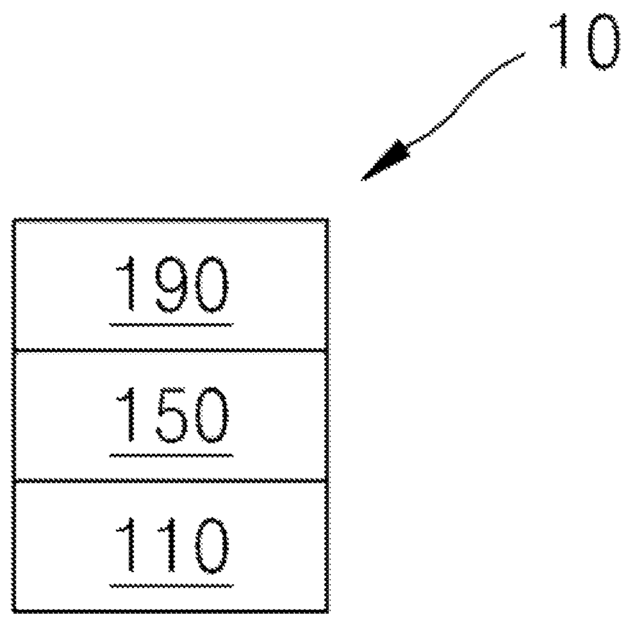
10
190
150
110

ORGANIC LIGHT-EMITTING DEVICE

CROSS-REFERENCE TO RELATED APPLICATION

Korean Patent Application No. 10-2014-0153736, filed on Nov. 6, 2014, in the Korean Intellectual Property Office, and entitled: "Organic Light-Emitting Device," is incorporated by reference herein in its entirety.

BACKGROUND

1. Field

Embodiments relate to an organic light-emitting device

2. Description of the Related Art

Organic light-emitting devices are self-emission devices that have wide viewing angles, high contrast ratios, short response times, and excellent brightness, driving voltage, and response speed characteristics, and produce full-color images.

An organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

Embodiments are directed to an organic light-emitting device.

An embodiment provides an organic light-emitting device including a first electrode, a second electrode, and an organic layer including an emission layer that is disposed between the first electrode and the second electrode;

wherein the emission layer includes a first material represented by Formula 1 below and a second material represented by any one of Formulae 2-1 to 2-4 below:

<Formula 1>

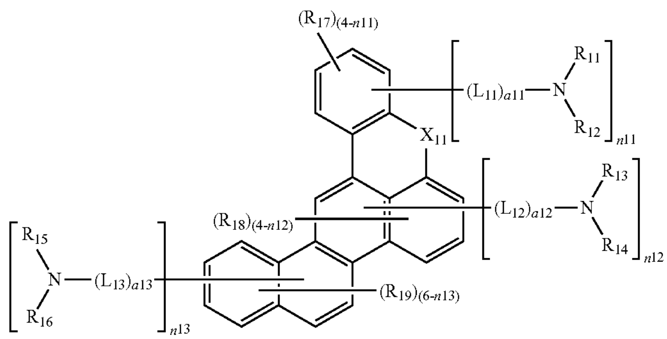

<Formula 2-1>

$$\left[(R_{212})_{b212}-(L_{213})_{a213}\right]_{n212}-Ar_{211}-(L_{211})_{a211}-Ar_{212}-\left[(L_{212})_{a212}-(R_{211})_{b211}\right]_{n211}$$

<Formula 2-2>

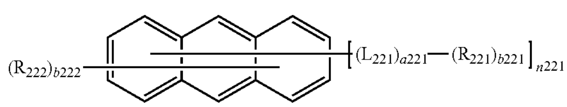

<Formula 2-3>

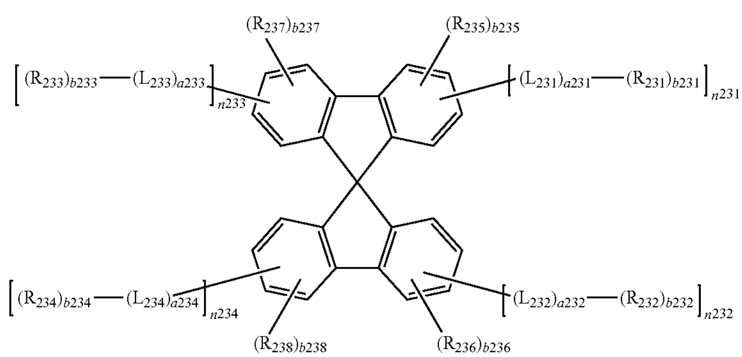

<Formula 2-4>

$$(R_{242})_{b242}-Ar_{241}-\left[(L_{241})_{a241}-(R_{241})_{b241}\right]_{n241}$$

In Formulae 1 and 2-1 to 2-4 above, $X_{11}$ is selected from an oxygen atom (O) and a sulfur atom (S);

$Ar_{211}$ is selected from a naphthalene, an anthracene, a triphenylene, a pyrene, a chrysene, and a perylene;

$Ar_{212}$ is selected from an anthracene, a triphenylene, a pyrene, a chrysene, and a perylene;

$Ar_{241}$ is selected from a benzene, a biphenyl, and a triphenylene;

$L_{11}$ to $L_{13}$, $L_{211}$ to $L_{213}$, $L_{221}$, $L_{231}$ to $L_{234}$, and $L_{241}$ may be each independently selected from a substituted or unsubstituted $C_3$-$C_{10}$ cycloalkylene group, a substituted or unsubstituted heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 may be each independently selected from 0, 1, 2, and 3;

a211 to a213, a221, a231 to a234 and a241 may be each independently 0, 1, and 2;

$R_{11}$ to $R_{16}$, $R_{231}$ to $R_{234}$ and $R_{241}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b231 to b234 and b241 may be each independently selected from 1, 2, and 3;

$R_{17}$ to $R_{19}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$);

$R_{211}$, $R_{212}$, $R_{221}$, $R_{222}$, $R_{235}$ to $R_{238}$, and $R_{242}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{211}$)($Q_{212}$)($Q_{213}$), —N($Q_{214}$)($Q_{215}$), and —B($Q_{216}$)($Q_{217}$);

b211, b212, b221, b222, b235 to b238, and b242 may be each independently selected from 1, 2, and 3;

n11 to n13 may be each independently selected from 0, 1, and 2; and a sum of n11, n12, and n13 may be selected from 2, 3, 4, 5, and 6;

n211, n212, and n221 may be each independently selected from 1, 2, and 3;

n231 to n234 may be each independently selected from 0, 1, and 2; and a sum of n231 to n234 may be selected from 1, 2, 3, 4, 5, and 6;

n241 may be selected from 3, 4, 5, 6, 7, and 8;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_1$-$C_{60}$ alkenyl group, a $C_1$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{10}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{10}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, wherein $Q_1$ to $Q_3$, $Q_{11}$ to $Q_{17}$, $Q_{21}$ to $Q_{27}$, $Q_{31}$ to $Q_{37}$ and $Q_{211}$ to $Q_{217}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWING

Features will be apparent to those of skill in the art by describing in detail exemplary embodiments with reference to the attached drawing in which:

FIG. 1 illustrates a schematic cross-sectional view of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

Expressions such as "at least one of," when preceding a list of elements, modify the entire list of elements and do not modify the individual elements of the list.

As used herein, the singular forms "a," "an", and "the" are intended to include the plural forms as well, unless the context clearly indicates otherwise.

It will be further understood that the terms"includes," "comprises," and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present.

The expression "(an organic layer) includes a first material" used herein may be interpreted as a case in which "(an organic layer) includes identical first materials represented by Formula 1 or two or more different first materials represented by Formula 1."

The first electrode may be an anode, which is a hole injection electrode, and the second electrode may be a cathode, which is an electron injection electrode, or the first electrode may be a cathode, which is an electron injection electrode, or the second electrode may be an anode, which is a hole injection electrode.

For example, the first electrode may be an anode, and the second electrode may be a cathode, and the organic layer may include i) a hole transport region that is disposed between the first electrode and an emission layer and includes at least one of a hole injection layer, a hole transport layer, and an electron blocking layer, and ii) an electron transport region that is disposed between the emission layer and the second electrode and includes at least one of a hole blocking layer, an electron transport layer, and an electron injection layer.

The term "organic layer" used herein refers to a single layer and/or a plurality of layers disposed between the first electrode and the second electrode of an organic light-emitting device. The "organic layer" may include, in addition to an organic compound, an organometallic complex including metal.

FIG. 1 illustrates a schematic view of an organic light-emitting device 10 according to an embodiment. The organic light-emitting device 10 may include a first electrode 110, an organic layer 150, and a second electrode 190.

Hereinafter, the structure of an organic light-emitting device according to an embodiment and a method of manufacturing an organic light-emitting device, according to an embodiment, will be described in connection with FIG. 1.

In FIG. 1, a substrate may be additionally disposed under the first electrode 110 or above the second electrode 190. The substrate may be a glass substrate or a transparent plastic substrate, each with excellent mechanical strength, thermal stability, transparency, surface smoothness, ease of handling, and waterproofness.

The first electrode 110 may be, e.g., formed by depositing or sputtering a material for forming a first electrode on a substrate. When the first electrode 110 is an anode, the material of the first electrode 110 may be selected from materials with a high work function to facilitate easy hole injection. The first electrode 110 may be a reflective electrode or a transmissive electrode. The material of the first electrode 110 may be a transparent and highly conductive material, and examples of such a material are indium tin oxide (ITO), indium zinc oxide (IZO), tin oxide ($SnO_2$), and zinc oxide (ZnO). When the first electrode 110 is a semi-transmissive electrode or a reflective electrode, as a material for forming a first electrode, at least one of magnesium (Mg), aluminum (Al), aluminum-lithium (Al—Li), calcium (Ca), magnesium-indium (Mg—In), magnesium-silver (Mg—Ag) may be used.

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

The organic layer 150 may be disposed on the first electrode 110. The organic layer 150 may include an emission layer.

The organic layer 150 may further include a hole transport region disposed between the first electrode 110 and the emission layer. The organic layer 150 may further include an electron transport region disposed between the emission layer and the second electrode 190.

The hole transport region may include at least one selected from a hole injection layer, a hole transport layer, a buffer layer, and an electron blocking layer, and the electron transport region may include at least one selected from a hole blocking layer, an electron transport layer, and an electron injection layer, but embodiments are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein layers of each structure are sequentially stacked from the first electrode 110 in this stated order, but are not limited thereto.

When the hole transport region includes a hole injection layer, the hole injection layer may be formed on the first electrode 110 by using various methods, such as vacuum deposition, spin coating casting, a Langmuir-Blodgett (LB) method, ink-jet printing, laser-printing, or laser-induced thermal imaging.

When a hole injection layer is formed by vacuum deposition, e.g., the vacuum deposition may be performed at a deposition temperature of about 100 to about 500° C., at a vacuum degree of about $10^{-8}$ to about $10^{-3}$ torr, and/or at a deposition rate of about 0.01 to about 100 Å/sec by taking into account a compound for a hole injection layer to be deposited, and the structure of a hole injection layer to be formed.

When a hole injection layer is formed by spin coating, the spin coating may be performed at a coating rate of about 2,000 rpm to about 5,000 rpm, and/or at a temperature of about 80° C. to 200° C., by taking into account a compound for a hole injection layer to be deposited, and the structure of a hole injection layer to be formed.

When the hole transport region includes a hole transport layer, the hole transport layer may be formed on the first electrode 110 or the hole injection layer by using various methods, e.g., vacuum deposition, spin coating, casting, an LB method, ink-jet printing, laser-printing, or laser-induced thermal imaging. When the hole transport layer is formed by vacuum deposition or spin coating, deposition and coating conditions for the hole transport layer may be the same as the deposition and coating conditions for the hole injection layer.

The hole transport region may include at least one selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201 below, and a compound represented by Formula 202 below:

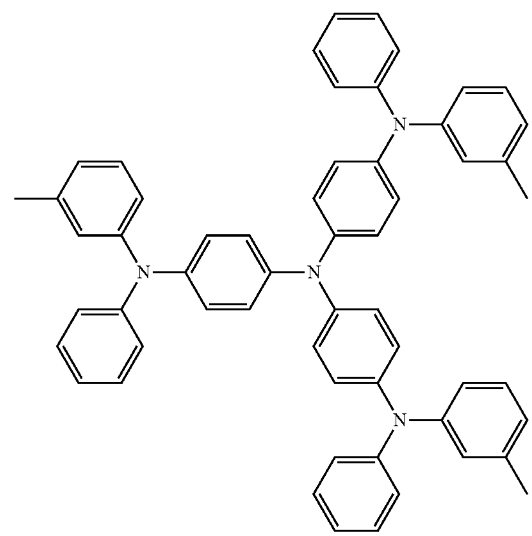

m-MTDATA

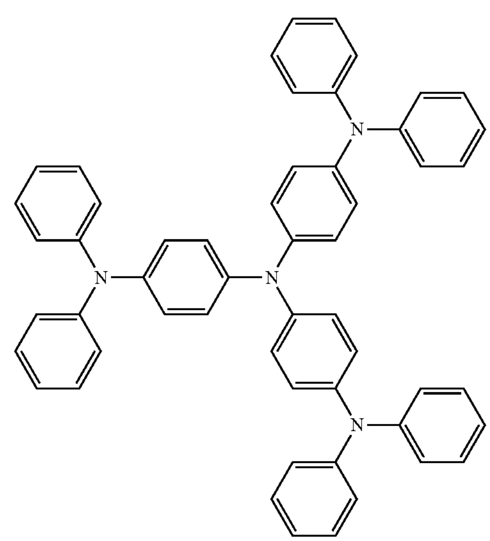

TDATA

-continued
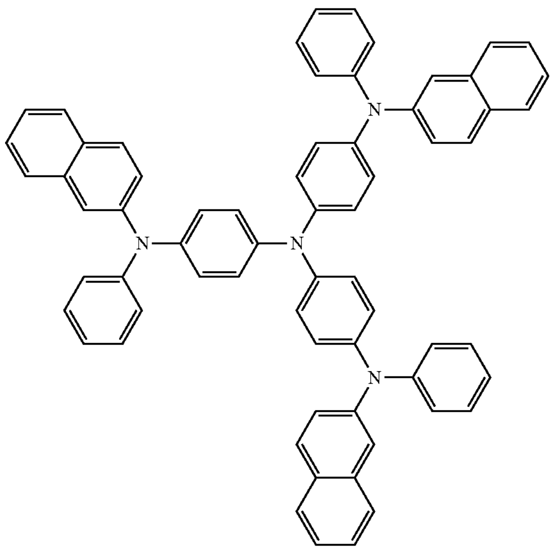
2-TNATA
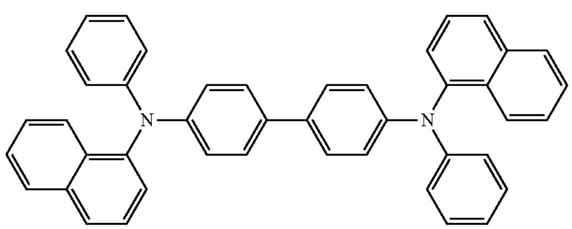
NPB
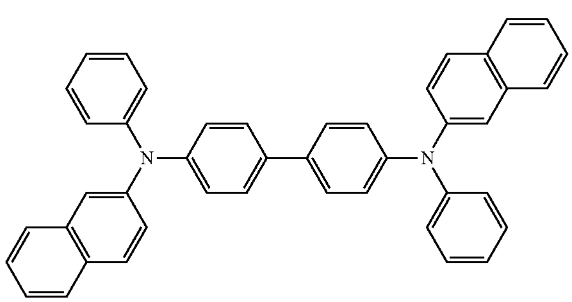
β-NPB
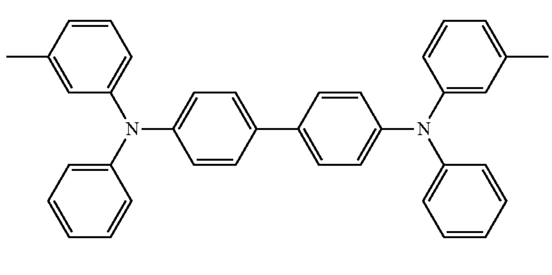
TPD
-continued
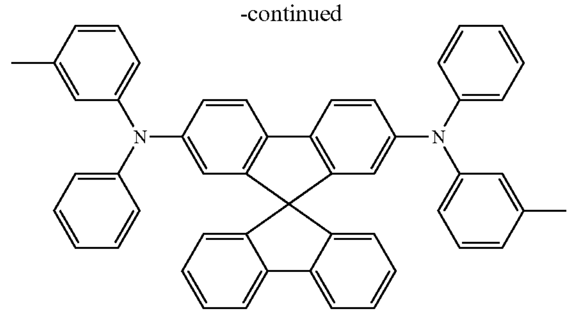
Spiro-TPD
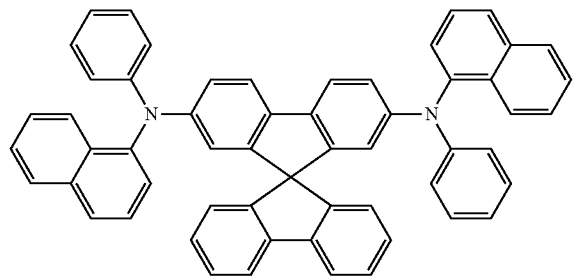
Spiro-NPB
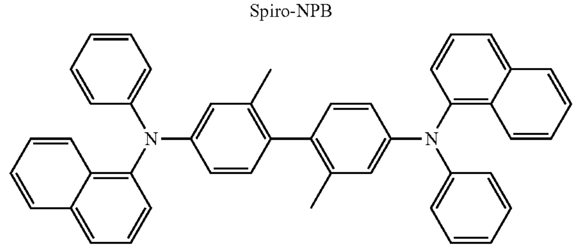
methylated NPB
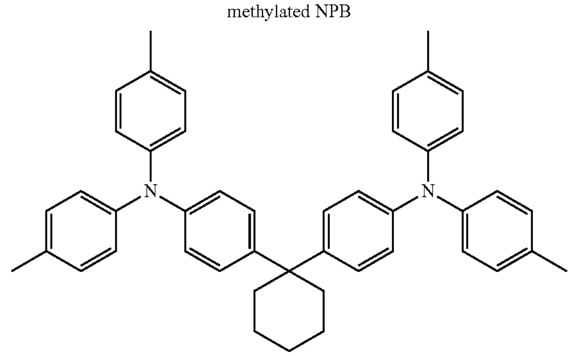
TAPC
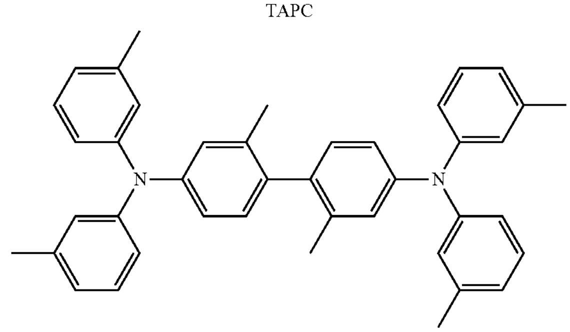
HMTPD
<Formula 201>
$$R_{201}—(L_{201})_{xa1}—N\begin{matrix}(L_{202})_{xa2}—R_{202}\\ \\ (L_{203})_{xa3}—R_{203}\end{matrix}$$

-continued

<Formula 202>

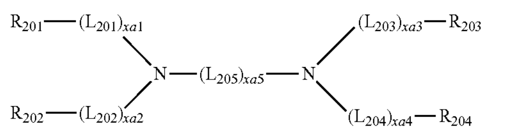

wherein in Formulae 201 and 202, $L_{201}$ to $L_{205}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene, the substituted divalent non-aromatic condensed polycyclic group, and the substituted divalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{201})(Q_{202})$, —$Si(Q_{203})(Q_{204})(Q_{205})$, and —$B(Q_{206})(Q_{207})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{211})(Q_{212})$, —$Si(Q_{213})(Q_{214})(Q_{215})$, and —$B(Q_{216})(Q_{217})$;

—$N(Q_{221})(Q_{222})$, —$Si(Q_{223})(Q_{224})(Q_{225})$, and —$B(Q_{226})(Q_{227})$, xa1 to xa4 may be each independently selected from 0, 1, 2, and 3;

xa5 may be selected from 1, 2, 3, 4, and 5;

$R_{201}$ to $R_{204}$ may be each independently selected from a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_1$-$C_{60}$ alkenyl group, a $C_1$-$C_{60}$ alkynyl group, or a $C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{231})(Q_{232})$, —$Si(Q_{233})(Q_{234})(Q_{235})$, and —$B(Q_{236})(Q_{237})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{10}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{241})(Q_{242})$, —$Si(Q_{243})(Q_{244})(Q_{245})$, and —$B(Q_{246})(Q_{247})$, wherein $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In some embodiments, in Formulae 201 and 202, $L_{201}$ to $L_{205}$ may be each independently selected from a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3; and $R_{201}$ to $R_{204}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments are not limited thereto.

The compound represented by Formula 201 may be represented by Formula 201A:

<Formula 201A>

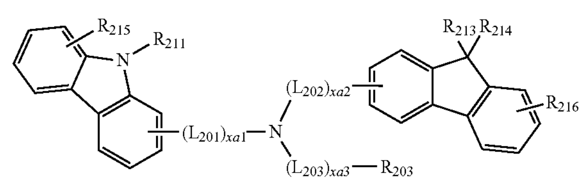

For example, the compound represented by Formula 201 may be represented by Formula 201A-1 below, but it is not limited thereto:

<Formula 201A-1>

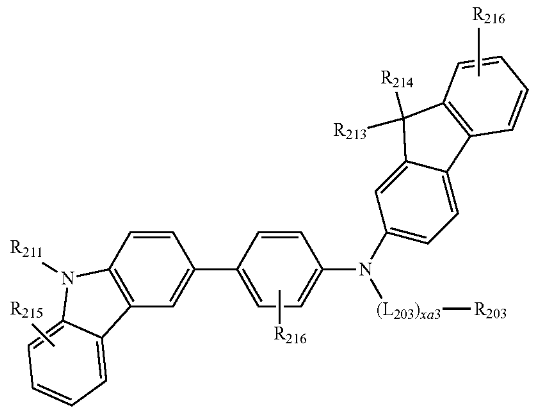

For example, the compound represented by Formula 202 may be represented by Formula 202A below, but is not limited thereto:

<Formula 202A>

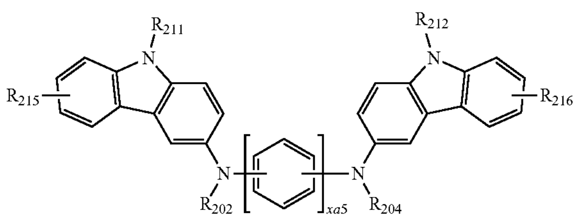

In Formulae 201A, 201A-1, and 202A above, the descriptions of $L_{201}$ to $L_{203}$, xa1 to xa3, xa5, and $R_{202}$ to $R_{204}$ may be understood by referring to the descriptions herein, and the descriptions of $R_{211}$ and $R_{212}$ may be understood by referring to the description of $R_{203}$, and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from a phenylene group, a naphthenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{202}$ to $R_{204}$, $R_{211}$, and $R_{212}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof, a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and xa5 is 1 or 2.

$R_{213}$ and $R_{214}$ in Formulae 201A and 201A-1 may bind to each other to form a saturated or unsaturated ring.

The compound represented by Formula 201 and the compound represented by Formula 202 may each include compounds HT1 to HT20 illustrated below, but are not limited thereto.

HT1

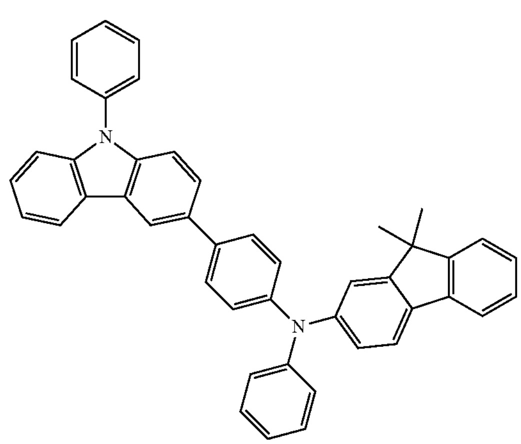

HT2

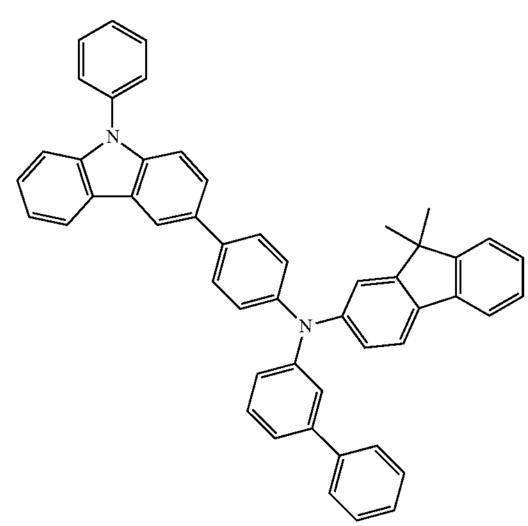

-continued
HT3
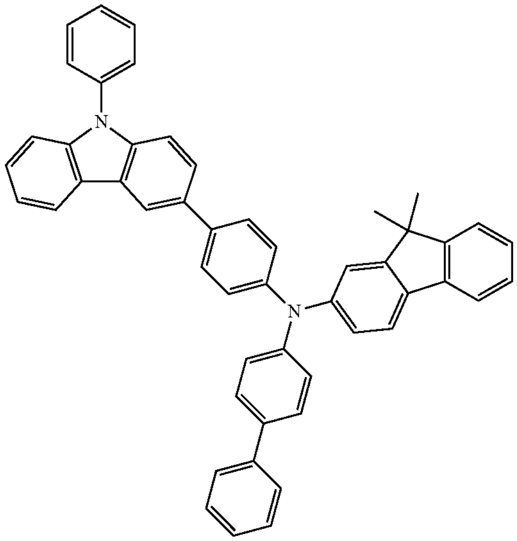
HT4
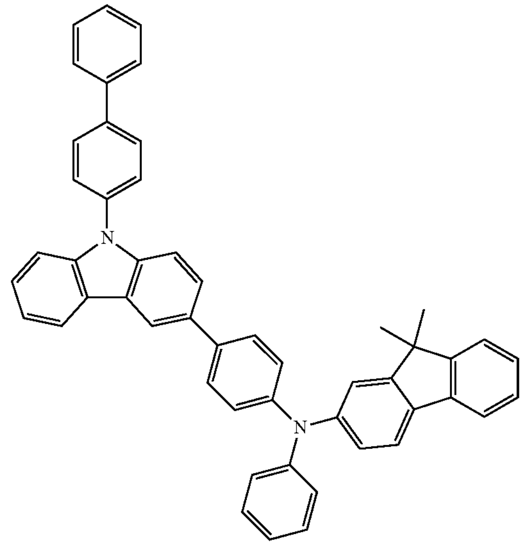
HT5
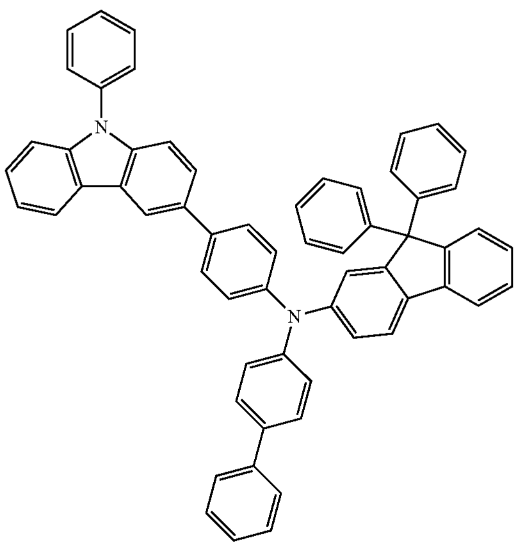
HT6
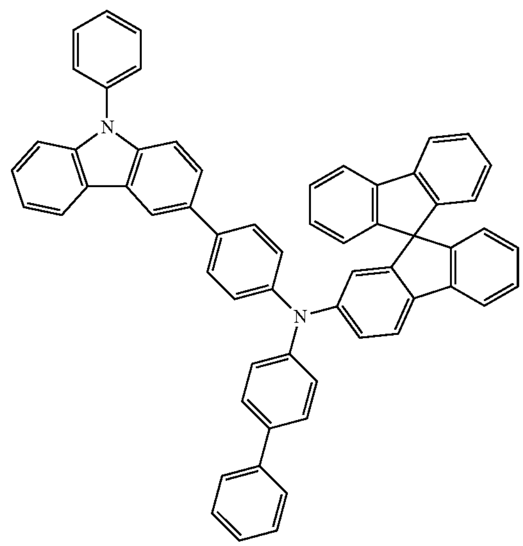
HT7
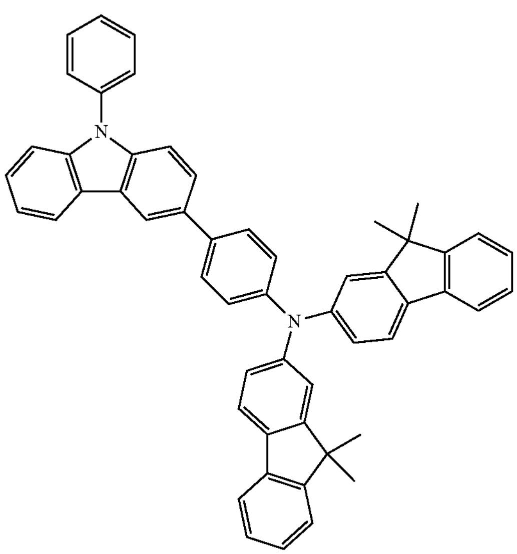
HT8
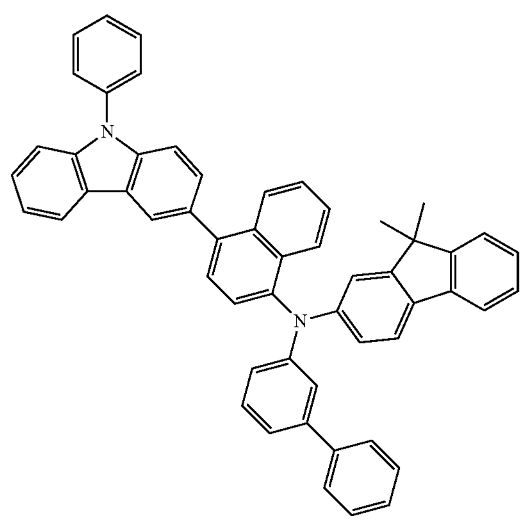

-continued
HT9
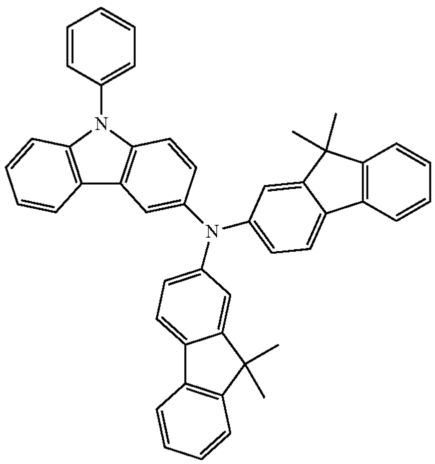
HT10
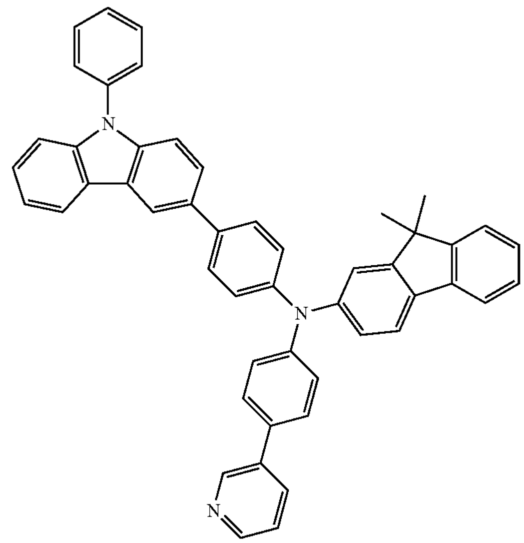
HT11
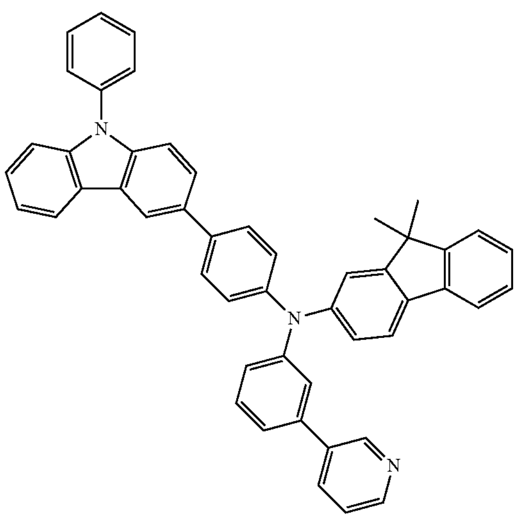
HT12
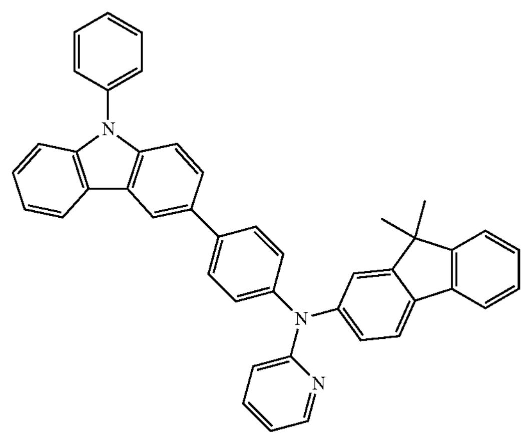
HT13
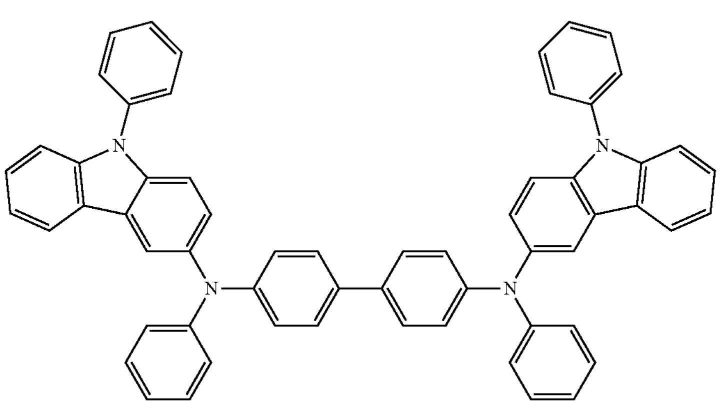

-continued
HT14
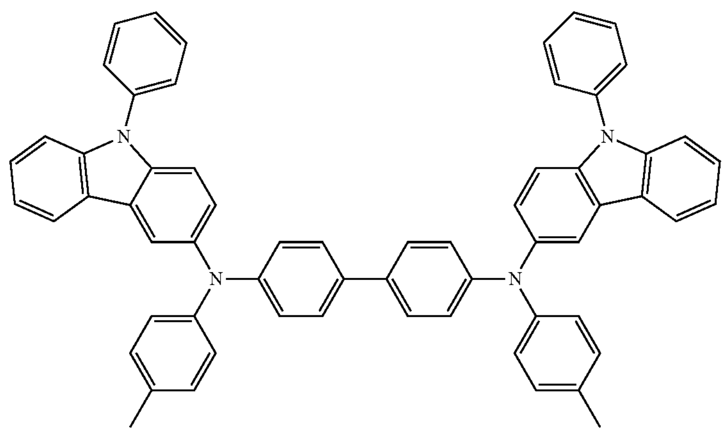
HT15
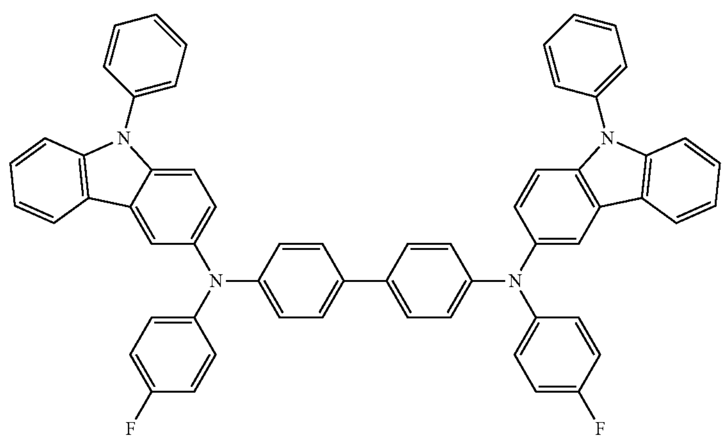
HT16
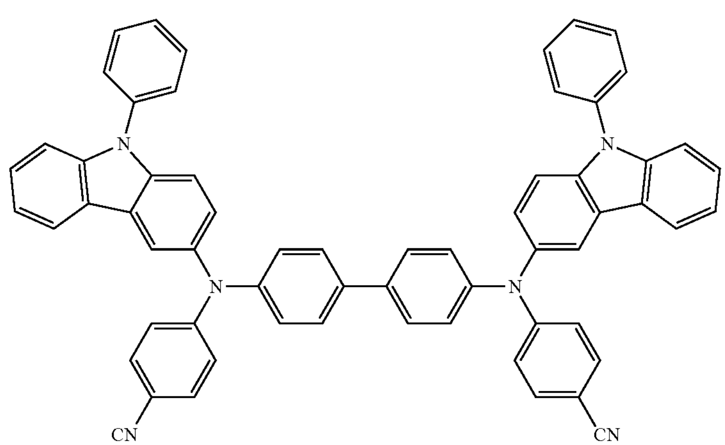

-continued
HT17
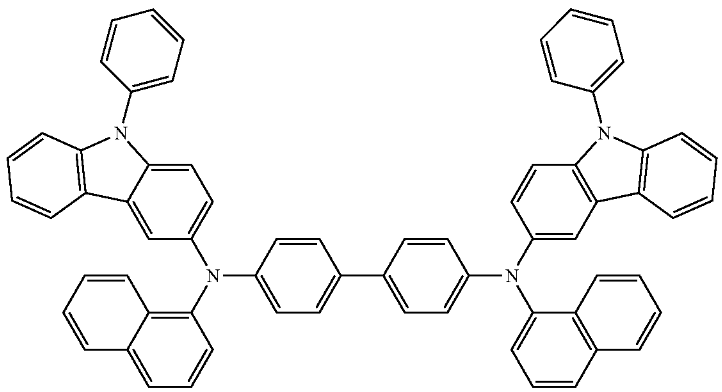
HT18
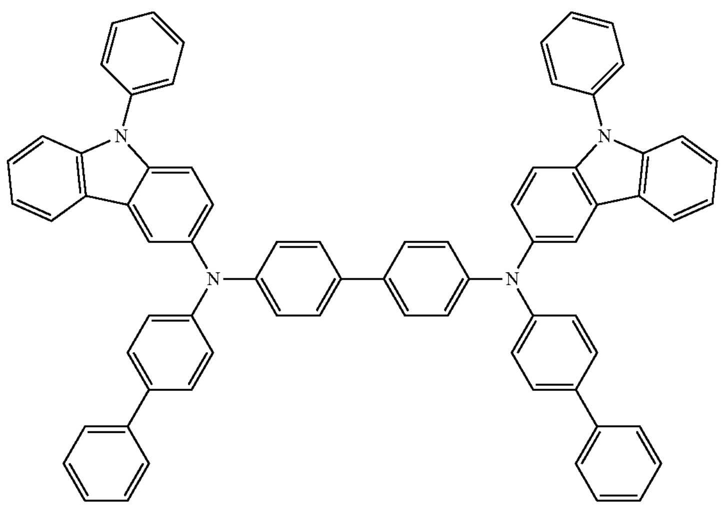
HT19
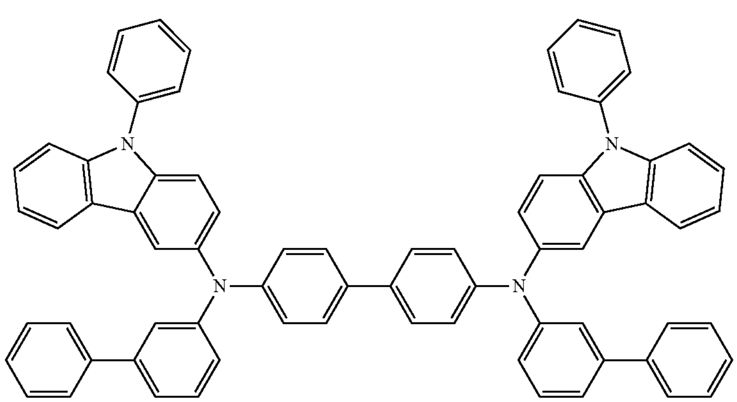

-continued

HT20

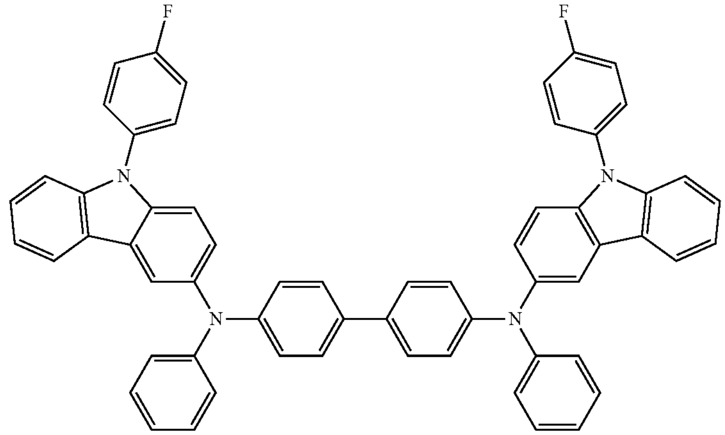

A thickness of the hole transport region may be in a range of about 100 Å to about 10,000 Å, e.g., about 100 Å to about 1,000 Å. When the hole transport region includes both a hole injection layer and a hole transport layer, a thickness of the hole injection layer may be in a range of about 100 Å to about 10000 Å, e.g., about 100 Å to about 1,000 Å, and a thickness of the hole transport layer may be in a range of about 50 Å to about 2,000 Å, e.g., about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material to improve conductive properties. The charge-generation material may be homogeneously or unhomogeneously dispersed in the hole transport region.

The charge-generation material may be, e.g., a p-dopant. The p-dopant may be one of a quinone derivative, a metal oxide, and a cyano group-containing compound, but it is not limited thereto. For example, non-limiting examples of the p-dopant are quinone derivatives, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide, and Compound HT-D1 illustrated below, but embodiments are not limited thereto.

<Compound HT-D1>

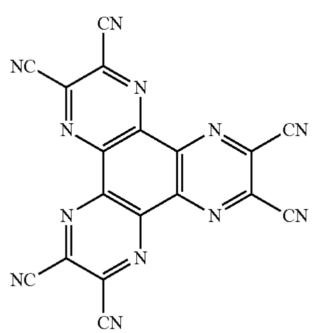

-continued

<F4-TCNQ>

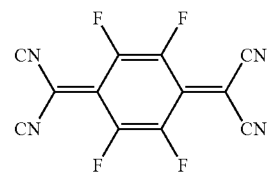

The hole transport region may further include, in addition to the hole injection layer and the hole transport layer, at least one of a buffer layer and an electron blocking layer. Since the buffer layer may compensate for an optical resonance distance according to a wavelength of light emitted from the emission layer, the light-emission efficiency of a formed organic light-emitting device may be improved. As a material included in the buffer layer, materials that are included in the hole transport region may be used. The electron blocking layer prevents injection of electrons from the electron transport region.

An emission layer may be formed on the first electrode 110 or the hole transport region by using various methods, e.g., vacuum deposition, spin coating, casting, an LB method, ink-jet printing, laser-printing, or laser-induced thermal imaging. When an emission layer is formed by vacuum deposition or spin coating, deposition and coating conditions for the emission layer may be the same as those for the hole injection layer.

When the organic light-emitting device 10 is a full color organic light-emitting device, the emission layer may be patterned into a red emission layer, a green emission layer, or a blue emission layer, according to individual sub-pixels. In an implementation, the emission layer may have a stacked structure of a red emission layer, a green emission layer, and a blue emission layer, or may include a red-light emission material, a green-light emission material, and a blue-light emission material, which are combined together in a single layer without layer separation, to emit white light. In an implementation, the emission layer may be a white emission layer, and may further include a color-converting layer or a color filter to turn white light into light of a desired color.

The emission layer may include a host and a dopant.

In an implementation, the host may include a second compound or material represented by one of Formulae 2-1 to 2-4 below.

<Formula 2-1>

$$\left[(R_{212})_{b212}-(L_{213})_{a213}\right]_{n212}-Ar_{211}-(L_{211})_{a211}-Ar_{212}-\left[(L_{212})_{a212}-(R_{211})_{b211}\right]_{n211}$$

<Formula 2-2>

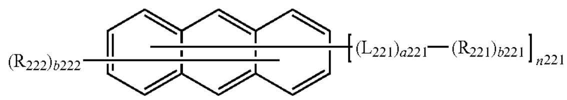

<Formula 2-3>

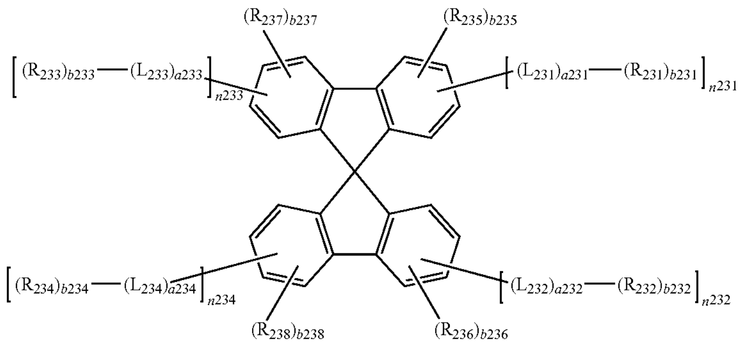

<Formula 2-4>

$$(R_{242})_{b242}-Ar_{241}-\left[(L_{241})_{a241}-(R_{241})_{b241}\right]_{n241}$$

In Formulae 2-1 to 2-4, $Ar_{211}$ may be selected from or include, e.g., a naphthalene group, an anthracene group, a triphenylene group, a pyrene group, a chrysene group, and a perylene group; $Ar_{212}$ may be selected from or include, e.g., an anthracene group, a triphenylene group, a pyrene group, a chrysene group, and a perylene group; and $Ar_{241}$ may be selected from or include, e.g., a benzene group, a biphenyl group, and a triphenylene group.

For example, in Formula 2-1 above, $Ar_{211}$ and $Ar_{212}$ may be each independently selected from or include an anthracene group, a triphenylene group, a pyrene group, a chrysene group, and a perylene group.

In an implementation, in Formula 2-1 above, $Ar_{211}$ and $Ar_{212}$ may be the same.

In an implementation, in Formula 2-1 above, $Ar_{211}$ and $Ar_{212}$ may be, e.g., an anthracene group.

In Formulae 2-1 to 2-4, $L_{211}$ to $L_{213}$, $L_{221}$, $L_{231}$ to $L_{234}$, and $L_{241}$ may each independently be selected from or include, e.g., a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In an implementation, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene, the substituted divalent non-aromatic condensed polycyclic group, and the substituted divalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$.

$Q_{11}$ to $Q_{17}$, $Q_{21}$ to $Q_{27}$ and $Q_{31}$ to $Q_{37}$ may each independently be selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, in Formulae 2-1 to 2-4 above, $L_{211}$ to $L_{213}$, $L_{221}$, $L_{231}$ to $L_{234}$, and $L_{241}$ may each independently be selected from, e.g., a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubycenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, a thiadiazolyl group, and an imidazopyridinyl group.

In an implementation, in Formulae 2-1 to 2-4, $L_{211}$ to $L_{213}$, $L_{221}$, $L_{231}$ to $L_{234}$, and $L_{241}$ may each independently be selected from, e.g., a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group, each substituted with at least one selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In an implementation, in Formulae 2-1 to 2-4, $L_{211}$ to $L_{213}$, $L_{221}$, $L_{231}$ to $L_{234}$, and $L_{241}$ may each independently be a group represented by one of Formulae 3-1 to 3-31.

3-1

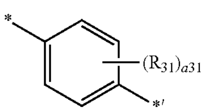

3-2

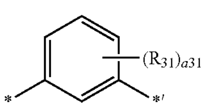

3-3

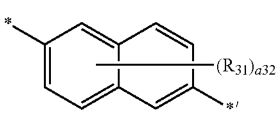

3-4

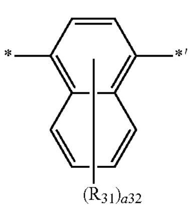

3-5

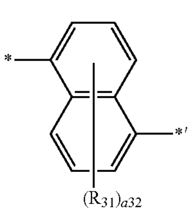

-continued 3-6

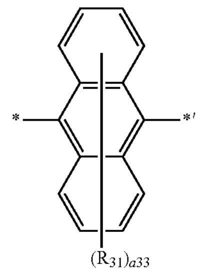

3-7

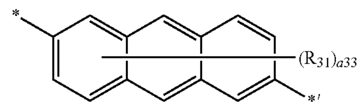

3-8

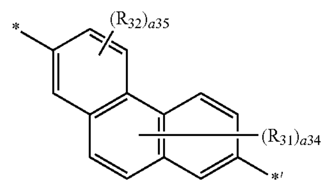

3-9

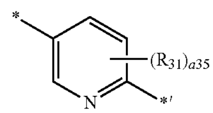

3-10

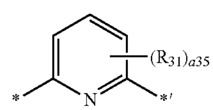

3-11

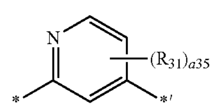

3-12

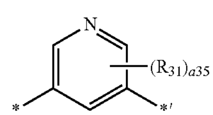

3-13

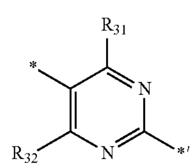

3-14

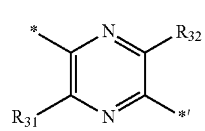

3-15

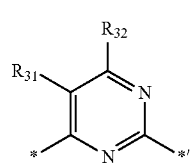

-continued
3-16
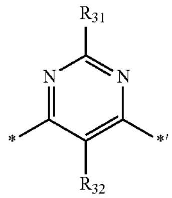
3-17
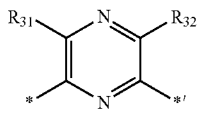
3-18
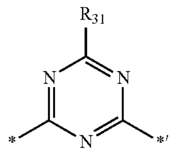
3-19
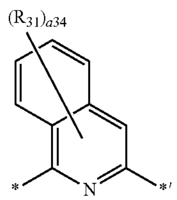
3-20
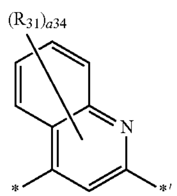
3-21
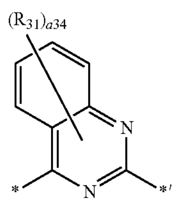
3-22
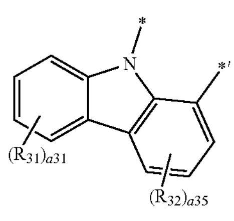
3-23
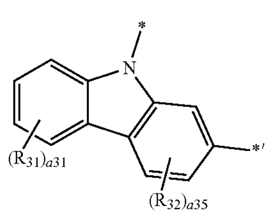
-continued
3-24
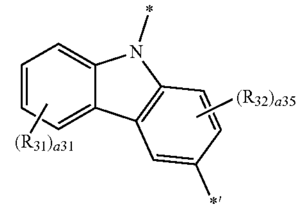
3-25
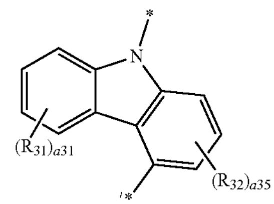
3-26
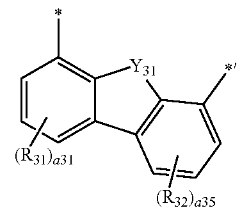
3-27
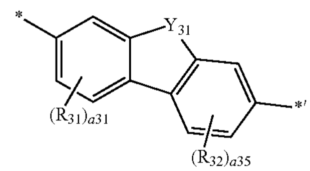
3-28
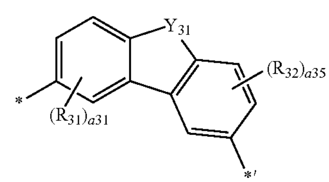
3-29
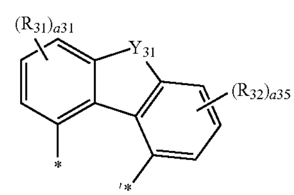
3-30
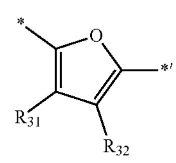
3-31
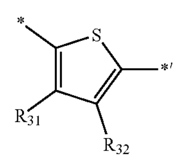
In Formulae 3-1 to 3-31,
$Y_{31}$ may be selected from, e.g., $C(R_{33})(R_{34})$, $N(R_{33})$, O, S, and $Si(R_{33})(R_{34})$;

$R_{31}$ to $R_{34}$ may each independently be selected from, e.g., a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 may be selected from 1, 2, 3, and 4;

a32 may be selected from 1, 2, 3, 4, 5, and 6;

a33 may be selected from 1, 2, 3, 4, 5, 6, 7, and 8;

a34 may be selected from 1, 2, 3, 4, and 5;

a35 may be selected from 1, 2, and 3; and

* and *' each independently indicate a binding site to a neighboring atom.

In an implementation, in Formulae 2-1 to 2-4, $L_{211}$ to $L_{213}$, $L_{221}$, $L_{231}$ to $L_{234}$, and $L_{241}$ may each independently be a group represented by one of Formulae 3-1 to 3-31; and in Formulae 3-2 to 3-31, $Y_{31}$ may be selected from, e.g., $C(R_{33})(R_{34})$, $N(R_{33})$, O, and S; and $R_{31}$ to $R_{34}$ may each independently be selected from, e.g., a hydrogen, a deuterium, —F, —Cl, —Br, —I, a methyl group, an ethyl group, a tert-butyl group, a methoxy group, an ethoxy group, a tert-butoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In an implementation, in Formulae 2-1 to 2-4, $L_{211}$ to $L_{213}$, $L_{221}$, $L_{231}$ to $L_{234}$, and $L_{241}$ may each independently be a group represented by one of Formulae 4-1 to 4-56.

4-1

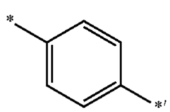

4-2

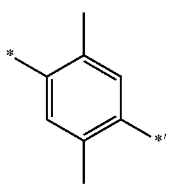

4-3

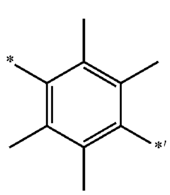

-continued 4-4

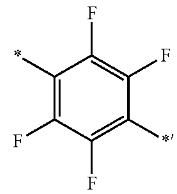

4-5

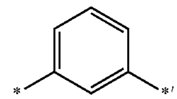

4-6

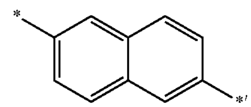

4-7

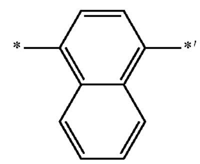

4-8

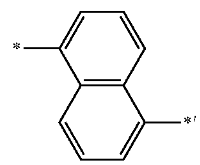

4-9

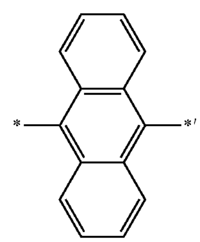

4-10

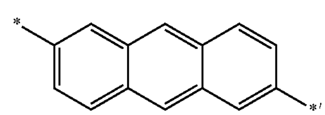

4-11

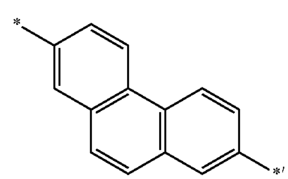

4-12

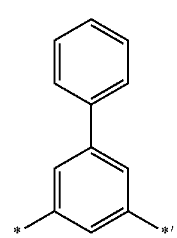

-continued
4-13
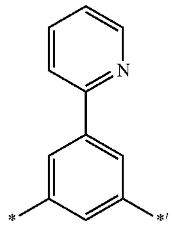
4-14
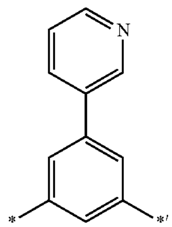
4-15
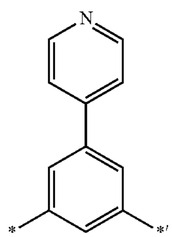
4-16
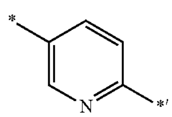
4-17
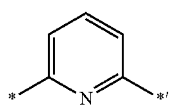
4-18
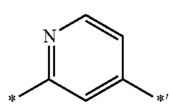
4-19
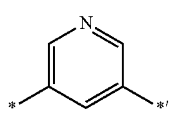
4-20
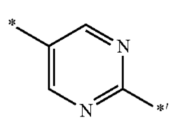
4-21
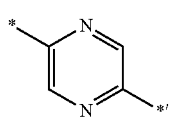
4-22
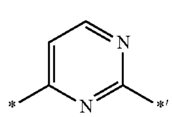
4-23
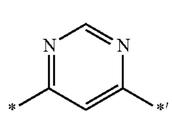
-continued
4-24
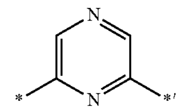
4-25
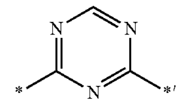
4-26
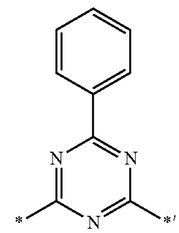
4-27
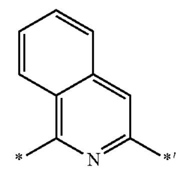
4-28
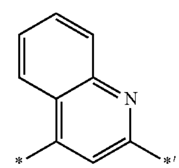
4-29
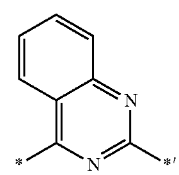
4-30
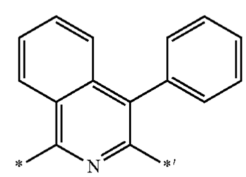
4-31
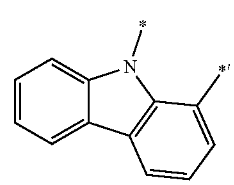
4-32
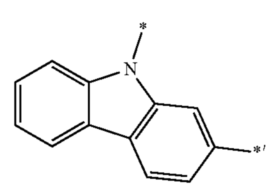

-continued
4-33
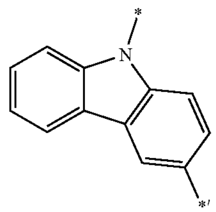
4-34
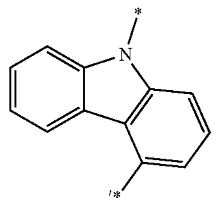
4-35
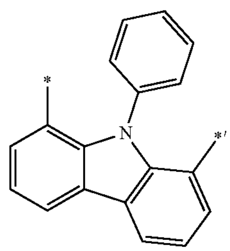
4-36
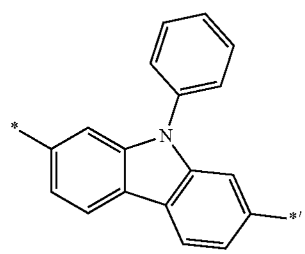
4-37
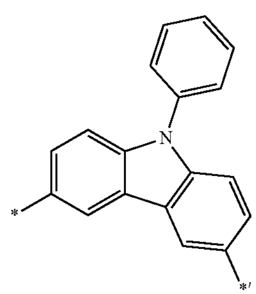
4-38
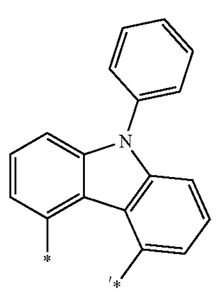
-continued
4-39
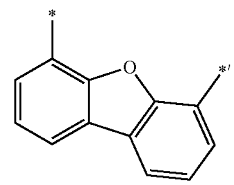
4-40
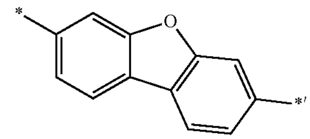
4-41
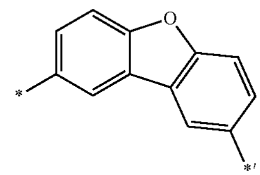
4-42
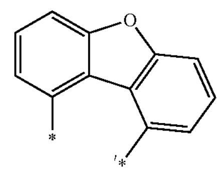
4-43
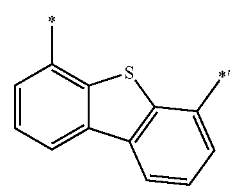
4-44
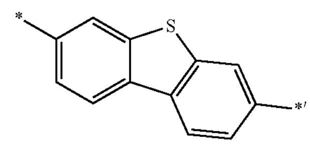
4-45
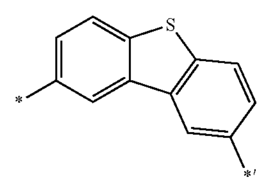
4-46
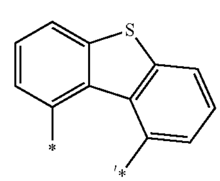
4-47
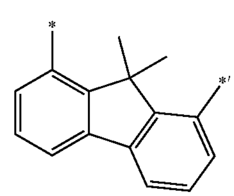

-continued 4-48

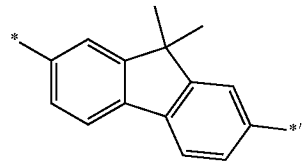

4-49

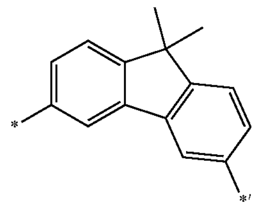

4-50

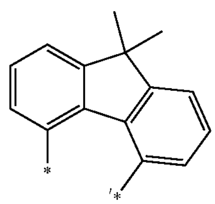

4-51

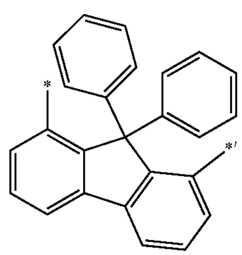

4-52

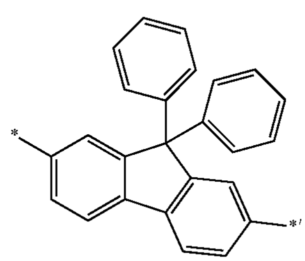

4-53

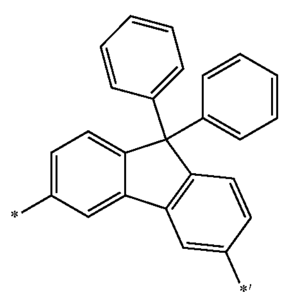

-continued 4-54

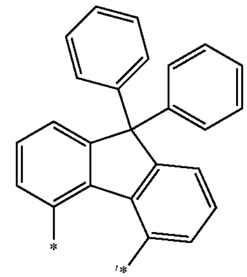

4-55

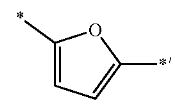

4-56

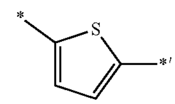

In Formulae 4-1 to 4-56, * and *' each independently indicate a binding site to a neighboring atom.

In an implementation, in Formulae 2-1 to 2-4, $L_{211}$ to $L_{213}$, $L_{221}$, $L_{231}$ to $L_{234}$, and $L_{241}$ may each independently be a group represented by one of Formulae 4-1 to 4-12 and 4-31 to 4-54.

In Formula 2-1, a211 represents the number of $L_{211s}$ and may be selected from 0, 1, and 2. When a211 is 0, $(L_{211})_{a211}$ represents a single bond. When a211 is 2 or higher, a plurality of $L_{211}$s may be identical or different. For example, in Formula 2-1, a211 may be selected from 0 and 1. In Formulae 2-1 to 2-4, each of a212, a213, a221, a231 to a234, and a241 may be understood by referring to the descriptions of a211 and Formulae 2-1 to 2-4.

In Formulae 2-1 to 2-4, a212, a213, a221, a231 to a234, and a241 may be each independently selected from 0, 1, and 2. For example, in Formulae 2-1 to 2-4, a212, a213, a221, a231 to a234, and a241 may be each independently selected from 0 and 1.

In Formulae 2-3 and 2-4, $R_{231}$ to $R_{234}$ and $R_{241}$ may each independently be selected from or include, e.g., a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted heteroaryl group, a substituted or unsubstituted monovalent non-aromatic condensed polycyclic group, and a substituted or unsubstituted monovalent non-aromatic condensed heteropolycyclic group.

At least one substituent of the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_3$, $Q_{11}$ to $Q_{17}$, $Q_{21}$ to $Q_{27}$, $Q_{31}$ to $Q_{37}$, and $Q_{211}$ to $Q_{217}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, in Formulae 2-3 and 2-4, $R_{231}$ to $R_{234}$ and $R_{241}$ may each independently be selected from, e.g., a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, each independently selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si($Q_{33}$)($Q_{34}$)($Q_{35}$);

wherein $Q_{33}$ to $Q_{35}$ may be each independently selected from a $C_1$-$C_{60}$ alkyl group and a $C_6$-$C_{60}$ aryl group.

In an implementation, in Formulae 2-3 and 2-4, $R_{231}$ to $R_{234}$ and $R_{241}$ may each independently be selected from, e.g., a phenyl group, a naphthyl group, a fluorenyl group, a benzofluorenyl group, a dibenzofluorenyl group, a phenalenyl group, a phenanthrenyl group, an anthracenyl group, a triphenylenyl group, a pyrenyl group, a chrysenyl group, a carbazolyl group, a dibenzofuranyl group, and a dibenzothiophenyl group; and a phenyl group, a naphthyl group, a fluorenyl group, a benzofluorenyl group, a dibenzofluorenyl group, a phenalenyl group, a phenanthrenyl group, an anthracenyl group, a triphenylenyl group, a pyrenyl group, a chrysenyl group, a carbazolyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group.

In an implementation, in Formulae 2-3 and 2-4, $R_{231}$ to $R_{234}$ and $R_{241}$ may each independently be selected from, e.g., a group represented by one of Formulae 7-1 to 7-16 below.

7-1

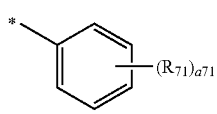

7-2

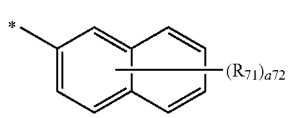

7-3

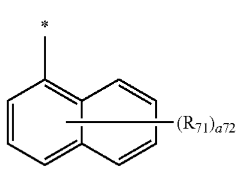

-continued 7-4

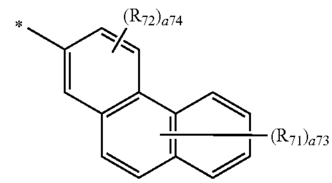

7-5

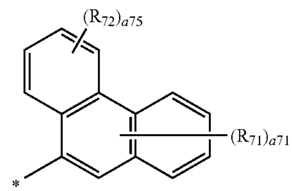

7-6

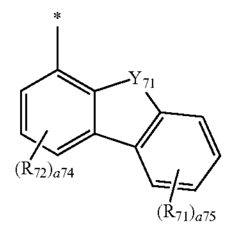

7-7

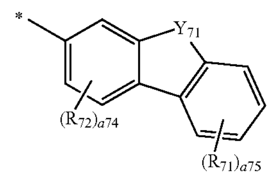

7-8

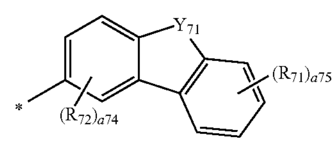

7-9

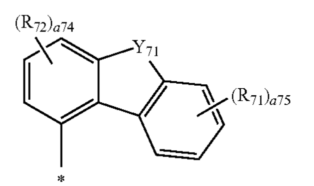

7-10

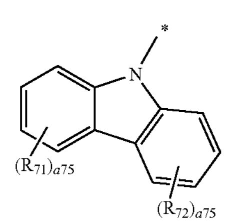

7-11

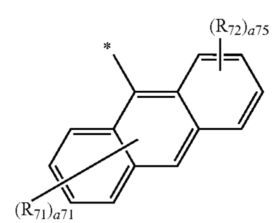

-continued 7-12

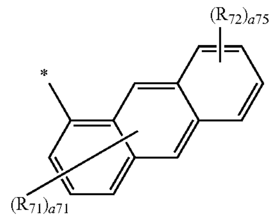

7-13

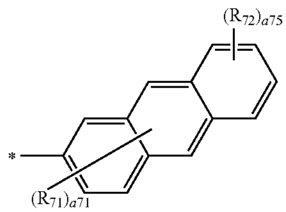

7-14

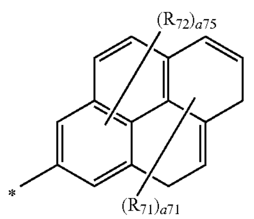

7-15

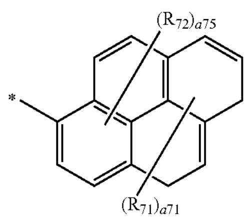

7-16

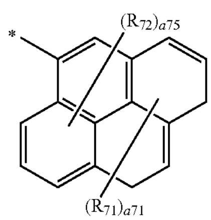

In Formulae 7-1 to 7-16, $Y_{71}$ may be selected from, e.g., $C(R_{73})(R_{74})$, $N(R_{73})$, O, and S;

$R_{71}$ to $R_{74}$ may each independently be selected from, e.g., a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group, a71 may be selected from 1, 2, 3, 4, and 5; and a72 may be selected from 1, 2, 3, 4, 5, 6, and 7;

a73 may be selected from 1, 2, 3, 4, 5, and 6;

a74 may be selected from 1, 2, and 3;

a75 may be selected from 1, 2, 3, and 4; and

* indicates a binding site to a neighboring atom.

In an implementation, in Formulae 2-3 and 2-4, $R_{231}$ to $R_{234}$ and $R_{241}$ may each independently be selected from, e.g., a group represented by one of Formulae 8-1 to 8-29.

8-1

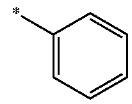

8-2

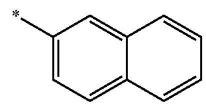

8-3

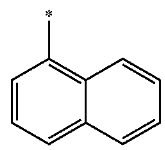

8-4

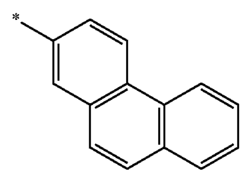

8-5

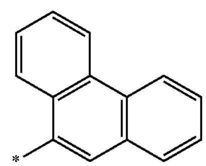

8-6

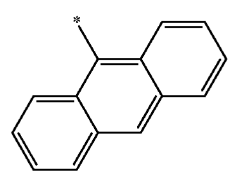

8-7

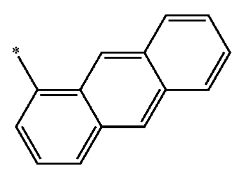

8-8

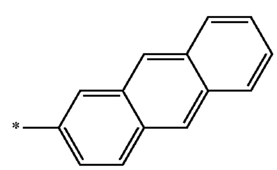

8-9

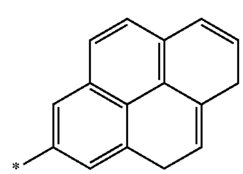

8-10

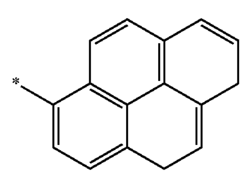

-continued 8-11
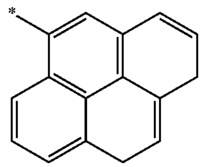

8-12
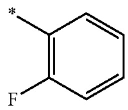

8-13
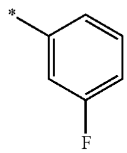

8-14
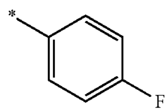

8-15
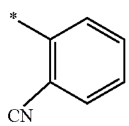

8-16
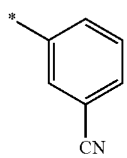

8-17
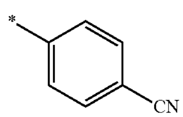

8-18
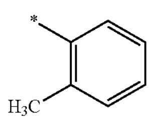

8-19
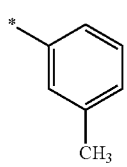

8-20
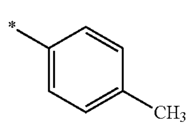

8-21
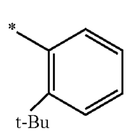

-continued 8-22
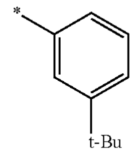

8-23
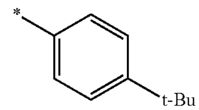

8-24
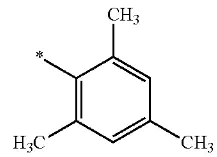

8-25
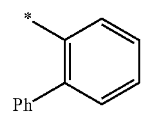

8-26
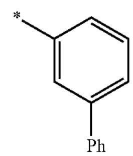

8-27
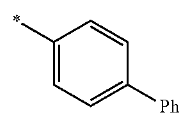

8-28
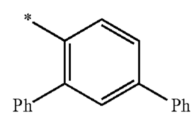

8-29
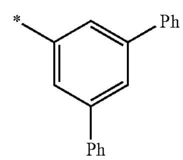

In Formulae 8-1 to 8-29, * indicates a binding site to a neighboring atom.

In Formula 2-3, b231 represents the number of $R_{231}$s and may be selected from 1, 2, and 3. For example, in Formula 2-3, b231 may be selected from 1 and 2. When b231 is 2 or higher, a plurality of $R_{231}$s may be identical or different. In Formulae 2-3 and 2-4, each of b232 to b234 and b241 may each independently be understood by referring to the description of b231 and Formulae 2-3 and 2-4 above.

In Formulae 2-3 and 2-4, b231 to b234 and b241 may each independently be selected from 1, 2, and 3. For example, in Formulae 2-3 and 2-4 above, b231 to b234 and b241 may each independently be selected from 1 and 2.

In Formulae 2-1 to 2-4, $R_{211}$, $R_{212}$, $R_{221}$, $R_{222}$, $R_{235}$ to $R_{238}$, and $R_{242}$ may each independently be selected from or include, e.g., a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{211}$)($Q_{212}$)($Q_{213}$), —N($Q_{214}$)($Q_{215}$), and —B($Q_{216}$)($Q_{217}$).

At least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —S($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_3$, $Q_{11}$ to $Q_{17}$, $Q_{21}$ to $Q_{27}$, $Q_{31}$ to $Q_{37}$ and $Q_{211}$ to $Q_{217}$ may each independently be selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, in Formulae 2-1 to 2-4, $R_{211}$, $R_{212}$, $R_{221}$, $R_{222}$, $R_{235}$ to $R_{238}$, and $R_{242}$ may each independently be selected from, e.g., a hydrogen, a deuterium, —F, —Cl, —Br, —I, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), —Si($Q_{33}$)($Q_{34}$)($Q_{35}$), and —B($Q_{36}$)($Q_{37}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), —Si($Q_{33}$)($Q_{34}$)($Q_{35}$), and —B($Q_{36}$)($Q_{37}$); and —Si($Q_{211}$)($Q_{212}$)($Q_{213}$), —N($Q_{214}$)($Q_{215}$), and —B($Q_{216}$)($Q_{217}$), wherein $Q_{31}$ to $Q_{37}$ and $Q_{211}$ to $Q_{217}$ may each independently be selected from a $C_1$-$C_{60}$ alkyl group and a $C_6$-$C_{60}$ aryl group.

In an implementation, in Formulae 2-1 to 2-4, $R_{211}$, $R_{212}$, $R_{221}$, $R_{222}$, $R_{235}$ to $R_{238}$, and $R_{242}$ may each independently be selected from, e.g., a hydrogen, a deuterium, —F, —Cl, —Br, —I, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one selected from a deuterium, —F, —Cl, —Br, —I, a phenyl group, a naphthyl group, a phenoxy group, a phenylthio group, —$N(Q_{31})(Q_{32})$, —$Si(Q_{33})(Q_{34})(Q_{35})$, and —$B(Q_{36})(Q_{37})$;

a phenoxy group, a phenylthio group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group;

a phenoxy group, a phenylthio group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenoxy group, a phenylthio group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —$N(Q_{31})(Q_{32})$, —$Si(Q_{33})(Q_{34})(Q_{35})$, and —$B(Q_{36})(Q_{37})$; and —$Si(Q_{211})(Q_{212})(Q_{213})$, —$N(Q_{214})(Q_{215})$, and —$B(Q_{216})(Q_{217})$, wherein $Q_{31}$ to $Q_{37}$ and $Q_{211}$ to $Q_{217}$ may each independently be selected from a $C_1$-$C_{60}$ alkyl group and a $C_6$-$C_{60}$ aryl group.

In an implementation, in Formulae 2-1 to 2-4, $R_{211}$, $R_{212}$, $R_{221}$, $R_{222}$, $R_{235}$ to $R_{238}$, and $R_{242}$ may each independently be selected from, e.g., a hydrogen, a deuterium, —F, —Cl, —Br, —I, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least selected from a deuterium, —F, —Cl, —Br, —I, a phenyl group, a naphthyl group, a phenoxy group, a phenylthio group, —$N(Q_{31})(Q_{32})$, —$Si(Q_{33})(Q_{34})(Q_{35})$, and —$B(Q_{36})(Q_{37})$;

a phenoxy group, a phenylthio group, a phenyl group, a naphthyl group, a fluorenyl group, a benzofluorenyl group, a dibenzofluorenyl group, a phenalenyl group, a phenanthrenyl group, an anthracenyl group, a triphenylenyl group, a pyrenyl group, a chrysenyl group, a carbazolyl group, a dibenzofuranyl group, and a dibenzothiophenyl group;

a phenoxy group, a phenylthio group, a phenyl group, a naphthyl group, a fluorenyl group, a benzofluorenyl group, a dibenzofluorenyl group, a phenalenyl group, a phenanthrenyl group, an anthracenyl group, a triphenylenyl group, a pyrenyl group, a chrysenyl group, a carbazolyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenoxy group, a phenylthio group, a phenyl group, a naphthyl group, —N($Q_{31}$)($Q_{32}$), —Si($Q_{33}$)($Q_{34}$)($Q_{35}$), and —B($Q_{36}$)($Q_{37}$); and —Si($Q_{211}$)($Q_{212}$)($Q_{213}$), —N($Q_{214}$)($Q_{215}$), and —B($Q_{216}$)($Q_{217}$), wherein $Q_{31}$ to $Q_{37}$ and $Q_{211}$ to $Q_{217}$ may each independently be selected from a $C_1$-$C_{60}$ alkyl group and a $C_6$-$C_{60}$ aryl group.

In an implementation, in Formulae 2-1 to 2-4, $R_{211}$, $R_{212}$, $R_{221}$, $R_{222}$, $R_{235}$ to $R_{238}$, and $R_{242}$ may each independently be selected from, e.g., a hydrogen, a deuterium, —F, —Cl, —Br, —I, a methyl group, an ethyl group, an n-propyl group, an iso-propyl group, an n-butyl group, an iso-butyl group, a sec-butyl group, a tert-butyl group, a methoxy group, an ethoxy group, an iso-propoxy group, an n-butoxy group, an iso-butoxy group, a sec-butoxy group, a tert-butoxy group, —Si($CH_3$)$_3$, —Si(Ph)$_3$, —N($Ph_2$)$_2$, —B(Ph)$_2$, and a group represented by one of Formulae 9-1 to 9-13 below.

9-1

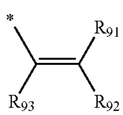

9-2

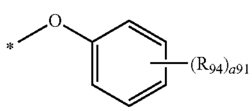

9-3

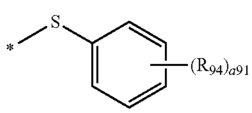

9-4

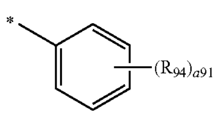

9-5

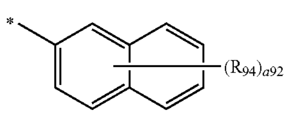

9-6

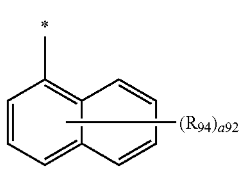

9-7

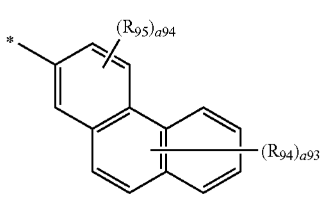

-continued 9-8

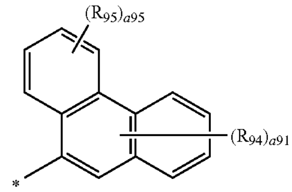

9-9

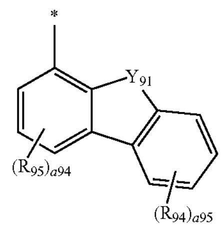

9-10

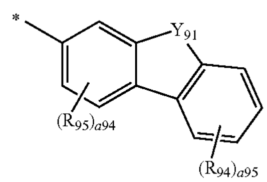

9-11

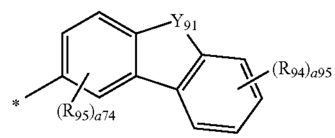

9-12

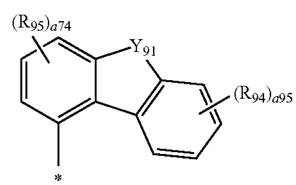

9-13

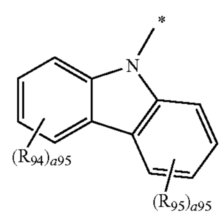

In Formulae 9-1 to 9-13, $Y_{91}$ may be selected from, e.g., C($R_{96}$)($R_{97}$), N($R_{96}$), O, and S;

$R_{91}$ to $R_{93}$ may each independently be selected from, e.g., a hydrogen, a deuterium, —F, —Cl, —Br, —I, a phenyl group, and a naphthyl group;

$R_{94}$ to $R_{97}$ may each independently be selected from, e.g., a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenoxy group, a phenylthio group, a phenyl group, and a naphthyl group;

a91 may be selected from 1, 2, 3, 4, and 5;

a92 may be selected from 1, 2, 3, 4, 5, 6, and 7;

a93 may be selected from 1, 2, 3, 4, 5, and 6;
a94 may be selected from 1, 2, and 3;
a95 may be selected from 1, 2, 3, and 4; and
* indicates a binding site to a neighboring atom.

In an implementation, in Formulae 2-1 to 2-4, $R_{211}$, $R_{212}$, $R_{221}$, $R_{222}$, $R_{235}$ to $R_{238}$, and $R_{242}$ may each independently be selected from, e.g., a hydrogen, a deuterium, —F, —Cl, —Br, —I, a methyl group, an ethyl group, an n-propyl group, an iso-propyl group, an n-butyl group, an iso-butyl group, a sec-butyl group, a tert-butyl group, a methoxy group, an ethoxy group, an iso-propoxy group, an n-butoxy group, an iso-butoxy group, a sec-butoxy group, a tert-butoxy group, $—Si(CH_3)_3$, $—Si(Ph)_3$, $—N(Ph_2)_2$, $—B(Ph)_2$, and a group represented by one of Formulae 10-1 to 10-24 below.

10-1

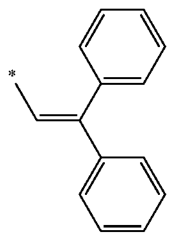

10-2

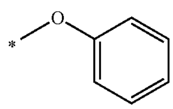

10-3

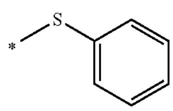

10-4

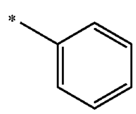

10-5

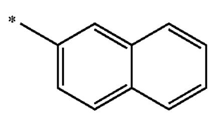

10-6

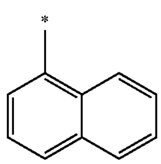

10-7

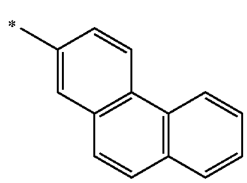

10-8

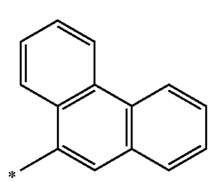

-continued 10-9

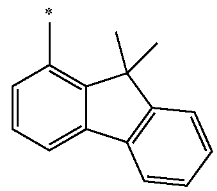

10-10

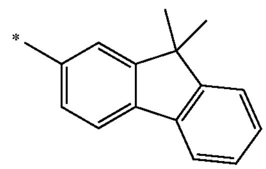

10-11

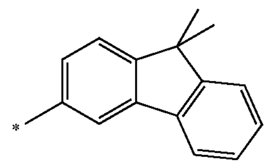

10-12

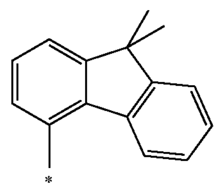

10-13

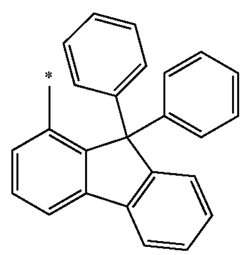

10-14

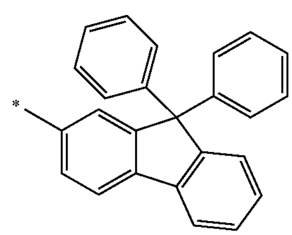

10-15

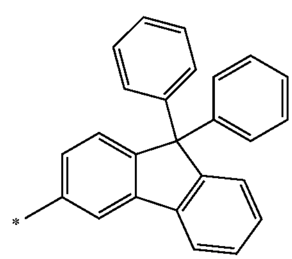

-continued 10-16

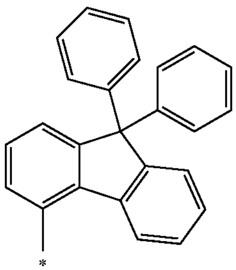

10-17

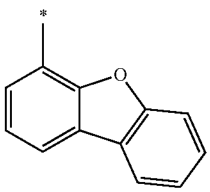

10-18

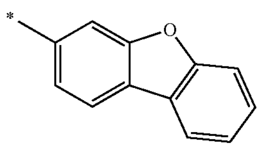

10-19

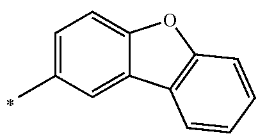

10-20

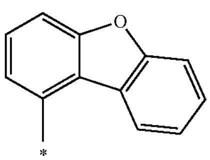

10-21

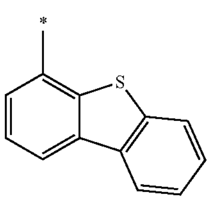

-continued 10-22

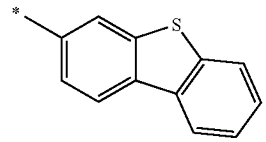

10-23

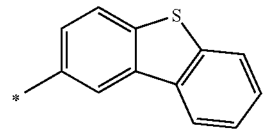

10-24

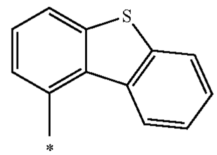

In Formulae 10-1 to 10-24, * indicates a binding site to a neighboring atom.

In an implementation, in Formulae 2-1 to 2-4, b211, b212, b221, b222, b235 to b238, and b242 may each independently be selected from 1, 2, and 3. For example, in Formulae 2-1 to 2-4, b211, b212, b221, b222, b235 to b238, and b242 may each independently be selected from 1 and 2.

In Formula 2-1, n211 and n212 may each independently be selected from 1, 2, and 3. For example, in Formula 2-1, n211 and n212 may be selected from 1 and 2.

In Formula 2-2, n221 may be selected from 1, 2, and 3. For example, n221 in Formula 2-2 may be 2.

In Formula 2-3, n231 to n234 may each independently be selected from 0, 1, and 2 and a sum of n231 to n234 may be selected from 1, 2, 3, 4, 5, and 6. For example, in Formula 2-3, n231 to n234 may be 1.

In Formula 2-4, n241 may be selected from 3, 4, 5, 6, 7, and 8. For example, n241 in Formula 2-4 may be selected from 3, 4, and 6.

In an implementation, Formula 2-2 excludes a case in which $L_{221}$ is a substituted or unsubstituted naphthylene group or a case in which at least one of $R_{221}$ and $R_{222}$ is a substituted or unsubstituted naphthyl group.

For example, the second compound may be represented by any one of Formulae 2-11 to 2-16 below.

<Formula 2-11>

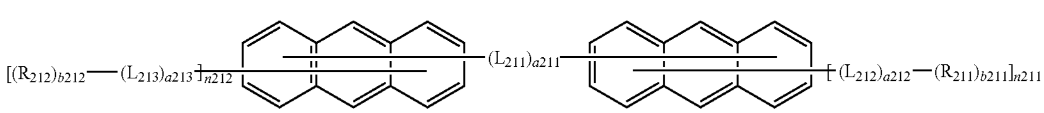

<Formula 2-12>

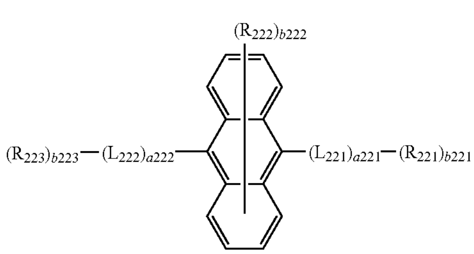

<Formula 2-13>

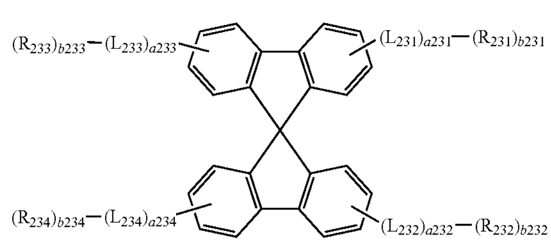

-continued

<Formula 2-14>

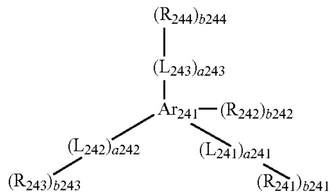

<Formula 2-15>

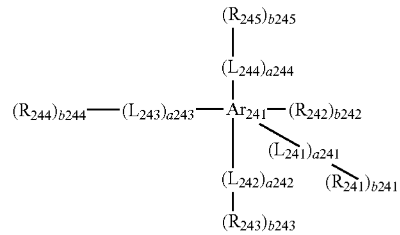

<Formula 2-16>

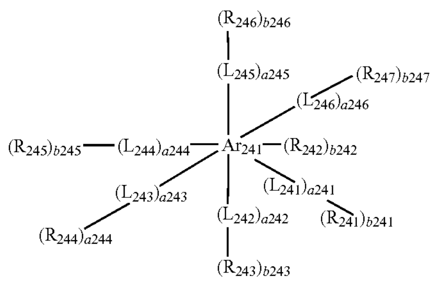

In Formulae 2-11 to 2-16, $Ar_{241}$, $L_{211}$ to $L_{213}$, $L_{221}$, $L_{231}$ to $L_{234}$, $L_{241}$, a211 to a213, a221, a231 to a234, a241, $R_{231}$ to $R_{234}$, $R_{241}$, b231 to b234, b241, $R_{211}$, $R_{212}$, $R_{221}$, $R_{222}$, $R_{242}$, b211, b212, b221, b222, b242, n211, and n212 may be defined the same as those of Formulae 2-1 to 2-4.

$L_{222}$ may be defined the same as $L_{221}$ of Formula 2-2; a222 may be defined the same as a221 of Formula 2-2; $R_{223}$ may be defined the same as $R_{221}$ of Formula 2-2; and b223 may be defined the same as b221 of Formula 2-2.

$L_{242}$ to $L_{246}$ may each independently be defined the same as $L_{241}$ of Formula 2-4, and a242 to a246 may each independently be defined the same as a241 of Formula 2-4.

In an implementation, the second compound may be represented by one of Formulae 2-21 to 2-29 below.

<Formula 2-21>

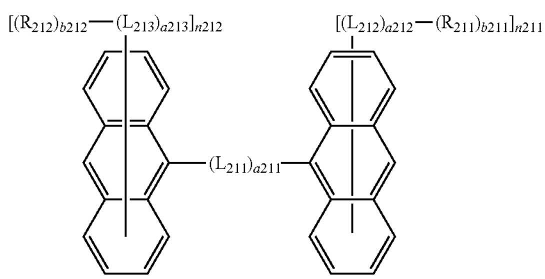

<Formula 2-22>

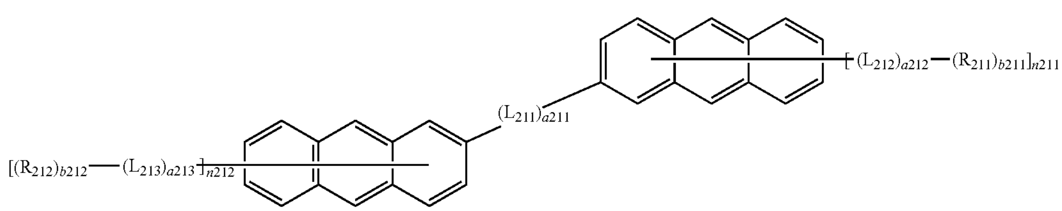

<Formula 2-23>

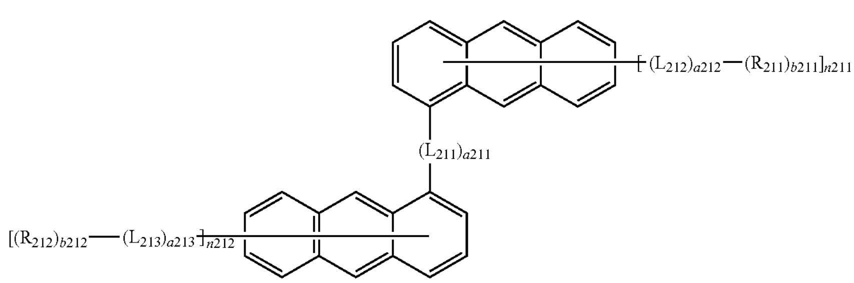

-continued

<Formula 2-24>

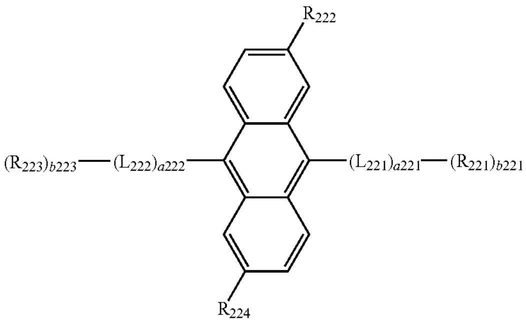

<Formula 2-25>

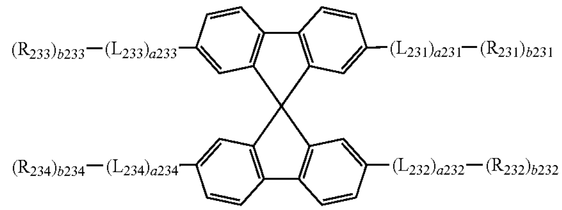

<Formula 2-26>

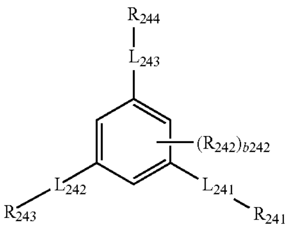

<Formula 2-27>

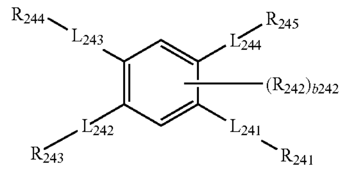

<Formula 2-28>

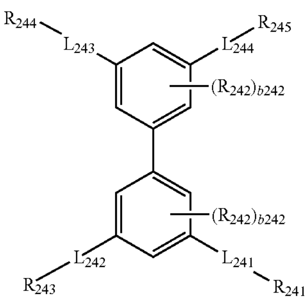

<Formula 2-29>

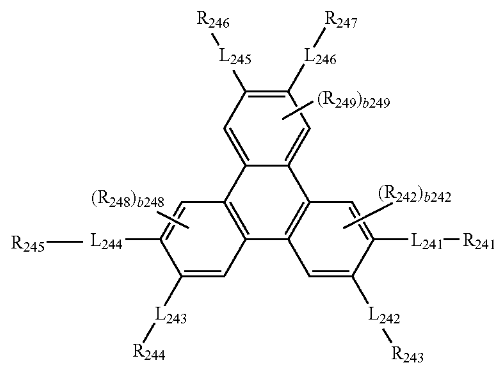

In Formulae 2-21 to 2-29, $L_{211}$ to $L_{213}$, $L_{221}$, $L_{231}$ to $L_{234}$, $L_{241}$, a211 to a213, a221, a231 to a234, $R_{231}$ to $R_{234}$, $R_{241}$, b231 to b234, $R_{211}$, $R_{212}$, $R_{221}$, $R_{222}$, $R_{242}$, b211, b212, b221, b242, n211, and n212 may be defined the same as those of Formulae 2-1 to 2-4.

$L_{222}$ may be defined the same as $L_{221}$ of Formula 2-2; a222 may be defined the same as a221 of Formula 2-2; $R_{223}$ may be defined the same as $R_{221}$ of Formula 2-2; and b223 may be defined the same as b221 of Formula 2-2.

$L_{242}$ to $L_{246}$ may each independently be defined the same as $L_{241}$ of Formula 2-4;

$R_{248}$ and $R_{249}$ may each independently be defined the same as $R_{242}$ of Formula 2-4; and b248 and b249 may each independently be defined the same as b242 of Formula 2-4.

In an implementation, the second compound may be one of the following Compounds H-1 to H-60 below.

H-1

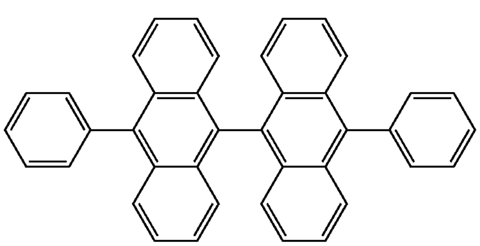

H-2

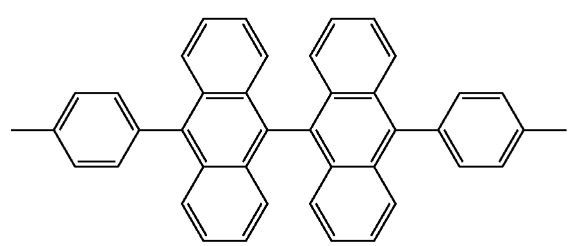

-continued
H-3
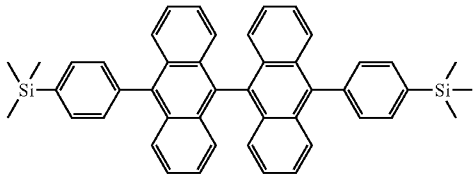
H-4
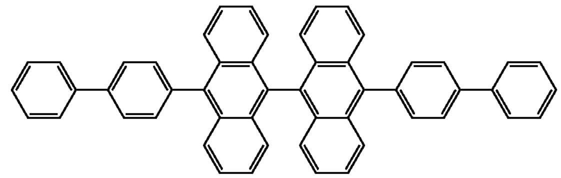
H-5
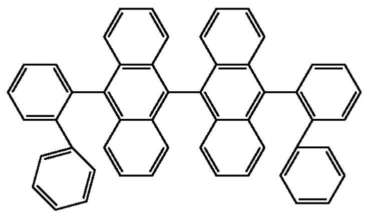
H-6
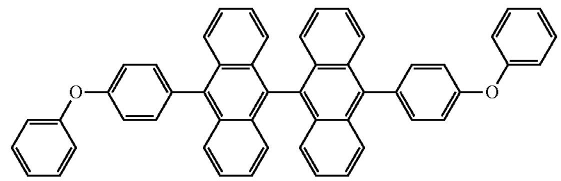
H-7
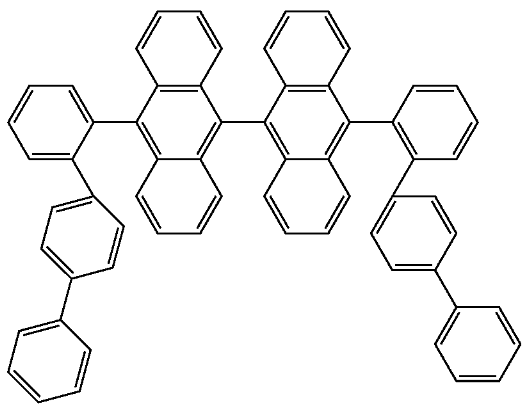
H-8
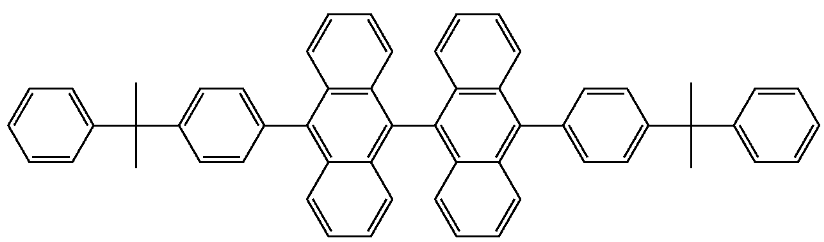
H-9
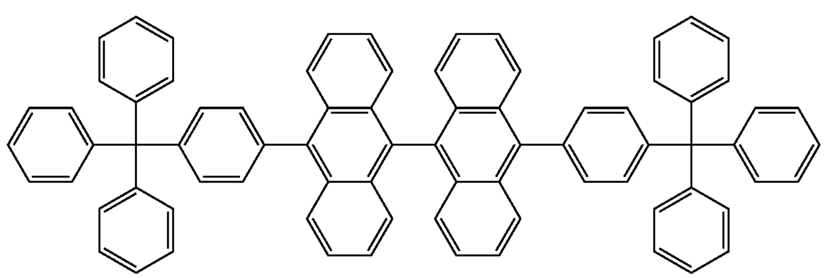
H-10
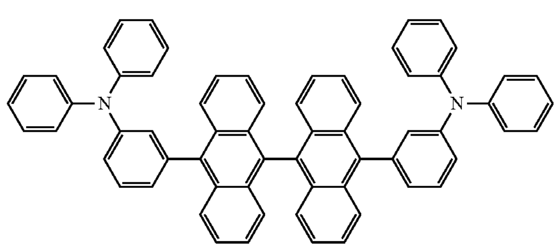
H-11
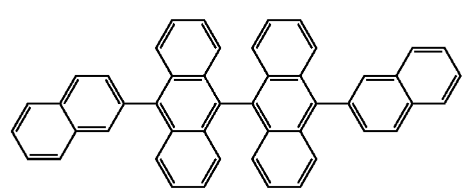

-continued
H-12
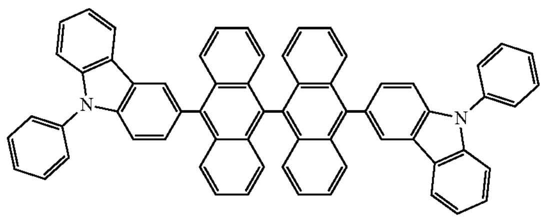
H-13
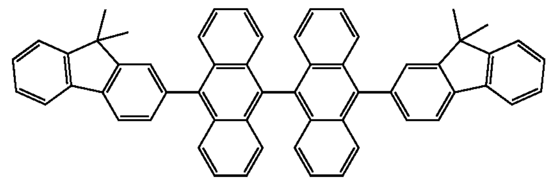
H-14
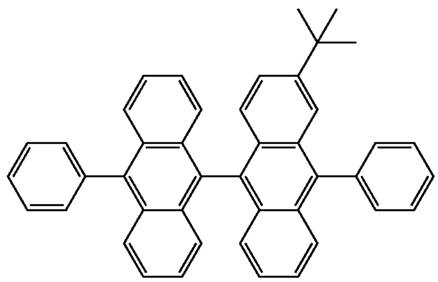
H-15
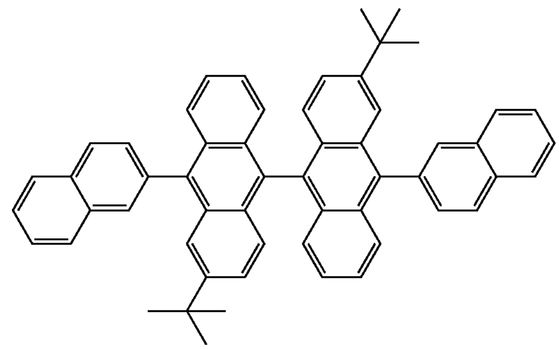
H-16
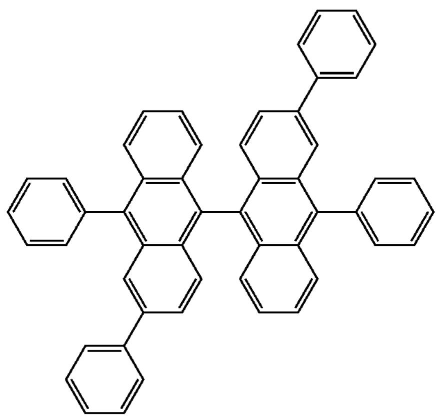
H-17
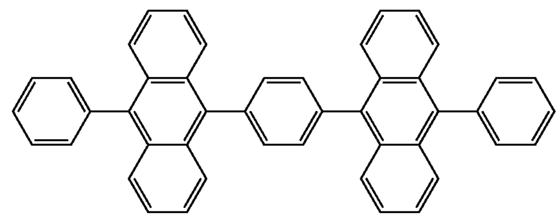
H-18
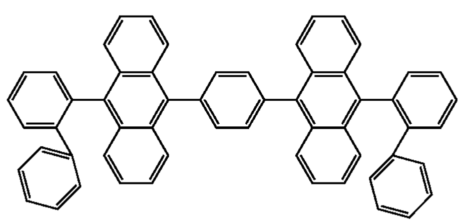
H-19
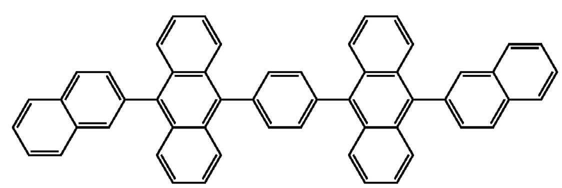
H-20
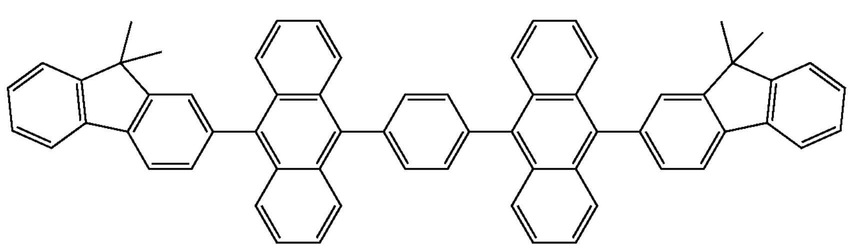

-continued
H-21
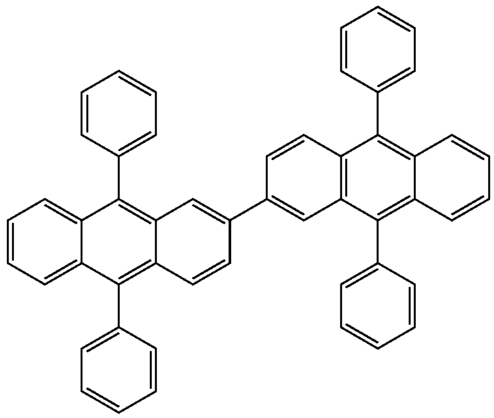
H-22
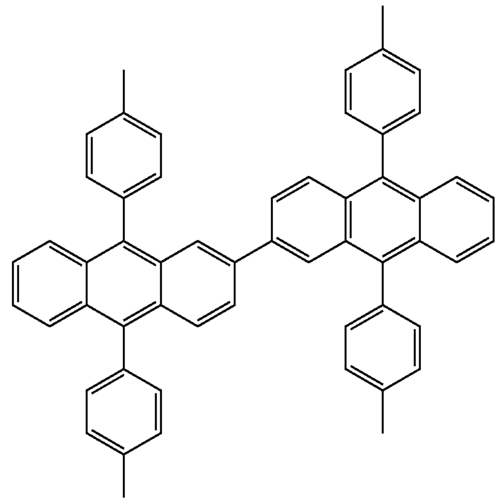
H-23
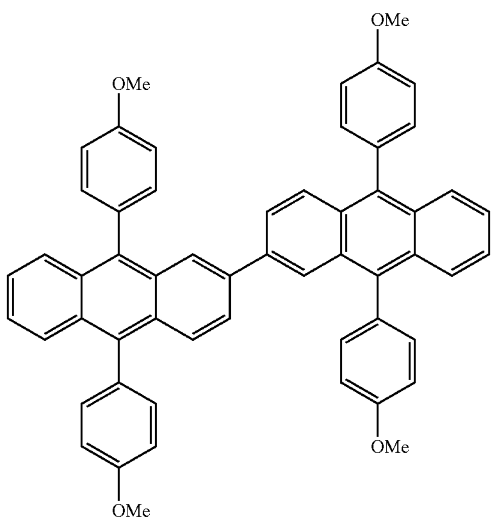
H-24
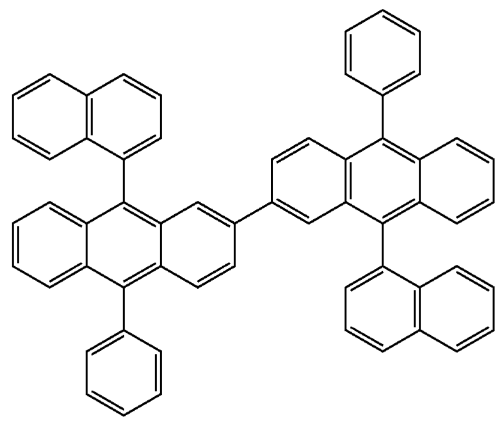
H-25
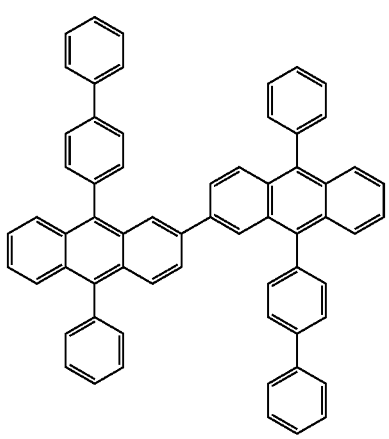
H-26
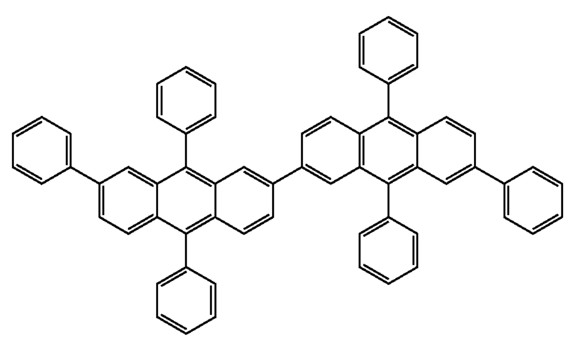

-continued
H-27
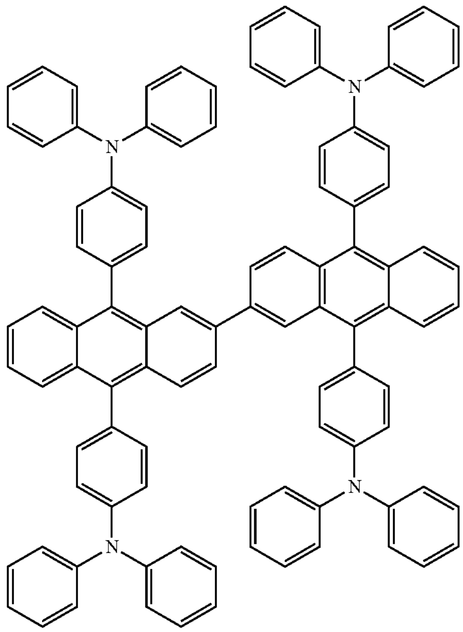
H-28
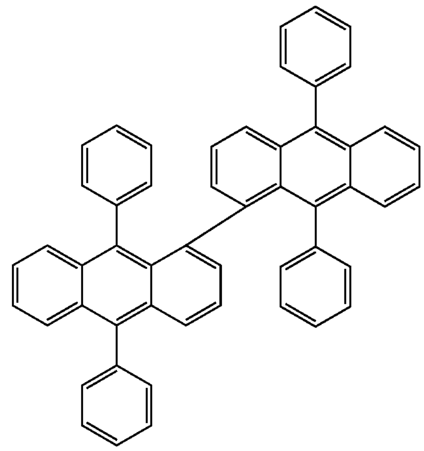
H-29
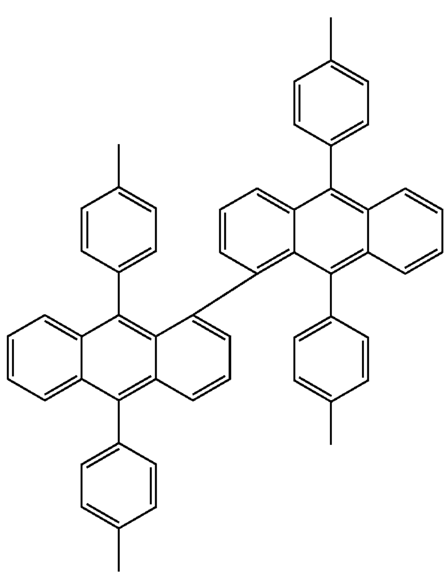
H-30
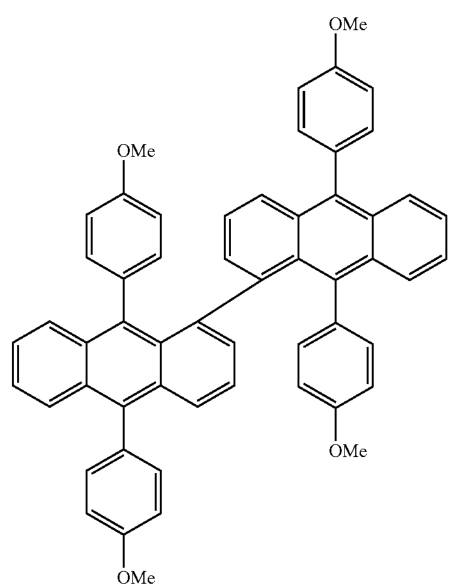

-continued
H-31
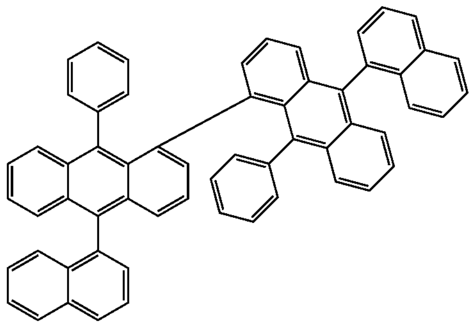
H-32
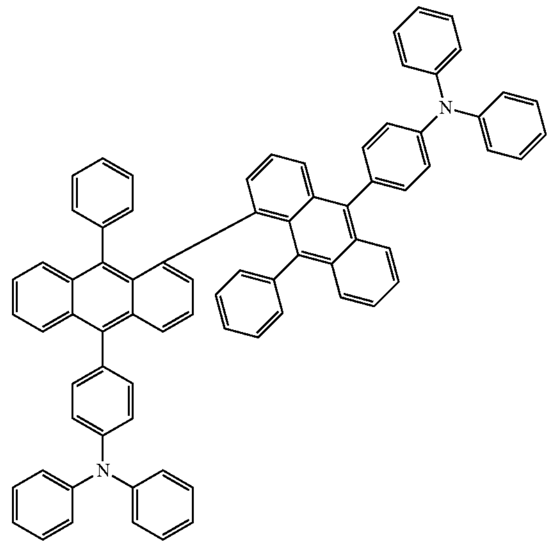
H-33
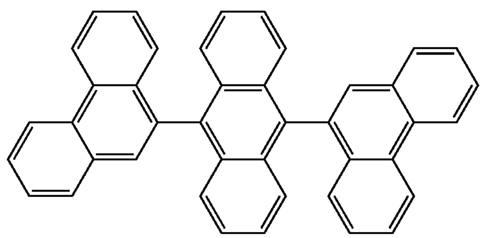
H-34
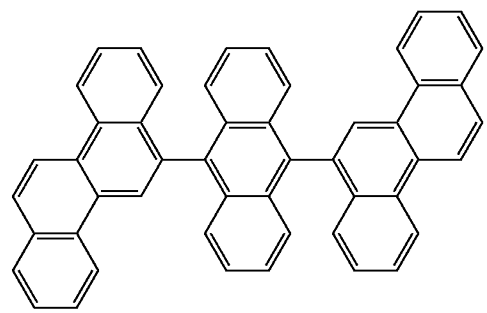
H-35
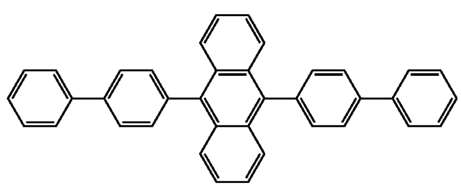
H-36
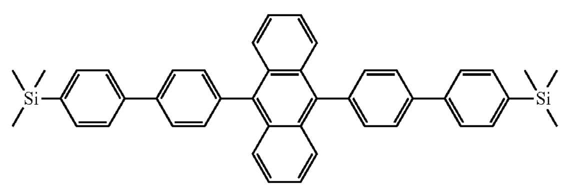
H-37
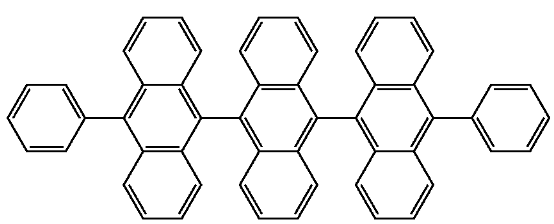
H-38
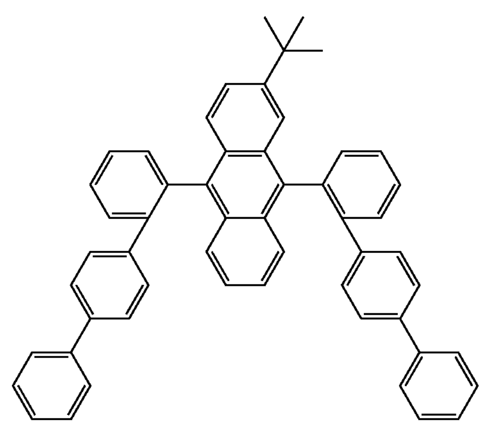

-continued
H-39
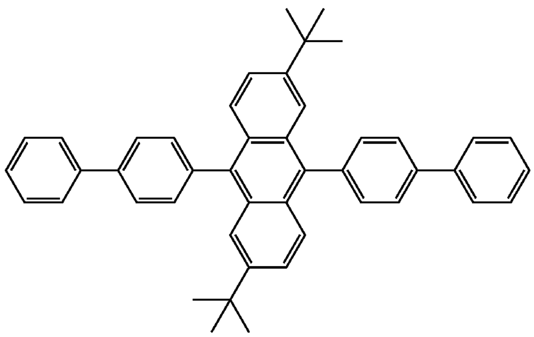
H-40
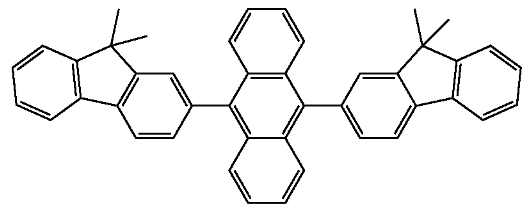
H-41
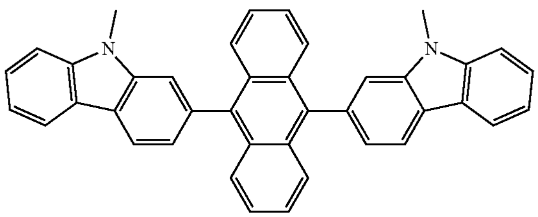
H-42
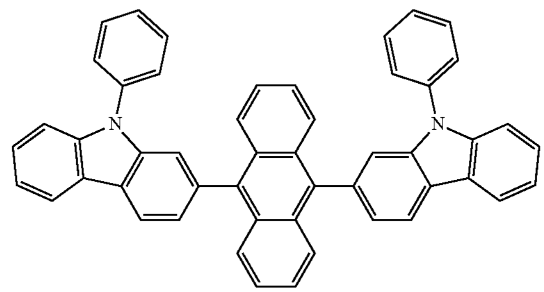
H-43
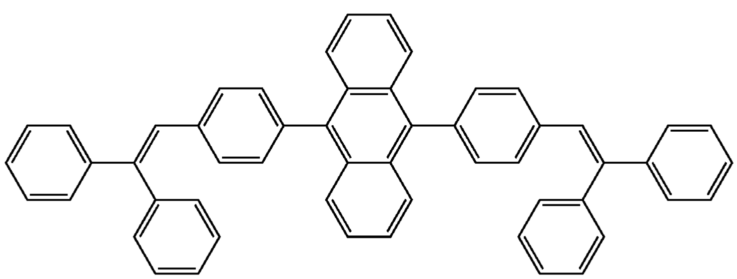
H-44
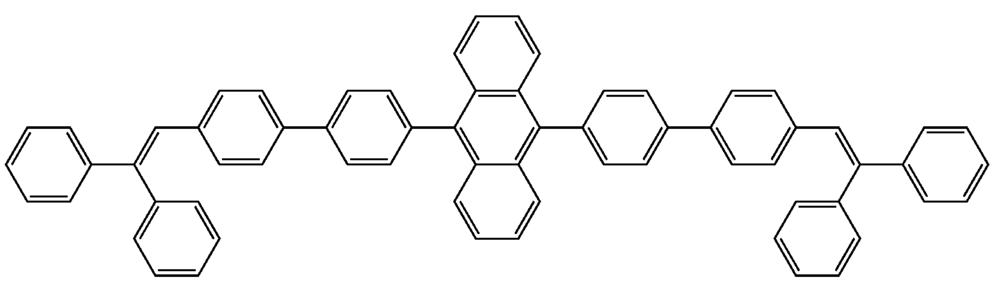
H-45
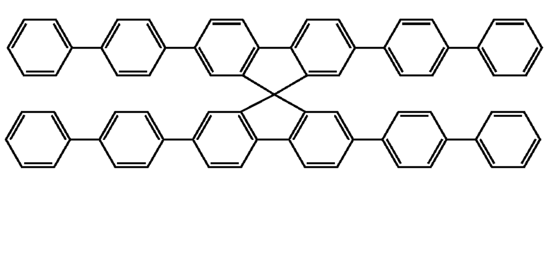
H-46
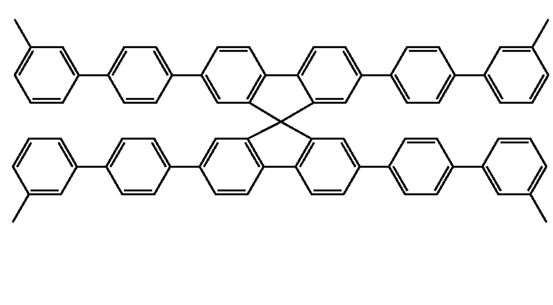

-continued
H-47
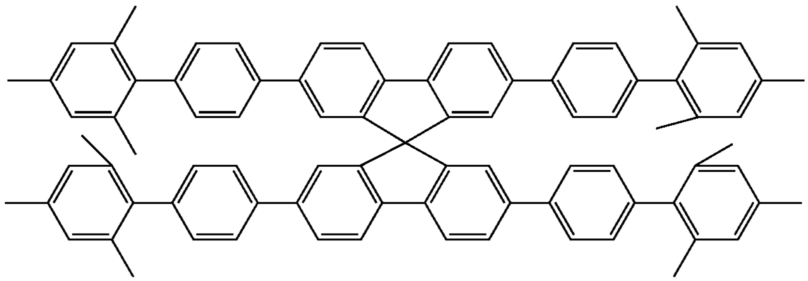
H-48
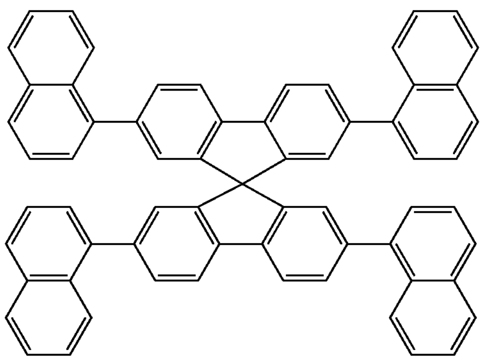
H-49
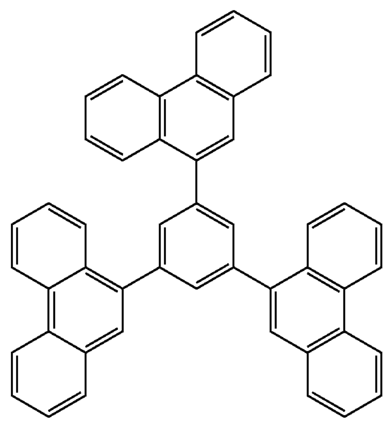
H-50
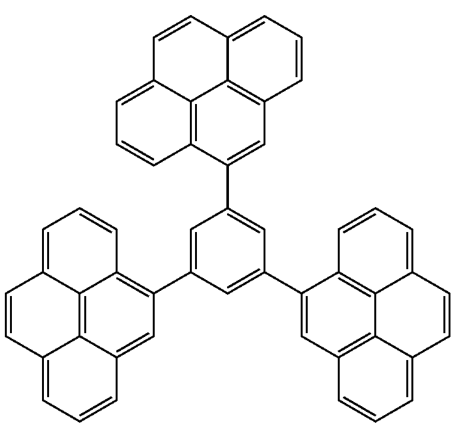
H-51
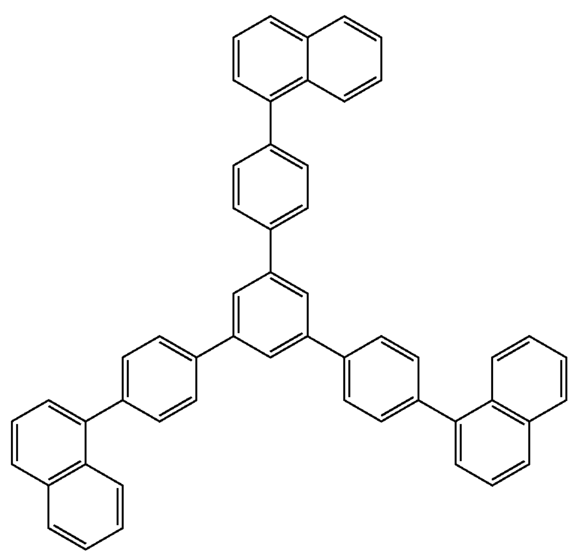

-continued
H-52
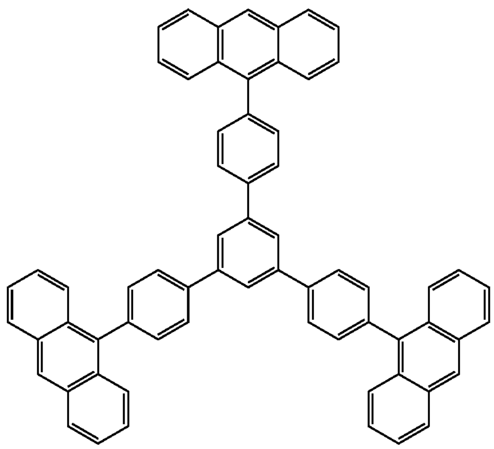
H-53
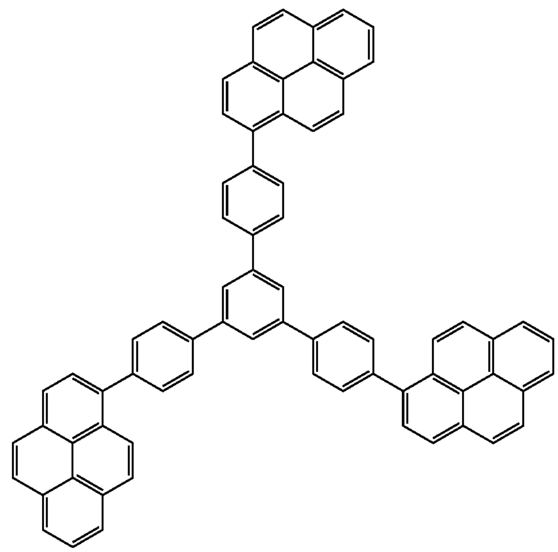
H-54
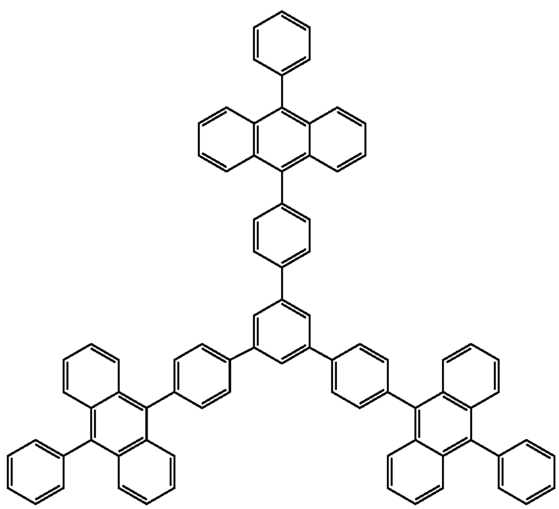
H-55
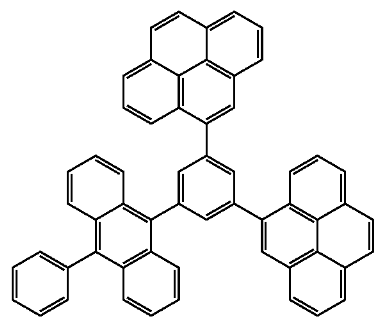
H-56
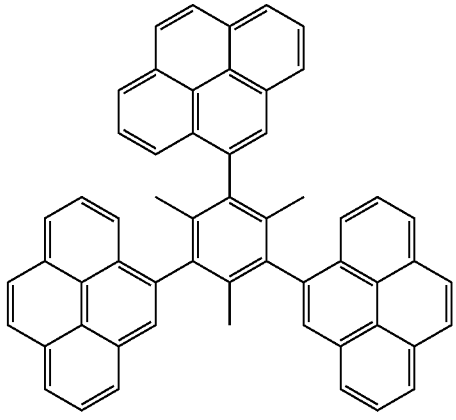
H-57
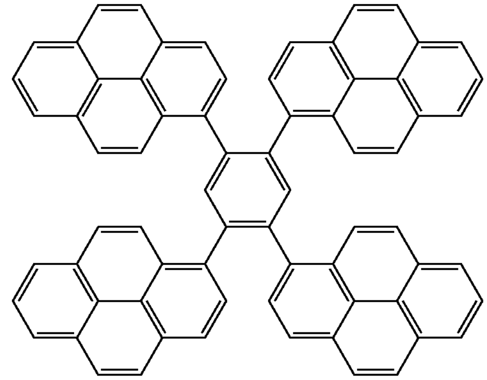

-continued

H-58

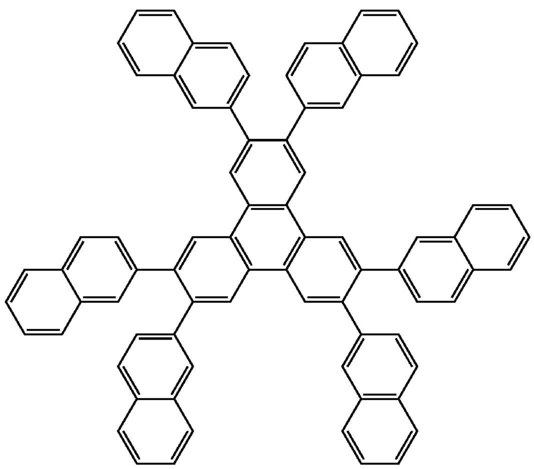

H-59

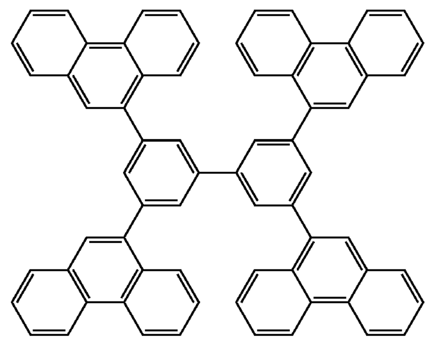

H-60

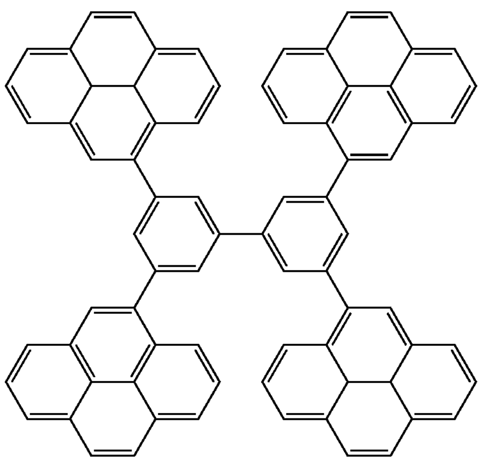

The dopant may include a first compound represented by Formula 1 below. For example, an emission layer of the organic light-emitting device may further include the first compound represented by Formula 1 below, in addition to the second second represented by one of Formulae 2-1 to 2-4. The first compound may be a fluorescent dopant.

In Formula 1, $L_{11}$ to $L_{13}$ may each independently be selected from or include, e.g., a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or <Formula 1>

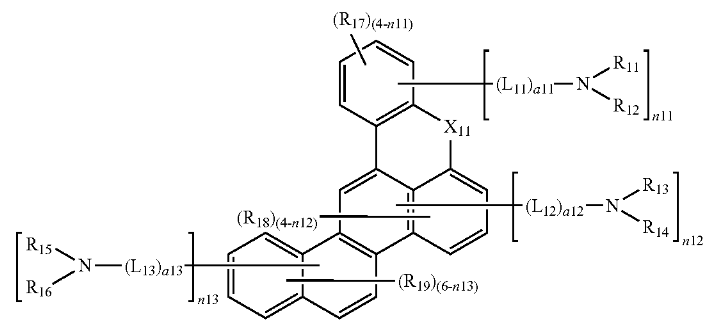

In Formula 1, $X_{11}$ may be, e.g., an oxygen atom (—O—) or a sulfur atom (—S—).

For example, $X_{11}$ in Formula 1 may be an oxygen atom.

unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In an implementation, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ may each independently be selected from a hydrogen, a $C_1$-$C_{60}$ alkyl group, a $C_1$-$C_{60}$ alkoxy group, $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, $L_1$, to $L_{13}$ in Formula 1 may each independently be selected from, e.g., a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubycenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

In an implementation, in Formula 1, $L_{11}$ to $L_{13}$ may each independently be selected from, e.g., a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group, each substituted with at least one selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In an implementation, in Formula 1, $L_{11}$ to $L_{13}$ may each independently be a group represented by one of Formulae 3-1 to 3-31 below.

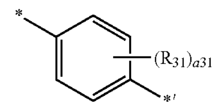

3-1

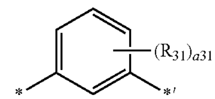

3-2

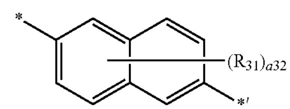

3-3

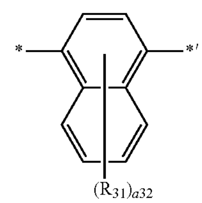

3-4

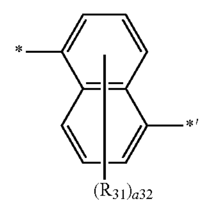

3-5

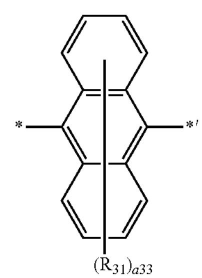

3-6

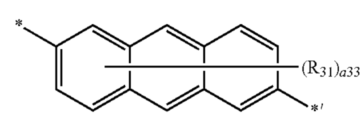

3-7

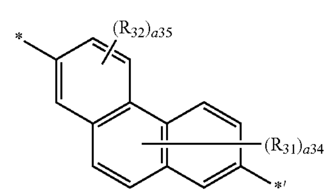

3-8

-continued
3-9
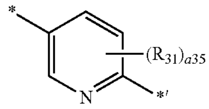
3-10
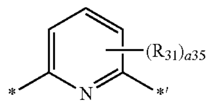
3-11
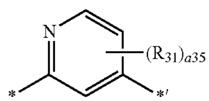
3-12
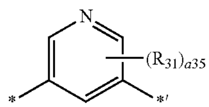
3-13
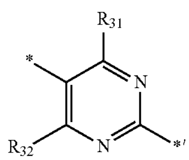
3-14
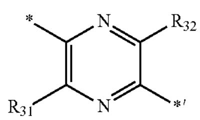
3-15
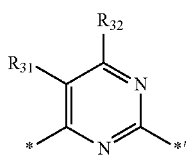
3-16
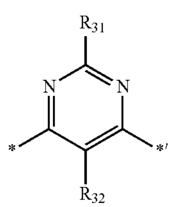
3-17
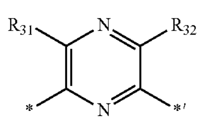
3-18
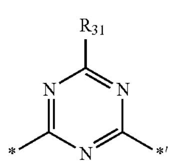
3-19
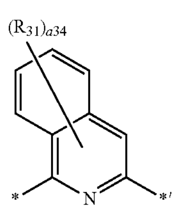
-continued
3-20
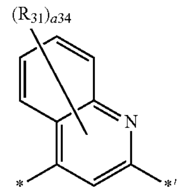
3-21
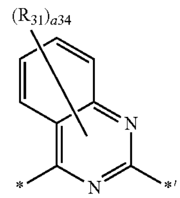
3-22
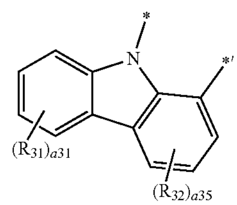
3-23
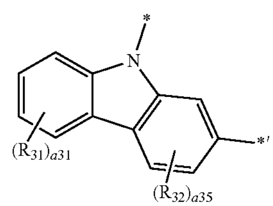
3-24
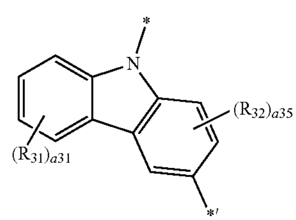
3-25
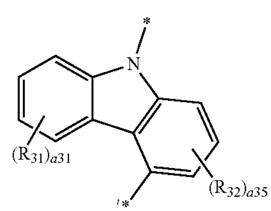
3-26
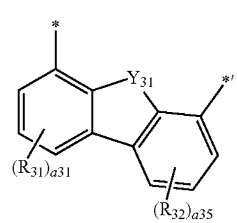
3-27
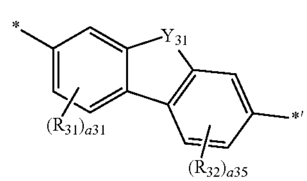

-continued 3-28

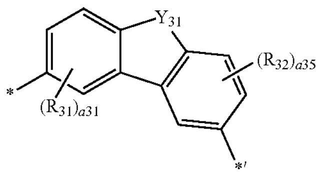

3-29

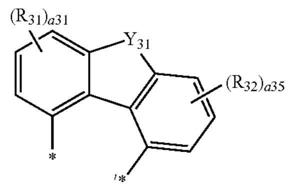

3-30

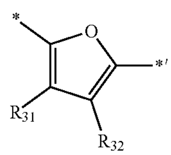

3-31

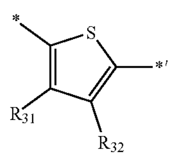

In Formulae 3-1 to 3-31, $Y_{31}$ may be selected from, e.g., $C(R_{33})(R_{34})$, $N(R_{33})$, O, S, and $Si(R_{33})(R_{34})$;

$R_{31}$ to $R_{34}$ may each independently be selected from, e.g., a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 may be selected from 1, 2, 3, and 4;

a32 may be selected from 1, 2, 3, 4, 5, and 6;

a33 may be selected from 1, 2, 3, 4, 5, 6, 7, and 8;

a34 may be selected from 1, 2, 3, 4, and 5;

a35 may be selected from 1, 2, and 3; and

* and *' each independently indicate a binding site to a neighboring atom.

In an implementation, in Formula 1, $L_{11}$ to $L_{13}$ may each independently be selected from, e.g., a group represented by one of Formulae 3-1 to 3-31;

$Y_{31}$ may be selected from, e.g., $C(R_{33})(R_{34})$, $N(R_{33})$, O, and S;

$R_{31}$ to $R_{34}$ may each independently be selected from, e.g., a hydrogen, a deuterium, —F, —Cl, —Br, —I, a methyl group, an ethyl group, a tert-butyl group, a methoxy group, an ethoxy group, a tert-butoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In an implementation, in Formula 1, $L_{11}$ to $L_{13}$ may each independently be a group represented by one of Formulae 4-1 to 4-56 below.

4-1

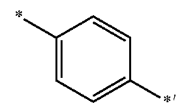

4-2

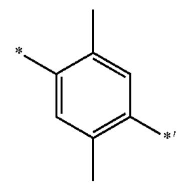

4-3

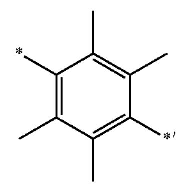

4-4

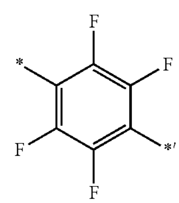

4-5

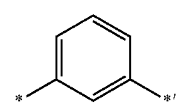

4-6

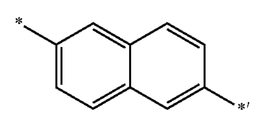

4-7

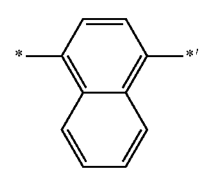

4-8

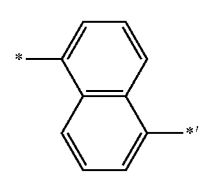

-continued
4-9
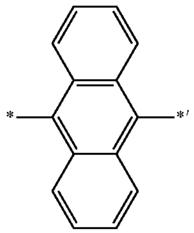
4-10
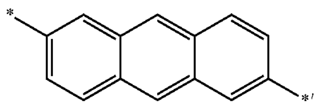
4-11
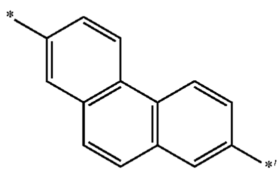
4-12
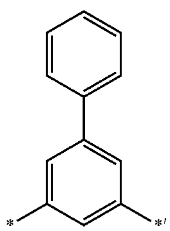
4-13
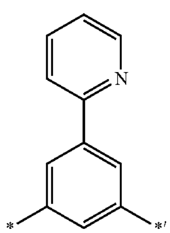
4-14
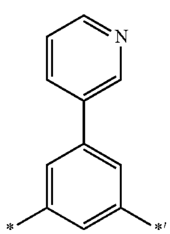
4-15
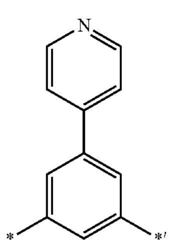
4-16
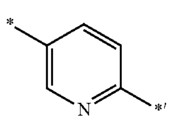
-continued
4-17
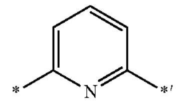
4-18
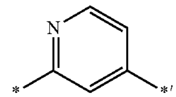
4-19
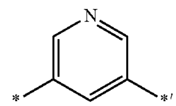
4-20
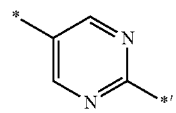
4-21
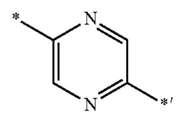
4-22
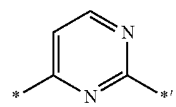
4-23
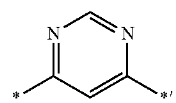
4-24
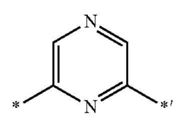
4-25
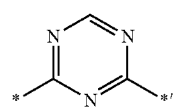
4-26
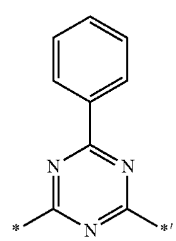
4-27
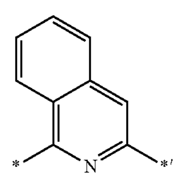
4-28
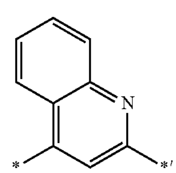

-continued
4-29
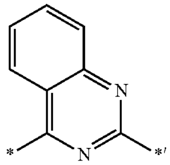
4-30
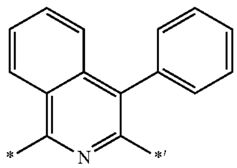
4-31
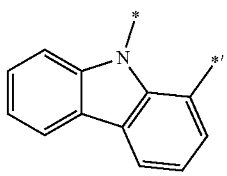
4-32
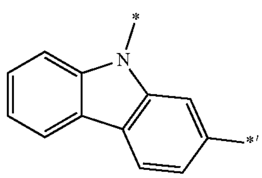
4-33
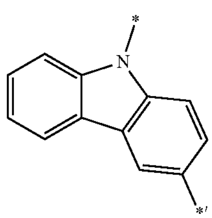
4-34
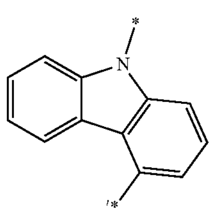
4-35
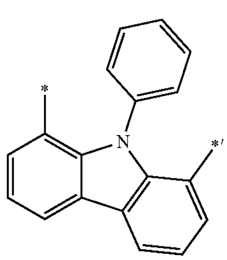
-continued
4-36
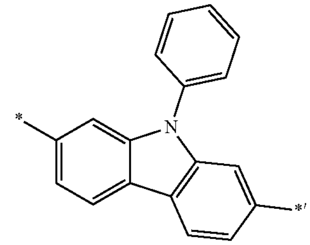
4-37
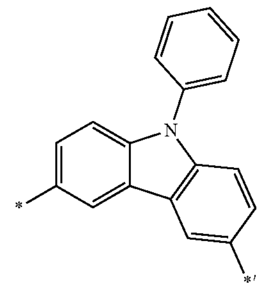
7-38
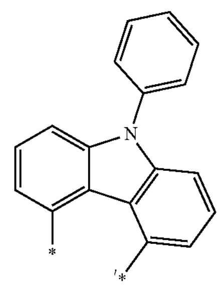
4-39
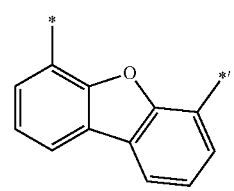
4-40
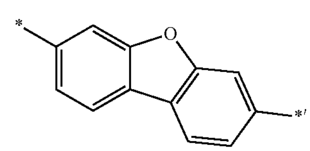
4-41
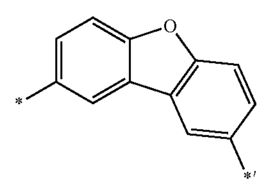
4-42
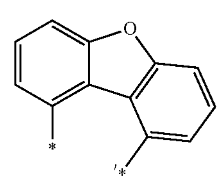

-continued 4-43

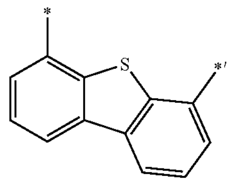

4-44

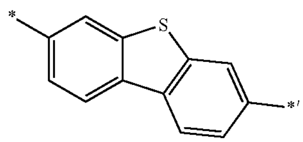

4-45

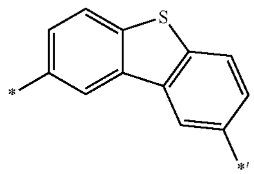

4-46

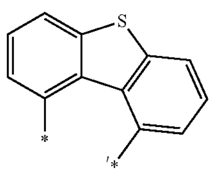

4-47

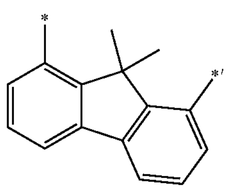

4-48

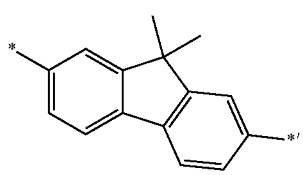

4-49

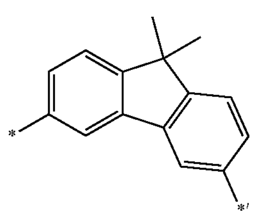

4-50

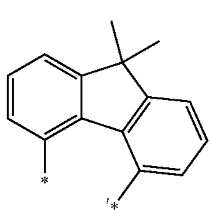

-continued 4-51

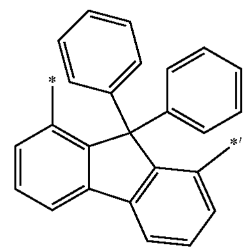

4-52

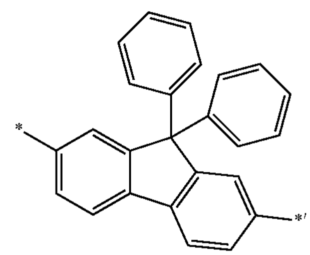

4-53

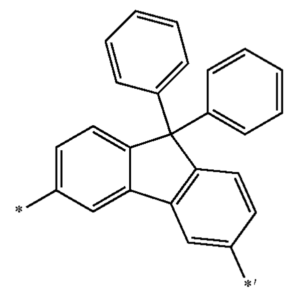

4-54

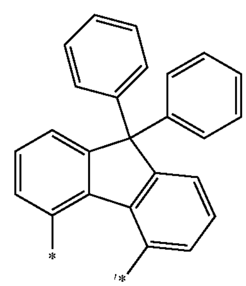

4-55

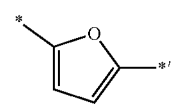

4-56

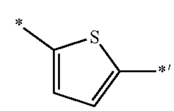

In Formulae 4-1 to 4-56, * and *' each independently indicate a binding site to a neighboring atom.

In an implementation, in Formula 1, $L_{11}$ to $L_{13}$ may each independently be a group represented by one of Formulae 4-1 to 4-8, 4-12 to 4-26, and 4-39 to 4-56 above.

In Formula 1, a11 indicates the number of $L_{11}$s and may be selected from 0, 1, 2, and 3. For example, in Formula 1, a11 may be selected from 0 and 1. When a11 is 0, $L_{11}$ is a single bond. When there are two or more a11s, a plurality of $L_{11}$s may be identical or different. Descriptions of a12 and a13 may be the same as the description of a11 and the structure of Formula 1.

For example, a12 and a13 in Formula 1 may each independently be selected from 0 and 1.

In an implementation, in Formula 1 above, a sum of a11, a12, and a13 may be selected from 0, 1, and 2.

In Formula 1 above, $R_{11}$ to $R_{16}$ may each independently be selected from or include, e.g., a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted heteroaryl group, a substituted or unsubstituted monovalent non-aromatic condensed polycyclic group, or a substituted or unsubstituted monovalent non-aromatic condensed heteropolycyclic group.

In an implementation, at least one substituent of the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{50}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, wherein $Q_{11}$ to $Q_{17}$, $Q_{21}$ to $Q_{27}$, and $Q_{31}$ to $Q_{37}$ may each independently be selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, in Formula 1, $R_{11}$ to $R_{16}$ may each independently be selected from, e.g., a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —$Si(Q_{33})(Q_{34})(Q_{35})$;

wherein $Q_{33}$ to $Q_{35}$ may each independently be selected from a $C_1$-$C_{60}$ alkyl group and a $C_6$-$C_{60}$ aryl group.

In an implementation, in Formula 1, $R_{11}$ to $R_{16}$ may each independently be selected from, e.g., a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group;

a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$; and a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with a $C_1$-$C_{20}$ alkyl group, which is substituted with at least one selected from a deuterium, —F, —Cl, —Br, —I, a cyano group, and a nitro group;

wherein $Q_{33}$ to $Q_{35}$ may each independently be selected from a $C_1$-$C_{20}$ alkyl group and a $C_6$-$C_{60}$ aryl group.

In an implementation, in Formula 1, $R_{11}$ to $R_{16}$ may each independently be selected from, e.g., a phenyl group, a naphthyl group, a fluorenyl group, a phenanthrenyl group, a pyridinyl group, a pyrazinyl group, a pyrimidinyl group, a quinolinyl group, an isoquinolinyl group, a naphthyridinyl group, a quinoxalinyl group, a quinazolinyl group, a cinnolinyl group, a triazinyl group, a dibenzofuranyl group, and a dibenzothiophenyl group; and a phenyl group, a naphthyl group, a fluorenyl group, a phenanthrenyl group, a pyridinyl group, a pyrazinyl group, a pyrimidinyl group, a quinolinyl group, an isoquinolinyl group, a naphthyridinyl group, a quinoxalinyl group, a quinazolinyl group, a cinnolinyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, —$CD_3$, —$CF_3$, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$;

wherein $Q_{33}$ to $Q_{35}$ may each independently be selected from a methyl group, an ethyl group, a tert-butyl group, a phenyl group, and a naphthyl group.

In an implementation, in Formula 1, $R_{11}$ to $R_{16}$ may each independently be a group represented b one of Formulae 5-1 to 5-33 below.

5-1
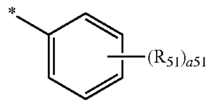
5-2
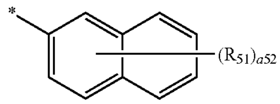
5-3
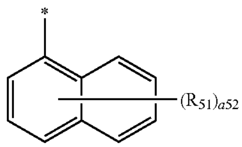
5-4
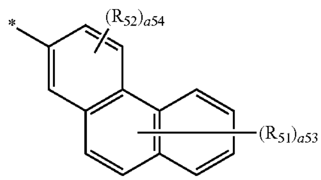
5-5
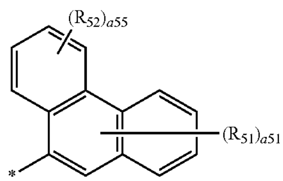
5-6
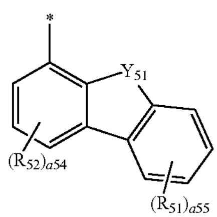
5-7
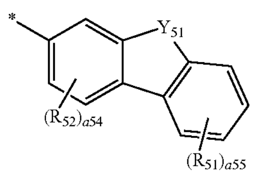
5-8
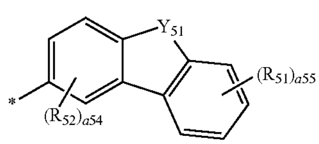
5-9
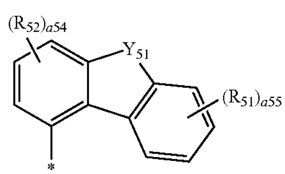
5-10
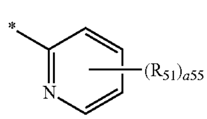
-continued
5-11
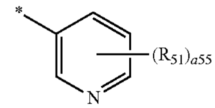
5-12
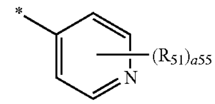
5-13
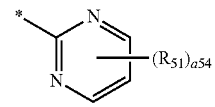
5-14
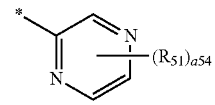
5-15
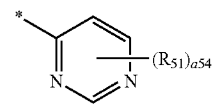
5-16
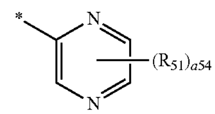
5-17
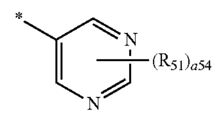
5-18
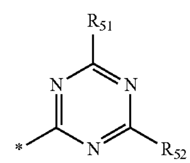
5-19
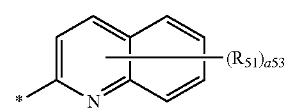
5-20
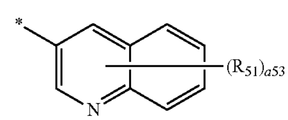
5-21
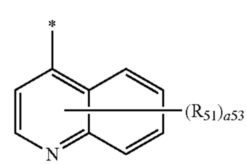
5-22
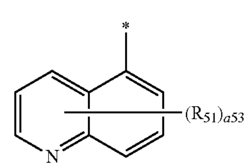

-continued 5-23

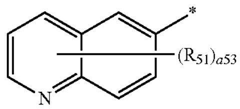

5-24

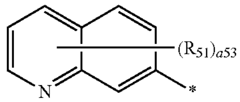

5-25

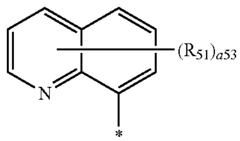

5-26

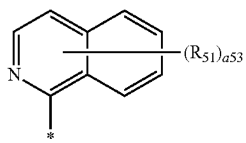

5-27

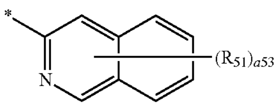

5-28

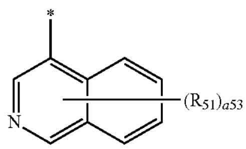

5-29

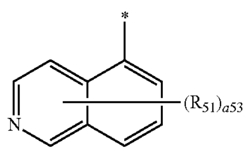

5-30

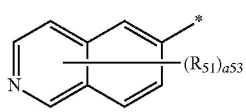

5-31

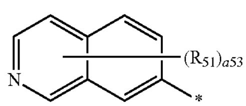

5-32

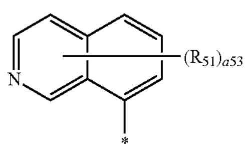

5-33

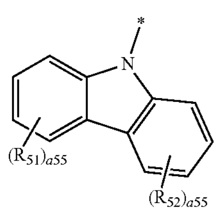

In Formulae 5-1 to 5-33, $Y_{51}$ may be selected from, e.g., $C(R_{53})(R_{54})$, $N(R_{53})$, O, and S;

$R_{51}$ to $R_{54}$ may each independently be selected from, e.g., a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, —$CD_3$, —$CF_3$, a $C_1$-$C_{20}$ alkoxy group, a phenyl group, a naphthyl group, a fluorenyl group, a spiro-fluorenyl group, a benzofluorenyl group, a dibenzo-fluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, wherein $Q_{33}$ to $Q_{35}$ may each independently be selected from a methyl group, an ethyl group, a tert-butyl group, a phenyl group, and a naphthyl group;

a51 may be selected from 1, 2, 3, 4, and 5;

a52 may be selected from 1, 2, 3, 4, 5, 6, and 7;

a53 may be selected from 1, 2, 3, 4, 5, and 6;

a54 may be selected from 1, 2, and 3;

a55 may be selected from 1, 2, 3, and 4; and

* indicates a binding site to a neighboring atom.

In an implementation, $R_{11}$ to $R_{16}$ in Formula 1 may each independently be selected from a group represented by one of Formulae 6-1 to 6-155 below.

6-1

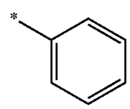

6-2

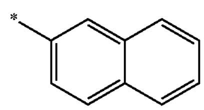

6-3

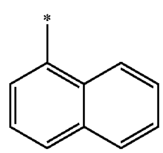

6-4

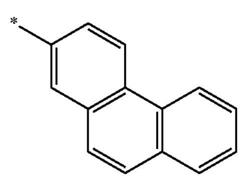

6-5

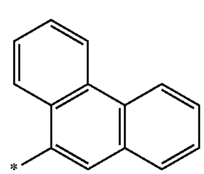

6-6

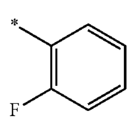

-continued
6-7
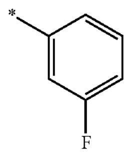
6-8
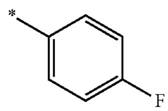
6-9
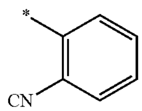
6-10
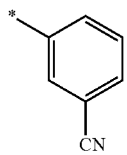
6-11
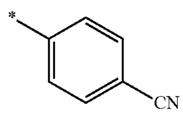
6-12
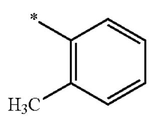
6-13
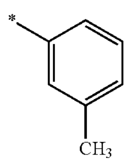
6-14
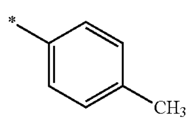
6-15
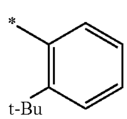
6-16
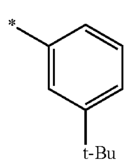
6-17
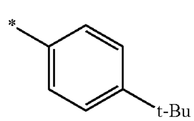
-continued
6-18
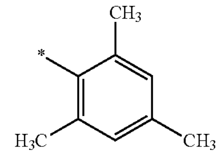
6-19
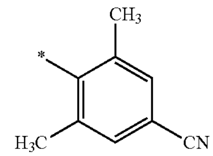
6-20
6-21
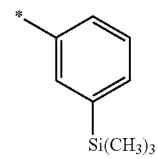
6-22
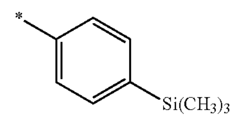
6-23
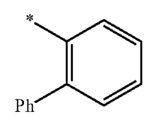
6-24
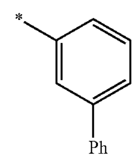
6-25
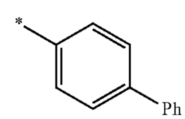
6-26
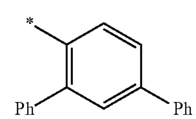
6-27
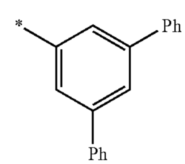
6-28
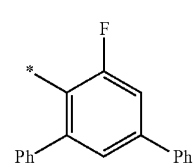

-continued
6-29
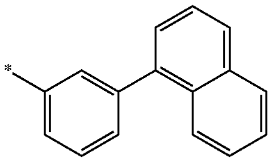
6-30
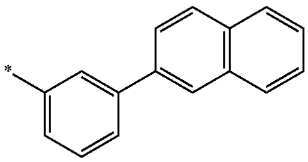
6-31
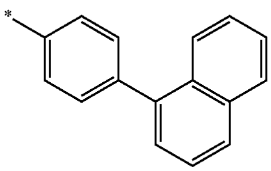
6-32
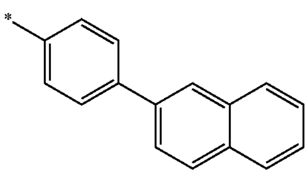
6-33
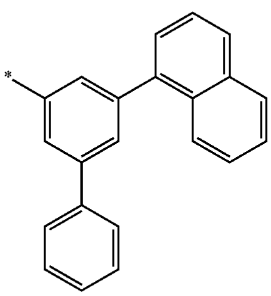
6-34
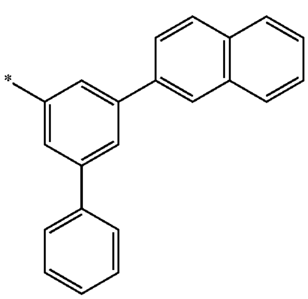
6-35
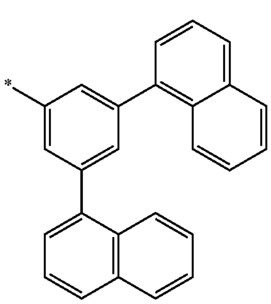
-continued
6-36
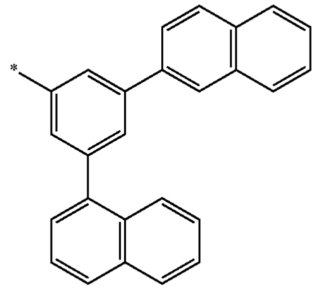
6-37
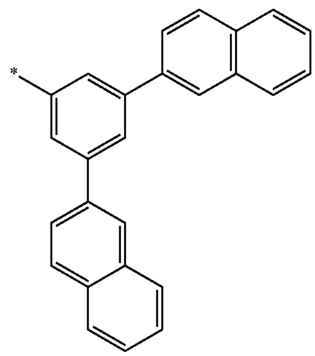
6-38
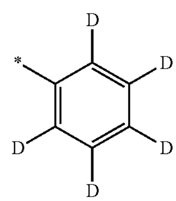
6-39
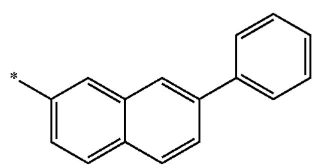
6-40
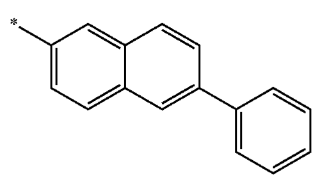
6-41
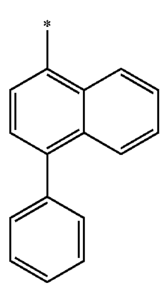

-continued
6-42
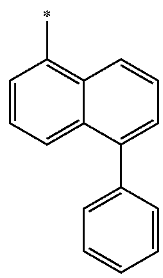
6-43
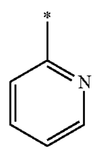
6-44
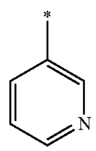
6-45
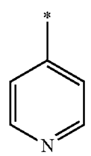
6-46
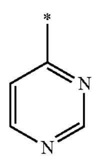
6-47
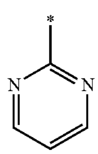
6-48
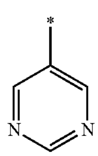
6-49
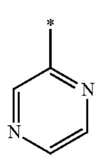
6-50
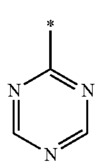
-continued
6-51
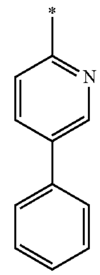
6-52
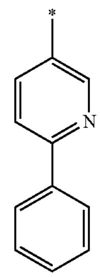
6-53
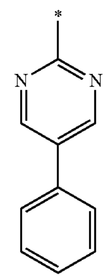
6-54
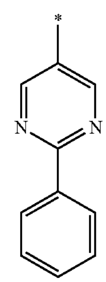
6-55
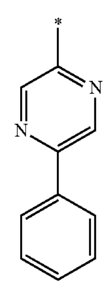
6-56
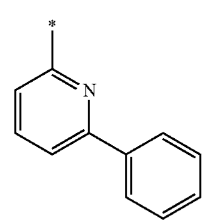

-continued
6-57
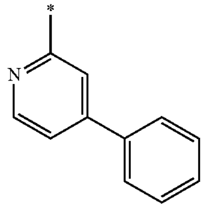
6-58
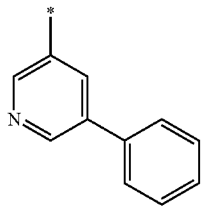
6-59
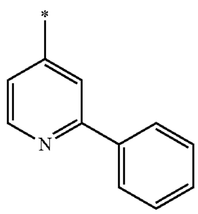
6-60
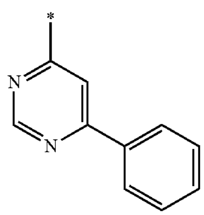
6-61
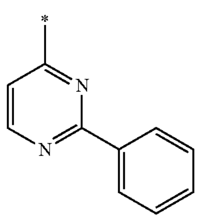
6-62
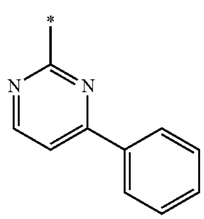
6-63
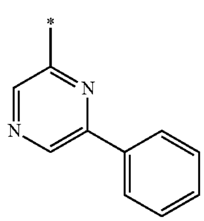
-continued
6-64
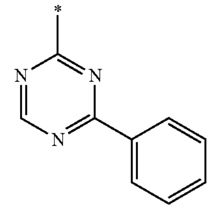
6-65
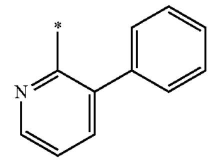
6-66
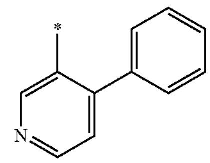
6-67
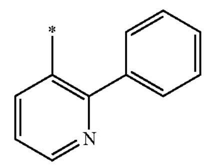
6-68
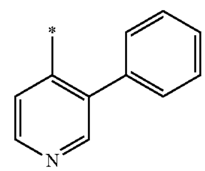
6-69
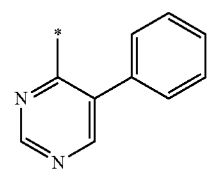
6-70
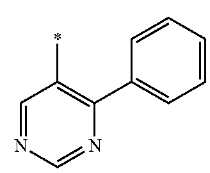
6-71
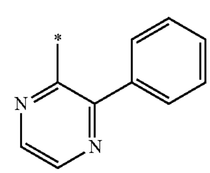

-continued
6-72
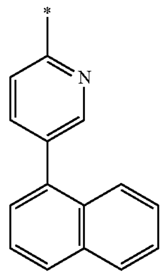
6-73
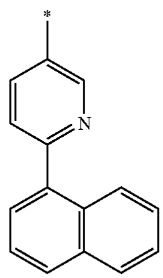
6-74
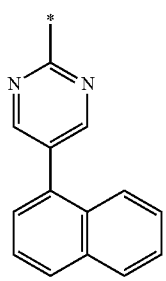
6-75
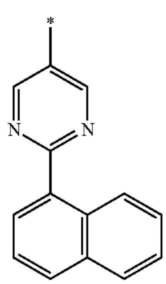
6-76
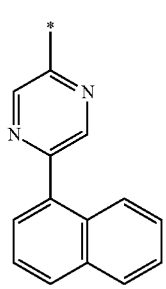
6-77
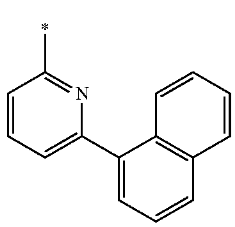
-continued
6-78
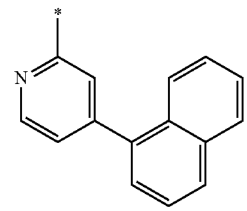
6-79
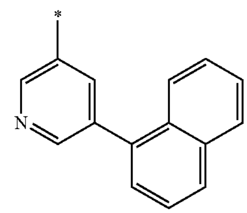
6-80
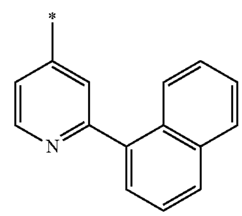
6-81
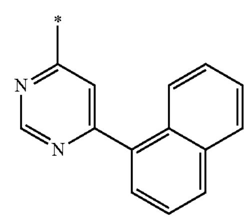
6-82
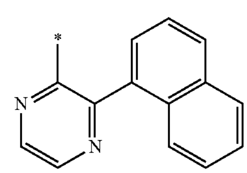
6-83
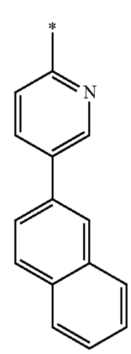

-continued
6-84
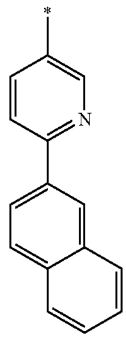
6-85
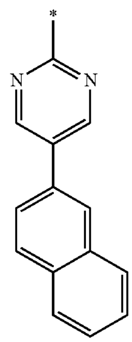
6-86
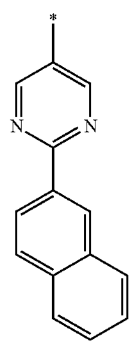
6-87
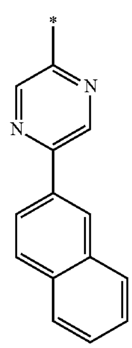
6-88
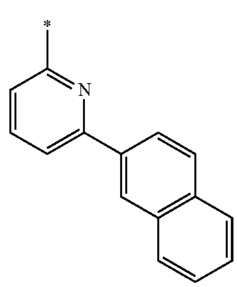
-continued
6-89
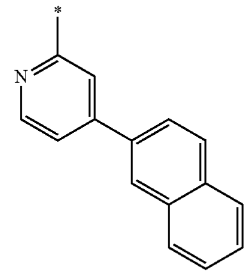
6-90
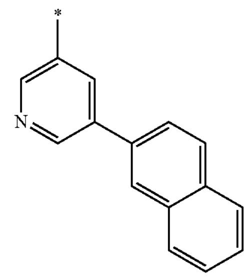
6-91
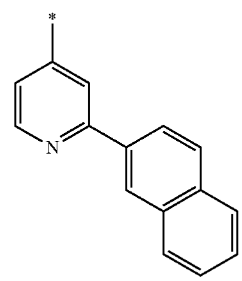
6-92
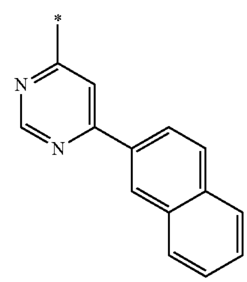
6-93
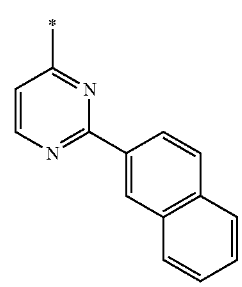

-continued
6-94
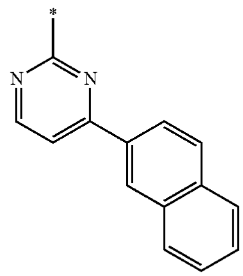
6-95
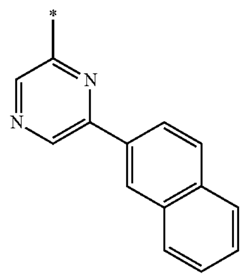
6-96
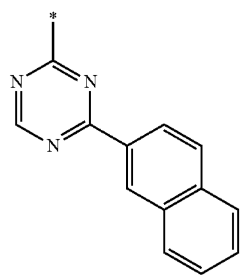
6-97
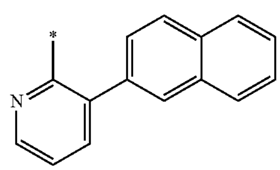
6-98
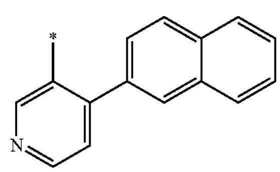
6-99
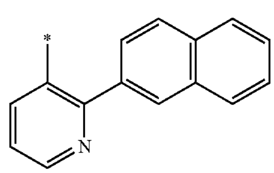
6-100
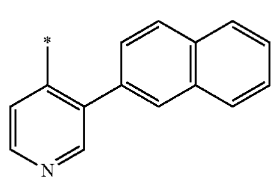
-continued
6-101
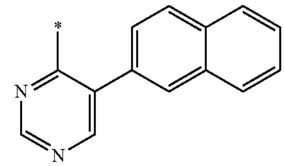
6-102
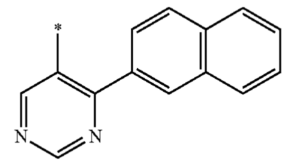
6-103
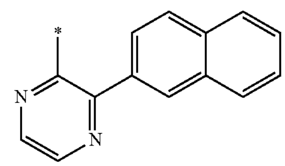
6-104
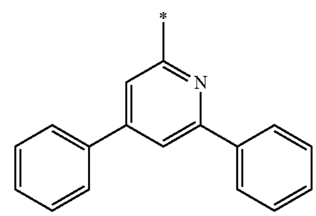
6-105
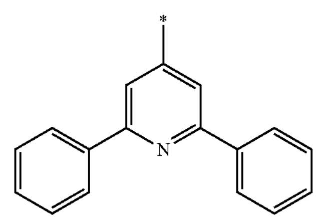
6-106
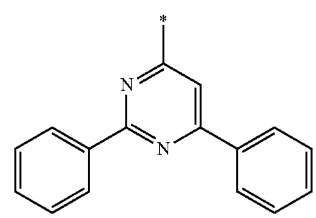
6-107
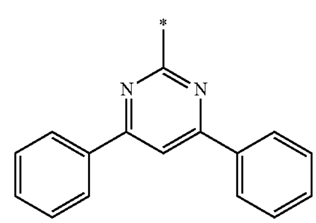
6-108
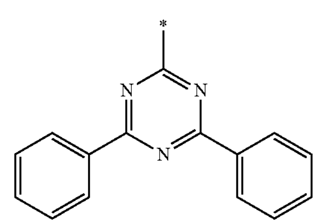

-continued
6-109
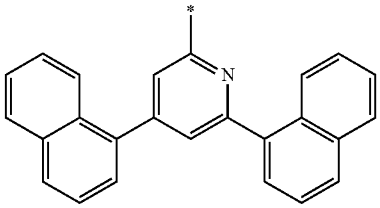
6-110
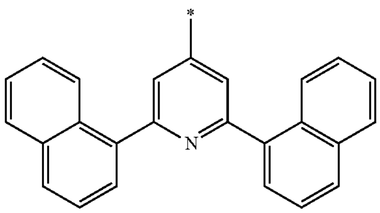
6-111
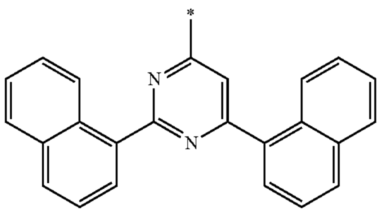
6-112
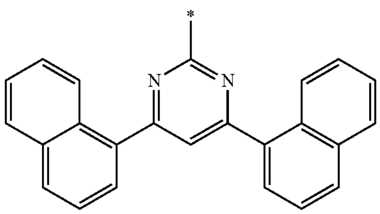
6-113
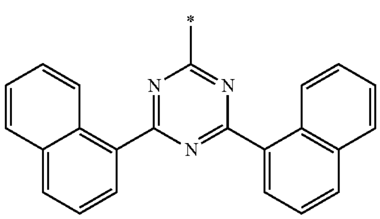
6-114
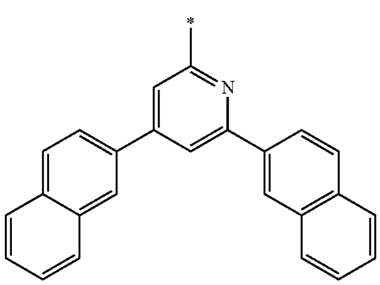
6-115
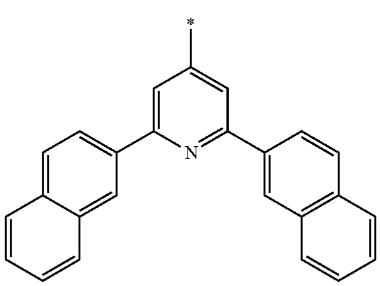
-continued
6-116
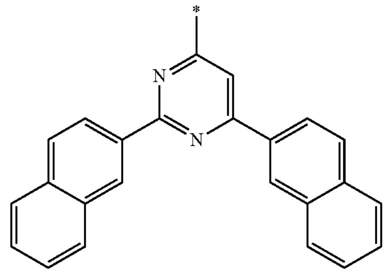
6-117
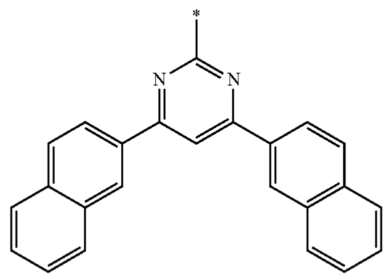
6-118
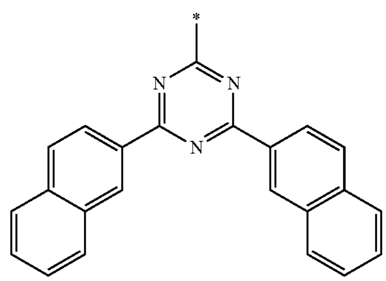
6-119
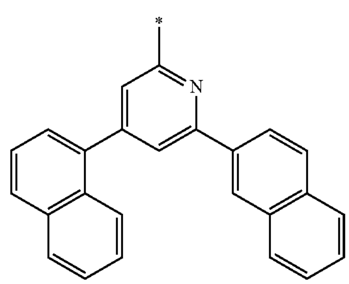
6-120
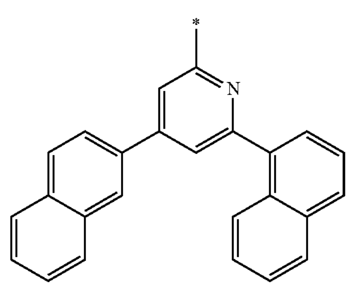

6-121
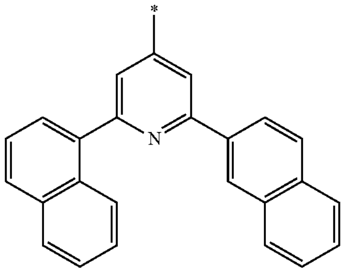
6-122
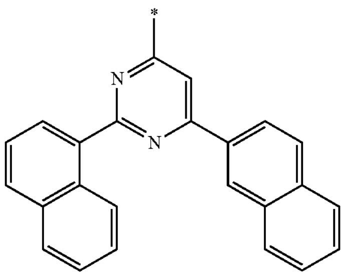
6-123
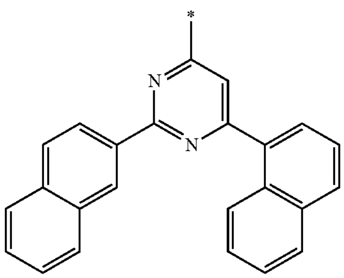
6-124
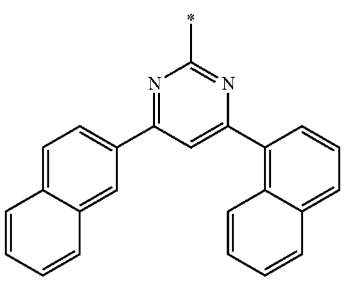
6-125
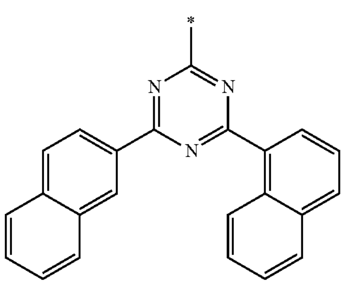
6-126
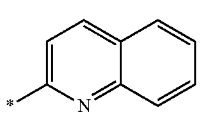
6-127
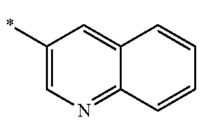
6-128
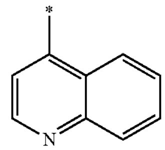
6-129
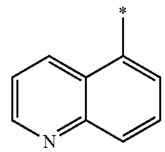
6-130
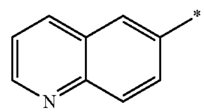
6-131
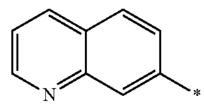
6-132
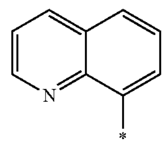
6-133
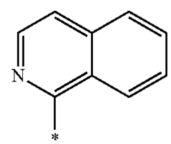
6-134
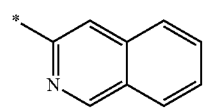
6-135
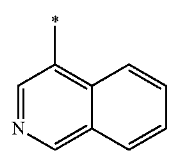
6-136
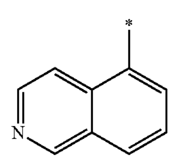
6-137
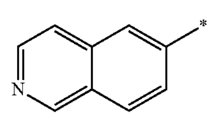
6-138
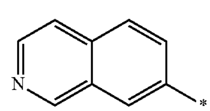

-continued
6-139
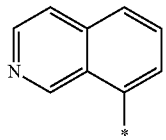
6-140
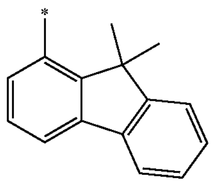
6-141
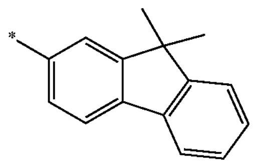
6-142
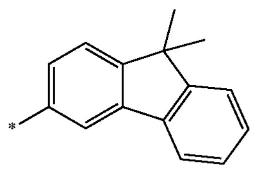
6-143
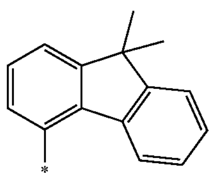
6-144
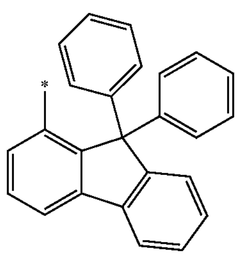
6-145
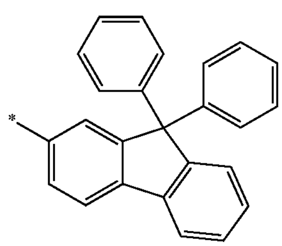
6-146
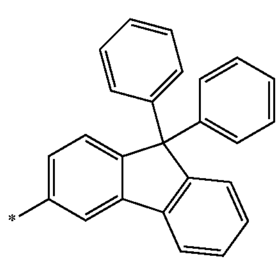
-continued
6-147
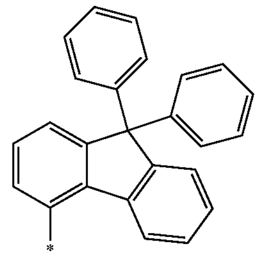
6-148
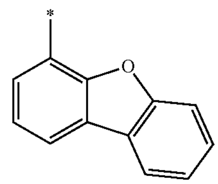
6-149
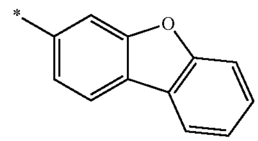
6-150
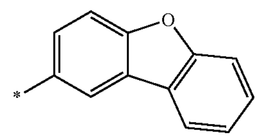
6-151
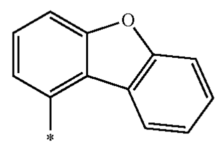
6-152
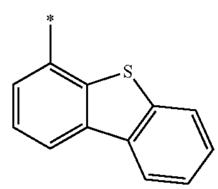
6-153
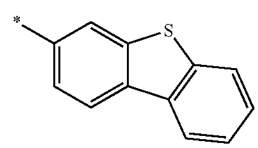
6-154
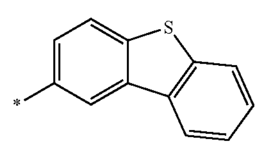
6-155
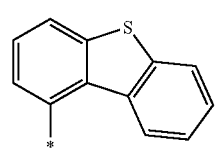
In Formulae 6-1 to 6-155,
t-Bu represents a tert-butyl group;
Ph represents a phenyl group; and
* indicates a binding site to a neighboring atom.

In an implementation, in Formula 1, $R_{11}$ to $R_{16}$ may each independently be a group represented by one of Formulae 6-1 to 6-42 and 6-140 to 6-155 above.

In Formula 1, n11 may represent the number of moieties represented by

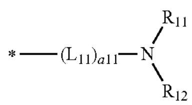

and may be selected from 0, 1, and 2. When n11 is 2 or greater, the two or more moieties represented by

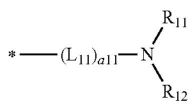

may be identical or different. n12 and n13 may be understood by referring to the description in connection with n11 and the structure of Formula 1.

For example, in Formula 1, n11 to n13 may each independently be selected from 0 and 1.

In Formula 1, a sum of n11, n12, and n13 may be selected from 2, 3, 4, 5, and 6.

For example, in Formula 1 above, the sum of n11, n12, and n13 may be selected from 2, 3, and 4.

In an implementation, in Formula 1 above, the sum of n11, n12, and n13 may be selected from 1 and 2.

In an implementation, in Formula 1 above, the sum of n11, n12, and n13 may be 2.

In an implementation, in Formula 1 above, n11 may be 1, n12 may be 0, and n13 may be 1.

In Formula 1, $R_{17}$ to $R_{19}$ may each independently be selected from or include, e.g., a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$).

In an implementation, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_3$, $Q_{11}$ to $Q_{17}$, $Q_{21}$ to $Q_{27}$, and $Q_{31}$ to $Q_{37}$ may each independently be selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, in Formula 1, $R_{17}$ to $R_{19}$ may each independently be selected from, e.g., a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —Si($Q_1$)($Q_2$)($Q_3$), wherein $Q_1$ to $Q_3$ may each independently be selected from a $C_1$-$C_{60}$ alkyl group and a $C_6$-$C_{60}$ aryl group.

In an implementation, in Formula 1, $R_{17}$ to $R_{19}$ may each independently be selected from, e.g., a hydrogen, a deuterium, —F, —Cl, —Br, —I, a cyano group, a nitro group, a $C_1$-$C_{60}$ alkyl group, a $C_1$-$C_{60}$ alkoxy group, a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, —Si($CH_3$)$_3$, and —Si(Ph)$_3$.

In an implementation, in Formula 1, $R_{17}$ to $R_{19}$ may be, e.g., a hydrogen.

In an implementation, the first compound represented by Formula 1 may be represented by Formula 1-1 below.

<Formula 1-1>

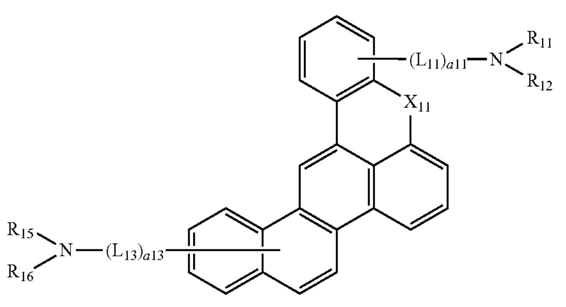

In Formula 1-1, $X_{11}$, $L_{11}$, $L_{13}$, a11, a13, $R_{11}$, $R_{12}$, $R_{15}$, and $R_{16}$ may be defined the same as those described above with respect to Formula 1.

For example, in Formula 1-1, $L_{11}$ and $L_{13}$ may each independently be a group represented by one of Formulae 4-1 to 4-56.

For example, in Formula 1-1, $R_{11}$, $R_{12}$, $R_{15}$, and $R_{16}$ each independently be a group represented by one of Formulae 6-1 to 6-155.

In an implementation, the first compound represented by Formula 1 may be represented by Formula 1-11 below.

<Formula 1-11>

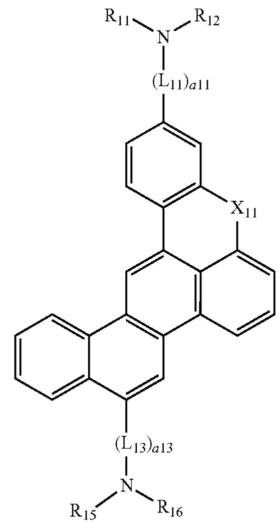

In Formula 1-11, $X_{11}$, $L_{11}$, $L_{13}$, a11, a13, $R_{11}$, $R_{12}$, $R_{15}$, and $R_{16}$ may be defined the same as those described above with respect to Formula 1.

For example, in Formula 1-11, $L_{11}$ and $L_{13}$ each independently be a group represented by one of Formulae 4-1 to 4-56.

For example, in Formula 1-11 above, $R_{11}$, $R_{12}$, $R_{15}$, and $R_{16}$ each independently be a group represented by one of Formulae 6-1 to 6-155.

In an implementation, the first compound represented by Formula 1 may be one of the following Compounds 1 to 162.

1

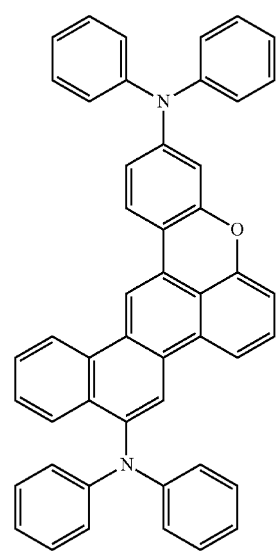

-continued
2
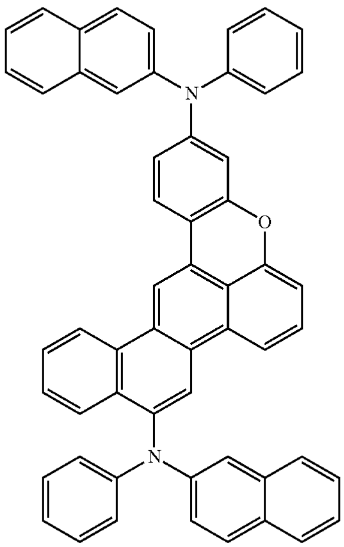
3
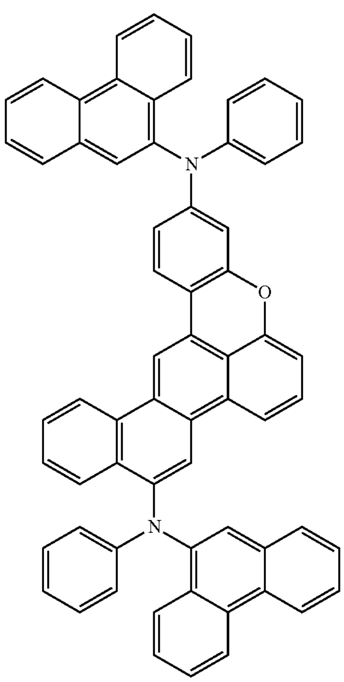
-continued
4
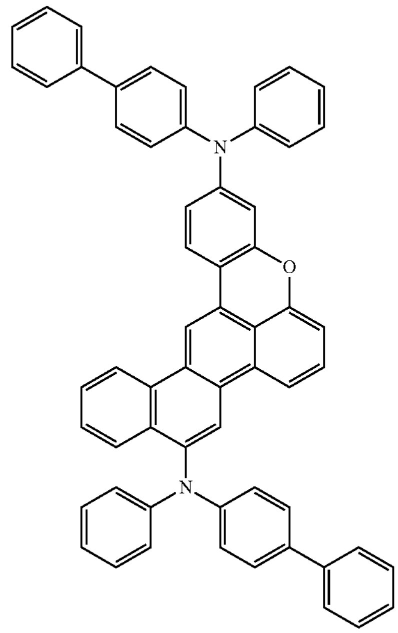
5
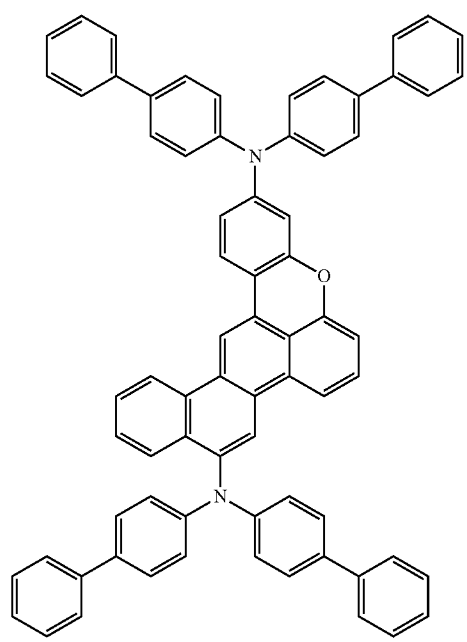

-continued
6
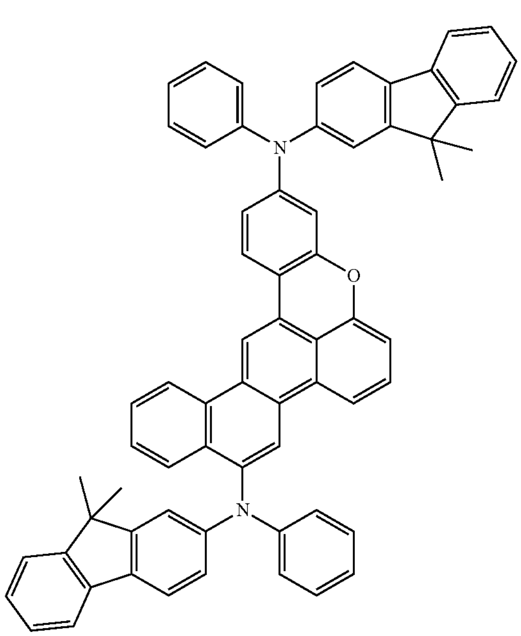
7
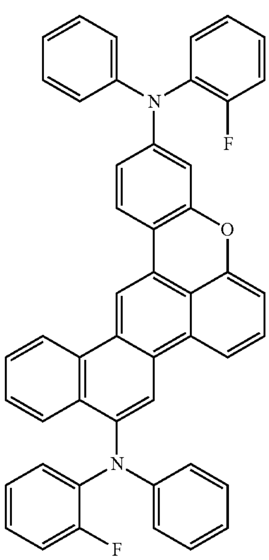
-continued
8
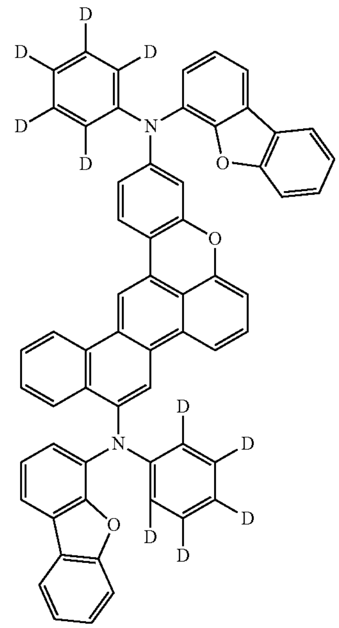
9
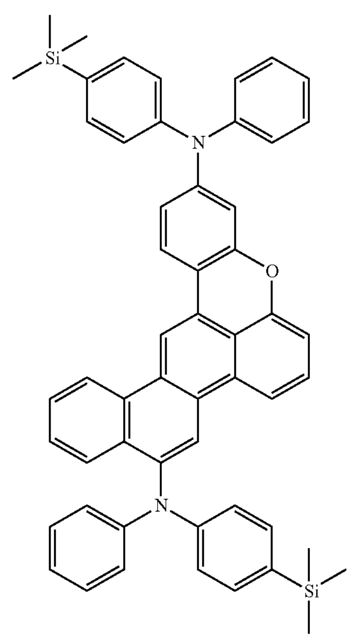

-continued
10
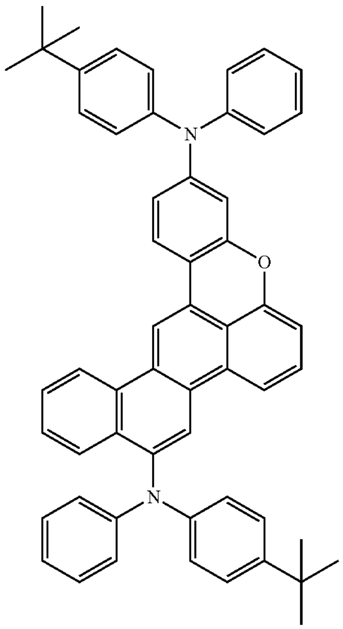
11
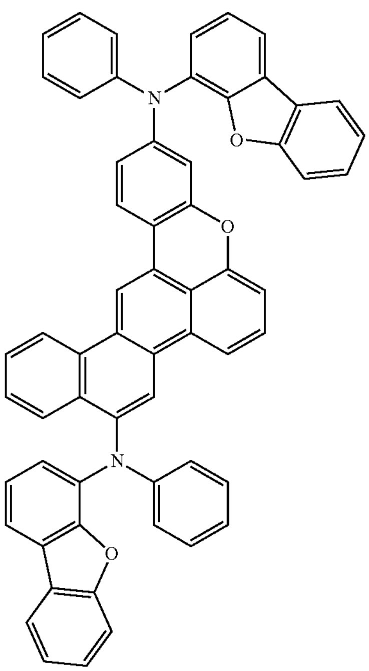
-continued
12
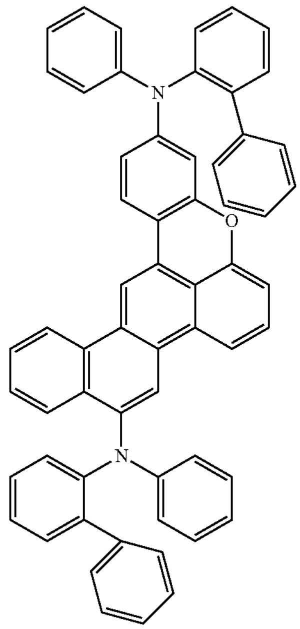
13
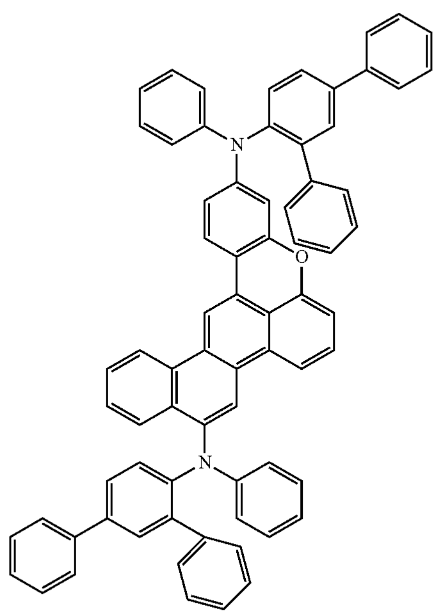

-continued
14
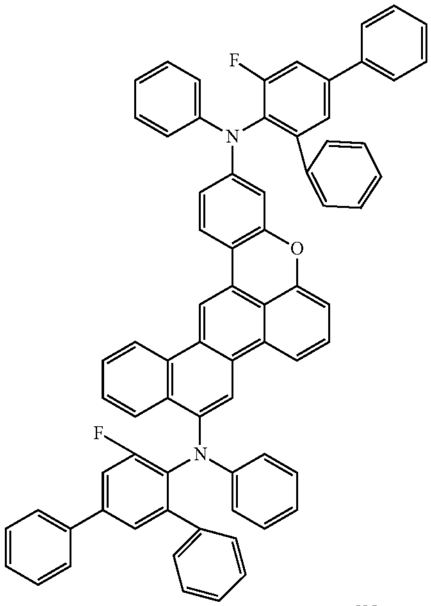
15
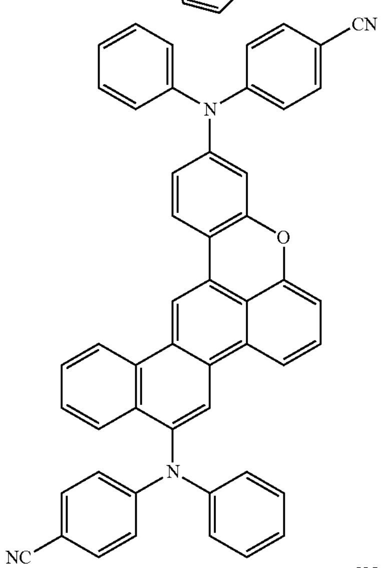
16
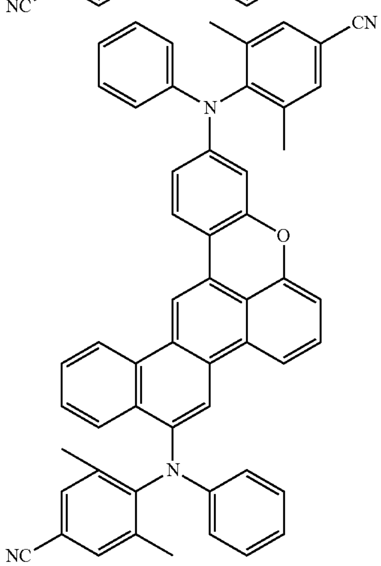
-continued
17
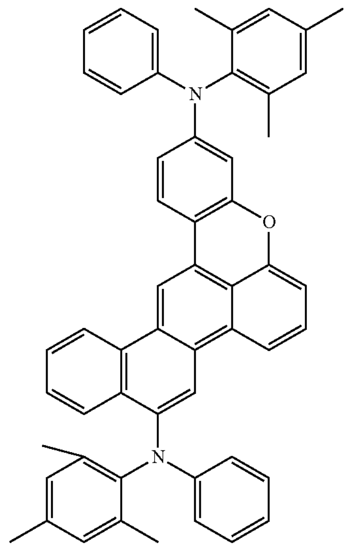
18
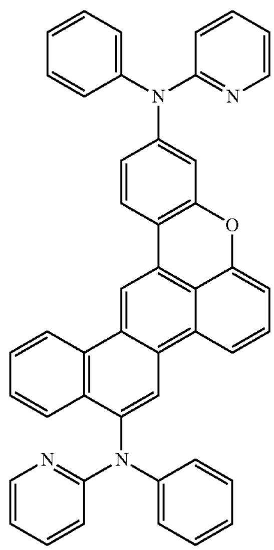
19
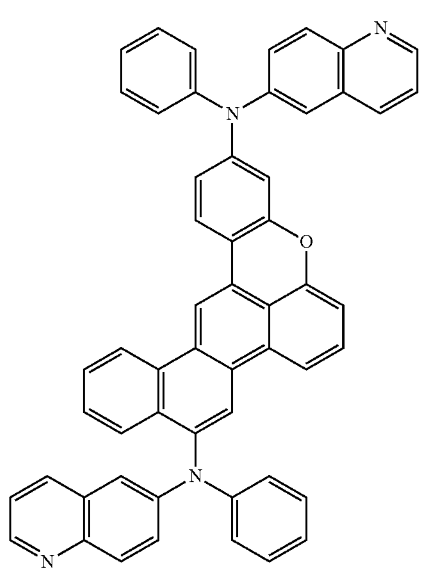

140
-continued
20
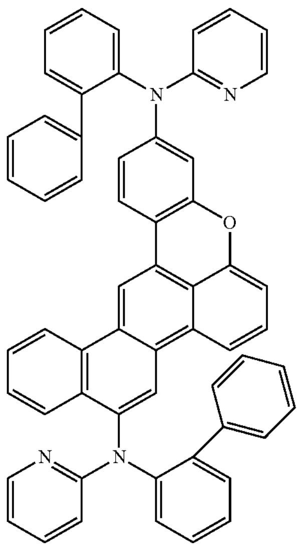
21
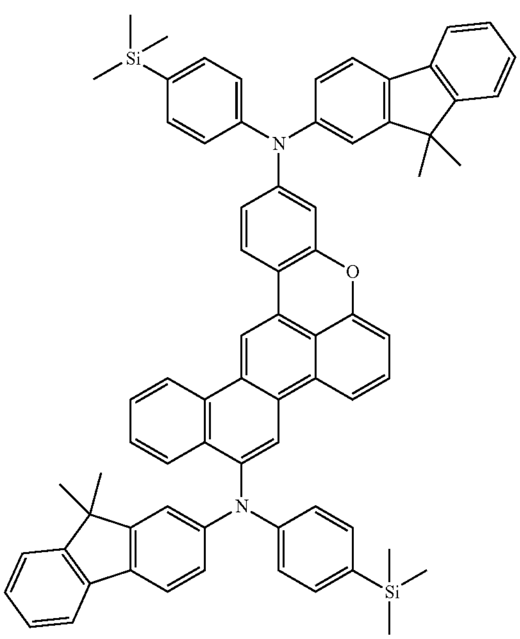
22
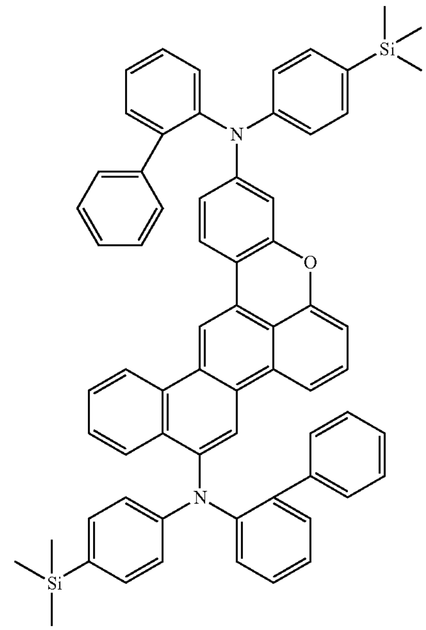
23
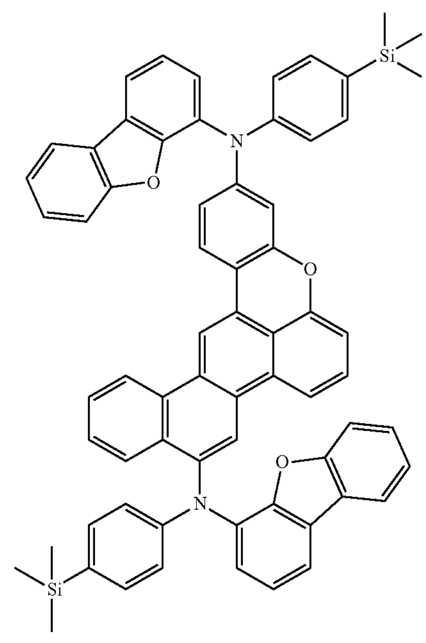

-continued
24
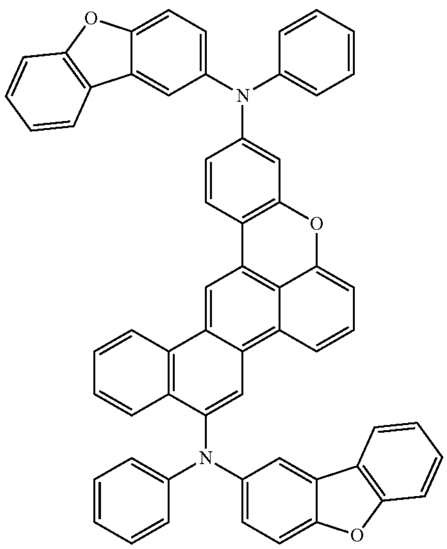
25
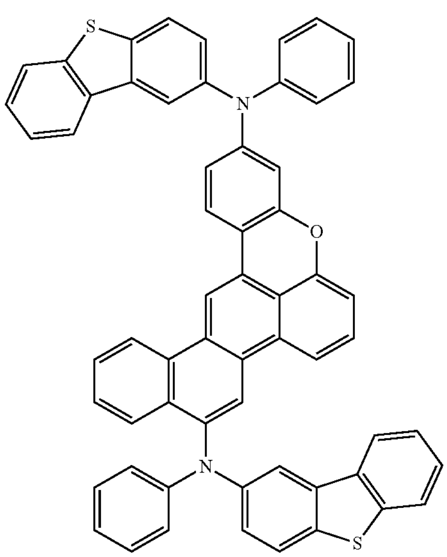
-continued
26
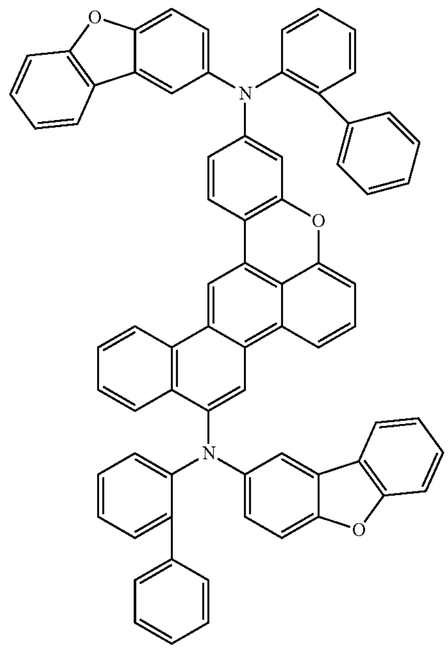
27
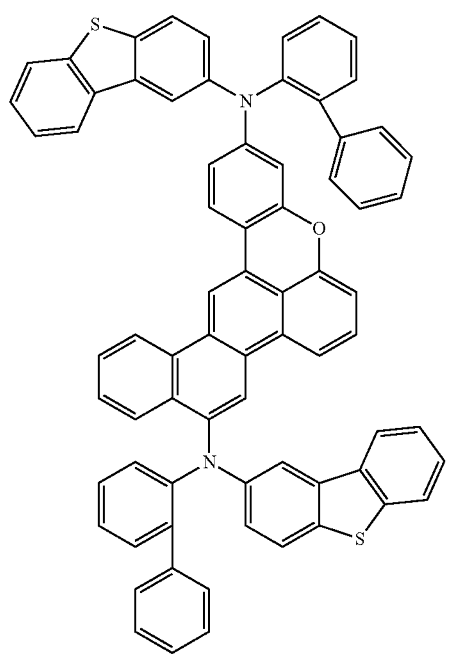

-continued
28
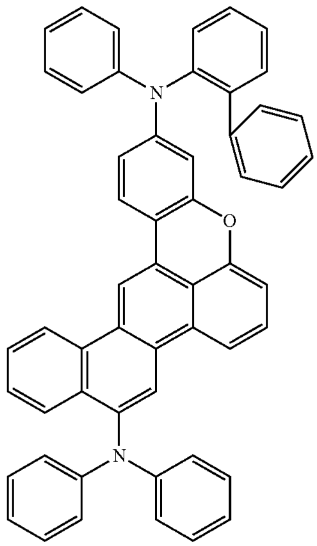
29
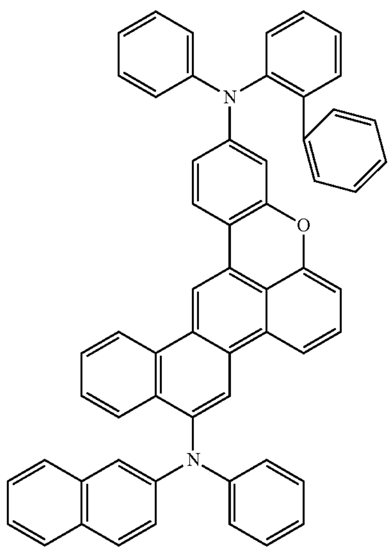
30
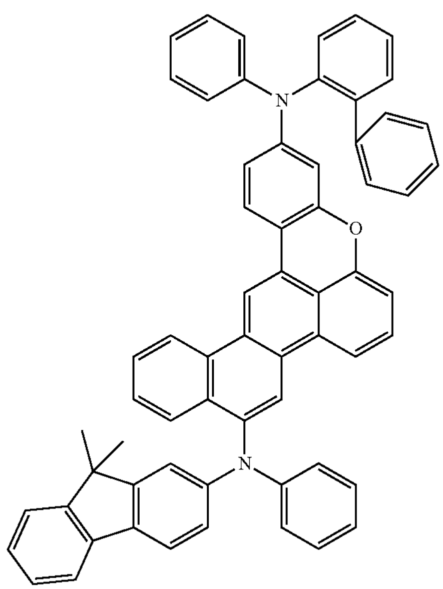
-continued
31
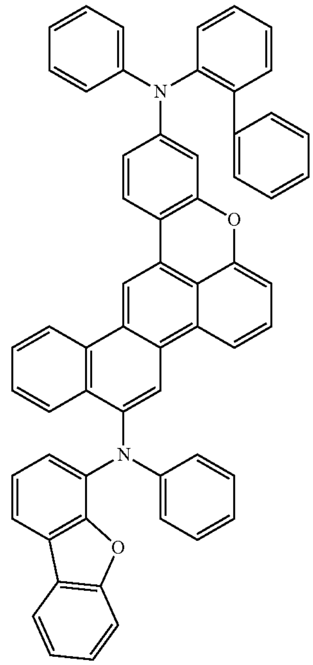
32
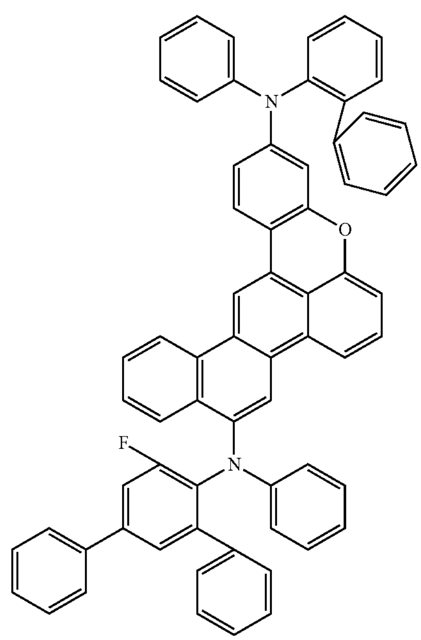

-continued
33
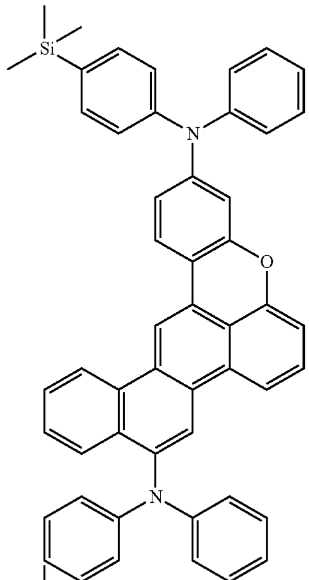
34
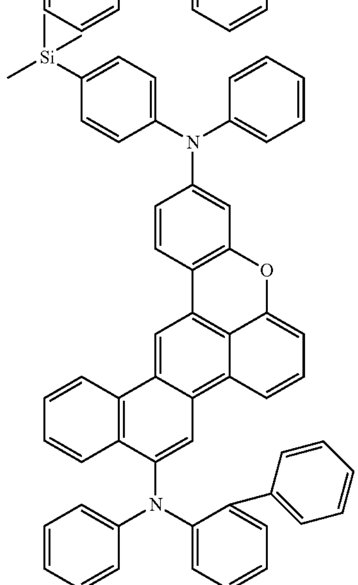
35
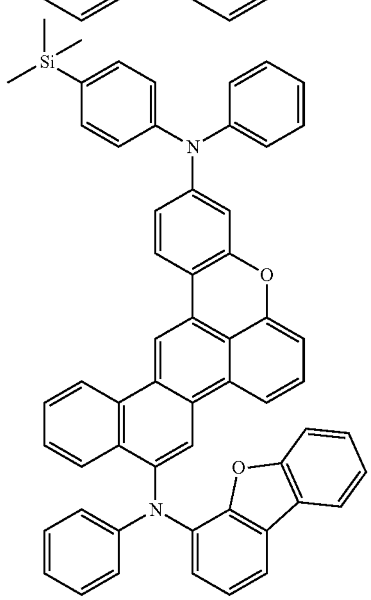
-continued
36
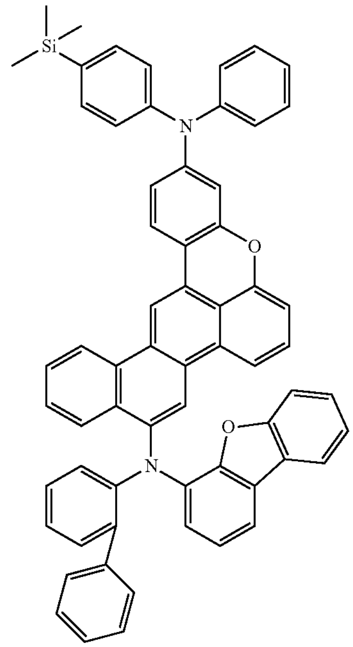
37
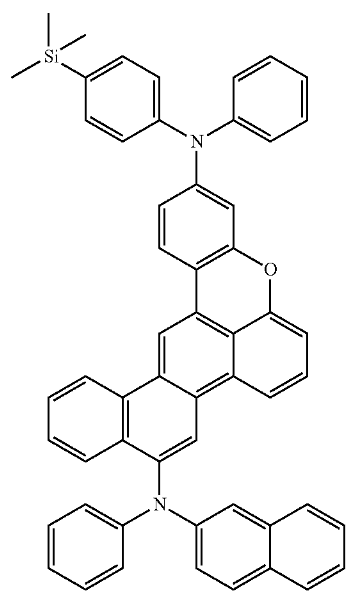

38
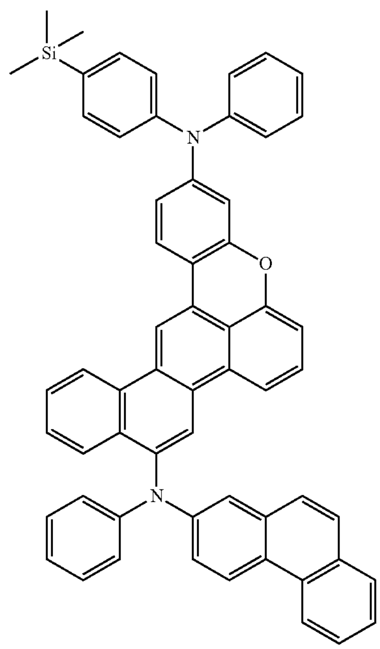
40
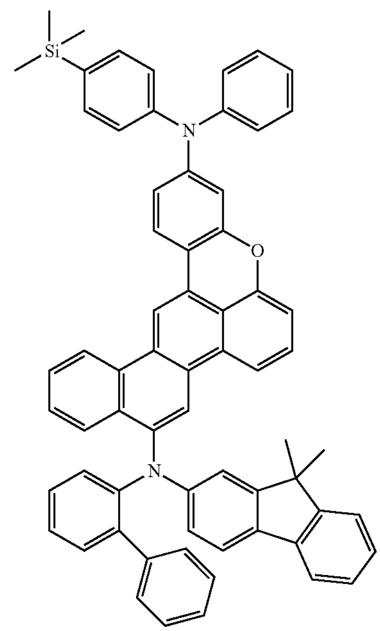
39
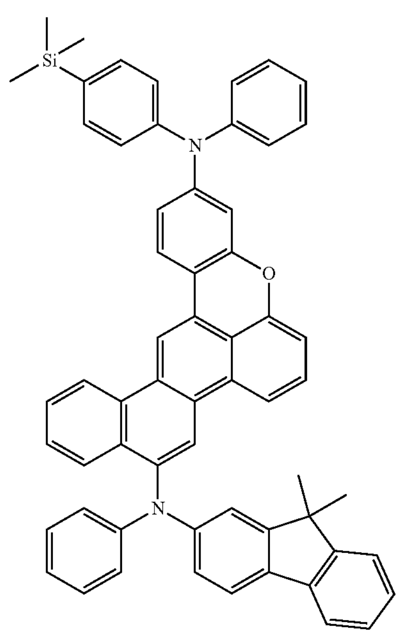
41
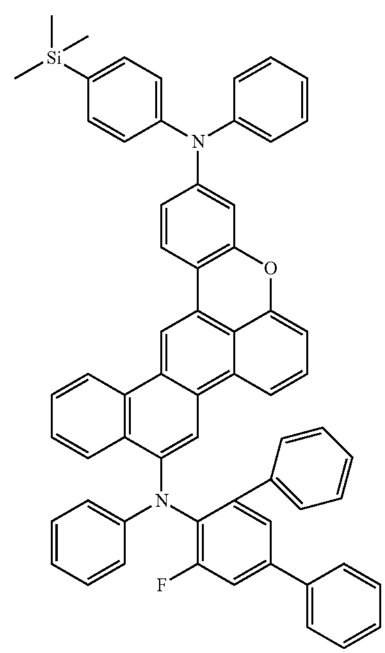

-continued
42
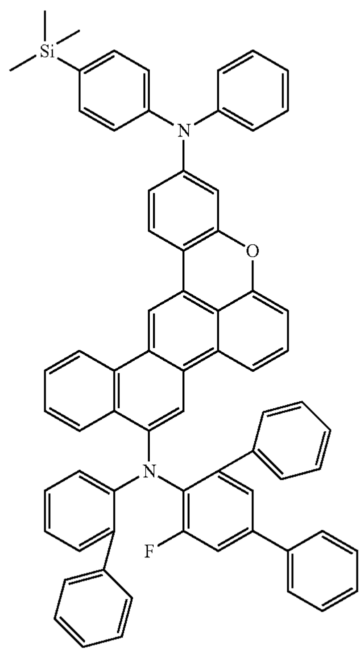
43
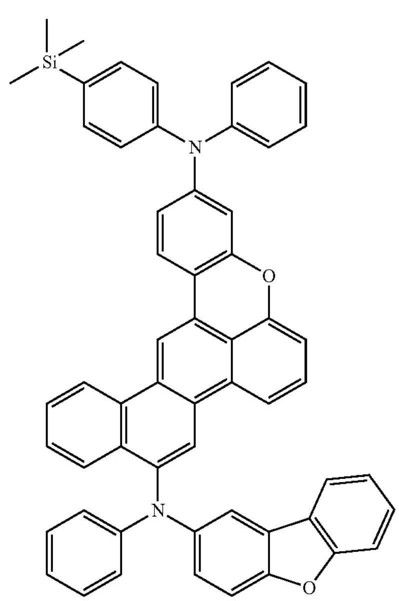
-continued
44
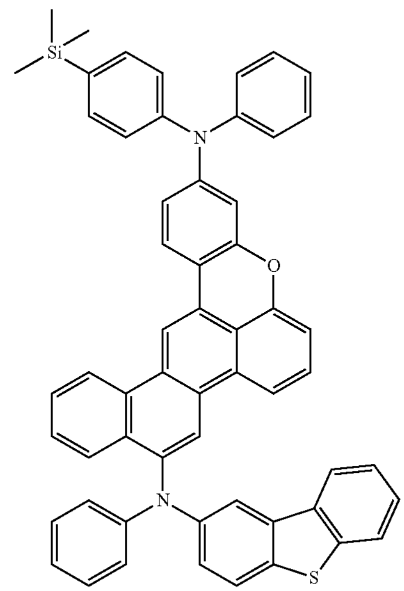
45
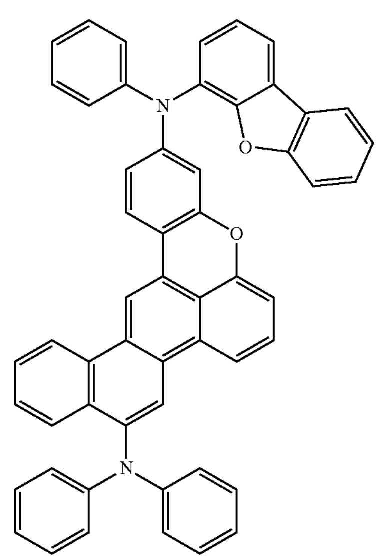

-continued
46
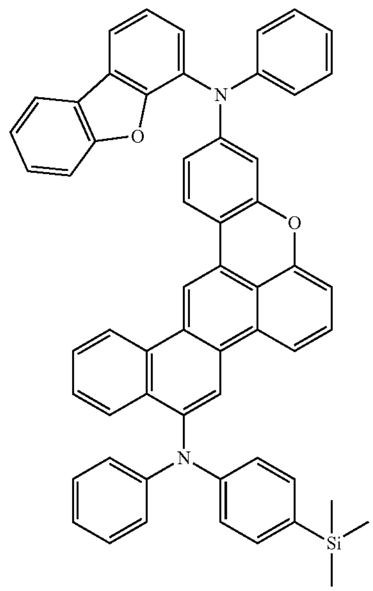
47
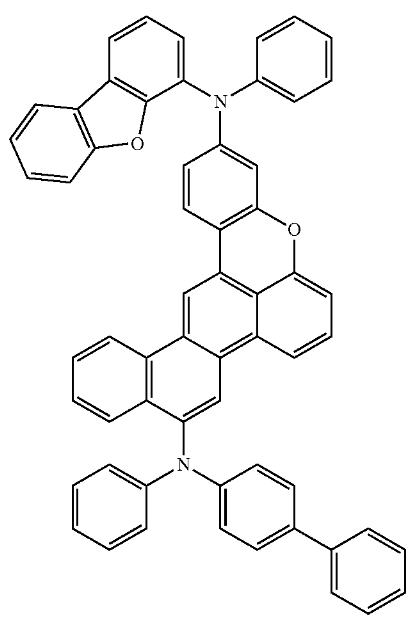
-continued
48
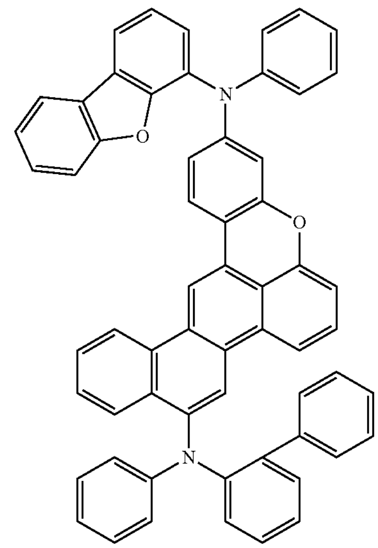
49
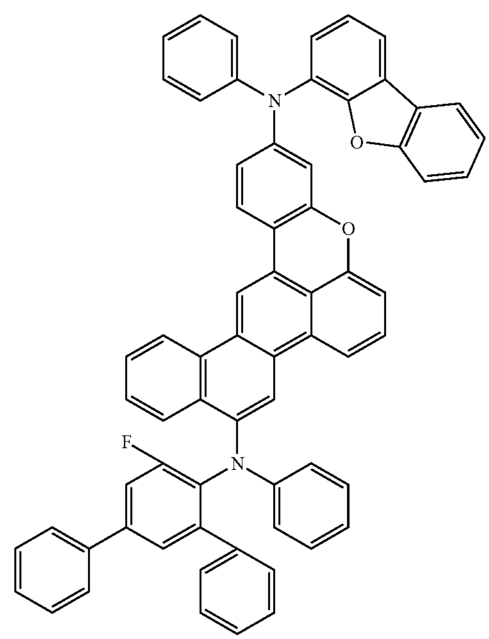

-continued
50
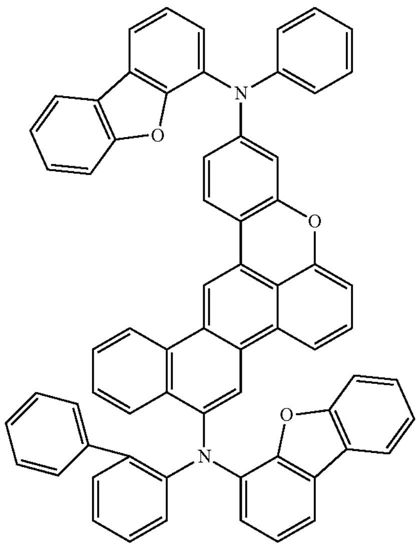
51
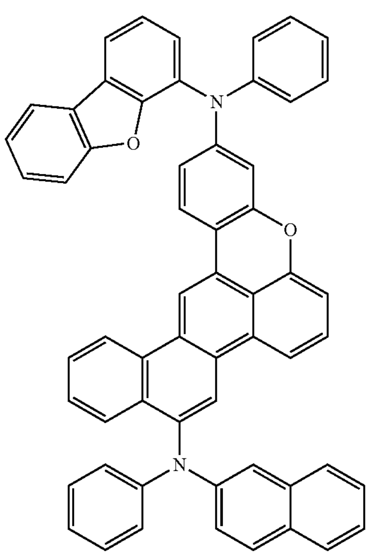
-continued
52
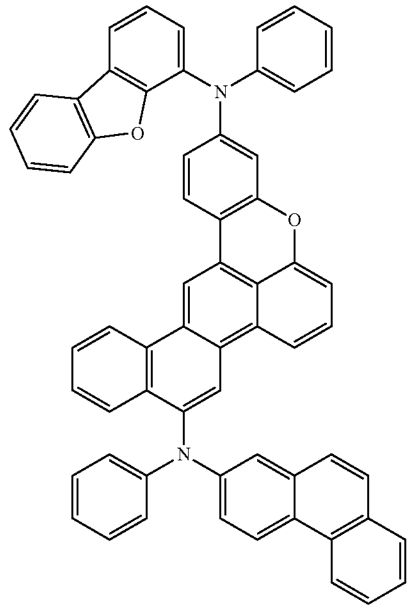
53
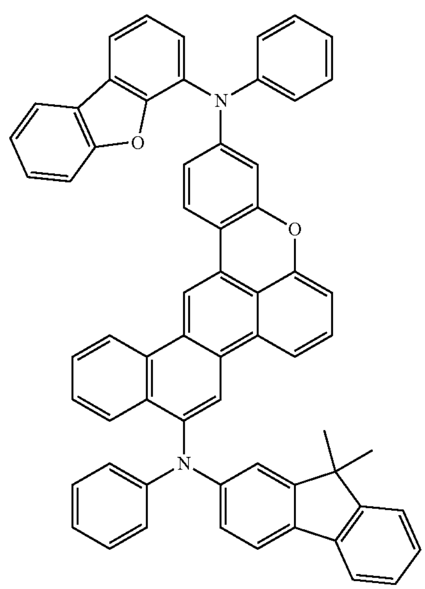

54
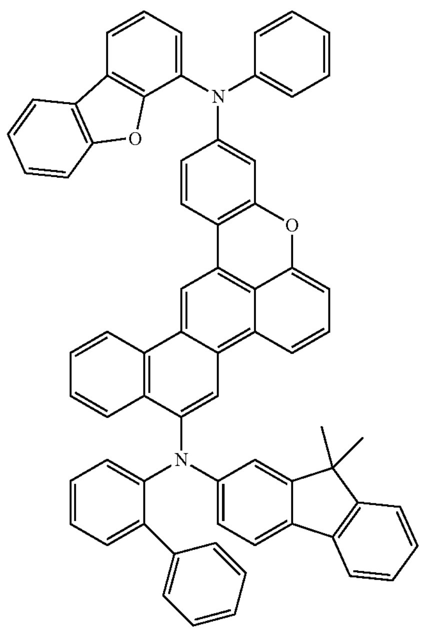
55
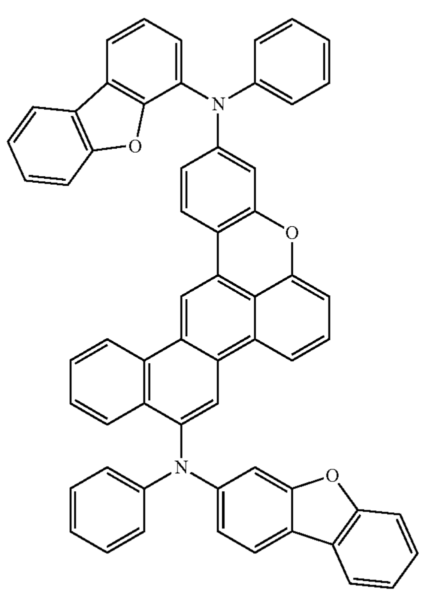
56
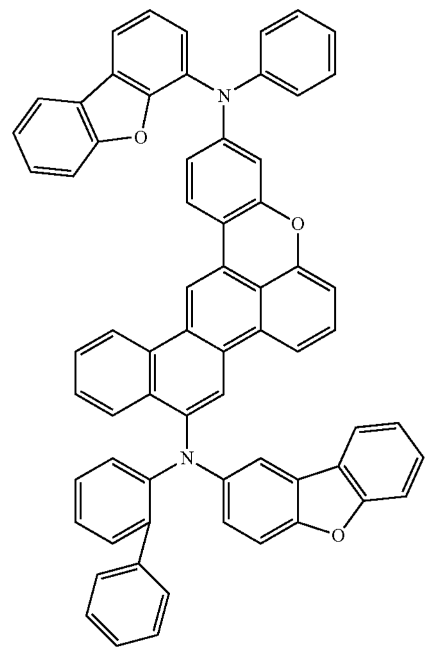
57
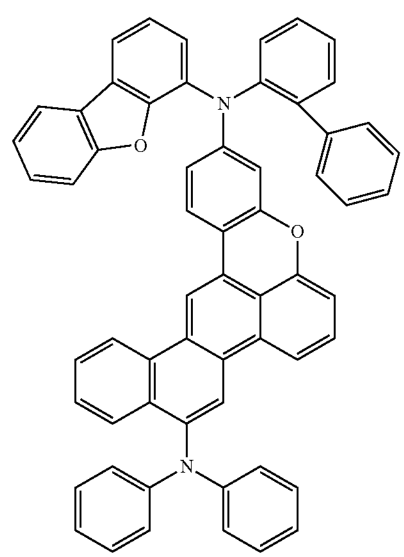

-continued
58
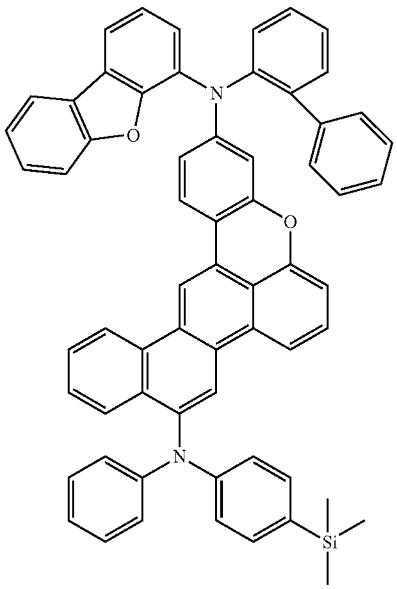
59
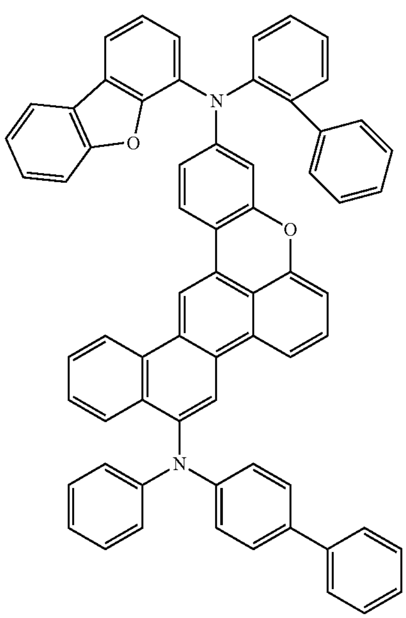
-continued
60
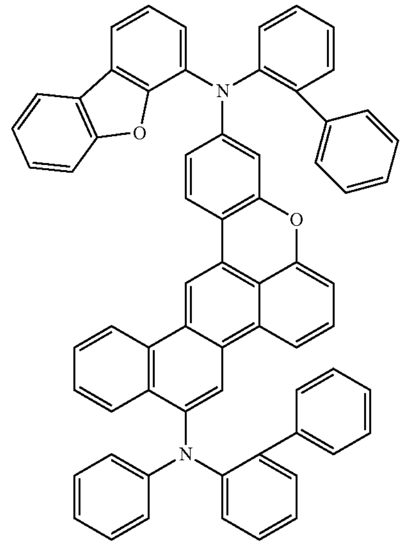
61
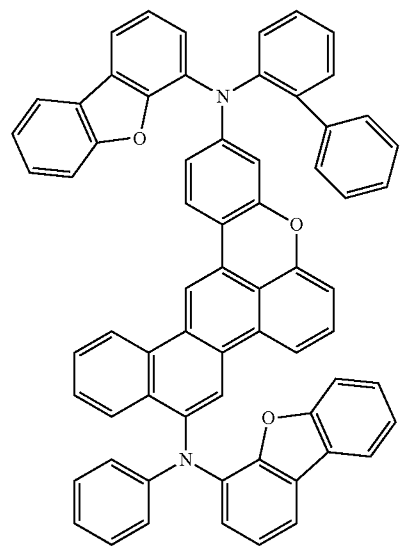
62
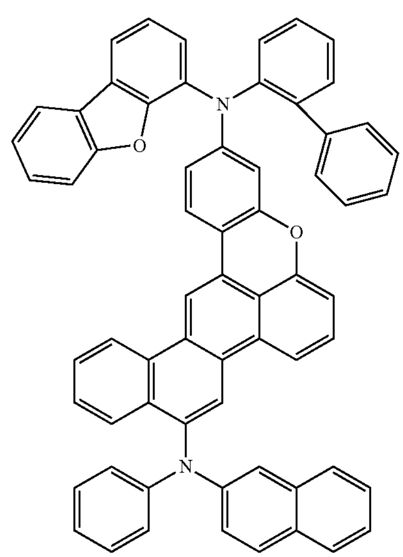

-continued
63
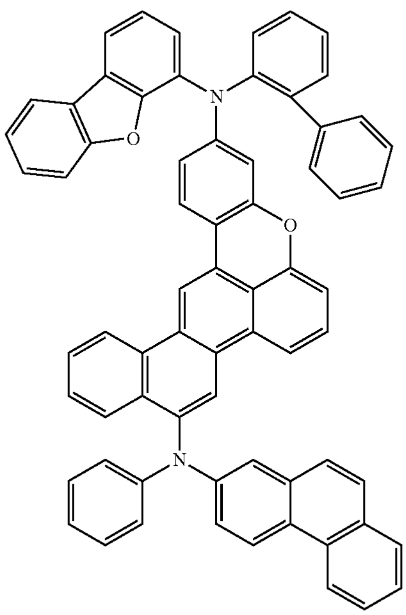
64
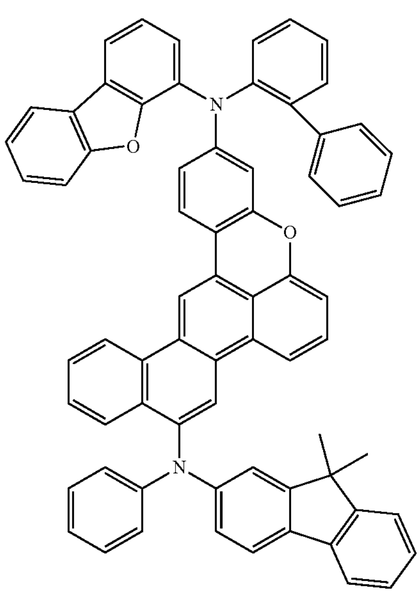
-continued
65
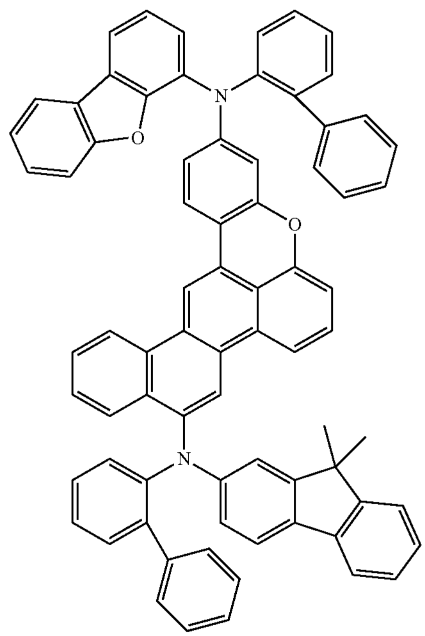
66
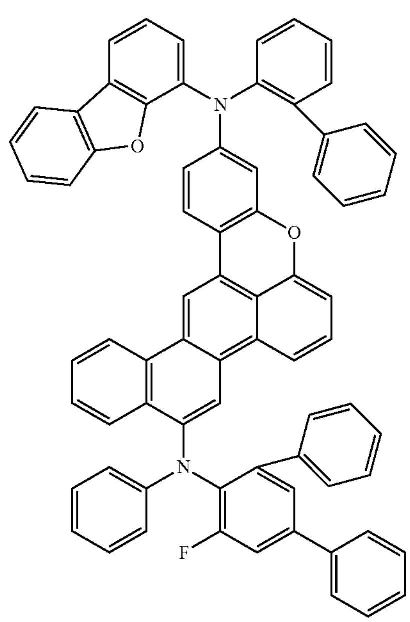

-continued
67
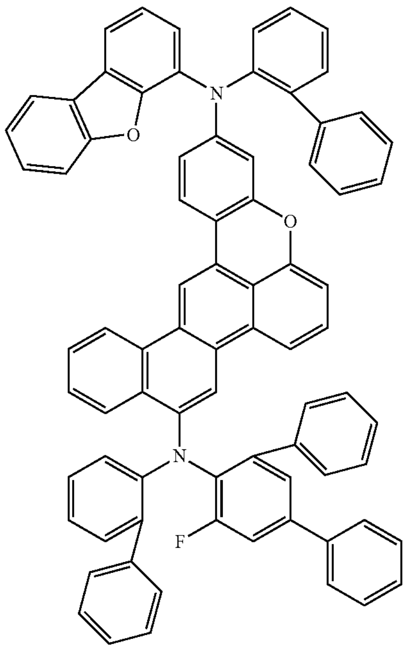
68
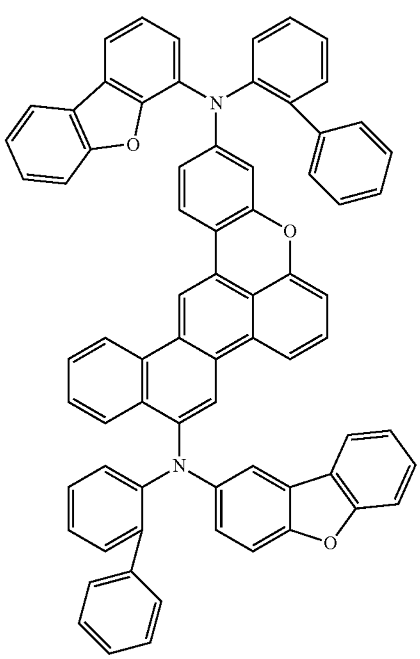
-continued
69
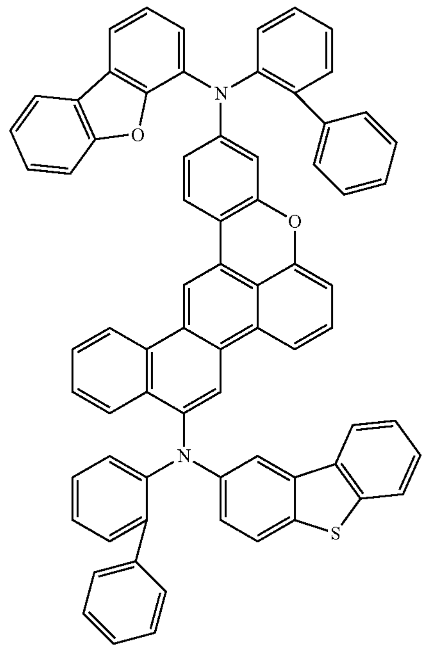
70
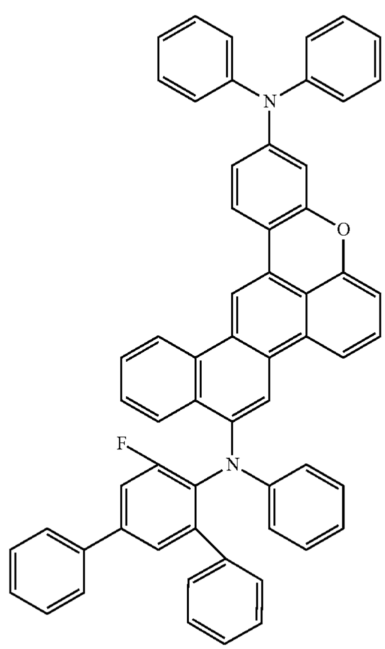

71
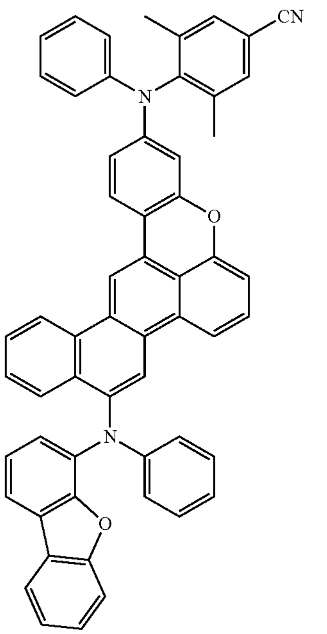
72
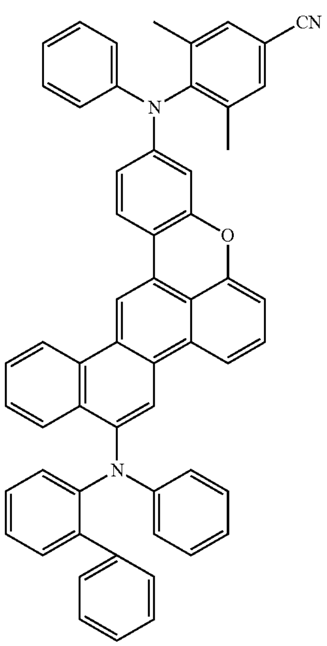
73
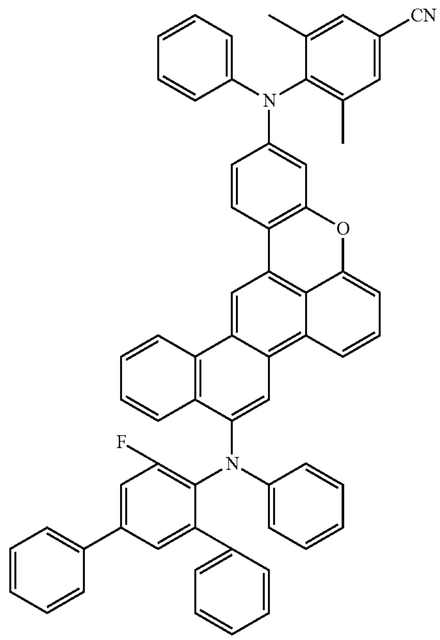
74
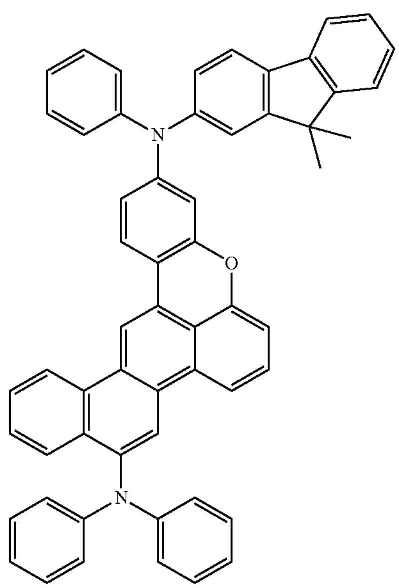

-continued
75
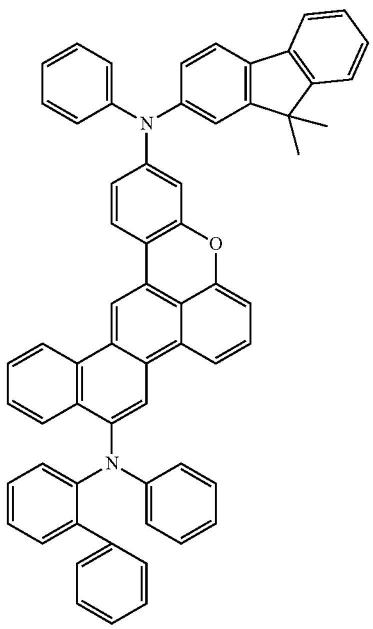
76
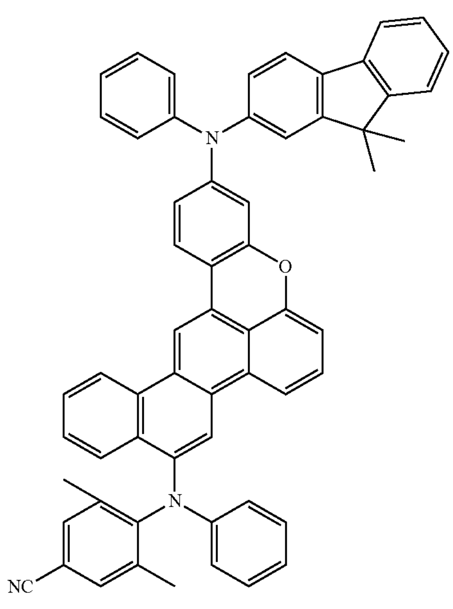
-continued
77
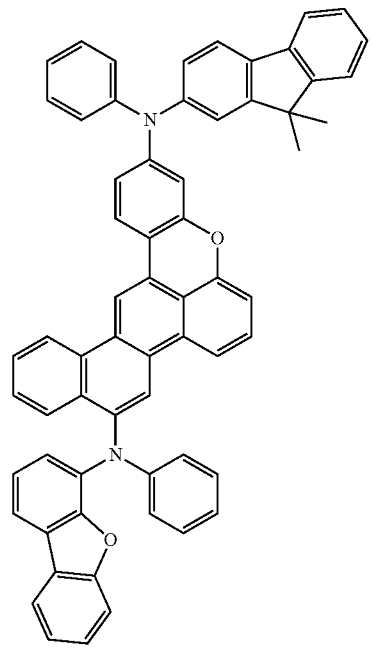
78
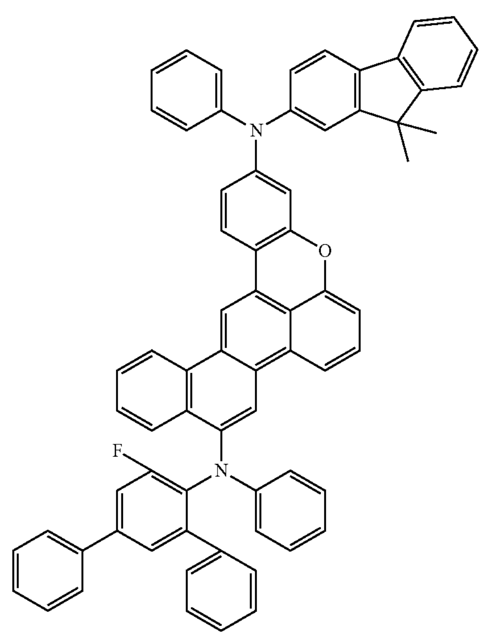

-continued
79
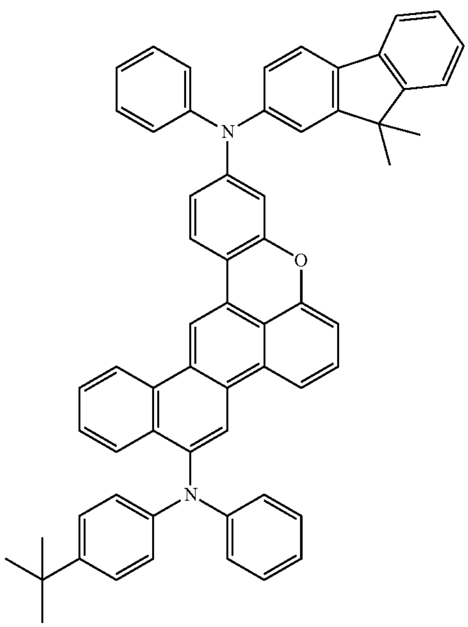
80
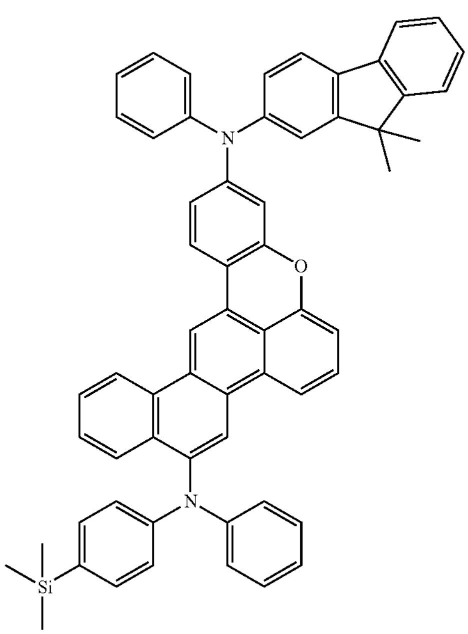
-continued
81
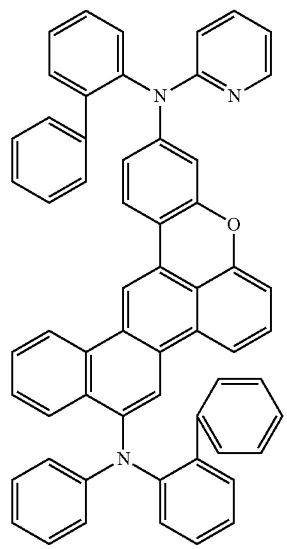
82
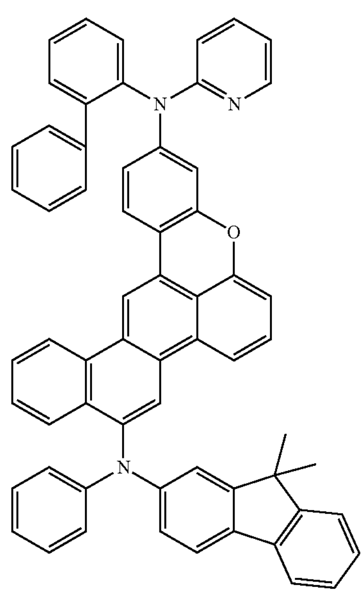

83
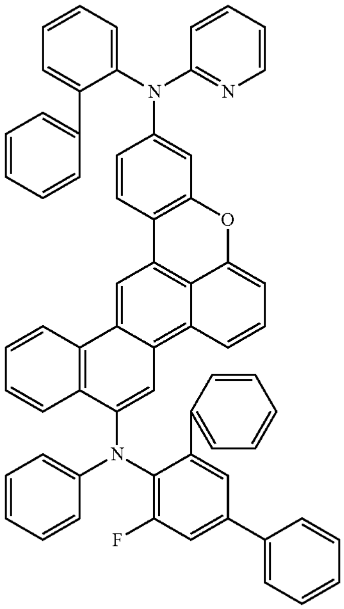
84
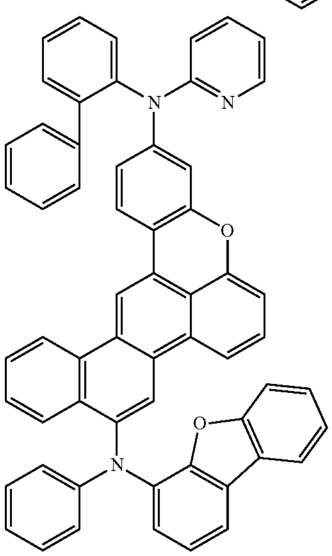
85
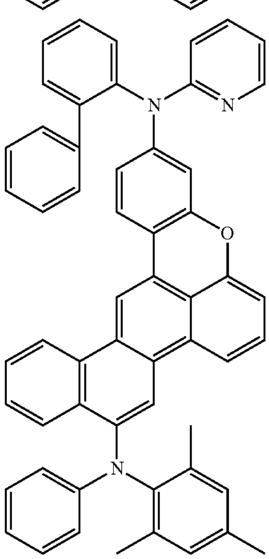
86
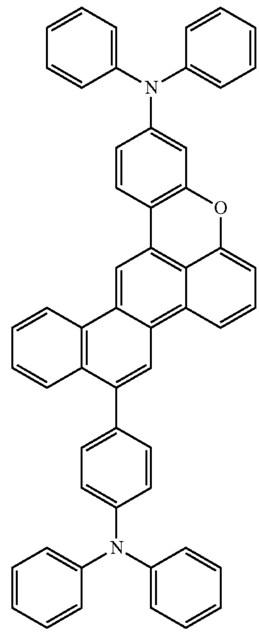
87
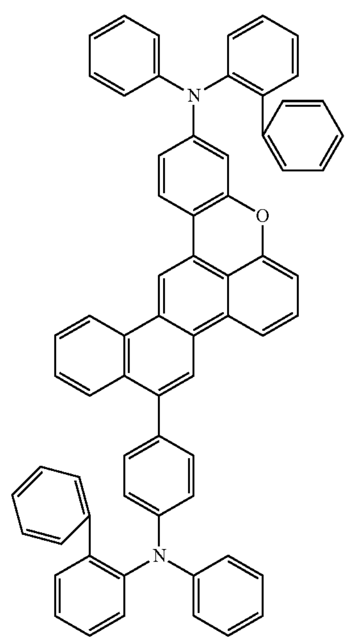

-continued
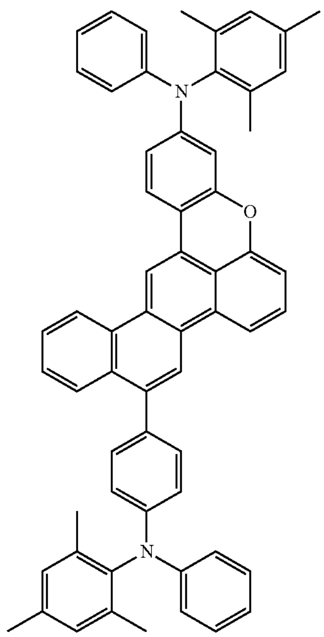
88
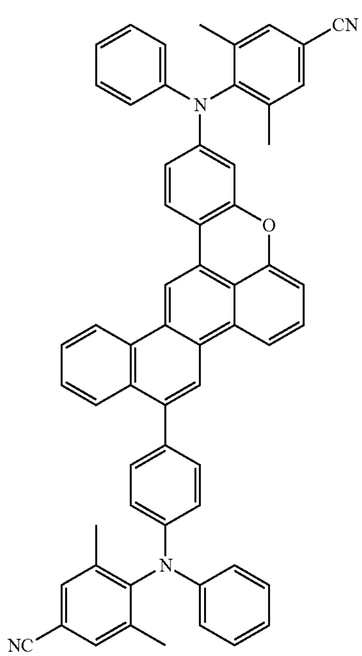
89
-continued
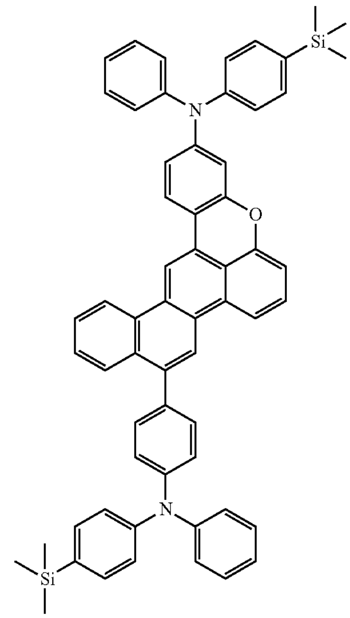
90
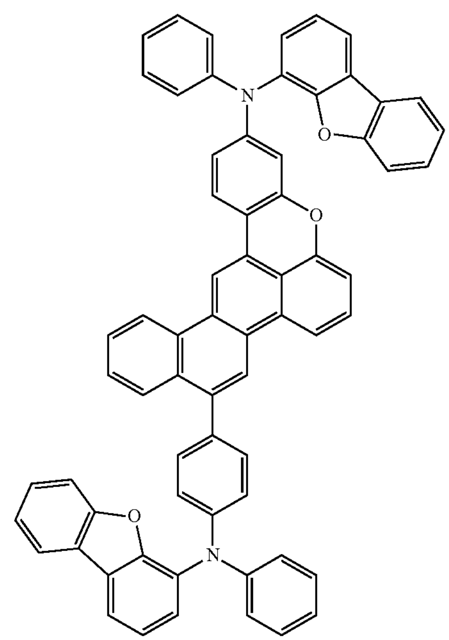
91

-continued
92
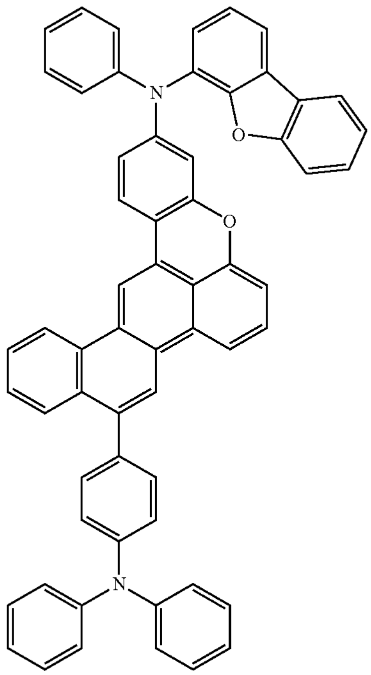
93
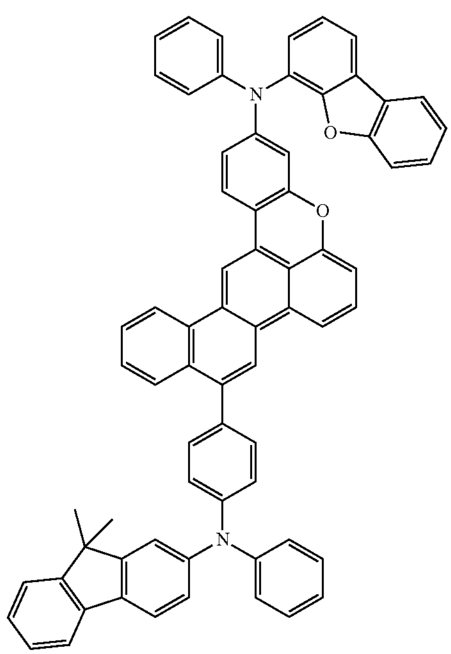
-continued
94
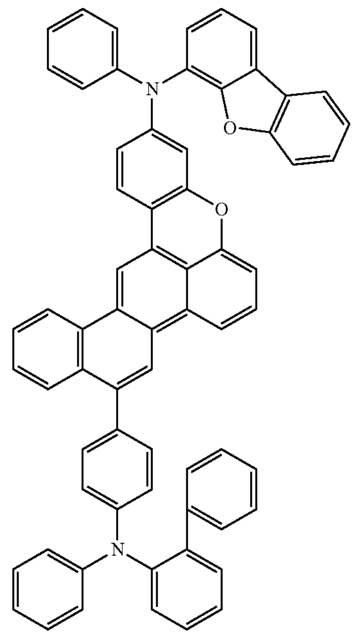
95
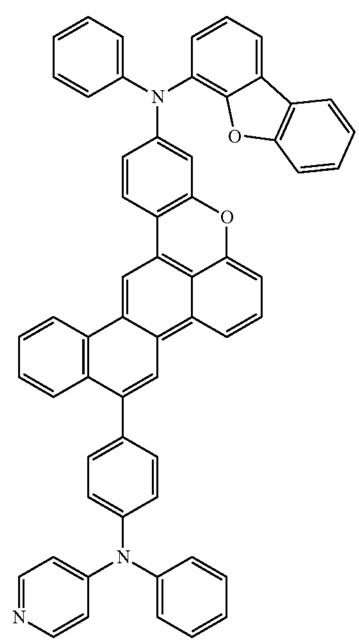

-continued
96
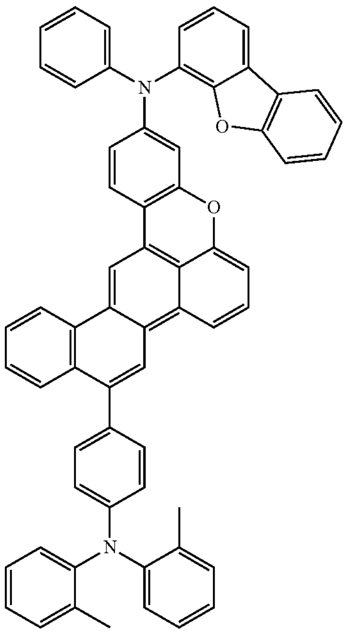
97
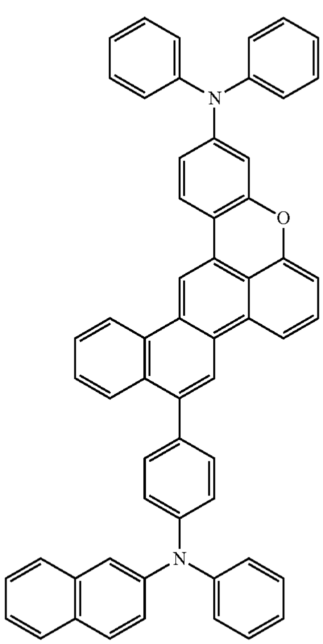
-continued
98
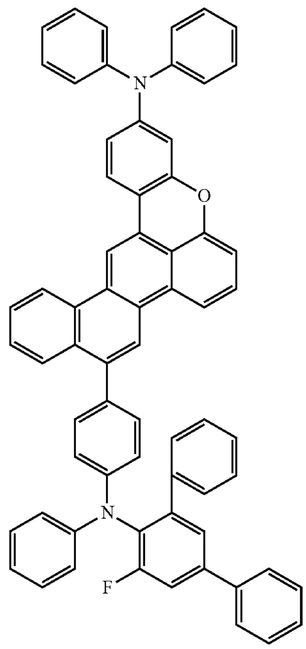
99
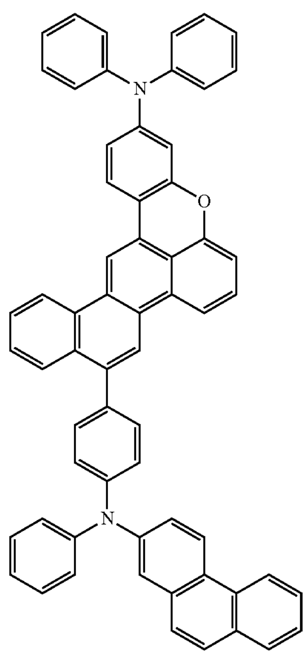

-continued
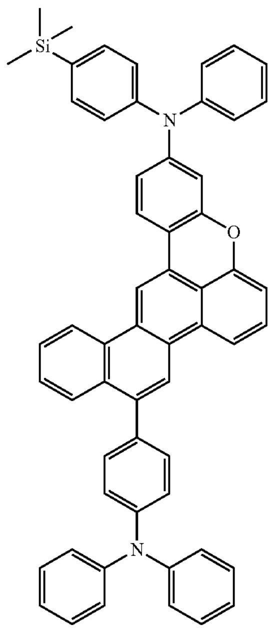
100
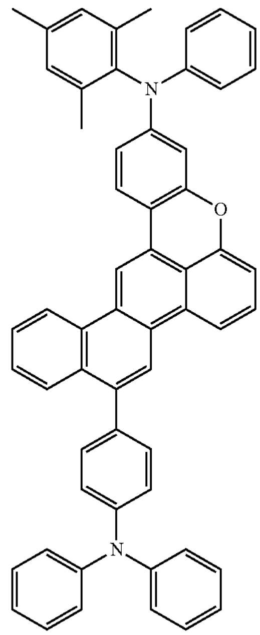
102
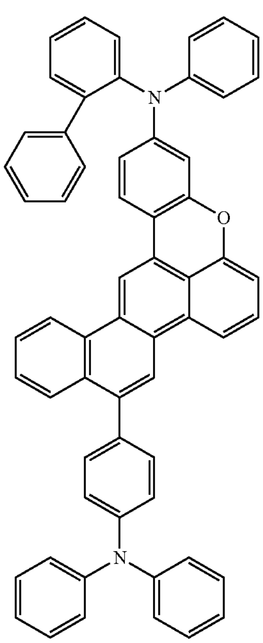
101
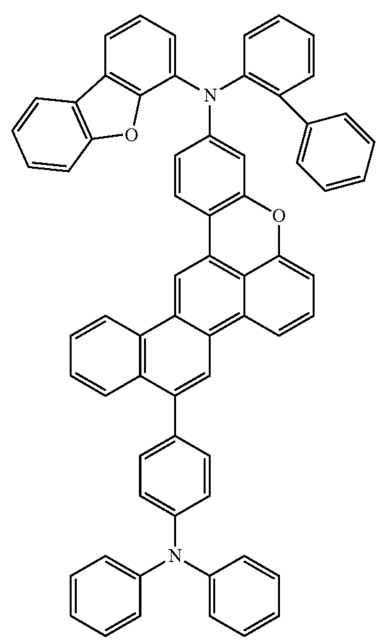
103

-continued
104
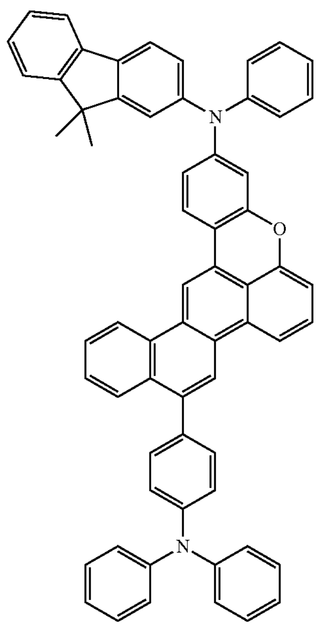
105
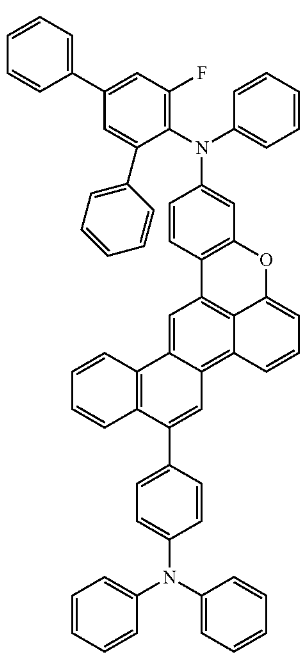
-continued
106
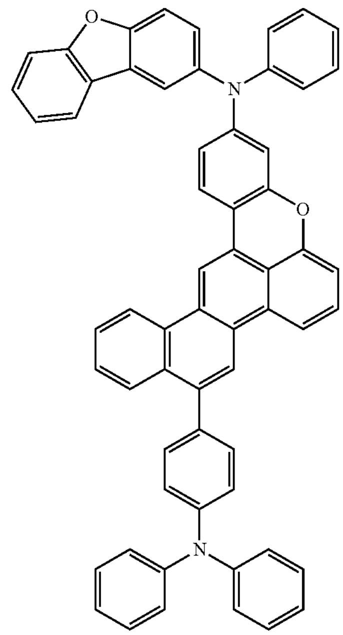
107
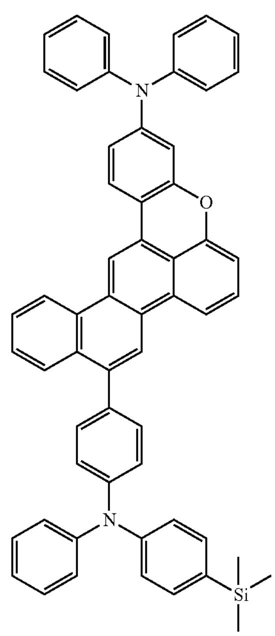

-continued
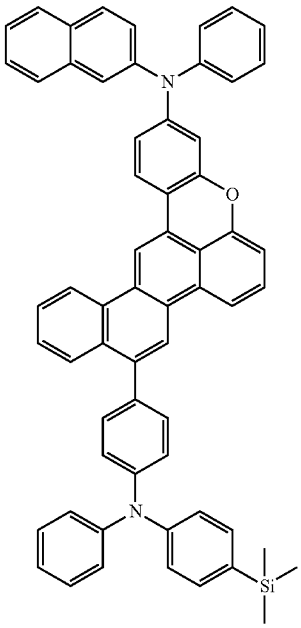
108
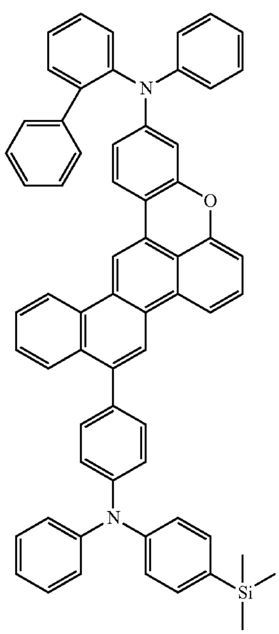
109
-continued
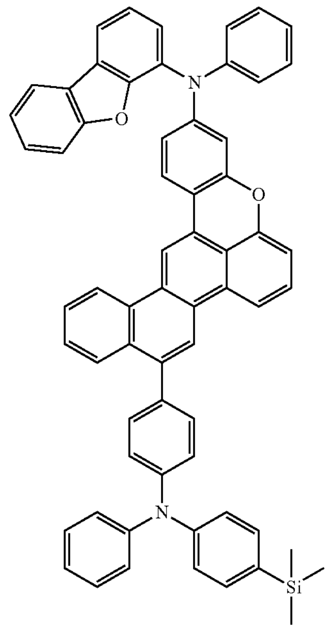
110
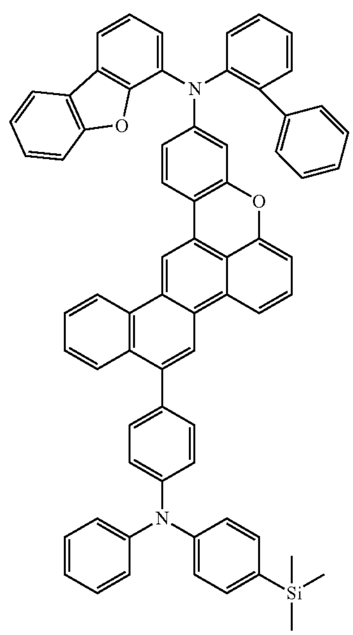
111

-continued
112
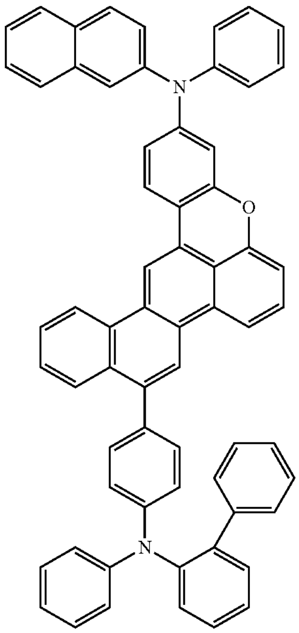
113
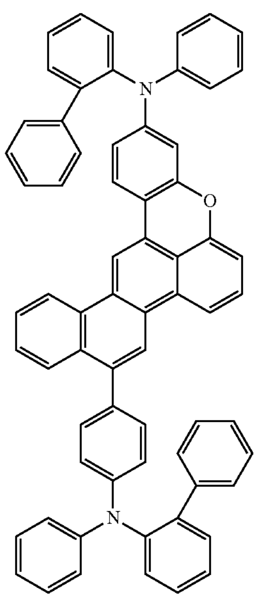
-continued
114
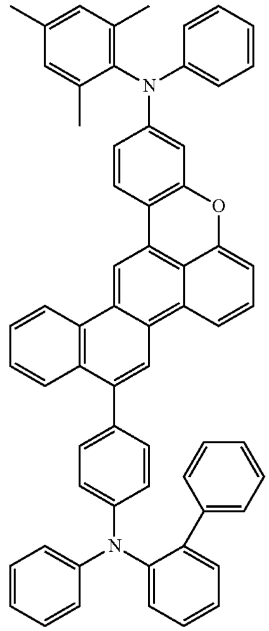
115
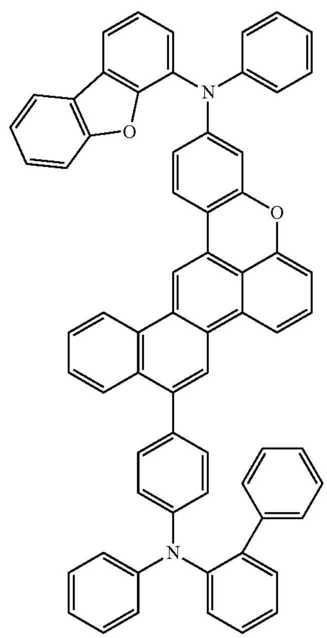

-continued
116
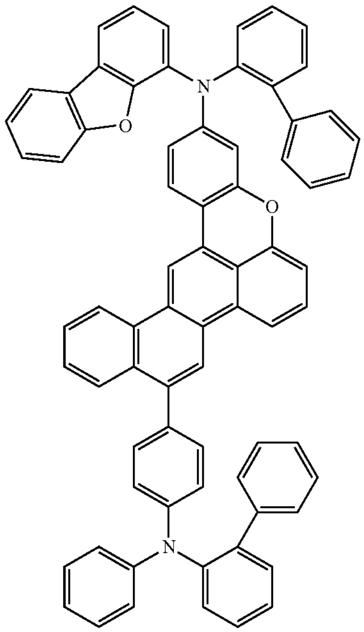
117
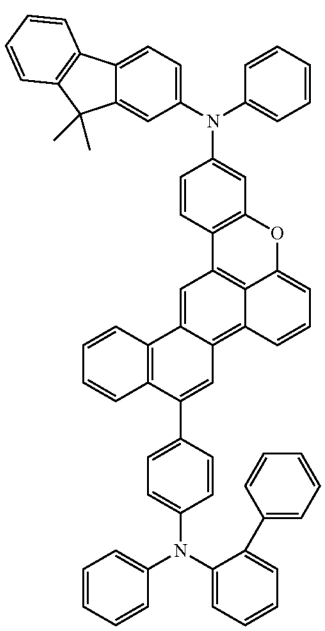
-continued
118
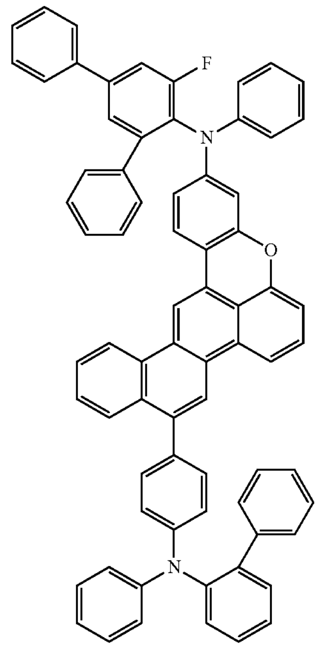
119
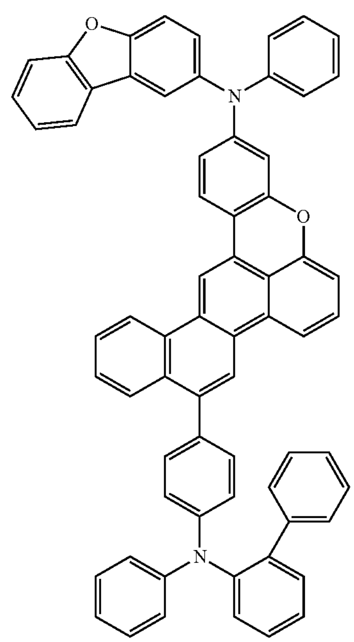

-continued
-continued
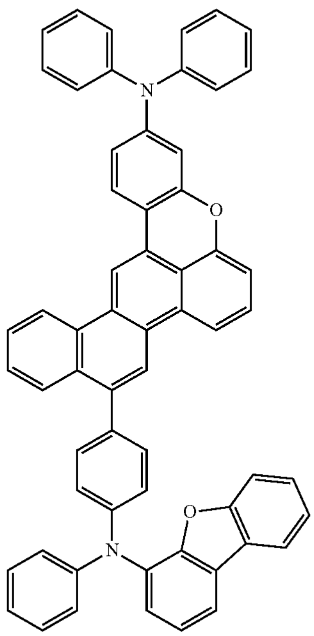
120
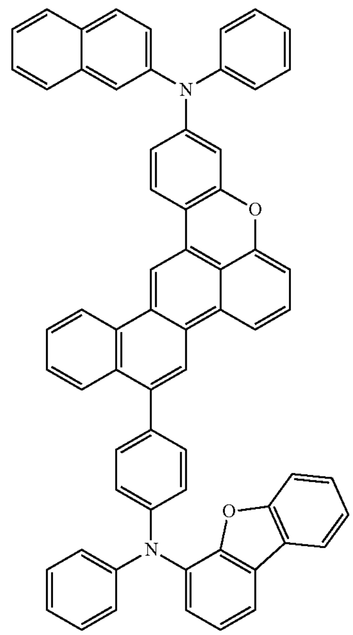
122
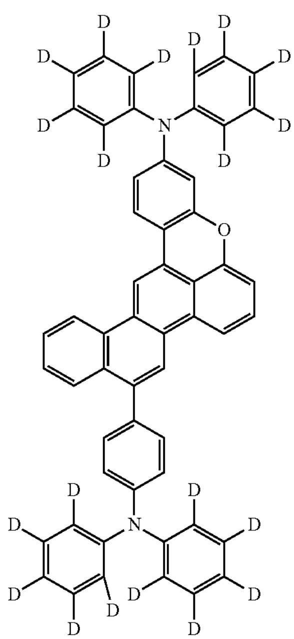
121
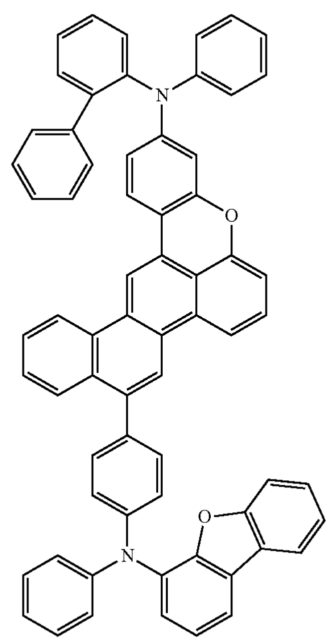
123

-continued
124
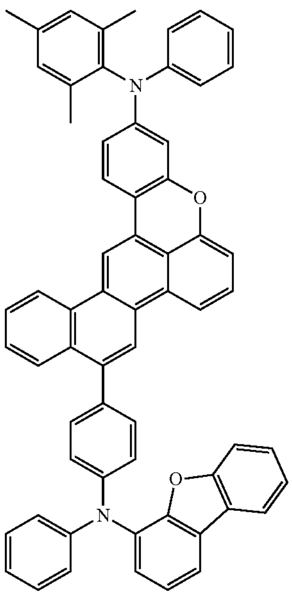
125
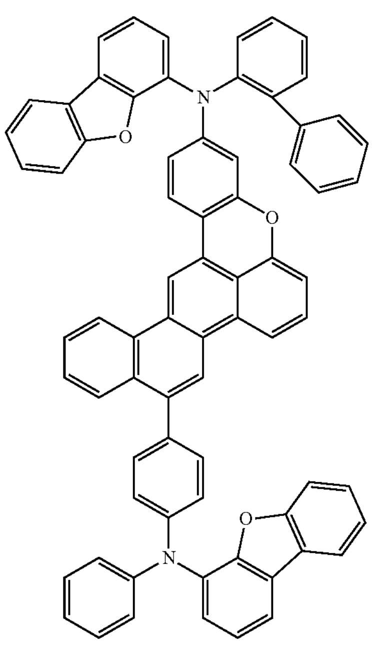
-continued
126
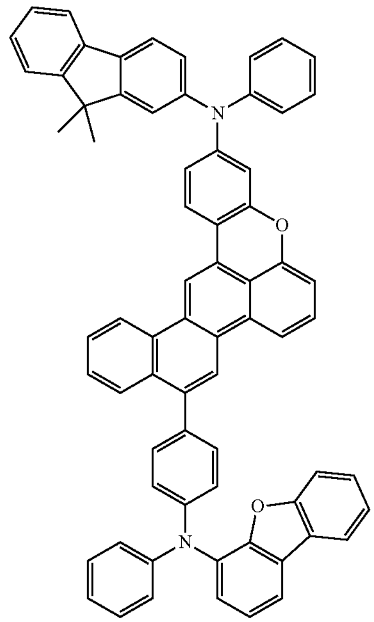
127
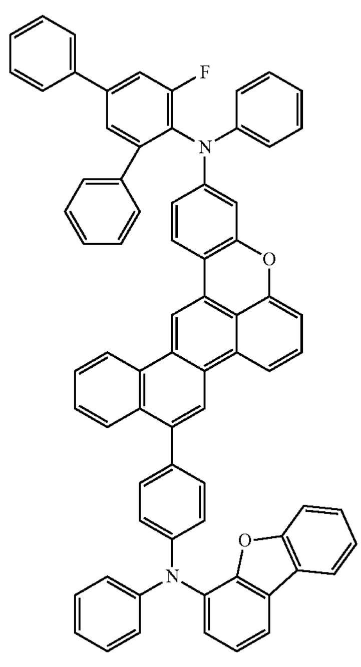

-continued
128
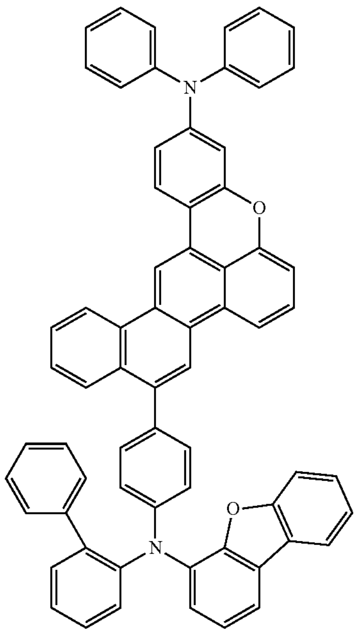
129
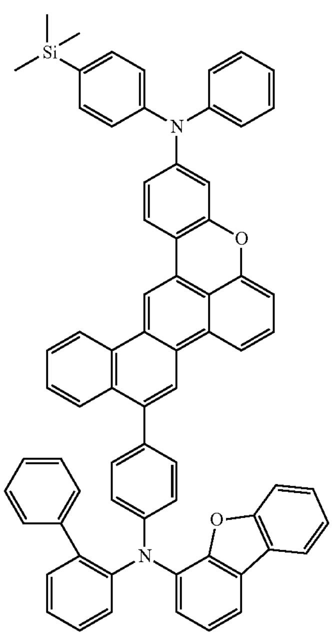
-continued
130
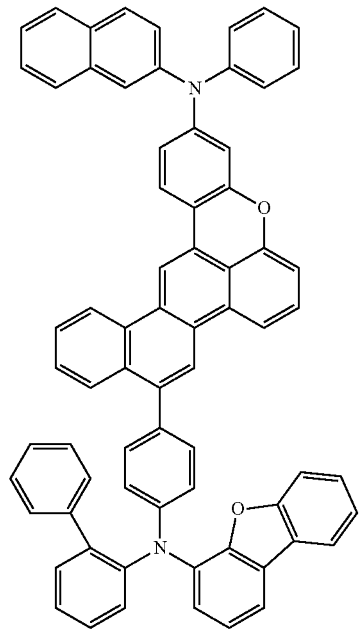
131
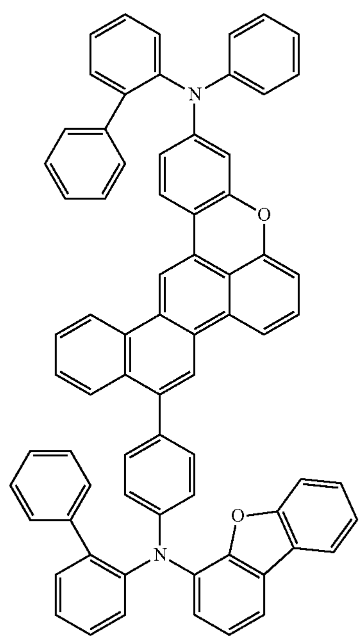

-continued
132
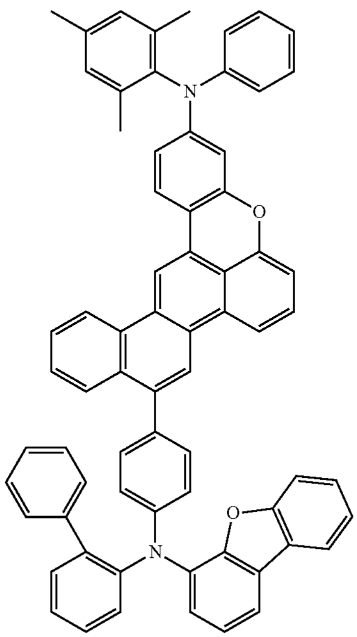
133
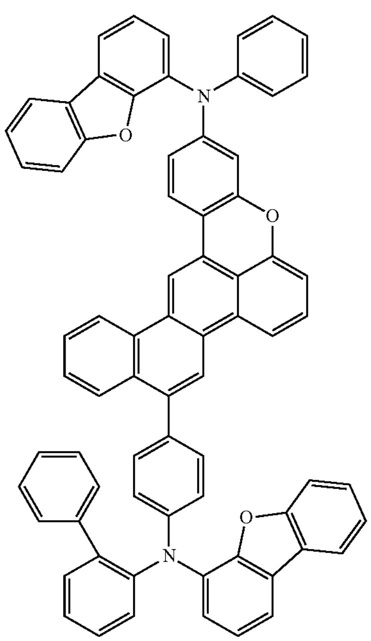
-continued
134
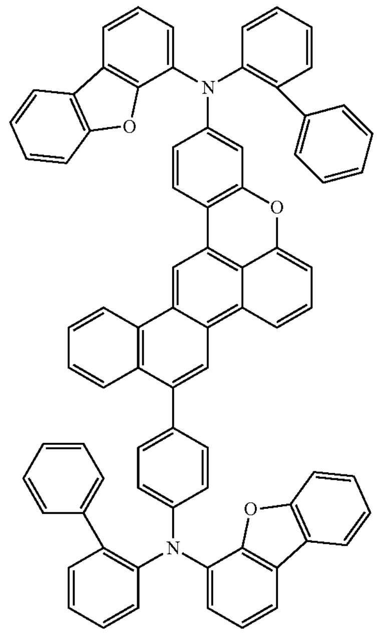
135
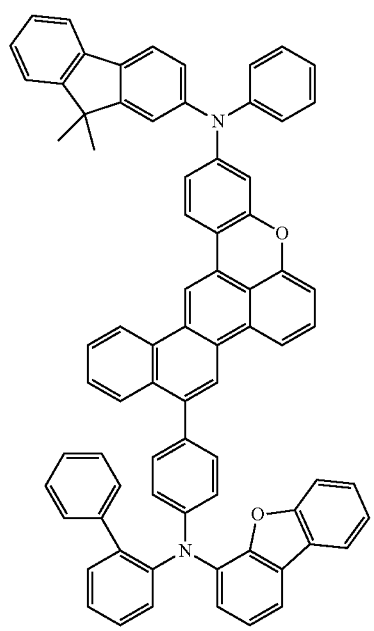

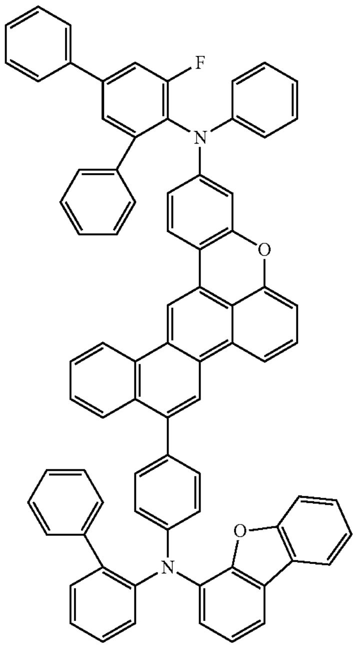
136
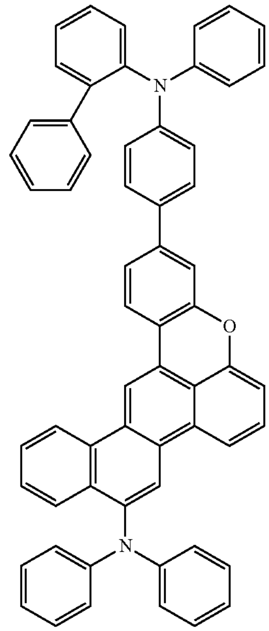
138
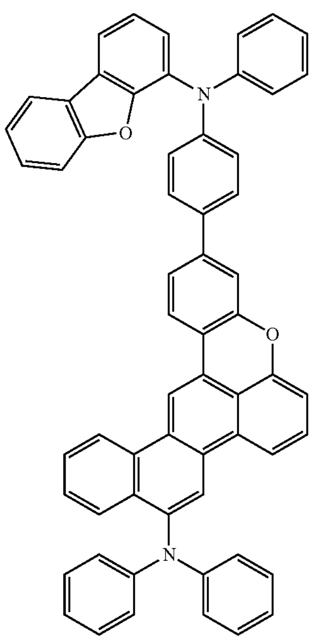
137
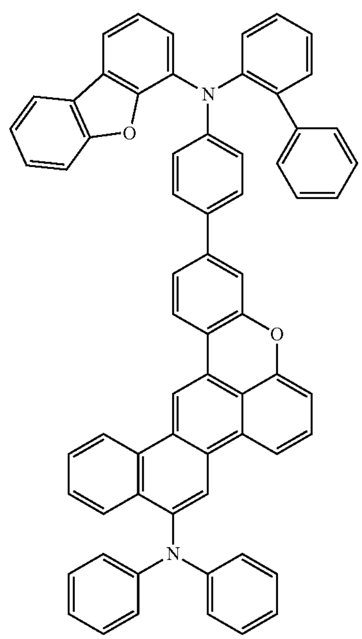
139

-continued
-continued
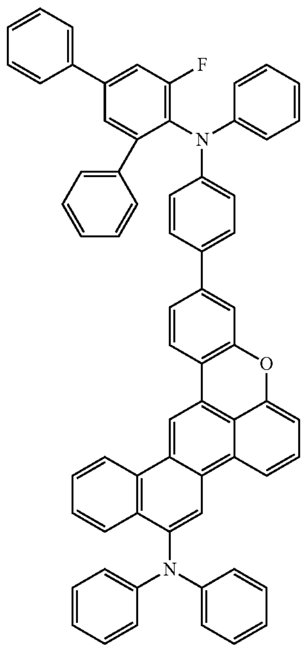
140
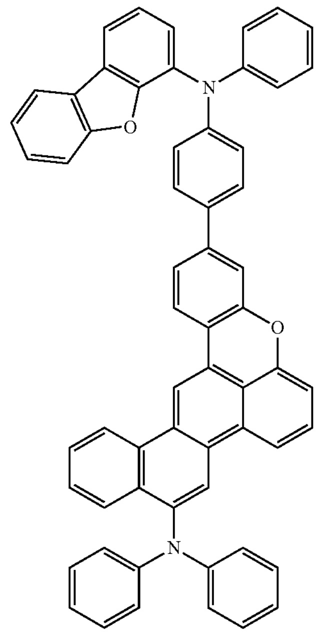
142
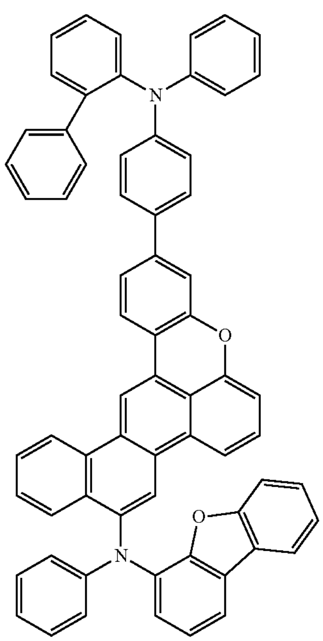
141
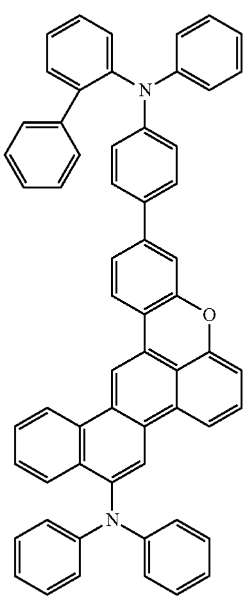
143

-continued
144
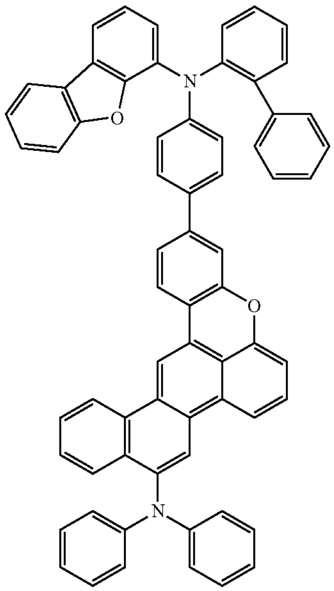
145
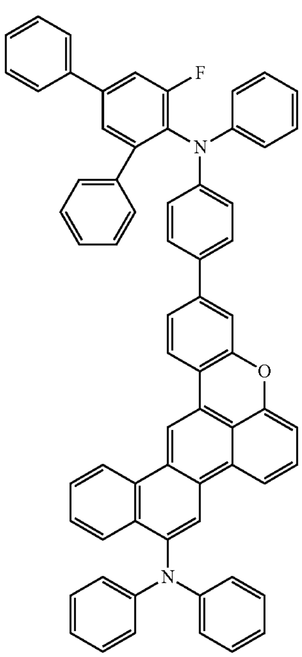
-continued
146
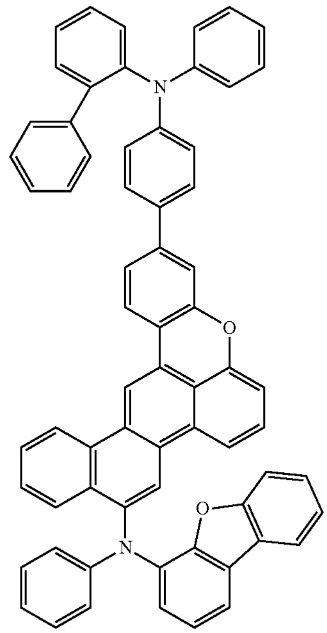
147
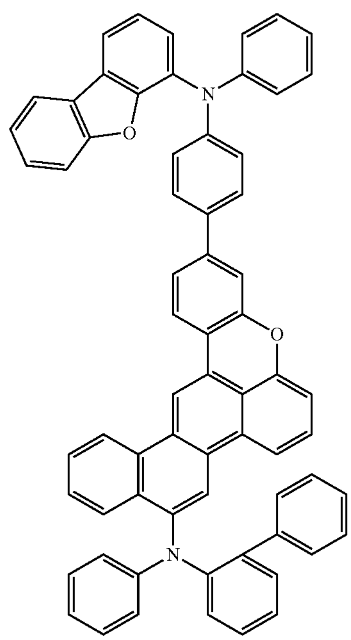

-continued
-continued
148
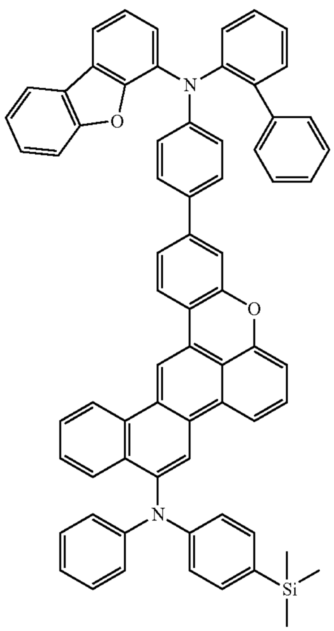
150
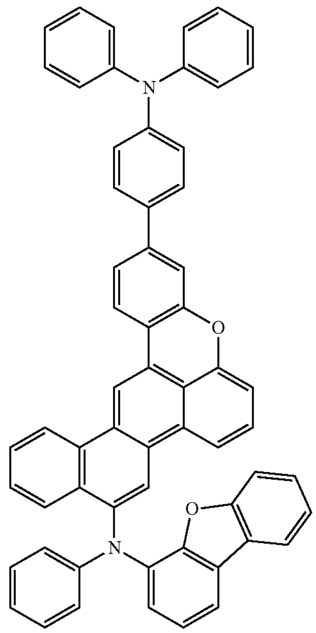
149
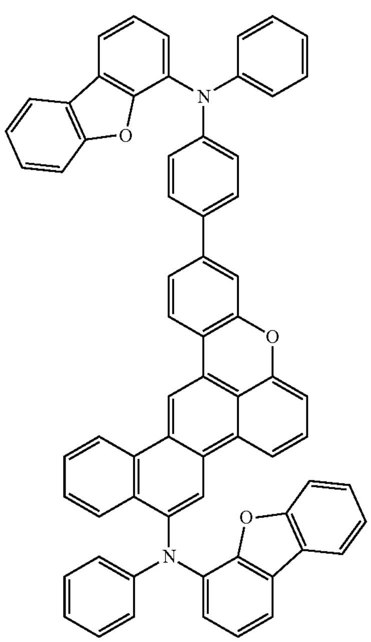
151
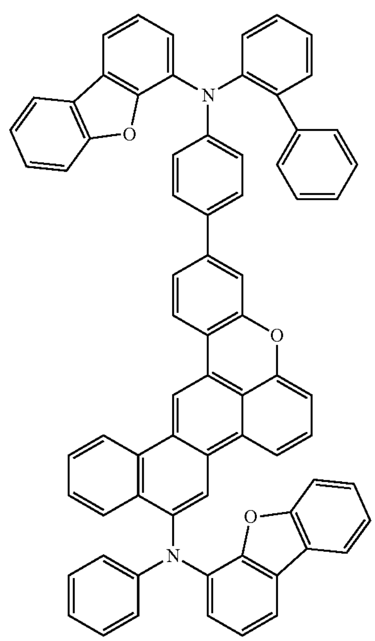

152
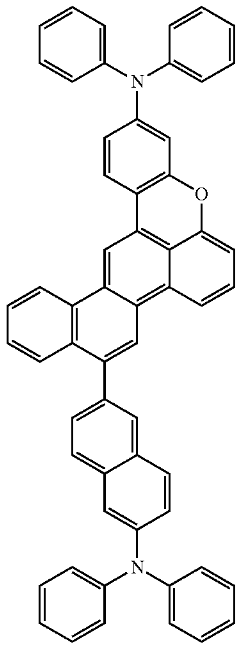
153
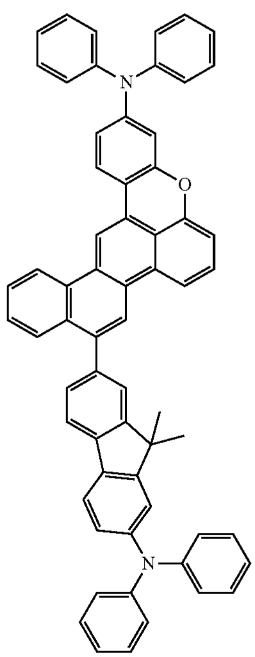
154
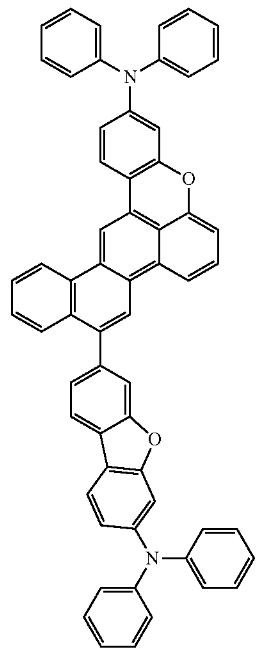
155
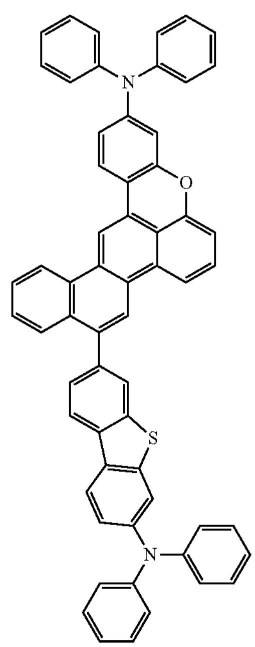

156
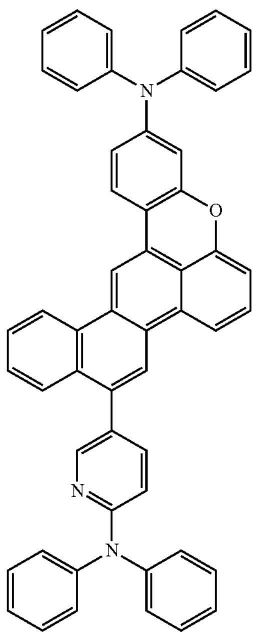
157
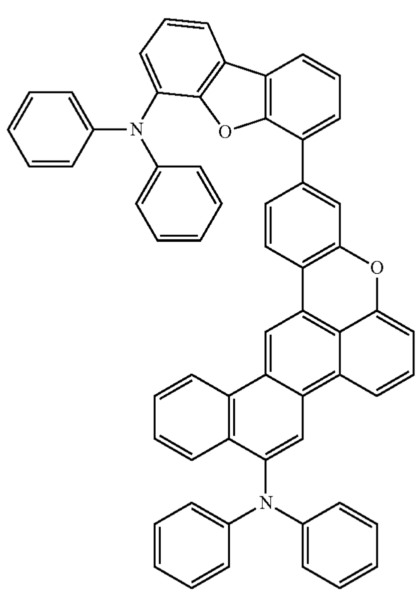
158
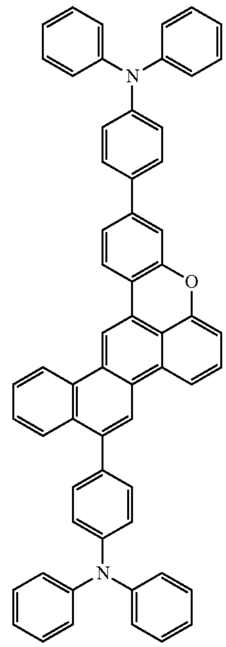
159
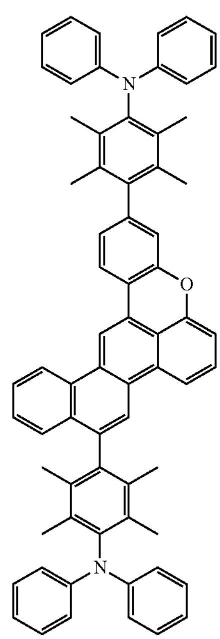

-continued

160

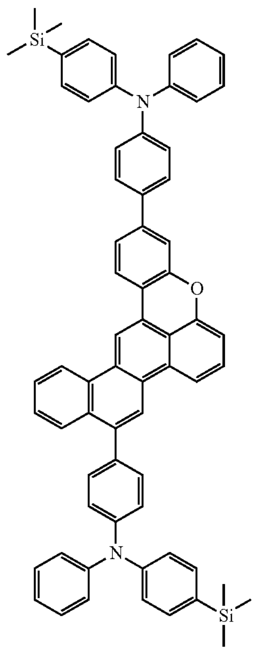

161

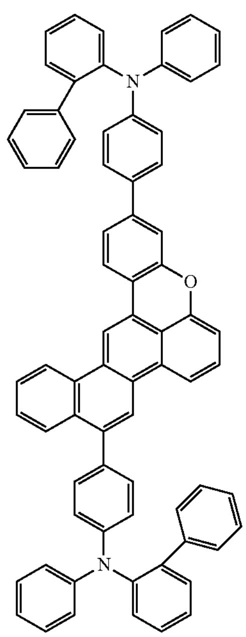

-continued

162

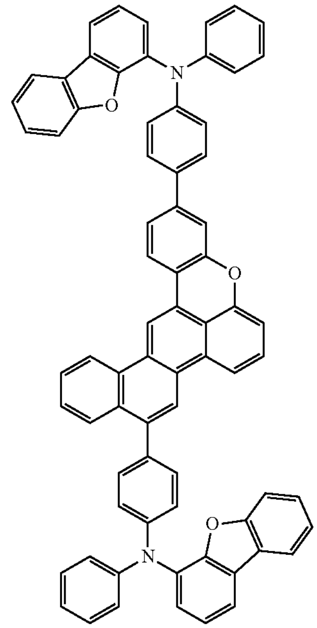

The first compound represented by Formula 1 may include a core in which a benzene moiety and a chrysene moiety are connected through an oxygen atom or a sulfur atom (see Formula 1' below).

<Formula 1'>

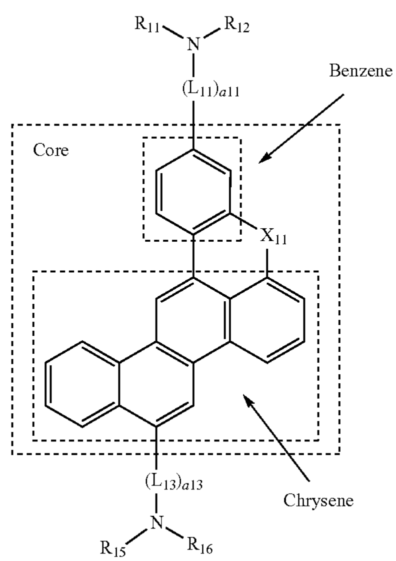

The first compound represented by Formula 1 above may have delocalized π-electrons because a benzene moiety and a chrysene moiety are connected through $X_{11}$ (wherein, $X_{11}$ is an oxygen atom or a sulfur atom). Also, the first compound represented by Formula 1 includes $X_{11}$, which includes two pairs of non-covalent electrons. Thus, the first compound may provide residual electrons to the core.

Accordingly, the first compound represented by Formula 1 above may be rich in π-electrons in the core; thus, the likelihood of a π→π* transition and an n→π* transition may increase.

The first compound represented by Formula 1 may be synthesized by using a suitable organic synthesis method. A synthesis method of the first compound may be recognizable in view of the following embodiments:

The first compound represented by Formula 1 above may be suitable for use in an organic layer of an organic light-emitting device, e.g., as a dopant in an emission layer of the organic layer. According to another embodiment, provided is an organic light-emitting device including a first electrode; a second electrode; and an an organic layer disposed between the first electrode and the second electrode and including an emission layer, and at least one first compound represented by Formula 1 above.

The organic light-emitting device may include the organic layer, which includes the first compound represented by Formula 1 above, and may have characteristics such as high efficiency, low driving voltage, and a long lifespan.

Energy may be easily transferred from the second compound represented by any one of Formulae 2-1 to 2-4 above to the first compound. Thus, efficiency of the organic light-emitting device including the first compound and the second compound may be improved.

The first compound may be included in the emission layer in an amount of, e.g., about 0.01 to about 15 parts by weight, based on 100 parts by weight of the second compound. In an implementation, the first compound may be included in the emission layer in an amount of, e.g., about 1 to about 5 parts by weight, based on 100 parts by weight of the second compound.

A thickness of the emission layer may be about 100 Å to about 1,000 Å, e.g., about 200 Å to about 600 Å. When the thickness of the emission layer is within these ranges, excellent light-emission characteristics may be obtained without a substantial increase in driving voltage.

Then, an electron transport region may be formed on the emission layer.

The electron transport region may include at least one selected from a hole blocking layer, an electron transport layer, and an electron injection layer, but it is not limited thereto.

For example, the electron transport region may have a structure of electron transport layer/electron injection layer or a structure of hole blocking layer/electron transport layer/electron injection layer, wherein layers of each structure are sequentially stacked from the emission layer in the stated order.

The electron transport region may include a hole blocking layer. The hole blocking layer may be formed, when the emission layer includes a phosphorescent dopant, to help prevent diffusion of excitons or holes into an electron transport layer.

When the electron transport region includes a hole blocking layer, the hole blocking layer may be formed on the emission layer by using various methods, such as vacuum deposition, spin coating casting, a Langmuir-Blodgett (LB) method, ink-jet printing, laser-printing, or laser-induced thermal imaging. When the hole blocking layer is formed by vacuum deposition or spin coating, deposition and coating conditions for the hole blocking layer may be determined by referring to the deposition and coating conditions for the hole injection layer.

The hole blocking layer may include, e.g., at least one of BCP and Bphen.

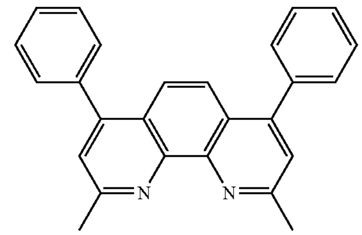

BCP

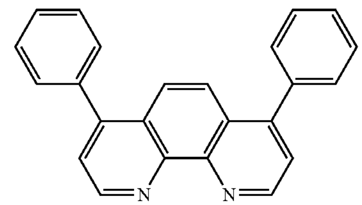

Bphen

A thickness of the hole blocking layer may be in a range of about 20 Å to about 1,000 Å, e.g., about 30 Å to about 300 Å. When the thickness of the hole blocking layer is within these ranges, the hole blocking layer may have excellent hole blocking characteristics without a substantial increase in driving voltage.

The electron transport region may include an electron transport layer. The electron transport layer may be formed on the emission layer or the hole blocking layer by using various methods, e.g. vacuum deposition, spin coating casting, an LB method, ink-jet printing, laser-printing, or laser-induced thermal imaging. When an electron transport layer is formed by vacuum deposition or spin coating, deposition and coating conditions for the electron transport layer may be the same as the deposition and coating conditions for the hole injection layer.

The electron transport layer may further include at least one selected from BCP and Bphen shown above, and $Alq_3$, Balq, TAZ, and NTAZ shown below.

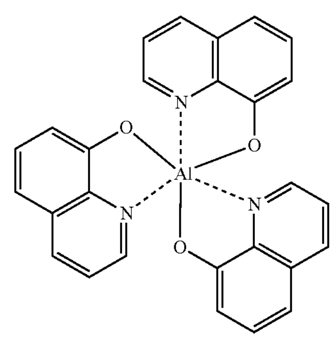

$Alq_3$

-continued

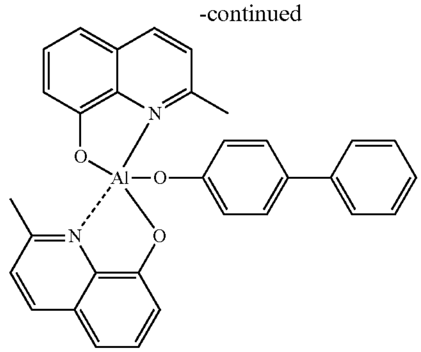

BAlq

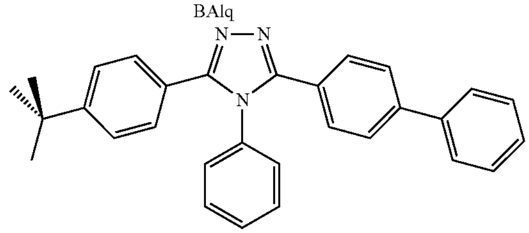

TAZ

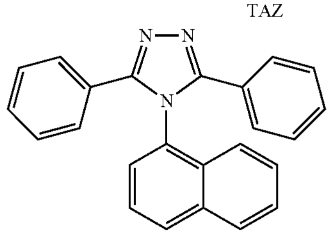

NTAZ

In an implementation, the electron transport layer may further include at least one of compounds represented by Formula 601 below:

$$Ar_{601}\text{-}[(L_{601})_{xe1}\text{-}E_{601}]_{xe2} \qquad \text{<Formula 601>}$$

$Ar_{601}$ in Formula 601 may be selected from a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{301})(Q_{302})(Q_{303})$ ($Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

a description of $L_{601}$ may be understood by referring to the description provided in connection with $L_{201}$;

$E_{601}$ may be selected from a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In an implementation, the electron transport layer may further include at least one of compounds represented by Formula 602 below:

<Formula 602>

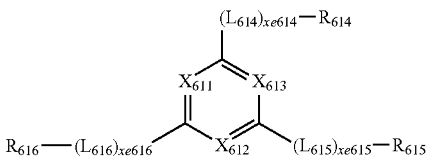

in Formula 602 above, $X_{611}$ may be N or C-$(L_{611})_{xe611}$-$R_{611}$, $X_{612}$ may be N or C-$(L_{612})_{xe612}$-$R_{612}$; $X_{613}$ may be N or C-$(L_{613})_{xe613}$-$R_{613}$, and at least one of $X_{611}$ to $X_{613}$ may be N;

$L_{611}$ to $L_{616}$ may be understood by referring to the description provided herein in connection with $L_{201}$;

$R_{611}$ to $R_{616}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may include at least one of Compounds ET1 to ET15 illustrated below.

ET1

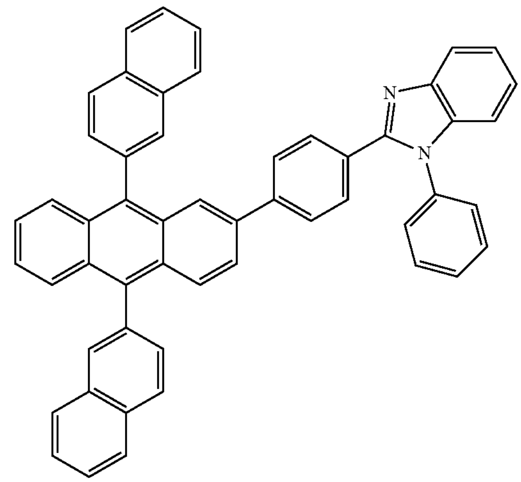

ET2

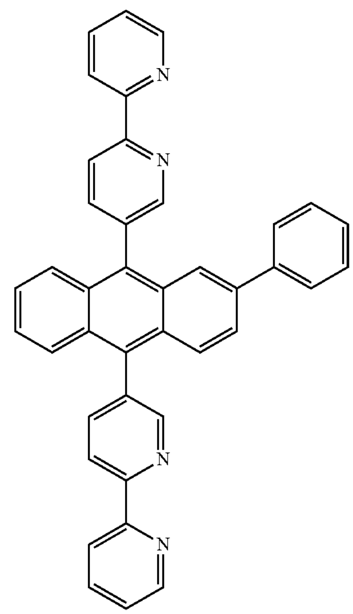

ET3

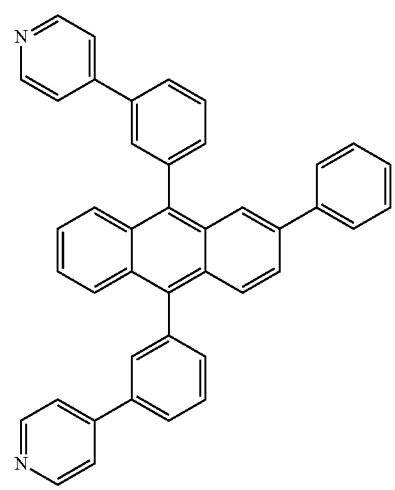

ET4
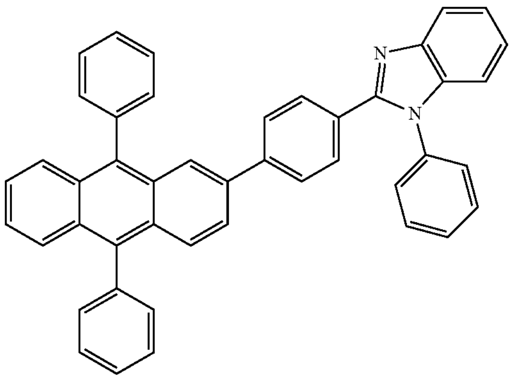
ET5
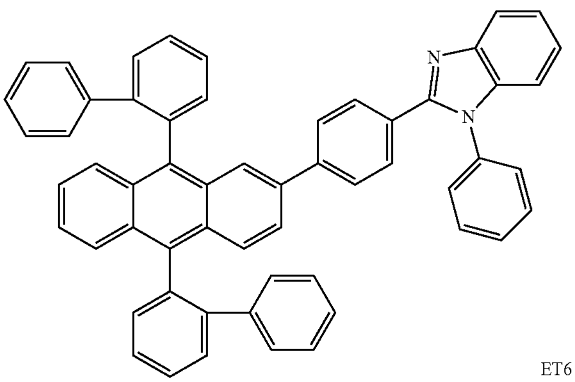
ET6
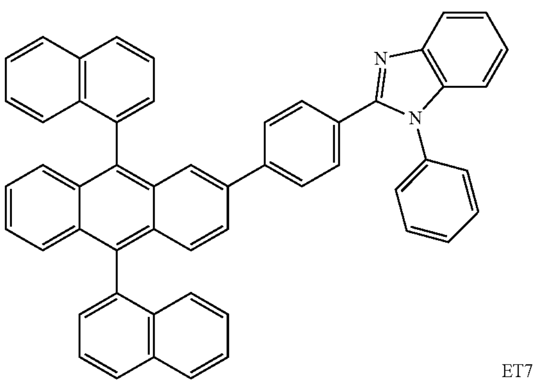
ET7
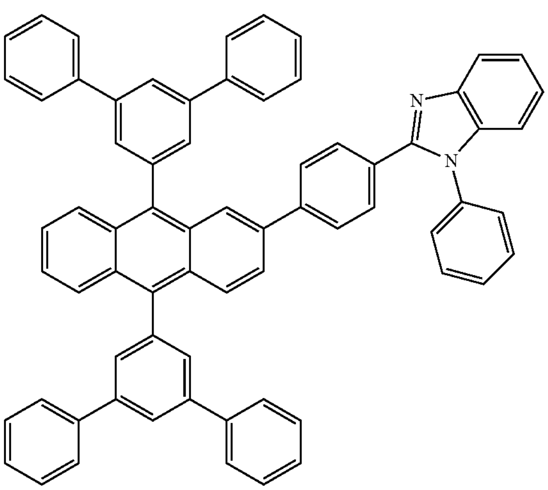
ET8
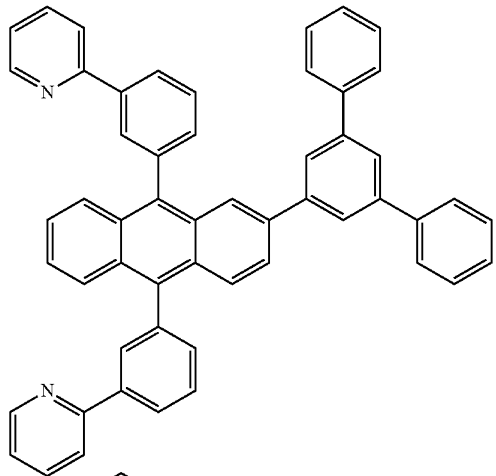
ET9
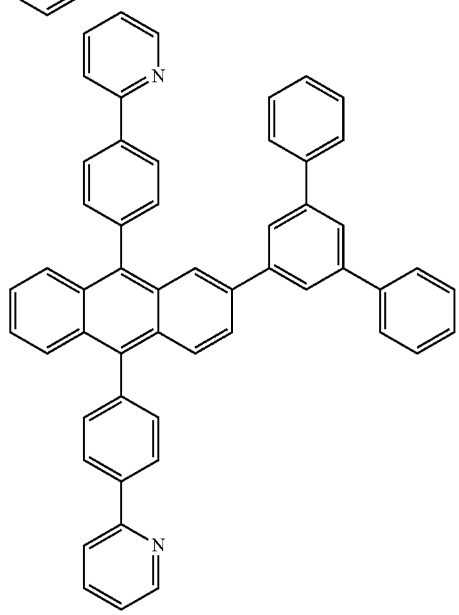
ET10
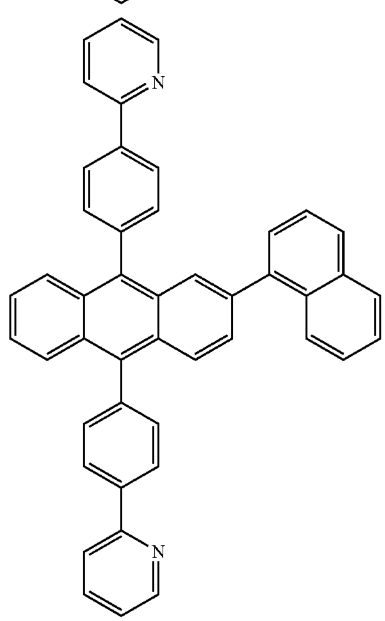

-continued

ET11

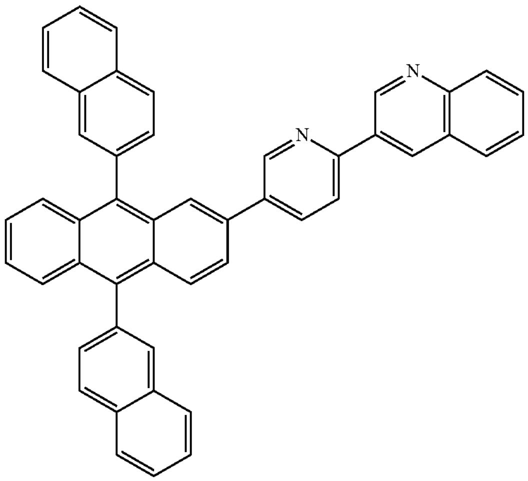

ET12

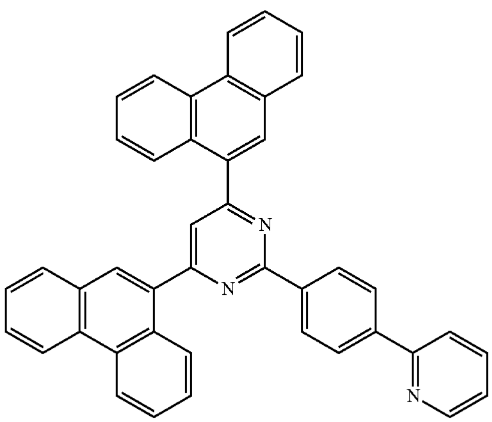

ET13

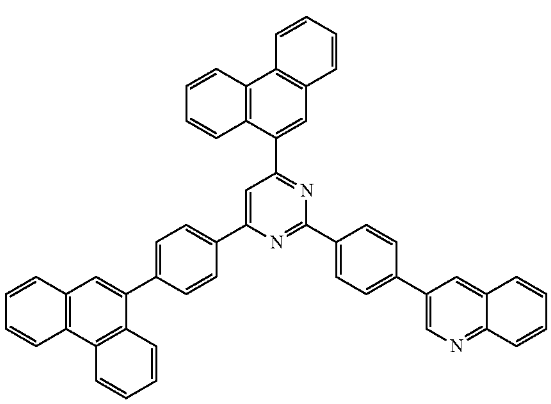

-continued

ET14

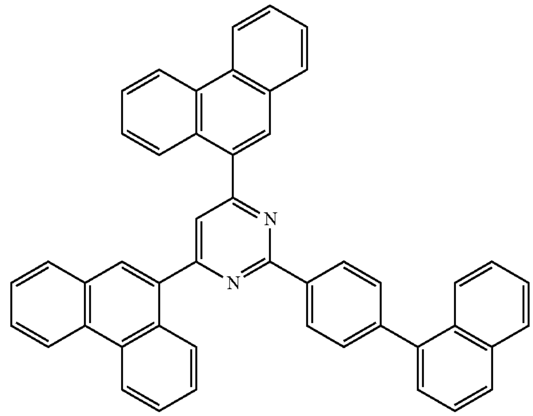

ET15

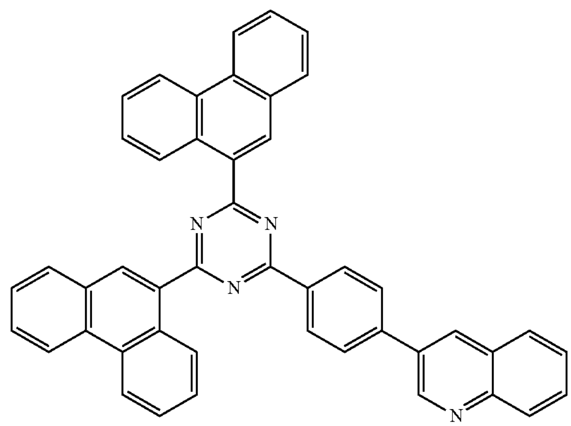

A thickness of the electron transport layer may be in a range of about 100 Å to about 1,000 Å, e.g., about 150 Å to about 500 Å. When the thickness of the electron transport layer is within the ranges described above, the electron transport layer may have satisfactory electron transport characteristics without a substantial increase in driving voltage.

In an implementation, the electron transport layer may further include, in addition to the materials described above, a metal-containing material.

The metal-containing material may include a Li complex. The Li complex may include, e.g., Compound ET-D1 (lithium quinolate, LiQ) or ET-D2.

ET-D1

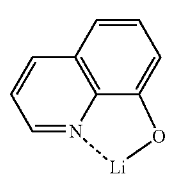

-continued

ET-D2

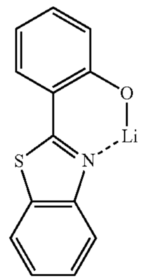

The electron transport region may include an electron injection layer that allows electrons to be easily provided from the second electrode 190.

The electron injection layer may be formed on the electron transport layer by using various methods, e.g., vacuum deposition, spin coating, casting, an LB method, ink-jet printing, laser-printing, or laser-induced thermal imaging (LITI). When an electron injection layer is formed by vacuum deposition or spin coating, deposition and coating conditions for the electron injection layer may be the same as those for the hole injection layer.

The electron injection layer may include at least one selected from, LiF, NaCl, CsF, $Li_2O$, BaO, and LiQ.

A thickness of the electron injection layer may be in a range of about 1 Å to about 100 Å, e.g., about 3 Å to about 90 Å. When the thickness of the electron injection layer is within the ranges described above, the electron injection layer may have satisfactory electron injection characteristics without a substantial increase in driving voltage.

The second electrode 190 may be disposed on the organic layer 150 having the structure described above. The second electrode 190 may be a cathode, which is an electron injection electrode, and in this regard, a material of the second electrode 190 may be selected from metal, an alloy, an electrically conductive compound, and a mixture thereof, which have a relatively low work function. Examples of the material for the second electrode 190 may include lithium (Li), magnesium (Mg), aluminum (Al), aluminum-lithium (Al—Li), calcium (Ca), magnesium-indium (Mg—In), or magnesium-silver (Mg—Ag). In an implementation, the material for forming the second electrode 190 may be ITO or IZO. The second electrode 190 may be a reflective electrode, a semi-transmissive electrode, or a transmissive electrode.

Hereinbefore, the organic light-emitting device 10 has been described with reference to FIG. 1.

A $C_1$-$C_{60}$ alkyl group used herein refers a $C_1$-$C_{60}$ linear or branched aliphatic hydrocarbon monovalent group, and detailed examples thereof include a methyl group, an ethyl group, an n-propyl group, an iso-propyl group, an n-butyl group, an iso-butyl group, a sec-butyl group, a tert-butyl group, a pentyl group, an iso-amyl group, and a hexyl group. As used herein, the $C_1$-$C_{60}$ alkylene group represents a divalent group having the same structure as the $C_1$-$C_{60}$ alkyl group.

A $C_1$-$C_{60}$ alkoxy group used herein refers to a monovalent group having a formula of —$OA_{101}$ (wherein, $A_{101}$ may be the $C_1$-$C_{60}$ alkyl group), and detailed examples thereof include a methoxy group, an ethoxy group, and an isopropyloxy group.

A $C_2$-$C_{60}$ alkenyl group used herein refers to a hydrocarbon group including at least one carbon-carbon double bond in the middle or terminal of the $C_2$-$C_{60}$ alkyl group, and detailed examples thereof include, an ethenyl group, a propenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group having at least one carbon-carbon triple bond in the middle or terminal of the $C_2$-$C_{60}$ alkyl group, and detailed examples thereof are an ethynyl group and a propynyl group. A $C_2$-$C_{60}$ alkenylene group used herein refers to a divalent group having the same structure as the $C_2$-$C_{60}$ alkenyl group.

A $C_3$-$C_{10}$ cycloalkyl group used herein refers to a $C_3$-$C_{10}$ monovalent saturated hydrocarbon monocyclic group, and detailed examples thereof include a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group used herein refers to a monovalent monocyclic group having at least one heteroatom selected from N, O, P, and S as a ring-forming atom and 1 to 10 carbon atoms, and detailed examples thereof are a tetrahydrofuranyl group and a tetrahydrothiophenyl group. A $C_1$-$C_{10}$ heterocycloalkylene group used herein refers to a divalent group having the same structure as the $C_1$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromacity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_1$-$C_{10}$ heterocycloalkenyl group used herein refers to a monovalent monocyclic group having 1 to 10 carbon atoms that has at least one heteroatom selected from N, O, P, and S as a ring-forming atom and at least one double bond in its ring. Detailed examples of the $C_1$-$C_{10}$ heterocycloalkenyl group are a 2,3-hydrofuranyl group and a 2,3-hydrothiophenyl group. A $C_1$-$C_{10}$ heterocycloalkenylene group used herein refers to a divalent group having the same structure as the $C_1$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Detailed examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group used herein refers to a monovalent group having a carboncyclic aromatic system of 1 to 60 carbon atoms that has at least one heteroatom selected from N, O, P, and S as a ring-forming atom. A $C_1$-$C_{60}$ heteroarylene group used herein refers to a divalent group having a carbocyclic aromatic system of 1 to 60 carbon atoms that has at least one hetero atom selected from N, O, P, and S as a ring-forming atom. Detailed examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The $C_6$-$C_{60}$ aryloxy group used herein indicates —$OA_{102}$ (wherein $A_{102}$ is the $C_6$-$C_{60}$ aryl group), and the $C_6$-$C_{60}$ arylthio indicates —$SA_{103}$ (wherein $A_{103}$ is the $C_6$-$C_{60}$ aryl).

A monovalent non-aromatic condensed polycyclic group used herein refers to a monovalent group that has two or more rings condensed to each other, only carbon atoms as a ring forming atom, and non-aromacity in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed with each other, has a heteroatom other than carbon atoms selected from N, O P, and S as a ring forming atom, and has non-aromacity in the entire molecular structure. A detailed example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

The term “Ph” used herein refers to phenyl group, the term “Me” used herein refers to methyl group, the term “Et” used herein refers to ethyl group, and the term “ter-Bu” or “But” used herein refers to tert-butyl.

Hereinafter, an organic light-emitting device according to an embodiment will be described in detail with reference to Synthesis Examples and Examples. In the Synthesis Examples below, a molar equivalent of A is identical to a molar equivalent of B in the expression, “B was used instead of A.”

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis of Compound 9

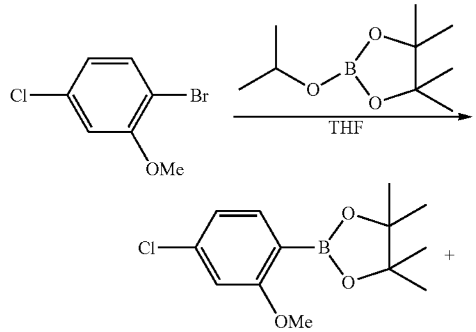

9-1

-continued

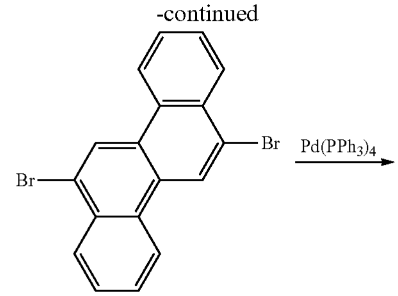

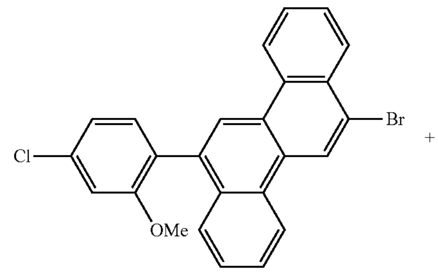

9-2

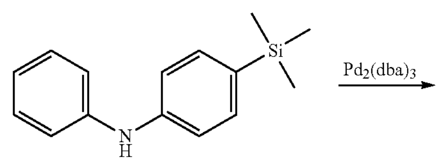

9-A

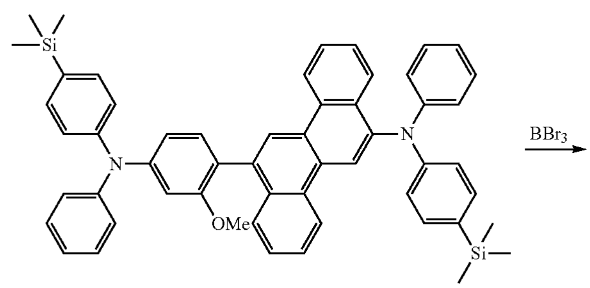

9-3

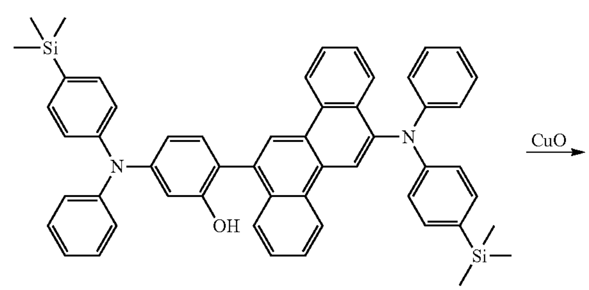

9-4

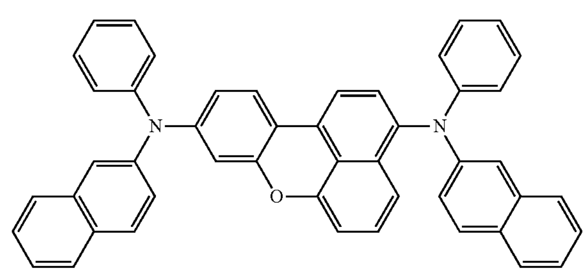

9

Synthesis of Intermediate 9-1

5.2 g (23.6 mmol) of 2-bromo-5-chloroanisol was dissolved in 100 ml of THF, and then, at a temperature of −78° C., 10 mL of n-BuLi (25.0 mmol, 2.5M in Hexane) was slowly added dropwise thereto to prepare a solution. The solution was stirred at the same temperature for an hour, 9.3 mL (50.0 mmol) of 2-isoproxy-4,4,5,5-tetramethyl-1,3,2-dioxaborolane was slowly added thereto in a drop-wise manner to prepare a reaction solution. The reaction solution was stirred at a temperature of −78° C. for an hour, and then stirred again for another 24 hours at ambient temperature. After the reaction was stopped, 50 mL of 10% HCl aqueous solution and 50 mL of $H_2O$ were added thereto, and then, the resultant solution was extracted three times by using 80 mL of diethyl ether. A collected organic layer was dried by using magnesium sulfate, and then, the residues obtained by evaporating a solvent therefrom were separation-purified by silica gel column chromatography to obtain 5.83 g (yield of 92%) of Intermediate 9-1. The obtained compound was identified by LC-MS.

$C_{13}H_{18}BClO_3$: $M^+$ 268.1

Synthesis of Intermediate 9-2

5.90 g (22.0 mmol) of Intermediate 9-1, 16.9 g (44.0 mmol) of 1,4-dibromochrysene, 1.27 g (1.1 mmol) of tetrakis(triphenylphosphine)palladium ($Pd(PPh_3)_4$), and 4.50 g (33 mmol) $K_2CO_3$ were dissolved in 200 mL of a mixture solution of $THF/H_2O$ (2/1 volume ratio), and then stirred for 5 hours at a temperature of 70° C. to prepare a reaction solution. The reaction solution was cooled to ambient temperature, and then, 60 mL of water was added thereto, and an extraction process was performed thereon three times with 60 mL of ethyl ether. A collected organic layer was dried by using magnesium sulfate, and then, the residues obtained by evaporating a solvent therefrom were separation-purified by silica gel column chromatography to obtain 6.30 g (yield of 64%) of Intermediate 9-2. The obtained compound was identified by LC-MS.

$C_{25}H_{16}BrClO$: $M^+$ 446.0

Synthesis of Intermediate 9-3

8.92 g (20.0 mmol) of Intermediate 9-2, 9.65 g (40.0 mmol) of Intermediate 9-A, 0.37 g (0.4 mmol) of $Pd_2(dba)_3$, 0.08 g (0.4 mmol) of $P(t\text{-}Bu)_3$, and 5.76 g (60.0 mmol) of t-BuOK were dissolved in 90 ml of toluene and then stirred at a temperature of 85° C. for 12 hours to prepare a reaction solution. The reaction solution was cooled to ambient temperature, and then extracted three times with 50 mL of water and 50 mL of diethyl ether. A collected organic layer was dried by using magnesium sulfate, and then, the residues obtained by evaporating a solvent therefrom were separation-purified by silica gel column chromatography to obtain 13.5 g (yield of 83%) of Intermediate 9-3. The obtained compound was identified by LC-MS.

$C_{55}H_{52}N_2OSi_2$ $M^+$ 812.4

Synthesis of Intermediate 9-4

1.62 g (2.00 mmol) of Intermediate 9-3 was dissolved in 10 mL of dichloromethane, and then, at a temperature of −78° C., 0.33 mL (3.5 mmol) of $BBr_3$ was slowly added dropwise thereto. The reaction solution was heated to ambient temperature and then stirred for 24 hours at ambient temperature. After the reaction was stopped, 5 mL of MeOH and 10 mL of $H_2O$ were added thereto, and then an extraction process was performed thereon three times by using 10 mL of dichloromethane. A collected organic layer was dried by using magnesium sulfate, and then, the residues obtained by evaporating a solvent therefrom were separation-purified by silica gel column chromatography to obtain 1.20 g (yield of 75%) of Intermediate 9-4. The obtained compound was identified by LC-MS.

$C_{54}H_{50}H_2OSi_2$: $M^+$ 798.3

Synthesis of Compound 9

1.60 g (2.00 mmol) of Intermediate 9-4 was dissolved in 10 mL of DMF, and then, at ambient temperature, 0.48 mL (6.0 mmol) of CuO was slowly dropped thereto. The reaction solution was stirred at a temperature of 140° C. for 48 hours. After the reaction was stopped, 10 mL of $H_2O$ was added to an organic layer collected by using Celite, and then, the organic layer was extracted three times by using 10 mL of ethylacetate. A collected organic layer was dried by using magnesium sulfate, and then, the residues obtained by evaporating a solvent therefrom were separation-purified by silica gel column chromatography to obtain 1.39 g (yield of 87%) of Compound 9. The obtained compound was identified by using $^1H$ NMR ($CDCl_3$, 400 MHz) and MS/FAB.

8.60-8.58 (m, 1H), 8.31-8.29 (m, 1H), 8.20-8.18 (m, 1H), 7.96-7.94 (m, 1H), 7.84-7.74 (m, 5H), 7.65-7.56 (m, 4H), 7.32-7.24 (m, 5H), 6.96-6.94 (m, 1H), 6.90-6.81 (m, 4H), 6.74-6.70 (m, 3H), 6.65-6.60 (m, 2H), 6.51-6.45 (m, 2H), 0.24 (s, 18H)

$C_{54}H_{48}N_2OSi_2$: $M^+$ calc. 796.33 found 796.34

Synthesis Example 2

Synthesis of Compound 1

1-A

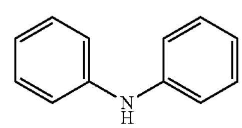

Compound 1 was synthesized in the same manner as in the synthesis of Compound 9, except for using Intermediate 1-A instead of using Intermediate 9-A. The obtained compound was identified by using $^1H$ NMR ($CDCl_3$, 400 MHz) and MS/FAB.

8.23-8.21 (m, 1H), 8.09 (d, 1H), 8.02 (d, 1H), 7.81-7.77 (m, 1H), 7.63-7.48 (m, 5H), 7.12-7.02 (m, 9H), 6.76-6.74 (m, 1H), 6.66-6.61 (m, 4H), 6.50 (dd, 1H), 6.30-6.25 (m, 4H), 6.15-6.10 (m, 4H)

$M^+$ calc. 652.25 found 652.26

Synthesis Example 3

Synthesis of Compound 3

3-A

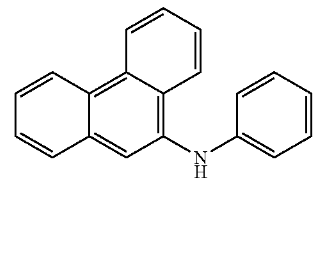

Compound 3 was synthesized in the same manner as in the synthesis of

Compound 9, except for using Intermediate 3-A instead of using Intermediate 9-A. The obtained compound was identified by using $^1$H NMR ($CDCl_3$, 400 MHz) and MS/FAB.

8.62-8.60 (m, 1H), 8.51-8.47 (m, 3H), 8.38 (d, 1H), 8.20-8.16 (m, 2H), 7.97-7.85 (m, 1H), 7.82-7.79 (m, 1H), 7.71-7.49 (m, 14H), 7.43-7.39 (m, 2H), 7.16-7.01 (m, 6H), 6.85-6.77 (m, 4H), 6.66 (dd, 1H), 6.52-6.49 (m, 2H), 6.45-6.41 (m, 2H)

$M^+$ calc. 852.31 found 852.32

Synthesis Example 4

Synthesis of Compound 8

8-A

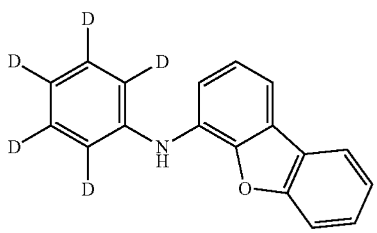

Compound 8 was synthesized in the same manner as in the synthesis of Compound 9, except for using Intermediate 8-A instead of using Intermediate 9-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.94-7.90 (m, 2H), 7.84-7.79 (m, 2H), 7.72-7.67 (m, 3H), 7.63-7.54 (m, 5H), 7.48-7.40 (m, 4H), 7.32-7.30 (m, 1H), 7.23-7.14 (m, 4H), 6.92-6.90 (m, 1H), 6.71 (dd, 1H)

$M^+$ calc. 842.34 found 842.34

Synthesis Example 5

Synthesis of Compound 11

11-A

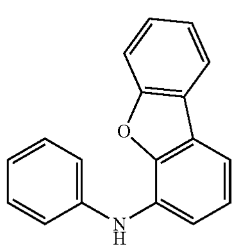

Compound 11 was synthesized in the same manner as in the synthesis of Compound 9, except for using Intermediate 11-A instead of using Intermediate 9-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.94-7.90 (m, 1H), 7.84-7.79 (m, 2H), 7.72-7.68 (m, 3H), 7.63-7.54 (m, 6H), 7.48-7.40 (m, 4H), 7.32-7.14 (m, 9H), 6.92-6.90 (m, 1H), 6.85-6.80 (m, 2H), 6.72 (dd, 1H), 6.56-6.53 (m, 2H), 6.53-6.50 (m, 2H)

$C_{60}H_{36}N_2O_3$: $M^+$ calc. 832.27 found 832.28

Synthesis Example 6

Synthesis of Compound 14

14-A

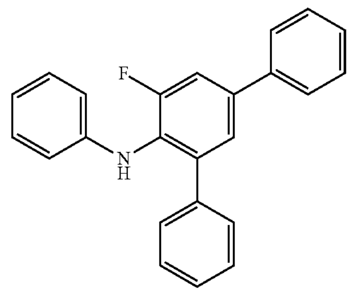

Compound 14 was synthesized in the same manner as in the synthesis of Compound 9, except for using Intermediate 14-A instead of using Intermediate 9-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.92-7.88 (m, 3H), 7.84-7.70 (m, 21H), 7.64-7.60 (m, 4H), 7.34-7.22 (m, 7H), 6.93-6.88 (m, 2H), 6.80-6.78 (m, 1H), 6.67 (dd, 1H), 6.55-6.52 (m, 2H), 6.45-6.42 (m, 2H)

$M^+$ calc. 992.36 found 992.37

Synthesis Example 7

Synthesis of Compound 18

18-A

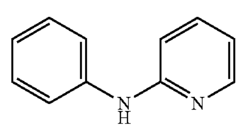

Compound 18 was synthesized in the same manner as in the synthesis of Compound 9, except for using Intermediate 18-A instead of using Intermediate 9-A. The obtained compound was identified by using $^1$H NMR ($CDCl_3$, 400 MHz) and MS/FAB.

8.60-8.58 (m, 1H), 8.47-8.42 (m, 2H), 8.30-8.28 (m, 1H), 8.20-8.15 (m, 2H), 7.94-7.89 (m, 1H), 7.72-7.65 (m, 4H), 7.55-7.50 (m, 2H), 7.38-7.30 (m, 5H), 7.25-7.20 (m, 2H), 7.08-7.05 (m, 1H), 6.99-6.92 (m, 2H), 6.89-6.81 (m, 4H), 6.76 (dd, 1H), 6.67-6.63 (m, 2H)

$M^+$ calc. 654.24 found 654.25

Synthesis Example 8

Synthesis of Compound 21

21-A

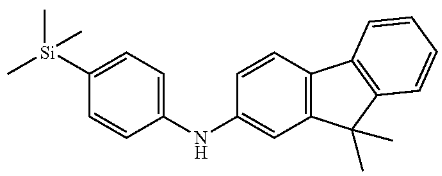

Compound 21 was synthesized in the same manner as in the synthesis of Compound 9, except for using Intermediate 21-A instead of using Intermediate 9-A. The obtained compound was identified by using $^1$H NMR ($CDCl_3$, 400 MHz) and MS/FAB.

8.60-8.58 (m, 1H), 8.30-8.26 (m, 2H), 8.20-8.18 (m, 1H), 7.82-7.76 (m, 3H), 7.68-7.54 (m, 6H), 7.41-7.30 (m, 6H), 7.22-7.16 (m, 5H), 6.99 (dd, 1H), 6.92-6.86 (m, 4H), 6.75-6.65 (m, 5H), 1.61 (m, 12H), 0.21 (m, 18H)

$M^+$ calc. 1028.46 found 1028.46

Synthesis Example 9

Synthesis of Compound 23

23-A

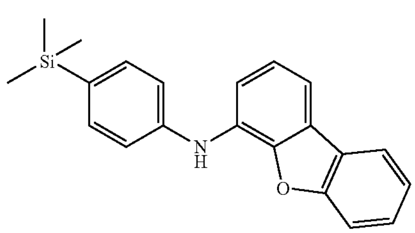

Compound 23 was synthesized in the same manner as in the synthesis of Compound 9, except for using Intermediate 23-A instead of using Intermediate 9-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.94-7.90 (m, 1H), 7.84-7.80 (m, 2H), 7.72-7.66 (m, 3H), 7.61-7.54 (m, 6H), 7.48-7.34 (m, 8H), 7.21 (dd, 1H), 7.13-7.04 (m, 4H), 6.93-6.86 (m, 3H), 6.73-6.70 (m, 3H), 0.24 (m, 18H)

$M^+$ calc. 976.35 found 976.36

Synthesis Example 10

Synthesis of Compound 26

26-A

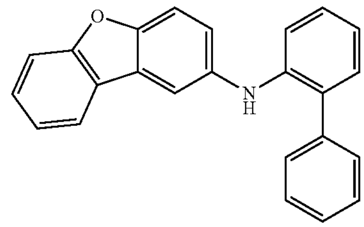

Compound 26 was synthesized in the same manner as in the synthesis of Compound 9, except for using Intermediate 26-A instead of using Intermediate 9-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.84-7.80 (m, 2H), 7.73-7.70 (m, 4H), 7.64-7.40 (m, 22H), 7.32-7.20 (m, 5H), 7.11-7.06 (m, 2H), 6.87-6.81 (m, 3H), 6.73-6.70 (m, 1H), 6.62-6.56 (m, 2H)

$M^+$ calc. 984.34 found 984.35

Synthesis Example 11

Synthesis of Compound 31

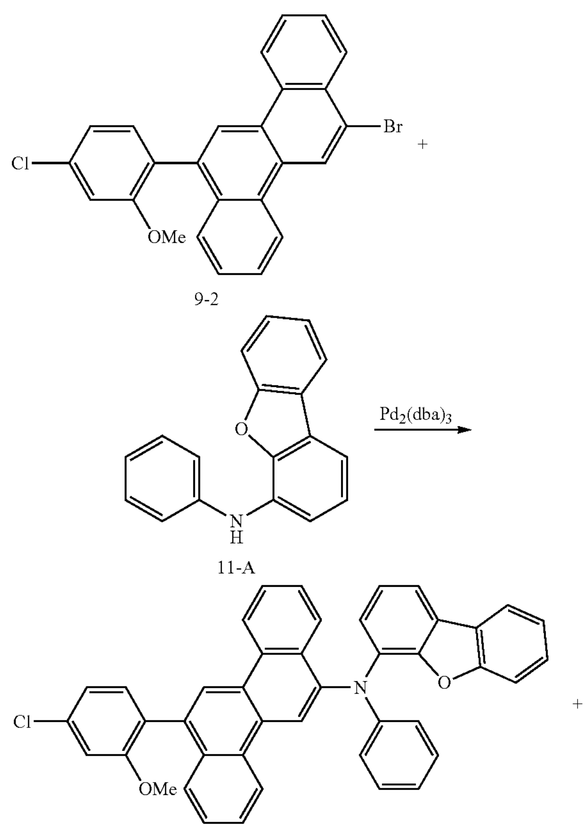

31-3

-continued

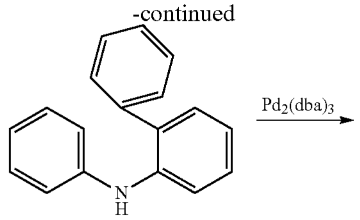

31-A

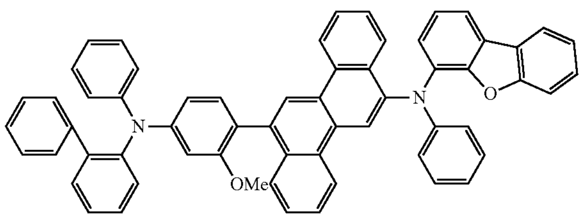

31-4

Compound 31 was synthesized in the same manner as in the synthesis of Compound 9, except for using Intermediate 11-A instead of using Intermediate 9-A in the synthesis of Intermediate 9-3, before using Intermediate 31-A. The obtained compound was identified by using $^1$H NMR ($CDCl_3$, 400 MHz) and MS/FAB.

□8.60-8.58 (m, 1H), 8.31-8.29 (m, 1H), 8.20-8.18 (m, 1H), 7.94-7.90 (m, 1H), 7.84-7.82 (m, 1H), 7.73-7.71 (m, 1H), 7.63-7.40 (m, 13H), 7.21-6.94 (m, 10H), 6.82-6.80 (m, 1H), 6.75-6.71 (m, 3H), 6.51 (dd, 1H), 6.43-6.35 (m, 4H)

$C_{60}H_{38}N_2O_2$: $M^+$ calc. 818.29 found 818.30

Synthesis Example 12

Synthesis of Compound 32

32-A

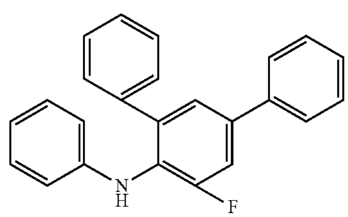

Compound 32 was synthesized in the same manner as in the synthesis of

Compound 9, except for using Intermediate 32-A instead of Intermediate 9-A in the synthesis of Intermediate 9-3, before using Intermediate 31-A. The obtained compound was identified by using $^1$H NMR ($CDCl_3$, 400 MHz) and MS/FAB.

8.60-8.58 (m, 1H), 8.32-8.30 (m, 1H), 8.20-8.18 (m, 1H), 7.72-7.70 (m, 2H), 7.66-7.40 (m, 20H), 7.21-6.96 (m, 9H), 6.92-6.90 (m, 1H), 6.85-6.78 (m, 3H), 6.61 (dd, 1H), 6.49-6.46 (m, 2H), 6.40-6.36 (m, 2H)

$C_{66}H_{43}FN_2O$: $M^+$ calc. 898.34 found 898.35

Synthesis Example 13

Compound 35

Compound 35 was synthesized in the same manner as in the synthesis of Compound 9, except for using Intermediate 11-A instead of Intermediate 9-A in the synthesis of Intermediate 9-3, before using Intermediate 9-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.94-7.90 (m, 1H), 7.84-7.82 (m, 1H), 7.72-7.70 (m, 1H), 7.63-7.52 (m, 6H), 7.48-7.36 (m, 4H), 7.21-7.14 (m, 7H), 6.96-6.94 (m, 1H), 6.90-6.82 (m, 4H), 6.73 (dd, 1H), 6.67-6.62 (m, 2H), 6.53-6.50 (m, 2H), 0.24 (m, 9H)

$M^+$ calc. 814.30 found 814.31

Synthesis Example 14

Synthesis of Compound 38

38-A

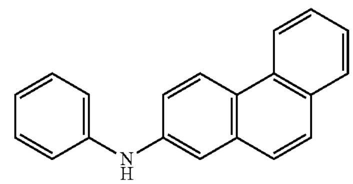

Compound 38 was synthesized in the same manner as in the synthesis of

Compound 9, except for using Intermediate 38-A instead of Intermediate 9-A in the synthesis of Intermediate 9-3, before using Intermediate 9-A. The obtained compound was identified by using $^1$H NMR ($CDCl_3$, 400 MHz) and MS/FAB.

8.60-8.58 (m, 1H), 8.30-8.28 (m, 1H), 8.23-8.21 (m, 1H), 8.20-8.18 (m, 1H), 7.96-7.89 (m, 2H), 7.82-7.80 (m, 1H), 7.72-7.70 (m, 1H), 7.65-7.40 (m, 9H), 7.40-7.36 (m, 2H), 7.22-7.13 (m, 5H), 7.01-6.95 (m, 2H), 6.91-6.81 (m, 4H), 6.73 (dd, 1H), 6.57-6.54 (m, 2H), 6.45-6.41 (m, 2H), 0.24 (m, 9H)

$M^+$ calc. 824.32 found 824.33

Synthesis Example 15

Synthesis of Compound 48

48-A

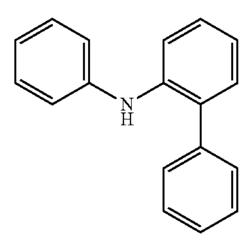

Compound 48 was synthesized in the same manner as in the synthesis of Compound 9, except for using Intermediate 48-A instead of Intermediate 9-A in the synthesis of Intermediate 9-3, before using Intermediate 11-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.84-7.82 (m, 1H), 7.72-7.53 (m, 11H), 7.48-7.40 (m, 4H), 7.28-7.04 (m, 10H), 6.96-6.94 (m, 1H), 6.82-6.80 (m, 1H), 6.75-6.70 (m, 2H), 6.61 (dd, 1H), 6.48-6.44 (m, 2H), 6.27-6.25 (m, 2H)

$M^+$ calc. 818.29 found 818.30

Synthesis Example 16

Synthesis of Compound 49

Compound 49 was synthesized in the same manner as in the synthesis of

Compound 9, except for using Intermediate 14-A instead of Intermediate 9-A in the synthesis of Intermediate 9-3, before using Intermediate 11-A. The obtained compound was identified by using $^1$H NMR ($CDCl_3$, 400 MHz) and MS/FAB.

8.60-8.58 (m, 1H), 8.32-8.30 (m, 1H), 8.20-8.18 (m, 1H), 7.84-7.82 (m, 1H), 7.70-7.40 (m, 21H), 7.22-7.04 (m, 8H), 6.92-6.90 (m, 1H), 6.85-6.78 (m, 2H), 6.70 (dd, 1H), 6.56-6.53 (m, 2H), 6.35-6.32 (m, 2H)

$M^+$ calc. 912.32 found 912.33

Synthesis Example 17

Synthesis of Compound 50

50-A

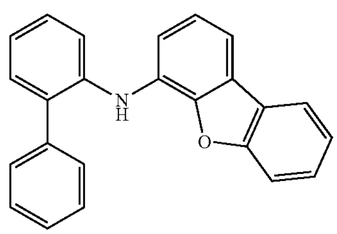

Compound 50 was synthesized in the same manner as in the synthesis of Compound 9, except for using Intermediate 50-A instead of Intermediate 9-A in the synthesis of Intermediate 9-3, before using Intermediate 11-A. The obtained compound was identified by using $^1$H NMR ($CDCl_3$, 400 MHz) and MS/FAB.

8.60-8.58 (m, 1H), 8.32-8.30 (m, 1H), 8.20-8.18 (m, 1H), 7.84-7.75 (m, 3H), 7.72-7.67 (m, 3H), 7.61-7.54 (m, 10H), 7.49-7.40 (m, 5H), 7.29-7.00 (m, 11H), 6.92-6.90 (m, 1H), 6.83 (t, 1H), 6.71 (dd, 1H), 6.66-6.63 (m, 2H)

$M^+$ calc. 908.30 found 908.31

Synthesis Example 18

Synthesis of Compound 57

Compound 57 was synthesized in the same manner as in the synthesis of Compound 9, except for using Intermediate 1-A instead of Intermediate 9-A in the synthesis of Intermediate 9-3, before using Intermediate 50-A. The obtained compound was identified by using $^1$H NMR ($CDCl_3$, 400 MHz) and MS/FAB.

8.60-8.58 (m, 1H), 8.30-8.28 (m, 1H), 8.10-8.08 (m, 1H), 7.84-7.79 (m, 2H), 7.72-7.70 (m, 3H), 7.63-7.54 (m, 9H), 7.49-7.40 (m, 4H), 7.20-6.92 (m, 11H), 6.85-6.81 (m, 2H), 6.74-6.72 (m, 1H), 6.61 (t, 1H), 6.52-6.48 (m, 2H)

$M^+$ calc. 818.29 found 818.30

Synthesis Example 19

Synthesis of Compound 60

Compound 60 was synthesized in the same manner as in the synthesis of Compound 9, except for using Intermediate 48-A instead of Intermediate 9-A in the synthesis of Intermediate 9-3, before using Intermediate 50-A. The obtained compound was identified by using $^1$H NMR ($CDCl_3$, 400 MHz) and MS/FAB.

8.60-8.58 (m, 1H), 8.33-8.29 (m, 1H), 8.10-8.08 (m, 1H), 7.84-7.82 (m, 1H), 7.72-7.70 (m, 1H), 7.65-7.50 (m, 14H), 7.47-7.40 (m, 5H), 7.20-7.10 (m, 5H), 7.05-6.90 (m, 7H), 6.78-6.76 (m, 1H), 6.72 (t, 1H), 6.64-6.62 (m, 1H), 6.41 (dd, 1H), 6.34-6.32 (m, 2H)

$M^+$ calc. 894.32 found 894.33

Synthesis Example 20

Synthesis of Compound 63

Compound 63 was synthesized in the same manner as in the synthesis of Compound 9, except for using Intermediate 38-A instead of Intermediate 9-A in the synthesis of Intermediate 9-3, before using Intermediate 50-A. The obtained compound was identified by using $^1$H NMR ($CDCl_3$, 400 MHz) and MS/FAB.

8.60-8.58 (m, 1H), 8.30-8.28 (m, 1H), 8.23-8.21 (m, 1H), 8.10-8.08 (m, 1H), 7.99-7.89 (m, 2H), 7.84-7.76 (m, 2H), 7.72-7.69 (m, 2H), 7.65-7.40 (m, 17H), 7.30-7.02 (m, 9H), 6.91-6.89 (m, 1H), 6.80 (t, 1H), 6.52-6.48 (m, 2H), 6.40-6.38 (m, 1H), 6.35 (dd, 1H)

$M^+$ calc. 918.32 found 918.33

Synthesis Example 21

Synthesis of Compound 70

Compound 70 was synthesized in the same manner as in the synthesis of Compound 9, except for using Intermediate 14-A instead of Intermediate 9-A in the synthesis of Intermediate 9-3, before using Intermediate 1-A. The obtained compound was identified by using $^1$H NMR ($CDCl_3$, 400 MHz) and MS/FAB.

8.60-8.58 (m, 1H), 8.32-8.30 (m, 1H), 8.22-8.20 (m, 1H), 7.72-7.49 (m, 16H), 7.43-7.40 (m, 1H), 7.32-7.22 (m, 8H), 7.16-7.14 (m, 1H), 7.06-6.98 (m, 3H), 6.82-6.80 (m, 1H), 6.70-6.62 (m, 4H), 6.52-6.48 (m, 2H)

$M^+$ calc. 822.30 found 822.31

Synthesis Example 22

Synthesis of Compound 73

73-A

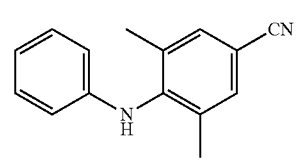

Compound 73 was synthesized in the same manner as in the synthesis of

Compound 9, except for using Intermediate 32-A instead of Intermediate 9-A in the synthesis of Intermediate 9-3 in Synthesis Example 1, before using Intermediate 73-A. The obtained compound was identified by using $^1$H NMR ($CDCl_3$, 400 MHz) and MS/FAB.

8.60-8.58 (m, 1H), 8.32-8.30 (m, 1H), 8.20-8.18 (m, 1H), 7.72-7.49 (m, 16H), 7.43-7.40 (m, 1H), 7.31-7.29 (m, 2H), 7.22-7.20 (m, 6H), 7.13-7.08 (m, 2H), 6.96-6.94 (m, 1H), 6.85 (dd, 1H), 6.72-6.68 (m, 2H), 6.62-6.58 (m, 2H), 2.25 (s, 6H)

$C_{63}H_{42}FN_3O$: $M^+$ calc. 875.33 found 875.34

Synthesis Example 23

Synthesis of Compound 75

75-A

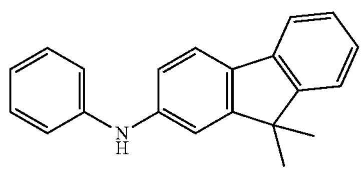

Compound 75 was synthesized in the same manner as in the synthesis of Compound 9, except for using Intermediate 48-A instead of Intermediate 9-A in the synthesis of Intermediate 9-3 in Synthesis Example 1, before using Intermediate 75-A. The obtained compound was identified by using $^1$H NMR ($CDCl_3$, 400 MHz) and MS/FAB.

8.60-8.58 (m, 1H), 8.33-8.30 (m, 1H), 8.20-8.18 (m, 1H), 7.78-7.76 (m, 1H), 7.68-7.52 (m, 10H), 7.47-7.44 (m, 2H), 7.35-7.30 (m, 1H), 7.19-6.98 (m, 10H), 6.87-6.84 (m, 2H), 6.72-6.60 (m, 3H), 6.53-6.51 (m, 2H), 6.44-6.41 (m, 2H), 6.35-6.30 (m, 2H), 1.61 (s, 6H)

$M^+$ calc. 843.35 found 843.35

Synthesis Example 24

Synthesis of Compound 77

Compound 77 was synthesized in the same manner as in the synthesis of Compound 9, except for using Intermediate 11-A instead of Intermediate 9-A in the synthesis of Intermediate 9-3 in Synthesis Example 1, before using Intermediate 75-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 7.94-7.90 (m, 1H), 7.84-7.54 (m, 10H), 7.45-7.40 (m, 2H), 7.35-7.30 (m, 1H), 7.24-7.04 (m, 9H), 6.97 (dd, 1H), 6.91-6.89 (m, 1H), 6.76-6.70 (m, 2H), 6.63-6.61 (m, 2H), 6.43-6.41 (m, 2H), 6.33-6.30 (m, 2H), 1.63 (s, 6H)

$M^+$ calc. 858.32 found 858.33

Synthesis Example 25

Synthesis of Compound 79

79-A

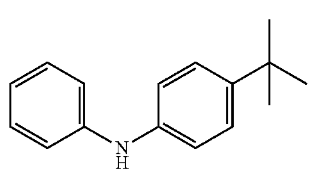

Compound 79 was synthesized in the same manner as in the synthesis of Compound 9, except for using Intermediate 79-A instead of Intermediate 9-A in the synthesis of Intermediate 9-3 in Synthesis Example 1, before using Intermediate 75-A. The obtained compound was identified by using $^1$H NMR ($CDCl_3$, 400 MHz) and MS/FAB.

8.60-8.58 (m, 1H), 8.30-8.28 (m, 1H), 8.20-8.18 (m, 1H), 7.81-7.77 (m, 2H), 7.65 (dd, 1H), 7.63-7.54 (m, 5H), 7.36-7.33 (m, 1H), 7.25-7.21 (m, 2H), 7.14-7.02 (m, 7H), 6.86 (dd, 1H), 6.77-6.75 (m, 1H), 6.65-6.62 (m, 2H), 6.53-6.50 (m, 2H), 6.46-6.42 (m, 2H), 6.33-6.31 (m, 2H), 6.22-6.19 (m, 2H), 1.63 (s, 6H), 1.50 (s, 9H)

$M^+$ calc. 824.38 found 824.39

Synthesis Example 26

Synthesis of Compound 84

84-A

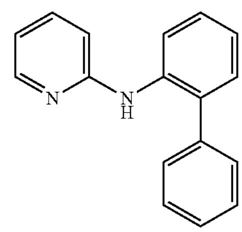

Compound 84 was synthesized in the same manner as in the synthesis of Compound 9, except for using Intermediate 11-A instead of Intermediate 9-A in the synthesis of Intermediate 9-3 in Synthesis Example 1, before using Intermediate 84-A. The obtained compound was identified by using $^1$H NMR ($CDCl_3$, 400 MHz) and MS/FAB.

8.60-8.58 (m, 1H), 8.31-8.29 (m, 1H), 8.20-8.18 (m, 1H), 8.07-8.05 (m, 1H), 7.94-7.92 (m, 1H), 7.84-7.82 (m, 1H), 7.72-7.70 (m, 1H), 7.63-7.40 (m, 14H), 7.31-7.26 (m, 2H), 7.16-6.94 (m, 7H), 6.81-6.75 (m, 2H), 6.63-6.57 (m, 2H), 6.49-6.47 (m, 1H), 6.43-6.40 (m, 2H)

$M^+$ calc. 819.29 found 819.30

Synthesis Example 27

Compound 86

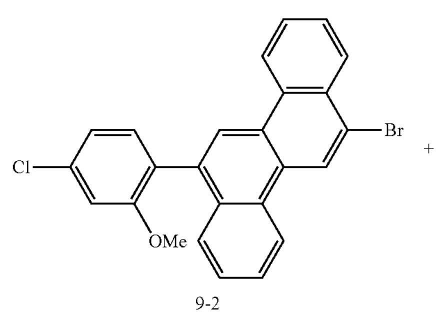

9-2

-continued

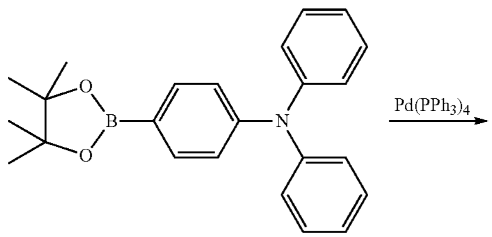

86-A

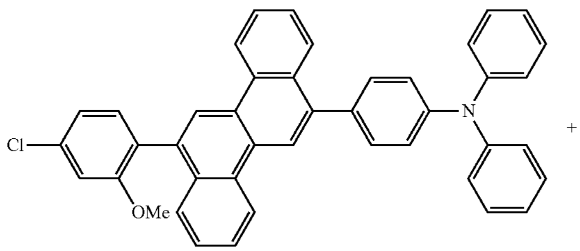

86-1

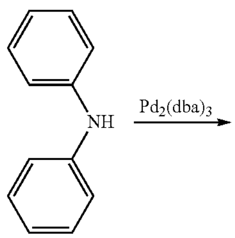

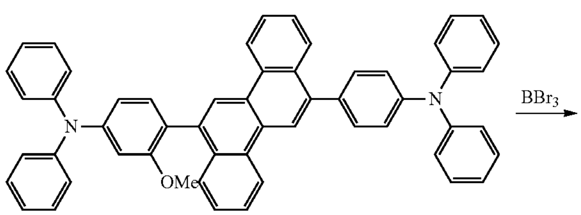

86-2

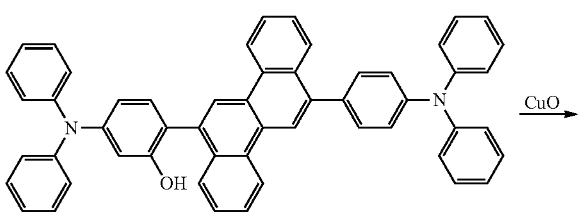

86-3

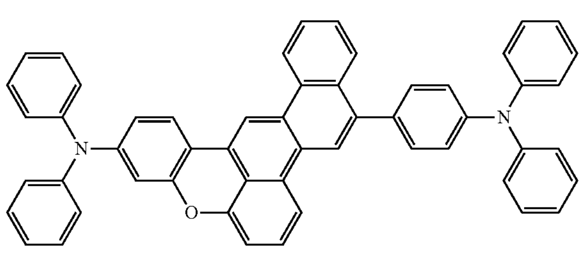

86

Synthesis of Intermediate 86-1

Intermediate 86-1 was synthesized in the same manner as in the synthesis of

Intermediate 9-2 in Synthesis Example 1, except for using Intermediate 86-A instead of Intermediate 9-1 and Intermediate 9-2 instead of dibromonaphthalene. The obtained compound was identified by using LC-MS.

$C_{43}H_{30}ClNO$: $M^+$ 611.2

Synthesis of Intermediate 86-2

Intermediate 86-2 was synthesized in the same manner as in the synthesis of Intermediate 9-3 in Synthesis Example 1, except for using Intermediate 1-A instead of Intermediate 9-A and Intermediate 86-1 instead of Intermediate 9-2. The obtained compound was identified by LC-MS.

$C_{55}H_{40}N_2O$: $M^+$ 744.3

Synthesis of Intermediate 86-3

Intermediate 86-3 was synthesized in the same manner as in the synthesis of Intermediate 9-4 in Synthesis Example 1, except for using Intermediate 86-2 instead of Intermediate 9-3. The obtained compound was identified by LC-MS.

$C_{54}H_{38}N_2O$: $M^+$ 730.3

Synthesis of Compound 86

Compound 86 was synthesized in the same manner as in the synthesis of Compound 9 in Synthesis Example 1, except for using Intermediate 86-3 instead of Intermediate 9-4. The obtained compound was identified by using $^1H$ NMR ($CDCl_3$, 400 MHz) and MS/FAB.

8.60-8.58 (m, 1H), 8.39-8.37 (m, 1H), 8.32-8.30 (m, 1H), 8.26-8.24 (m, 1H), 7.79-7.77 (m, 1H), 7.67-7.56 (m, 3H), 7.53-7.49 (m, 2H), 7.18-7.03 (m, 10H), 6.96-6.93 (m, 2H), 6.86-6.84 (m, 1H), 6.76-6.72 (m, 4H), 6.62-6.59 (m, 1H), 6.50-6.47 (m, 4H), 6.36-6.32 (m, 4H)

$C_{54}H_{36}N_2O$: $M^+$ calc. 728.28 found 728.29

Synthesis Example 28

Synthesis of Compound 92

Compound 92 was synthesized in the same manner as in the synthesis of Compound 86, except for using Intermediate 11-A instead of Intermediate 1-A in the synthesis of Intermediate 86-2 in Synthesis Example 27. The obtained compound was identified by using $^1H$ NMR ($CDCl_3$, 400 MHz) and MS/FAB.

8.60-8.58 (m, 1H), 8.39-8.37 (m, 1H), 8.32-8.30 (m, 1H), 8.26-8.24 (m, 1H), 7.84-7.77 (m, 2H), 7.72-7.62 (m, 4H), 7.53-7.40 (m, 5H), 7.28-7.13 (m, 12H), 6.92-6.90 (m, 1H), 6.85-6.81 (m, 3H), 6.71-6.69 (m, 1H), 6.56-6.52 (m, 2H), 6.40-6.35 (m, 4H)

$M^+$ calc. 818.29 found 818.30

Synthesis Example 29

Synthesis of Compound 94

94-A

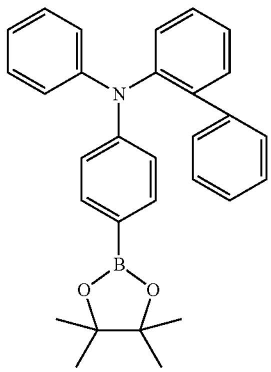

Compound 94 was synthesized in the same manner as in the synthesis of Compound 86, except for using Intermediate 94-A instead of Intermediate 86-A and using Intermediate 11-A instead of Intermediate 1-A. The obtained compound was identified by using $^1$H NMR ($CDCl_3$, 400 MHz) and MS/FAB.

8.60-8.58 (m, 1H), 8.39-8.37 (m, 1H), 8.34-8.32 (m, 1H), 8.26-8.24 (m, 1H), 7.84-7.79 (m, 2H), 7.72-7.40 (m, 14H), 7.30-7.02 (m, 14H), 6.95-6.93 (m, 1H), 6.82-6.79 (m, 2H), 6.69 (dd, 1H), 6.56-6.54 (m, 2H), 6.39-6.37 (m, 2H)

$M^+$ calc. 894.32 found 894.32

Synthesis Example 30

Synthesis of Compound 98

98-A

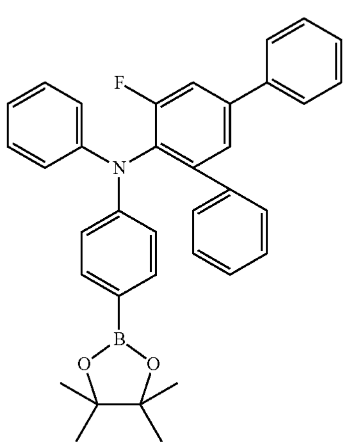

Compound 98 was synthesized in the same manner as in the synthesis of Compound 86, except for using Intermediate 98-A instead of Intermediate 86-A. The obtained compound was identified by using $^1$H NMR ($CDCl_3$, 400 MHz) and MS/FAB.

8.60-8.58 (m, 1H), 8.37-8.35 (m, 1H), 8.24-8.22 (m, 1H), 8.16-8.12 (m, 1H), 7.79-7.77 (m, 1H), 7.72-7.50 (m, 15H), 7.44-7.42 (m, 1H), 7.28-7.14 (m, 9H), 7.10-7.05 (m, 2H), 6.97-6.95 (m, 1H), 6.86-6.82 (m, 3H), 6.72 (dd, 1H), 6.50-6.45 (m, 4H), 6.40-6.41 (m, 2H)

$M^+$ calc. 898.34 found 898.35

Synthesis Example 31

Synthesis of Compound 103

Compound 103 was synthesized in the same manner as in the synthesis of

Compound 86, except for using Intermediate 50-A instead of Intermediate 1-A. The obtained compound was identified by using $^1$H NMR ($CDCl_3$, 400 MHz) and MS/FAB.

8.60-8.58 (m, 1H), 8.39-8.37 (m, 1H), 8.24-8.22 (m, 1H), 8.16-8.12 (m, 1H), 7.84-7.79 (m, 2H), 7.72-7.40 (m, 14H), 7.30-7.02 (m, 14H), 6.88-7.82 (m, 2H), 6.74-6.72 (m, 1H), 6.62 (dd, 1H), 6.54-6.50 (m, 4H)

$M^+$ calc. 894.32 found 894.33

Synthesis Example 32

Compound 107

107-A

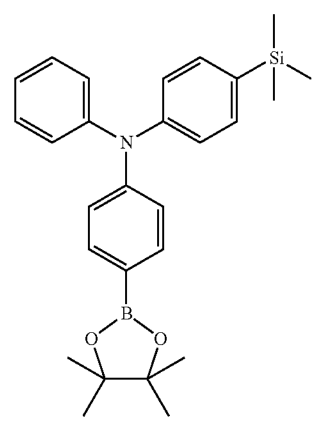

Compound 107 was synthesized in the same manner as in the synthesis of Compound 86, except for using Intermediate 107-A instead of Intermediate 86-A. The obtained compound was identified by using $^1$H NMR ($CDCl_3$, 400 MHz) and MS/FAB.

8.60-8.58 (m, 1H), 8.39-8.37 (m, 1H), 8.24-8.22 (m, 1H), 8.16-8.14 (m, 1H), 7.79-7.77 (m, 1H), 7.67-7.56 (m, 3H), 7.53-7.49 (m, 2H), 7.40-7.36 (m, 2H), 7.29-7.13 (m, 7H), 7.06-7.02 (m, 2H), 6.96-6.94 (m, 1H), 6.84-6.75 (m, 4H), 6.66-6.59 (m, 3H), 6.40-6.34 (m, 4H), 6.30-6.26 (m, 2H), 0.25 (m, 9H)

$M^+$ calc. 800.32 found 800.33

Synthesis Example 33

Synthesis of Compound 113

113-A

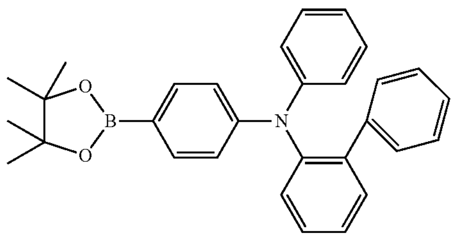

Compound 113 was synthesized in the same manner as in the synthesis of Compound 86, except for using Intermediate 113-A instead of Intermediate 86-A and using Intermediate 31-A instead of Intermediate 1-A. The obtained compound was identified by using $^1$H NMR ($CDCl_3$, 400 MHz) and MS/FAB.

8.60-8.58 (m, 1H), 8.39-8.37 (m, 1H), 8.24-8.22 (m, 1H), 8.16-8.14 (m, 1H), 7.79-7.77 (m, 1H), 7.67-7.44 (m, 15H), 7.31-7.09 (m, 14H), 6.95-6.90 (m, 2H), 6.85-6.80 (m, 3H), 6.71 (dd, 1H), 6.58-6.54 (m, 2H), 6.50-6.46 (m, 2H)

$C_{54}H_{36}N_2O$: $M^+$ calc. 880.35 found 880.36

Synthesis Example 34

Synthesis of Compound 121

121-A

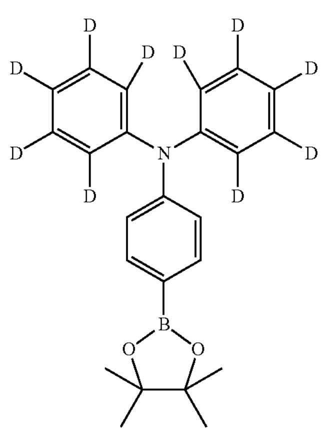

121-B

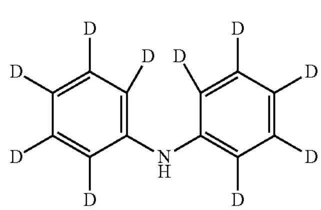

Compound 121 was synthesized in the same manner as in the synthesis of Compound 86, except for using Intermediate 121-A instead of Intermediate 86-A and using Intermediate 121-B instead of Intermediate 1-A. The obtained compound was identified by using $^1$H NMR ($CDCl_3$, 400 MHz) and MS/FAB.

8.60-8.58 (m, 1H), 8.39-8.37 (m, 1H), 8.24-8.22 (m, 1H), 8.16-8.14 (m, 1H), 7.79-7.77 (m, 1H), 7.67-7.58 (m, 3H), 7.53-7.49 (m, 2H), 7.38-7.30 (m, 2H), 7.17-7.13 (m, 2H), 6.99-6.97 (m, 1H), 6.82-6.80 (m, 1H)

$M^+$ calc. 748.31 found 748.31

Synthesis Example 35

Synthesis of Compound 124

17-A

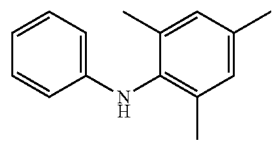

124-A

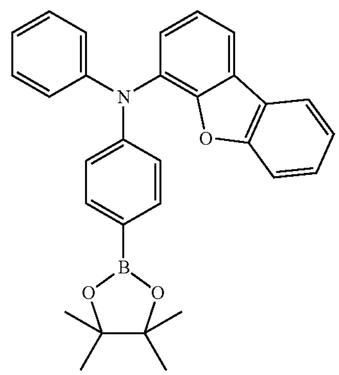

Compound 124 was synthesized in the same manner as in the synthesis of

Compound 86, except for using Intermediate 124-A instead of Intermediate 86-A and using Intermediate 17-A instead of Intermediate 1-A. The obtained compound was identified by using $^1$H NMR ($CDCl_3$, 400 MHz) and MS/FAB.

8.60-8.58 (m, 1H), 8.39-8.37 (m, 1H), 8.24-8.22 (m, 1H), 8.16-8.14 (m, 1H), 7.84-7.40 (m, 11H), 7.28-7.08 (m, 9H), 6.90-6.88 (m, 1H), 6.85-6.80 (m, 2H), 6.66-6.62 (m, 3H), 6.42 (dd, 1H), 6.35-6.32 (m, 2H), 6.25-6.22 (m, 2H), 2.28 (s, 3H), 2.26 (s, 6H)

$M^+$ calc. 860.34 found 860.35

Synthesis Example 36

Synthesis of Compound 141

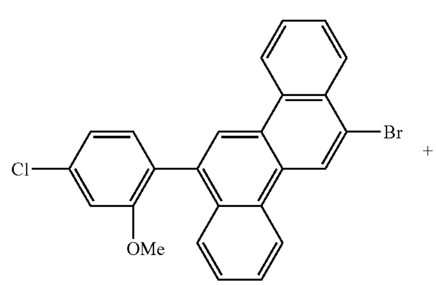

9-2

-continued

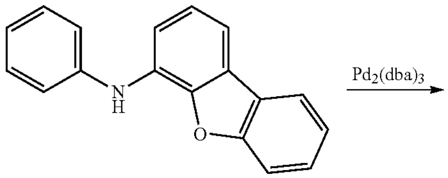

35-A

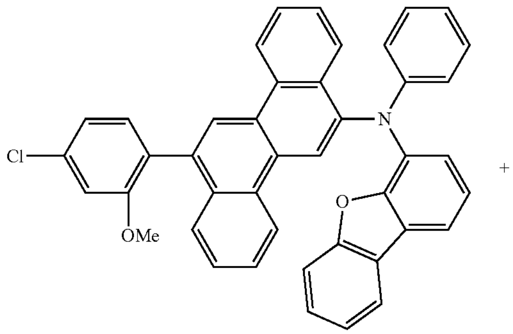

141-1

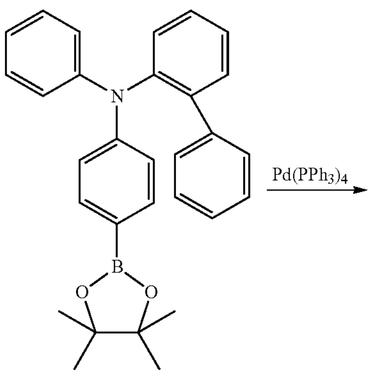

94-A

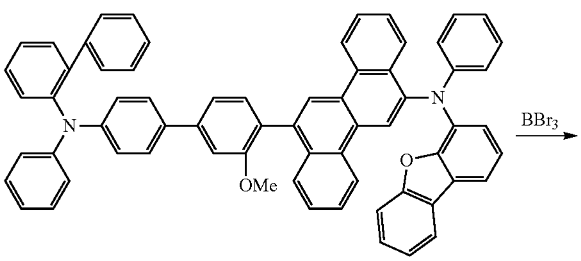

141-2

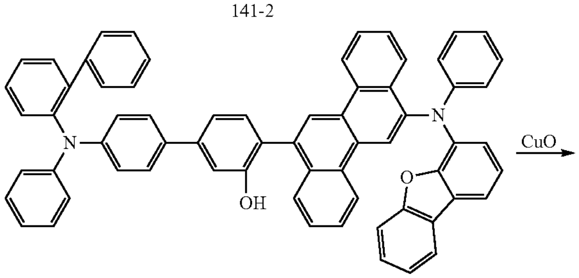

141-3

-continued

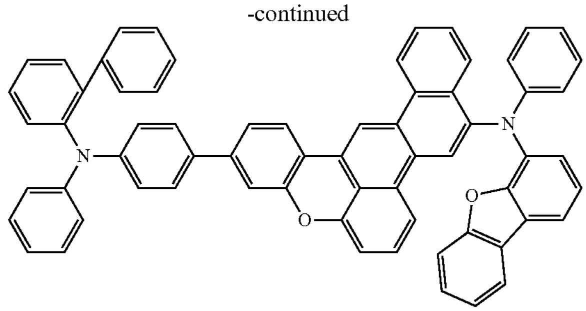

141

Synthesis of Intermediate 141-1

Intermediate 141-1 was synthesized in the same manner as in the synthesis of Intermediate 9-3, except for using Intermediate 35-A instead of Intermediate 9-A in the synthesis of Intermediate 9-3 in Synthesis Example 1. The obtained compound was identified by using LC-MS.

$C_{42}H_{24}ClNO_2$: M+ 609.2

Synthesis of Intermediate 141-2

Intermediate 141-2 was synthesized in the same manner as in the synthesis of Intermediate 9-2, except for using Intermediate 94-A instead of Intermediate 9-1 and using Intermediate 141-1 instead of 6,12-dibromochrysene in the synthesis of Intermediate 9-2 in Synthesis Example 1. The obtained compound was identified by using $^1$H NMR ($CDCl_3$, 400 MHz) and MS/FAB.

C67H46N2O2: M+ 910.3

Synthesis of Intermediate 141-3

Intermediate 141-3 was synthesized in the same manner as in the synthesis of Intermediate 9-4, except for using Intermediate 141-2 instead of Intermediate 9-3 in the synthesis of Intermediate 9-4 in Synthesis Example 1. The obtained compound was identified by using LC-MS.

C66H44$N_2O_2$: M+ 896.3

Synthesis of Compound 141

Compound 141 was synthesized in the same manner as in the synthesis of Compound 9, except for using Intermediate 141-3 instead of Intermediate 9-4 in the synthesis of Compound 9 in Synthesis Example 1. The obtained compound was identified by using $^1$H NMR ($CDCl_3$, 400 MHz) and MS/FAB.

□8.65-8.62 (m, 1H), 8.39-8.37 (m, 1H), 8.20-8.18 (m, 1H), 8.01-7.90 (m, 2H), 7.84-7.82 (m, 1H), 7.72-7.70 (m, 1H), 7.63-7.48 (m, 16H), 7.30-7.26 (m, 2H), 7.16-7.04 (m, 8H), 6.95-6.92 (m, 1H), 6.85-6.80 (m, 2H), 6.67-6.62 (m, 2H), 6.53-6.49 (m, 2H), 6.37-6.34 (m, 2H)

M+ calc. 894.32 found 894.33

Synthesis Example 37

Synthesis of Compound 154

154-A

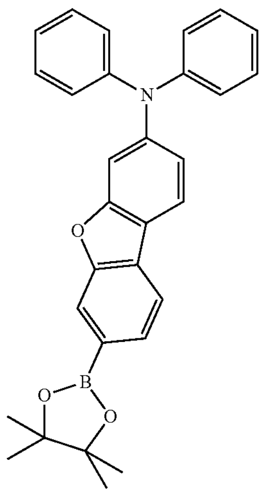

Compound 154 was synthesized in the same manner as in the synthesis of Compound 86, except for using Intermediate 154-A instead of Intermediate 86-A. The obtained compound was identified by using $^1$H NMR ($CDCl_3$, 400 MHz) and MS/FAB.

8.66-8.64 (m, 1H), 8.36-8.34 (m, 1H), 8.24-8.22 (m, 1H), 8.12-8.02 (m, 2H), 7.97-7.90 (m, 2H), 7.80-7.78 (m, 1H), 7.66-7.56 (m, 4H), 7.45-7.41 (m, 1H), 7.32-7.24 (m, 9H), 7.13-7.11 (m, 1H), 6.97 (dd, 1H), 6.87-6.85 (m, 1H), 6.76-6.72 (m, 4H), 6.63 (dd, 1H), 6.50-6.42 (m, 8H)

$M^+$ calc. 818.29 found 818.30

Synthesis Example 38

Synthesis of Compound 156

156-A

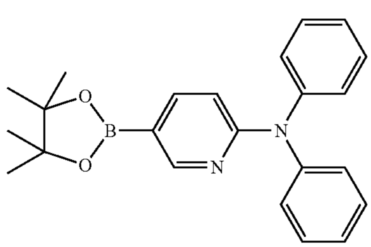

Compound 156 was synthesized in the same manner as in the synthesis of Compound 86, except for using Intermediate 156-A instead of Intermediate 86-A. The obtained compound was identified by using $^1$H NMR ($CDCl_3$, 400 MHz) and MS/FAB.

8.66-8.64 (m, 1H), 8.32-8.30 (m, 1H), 8.15-8.13 (m, 1H), 8.06-8.04 (m, 1H), 7.94-7.91 (m, 1H), 7.88 (dd, 1H), 7.82-7.80 (m, 1H), 7.67-7.56 (m, 3H), 7.40-7.30 (m, 5H), 7.22-7.14 (m, 5H), 7.05-6.95 (m, 3H), 6.87-6.85 (m, 1H), 6.78-6.59 (m, 7H), 6.40-6.35 (m, 4H)

$C_{53}H_{35}N_3O$: $M^+$ calc. 729.28 found 729.29

Synthesis Example 39

Synthesis of Compound 157

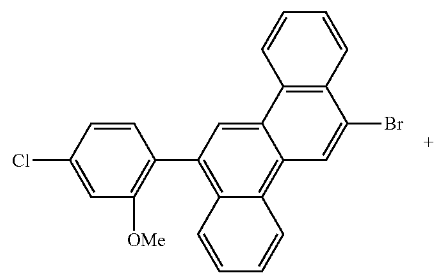

9-2

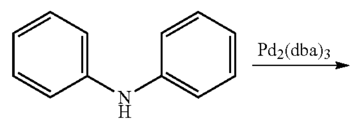

1-A

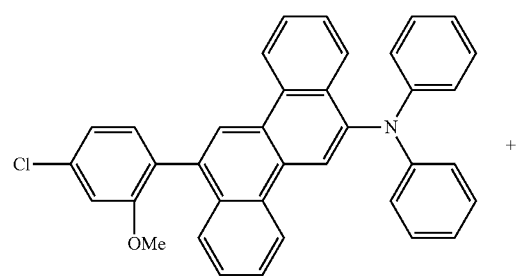

157-1

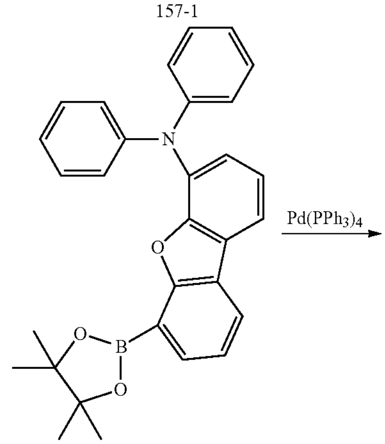

157-A

-continued

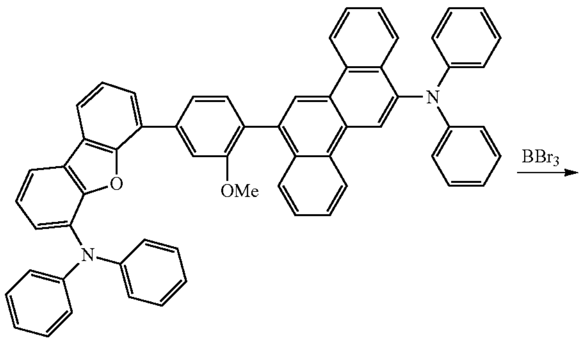

157-2

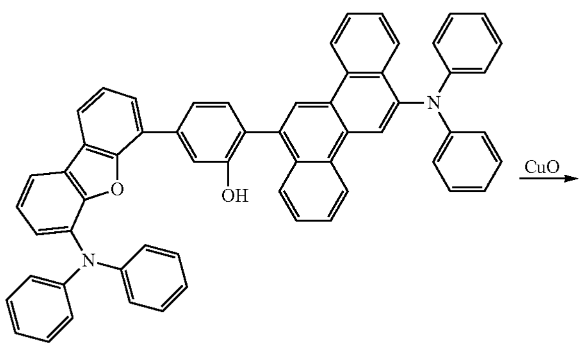

157-3

-continued

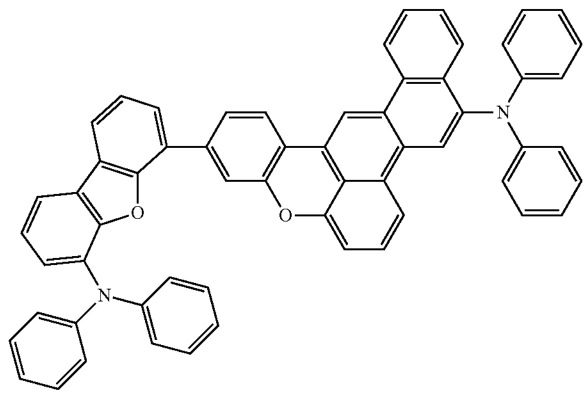

157

Compound 157 was synthesized in the same manner as in the synthesis of Compound 141, except for using Intermediate 1-A instead of Intermediate 35-A and using Intermediate 157-A instead of Intermediate 94-A. The obtained compound was identified by using $^1$H NMR ($CDCl_3$, 400 MHz) and MS/FAB.

8.60-8.58 (m, 1H), 8.30-8.28 (m, 1H), 8.20-8.18 (m, 1H), 7.97-7.86 (m, 2H), 7.82-7.78 (m, 2H), 7.65-7.54 (m, 5H), 7.48-7.44 (m, 2H), 7.35 (t, 1H), 7.26-7.19 (m, 10H), 7.08 (t, 1H), 6.85-6.81 (m, 4H), 6.70-6.62 (m, 4H), 6.52-6.46 (m, 4H)

$M^+$ calc. 818.29 found 818.29

Synthesis Example 40

Synthesis of Compound 160

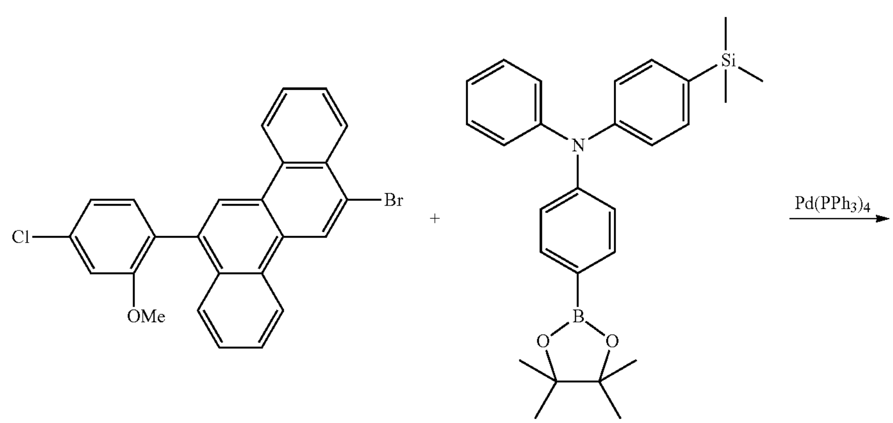

9-2

107-A

-continued

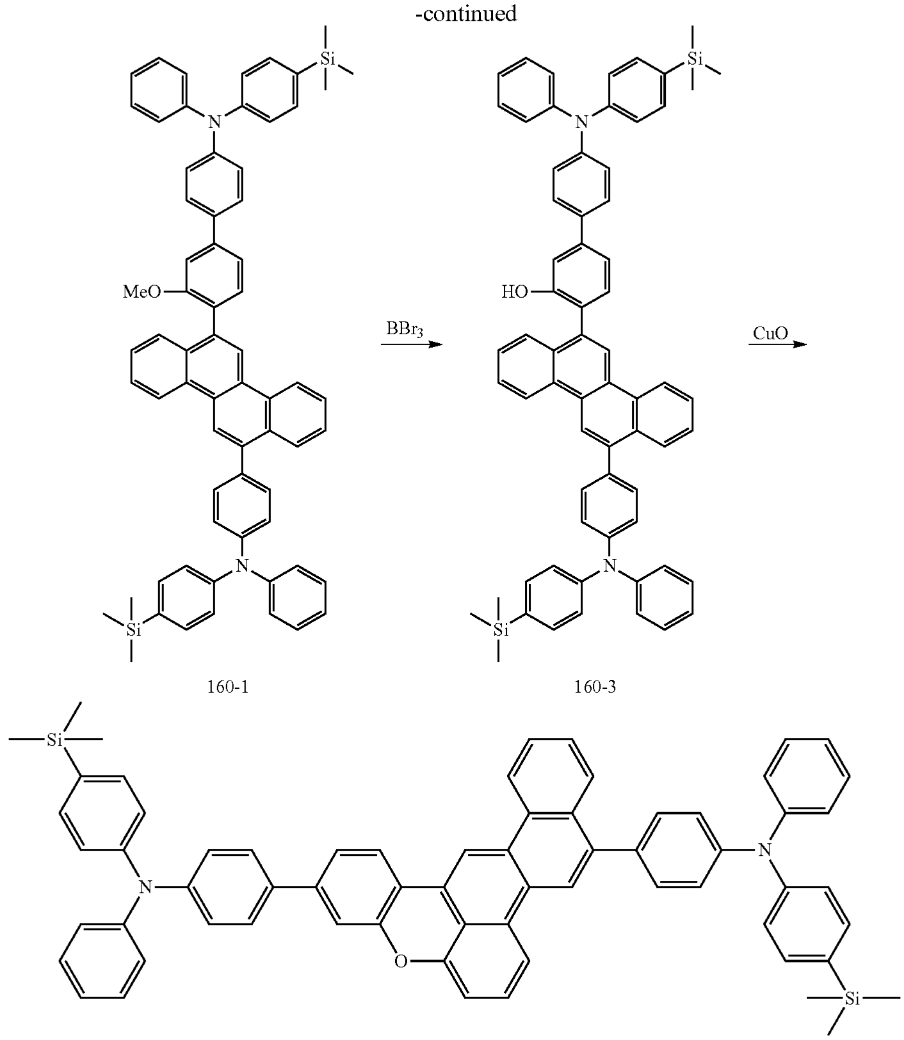

160-1 160-3

160

Intermediate 160-1 was synthesized in the same manner as in the synthesis of Intermediate 9-2, except for using Intermediate 107-A instead of Intermediate 9-1 and using Intermediate 9-2 instead of 6,12-dibromochrysene in the synthesis of Intermediate 9-2 in Synthesis Example 1. The obtained compound was identified by using LC-MS.

$C_{67}H_{60}N_2OSi_2$: $M^+$ 964.4

Synthesis of Intermediate 160-3

Intermediate 160-3 was synthesized in the same manner as in the synthesis of Intermediate 9-4, except for using Intermediate 160-1 instead of Intermediate 9-3 in the synthesis of Intermediate 9-4 in Synthesis Example 1. The obtained compound was identified by LC-MS.

$C_{66}H_{58}N_2OSi_2$: $M^+$ 950.4

Synthesis of Compound 160

Compound 160 was synthesized in the same manner as in the synthesis of Compound 9, except for using Intermediate 160-3 instead of Intermediate 9-4 in the synthesis of Compound 9 in Synthesis Example 1. The obtained compound was identified by using $^1H$ NMR ($CDCl_3$, 400 MHz) and MS/FAB.

8.56-8.54 (m, 1H), 8.39-8.37 (m, 1H), 8.24-8.22 (m, 1H), 8.16-8.14 (m, 1H), 8.01-7.99 (m, 1H), 7.89-7.87 (m, 1H), 7.77-7.72 (m, 2H), 7.66-7.59 (m, 4H), 7.52-7.45 (m, 6H), 7.38-7.35 (m, 1H), 7.27-7.05 (m, 9H), 6.85-6.82 (m, 2H), 6.76-6.65 (m, 4H), 6.52-6.46 (m, 4H), 0.24 (s, 18H)

$M^+$ calc. 948.39 found 948.40

Example 1

An ITO glass substrate (a product of Corning Co., Ltd) having a thickness of 1,200 Å was cut into a size of 50 mm×50 mm×0.7 mm, which was then sonicated by using isopropyl alcohol and pure water for 5 minutes each, irradiated with ultraviolet rays for 30 minutes, and then exposed to ozone. Then, the ITO glass substrate was mounted on a vacuum deposition apparatus to manufacture an anode.

2-TNATA was deposited on the anode to form a hole injection layer having a thickness of 600 Å, then NPB was deposited thereon to form a hole transport layer. Then, H-4 and Compound 11 were co-deposited thereon in a weight ratio of 98:2 to form an emission layer having a thickness of 300 Å.

$Alq_3$ was deposited on the emission layer to form an electron transport layer having a thickness of 300 Å. LiF was vacuum-deposited on the electron transport layer to form an electron injection layer having a thickness of 10 Å, and then, Al was vacuum-deposited thereon to form a cathode having a thickness of 3,000 Å to complete the manufacturing of an organic light-emitting device.

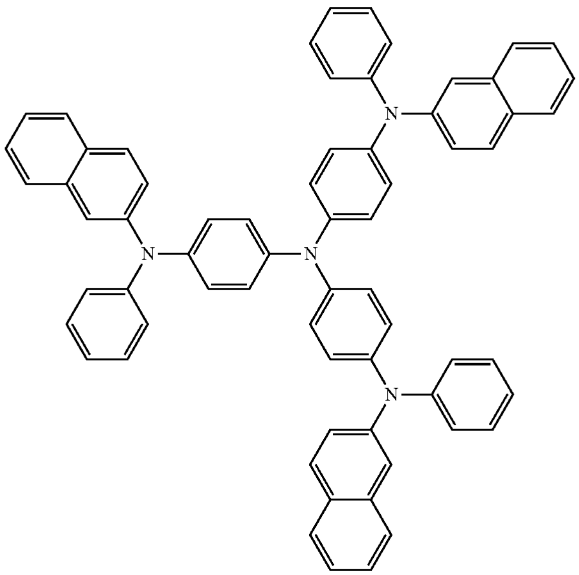

2-TNATA

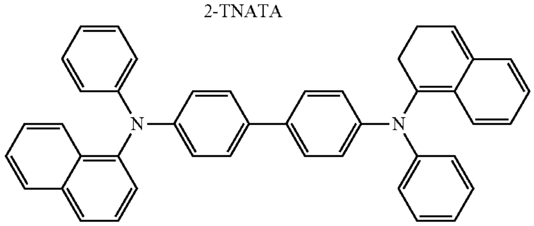

NPB

Example 2

An organic light-emitting device was manufactured in the same manner as in Example 1, except for using Compound 17 instead of Compound 11 to form an emission layer.

Example 3

An organic light-emitting device was manufactured in the same manner as in Example 1, except for using Compound 48 instead of Compound 11 to form an emission layer.

Example 4

An organic light-emitting device was manufactured in the same manner as in Example 1, except for using Compound H-11 instead of Compound H-4 and using Compound 58 instead of Compound 11 to form an emission layer.

Example 5

An organic light-emitting device was manufactured in the same manner as in Example 1, except for using Compound H-11 instead of Compound H-4 and using Compound 60 instead of Compound 11 to form an emission layer.

Example 6

An organic light-emitting device was manufactured in the same manner as in Example 1, except for using Compound H-11 instead of Compound H-4 and using Compound 141 instead of Compound 11 to form an emission layer.

Example 7

An organic light-emitting device was manufactured in the same manner as in Example 1, except for using Compound H-17 instead of Compound H-4 and using Compound 9 instead of Compound 11 to form an emission layer.

Example 8

An organic light-emitting device was manufactured in the same manner as in Example 1, except for using Compound H-17 instead of Compound H-4 and using Compound 67 instead of Compound 11 to form an emission layer.

Example 9

An organic light-emitting device was manufactured in the same manner as in Example 1, except for using Compound H-36 instead of Compound H-4 and using Compound 55 instead of Compound 11 to form an emission layer.

Example 10

An organic light-emitting device was manufactured in the same manner as in Example 1, except for using Compound H-52 instead of Compound H-4 and using Compound 8 instead of Compound 11 to form an emission layer.

Example 11

An organic light-emitting device was manufactured in the same manner as in Example 1, except for using Compound H-52 instead of Compound H-4 and using Compound 151 instead of Compound 11 to form an emission layer.

Example 12

An organic light-emitting device was manufactured in the same manner as in Example 1, except for using Compound H-57 instead of Compound H-4 and using Compound 31 instead of Compound 11 to form an emission layer.

Example 13

An organic light-emitting device was manufactured in the same manner as in Example 1, except for using Compound H-57 instead of Compound H-4 and using Compound 50 instead of Compound 11 to form an emission layer.

Example 14

An organic light-emitting device was manufactured in the same manner as in Example 1, except for using Compound H-57 instead of Compound H-4 and using Compound 66 instead of Compound 11 to form an emission layer.

Comparative Example 1

An organic light-emitting device was manufactured in the same manner as in Example 1, except that to form an emission layer, ADN was used instead of Compound H-4 and TPD was used instead of Compound 11.

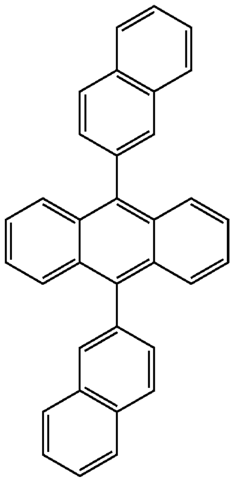

ADN

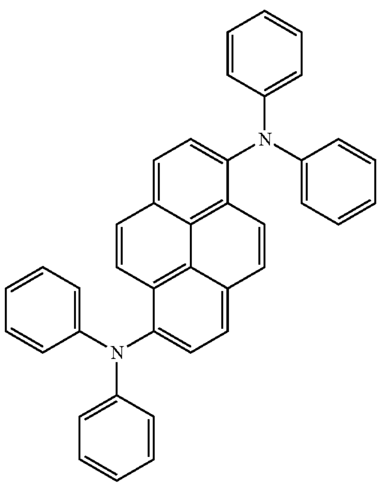

TPD

Comparative Example 2

An organic light-emitting device was manufactured in the same manner as in Example 1, except that to form an emission layer, Compound A-1 was used instead of Compound H-4 and Compound B-1 was used instead of Compound 11.

A-1

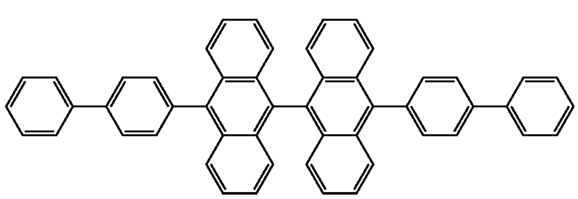

-continued

B-1

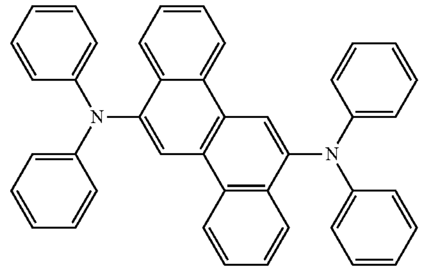

Comparative Example 3

An organic light-emitting device was manufactured in the same manner as in Example 1, except that to form an emission layer, Compound A-2 was used instead of Compound H-4 and Compound B-1 was used instead of Compound 11.

A-2

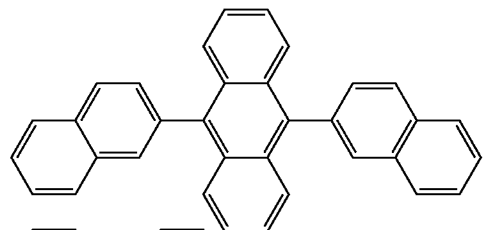

B-1

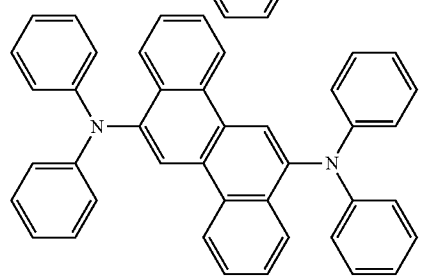

Comparative Example 4

An organic light-emitting device was manufactured in the same manner as in Example 1, except that to form an emission layer, Compound A-3 was used instead of Compound H-4 and Compound B-1 was used instead of Compound 11.

A-3

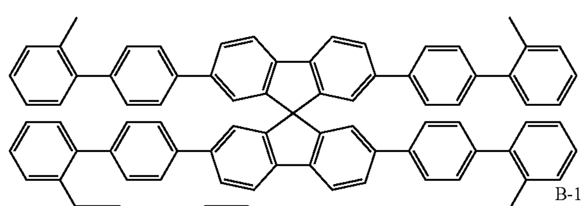

B-1

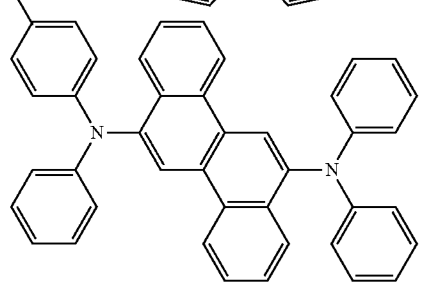

Comparative Example 5

An organic light-emitting device was manufactured in the same manner as in Example 1, except that to form an emission layer, Compound A-4 was used instead of Compound H-4 and Compound B-2 was used instead of Compound 11.

A-4

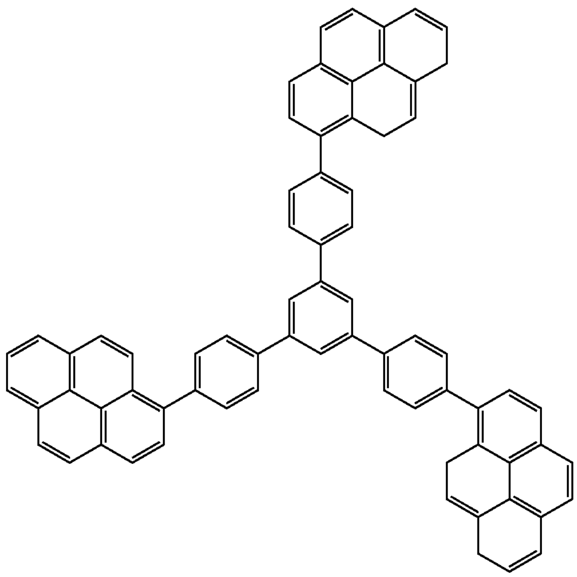

-continued

B-2

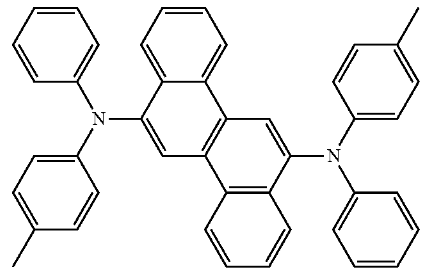

Evaluation Example 1

The driving voltage, current density, brightness, efficiency, and half-lifespan of the organic light-emitting devices manufactured according to Examples 1 to 14, and Comparative Examples 1 and 5 were measured by using Kethley SMU 236 and a brightness photometer PR650, and results thereof are shown in Table 1 below. The half-lifespan is a period of time that is taken until the brightness of the organic light-emitting device becomes 50% of the initial brightness.

TABLE 1

| | First material | Second material | Driving voltage (V) | Current density (mA/cm$^2$) | Brightness (cd/m$^2$) | Efficiency (cd/A) | Emission color | Half lifespan (time @100 mA/cm$^2$) |
|---|---|---|---|---|---|---|---|---|
| Example 1 | Compound H-4 | Compound 11 | 5.84 | 50 | 3,690 | 7.38 | Blue | 395 |
| Example 2 | Compound H-4 | Compound 17 | 5.82 | 50 | 3,240 | 6.48 | Blue | 342 |
| Example 3 | Compound H-4 | Compound 48 | 5.84 | 50 | 3,580 | 7.16 | Blue | 345 |
| Example 4 | Compound H-11 | Compound 58 | 5.80 | 50 | 3,620 | 7.24 | Blue | 382 |
| Example 5 | Compound H-11 | Compound 60 | 5.80 | 50 | 3,555 | 7.11 | Blue | 362 |
| Example 6 | Compound H-11 | Compound 141 | 5.80 | 50 | 3,750 | 7.50 | Blue | 315 |
| Example 7 | Compound H-17 | Compound 9 | 5.75 | 50 | 3,820 | 7.64 | Blue | 390 |
| Example 8 | Compound H-17 | Compound 67 | 5.75 | 50 | 3,760 | 7.52 | Blue | 395 |
| Example 9 | Compound H-36 | Compound 55 | 5.90 | 50 | 3,720 | 7.44 | Blue | 352 |
| Example 10 | Compound H-52 | Compound 8 | 5.99 | 50 | 3,750 | 7.50 | Blue | 366 |
| Example 11 | Compound H-52 | Compound 151 | 5.99 | 50 | 3,780 | 7.56 | Blue | 362 |
| Example 12 | Compound H-57 | Compound 31 | 5.86 | 50 | 3,920 | 7.84 | Blue | 380 |
| Example 13 | Compound H-57 | Compound 50 | 5.86 | 50 | 3,950 | 7.90 | Blue | 372 |
| Example 14 | Compound H-57 | Compound 66 | 5.84 | 50 | 3,620 | 7.24 | Blue | 376 |
| Comparative Example 1 | ADN | TPD | 6.96 | 50 | 2,730 | 5.46 | Blue | 248 |
| Comparative Example 2 | Compound A-1 | Compound B-1 | 6.74 | 50 | 2,890 | 5.78 | Blue | 310 |
| Comparative Example 3 | Compound A-2 | Compound B-1 | 6.88 | 50 | 2,910 | 5.82 | Blue | 245 |
| Comparative Example 4 | Compound A-3 | Compound B-1 | 6.90 | 50 | 2,815 | 5.63 | Blue | 251 |
| Comparative Example 5 | Compound A-4 | Compound B-2 | 6.91 | 50 | 2,725 | 5.45 | Blue | 230 |

As may be seen in Table 1, the organic light-emitting devices manufactured in Examples 1 to 14 exhibited superior characteristics, compared to the organic light-emitting devices manufactured in Comparative Examples 1 to 5.

An organic light-emitting device according to an embodiment may show characteristics such as low driving voltage, high luminance, high efficiency, high color purity, and a long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:

a first electrode;

a second electrode; and an organic layer between the first electrode and the second electrode, the organic layer including an emission layer, wherein the emission layer includes:

a first compound represented by the following Formula 1, and a second compound represented by one of the following Formulae 2-1 to 2-4:

<Formula 1>

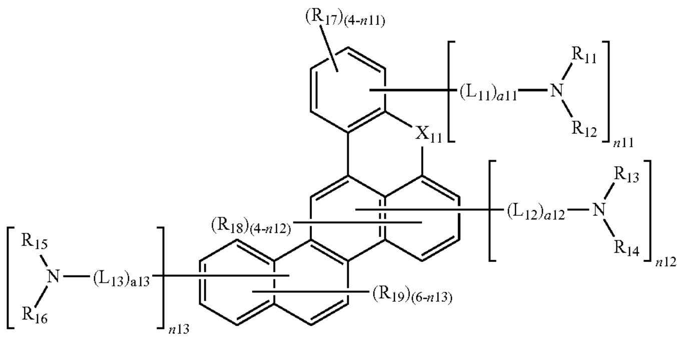

<Formula 2-1>

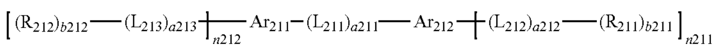

<Formula 2-2>

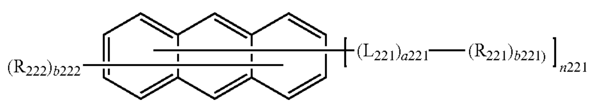

<Formula 2-3>

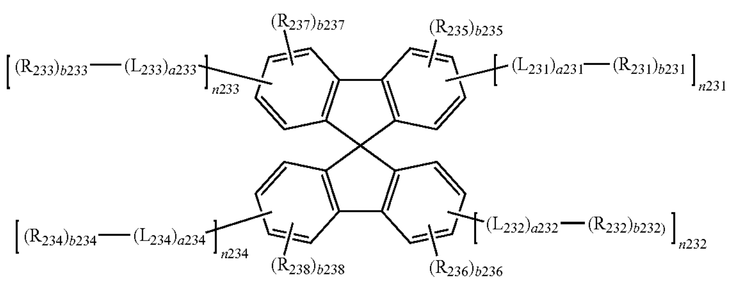

<Formula 2-4>

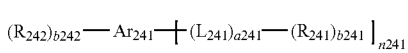

wherein, in Formulae 1 and 2-1 to 2-4, $X_{11}$ is an oxygen atom or a sulfur atom;

$Ar_{211}$ is selected from a naphthalene group, an anthracene group, a triphenylene group, a pyrene group, a chrysene group, and a perylene group;

$Ar_{212}$ is selected from an anthracene group, a triphenylene group, a pyrene group, a chrysene group, and a perylene group;

$Ar_{241}$ is selected from a benzene group, a biphenyl group, and a triphenylene group;

$L_{11}$ to $L_{13}$, $L_{211}$ to $L_{213}$, $L_{221}$, $L_{231}$ to $L_{234}$, and $L_{241}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 are each independently selected from 0, 1, 2, and 3;

a211 to a213, a221, a231 to a234, and a241 are each independently selected from 0, 1, and 2;

$R_{11}$ to $R_{16}$, $R_{231}$ to $R_{234}$, and $R_{241}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b231 to b234 and b241 are each independently selected from 1, 2, and 3;

$R_{17}$ to $R_{19}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$;

$R_{211}$, $R_{212}$, $R_{221}$, $R_{222}$, $R_{235}$ to $R_{238}$, and $R_{242}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{211})(Q_{212})(Q_{213})$, —$N(Q_{214})(Q_{215})$, and —$B(Q_{216})(Q_{217})$;

b211, b212, b221, b222, b235 to b238, and b242 are each independently selected from 1, 2, and 3;

n11 to n13 are each independently selected from 0, 1, and 2, and a sum of n11, n12, and n13 is selected from 2, 3, 4, 5, and 6;

n211, n212, and n221 are each independently selected from 1, 2, and 3;

n231 to n234 are each independently selected from 0, 1, and 2, and a sum of n231 to n234 is selected from 1, 2, 3, 4, 5, and 6;

n241 is selected from 3, 4, 5, 6, 7, and 8;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{11}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_3$, $Q_{11}$ to $Q_{17}$, $Q_{21}$ to $Q_{27}$, $Q_{31}$ to $Q_{37}$, and $Q_{211}$ to $Q_{217}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device as claimed in claim 1, wherein $Ar_{211}$ and $Ar_{212}$ are an anthracene group.

3. The organic light-emitting device as claimed in claim 1, wherein $L_{11}$ to $L_{13}$, $L_{211}$ to $L_{213}$, $L_{221}$, $L_{231}$ to $L_{234}$, and $L_{241}$ are each independently selected from a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group, each substituted with at least one selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

4. The organic light-emitting device as claimed in claim 1, wherein $L_{11}$ to $L_{13}$, $L_{211}$ to $L_{213}$, $L_{221}$, $L_{231}$ to $L_{234}$, and $L_{241}$ are each independently a group represented by one of the following Formulae 3-1 to 3-31:

3-1

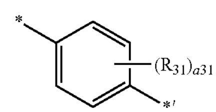

3-2

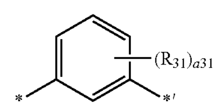

3-3

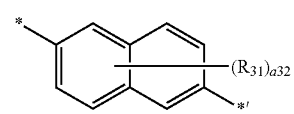

3-4

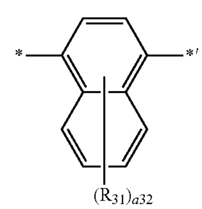

3-5

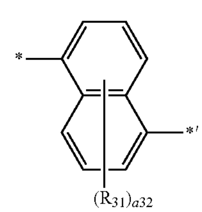

-continued
3-6
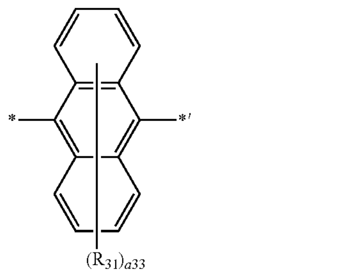
3-7
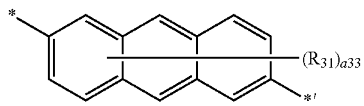
3-8
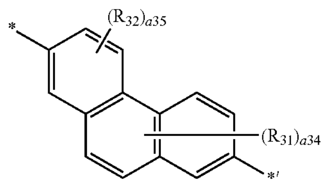
3-9
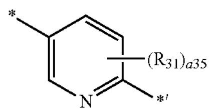
3-10
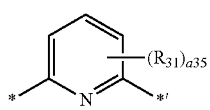
3-11
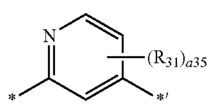
3-12
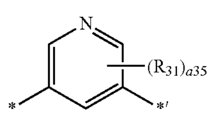
3-13
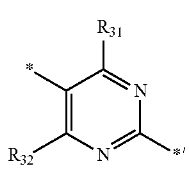
3-14
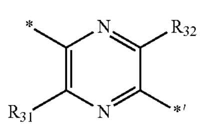
3-15
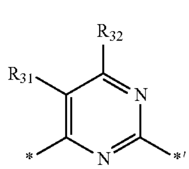
-continued
3-16
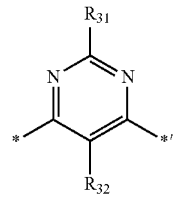
3-17
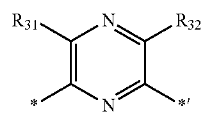
3-18
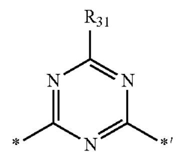
3-19
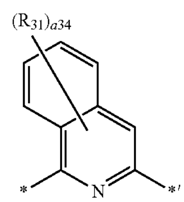
3-20
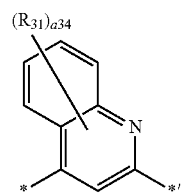
3-21
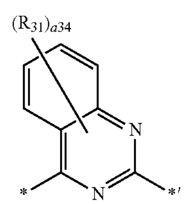
3-22
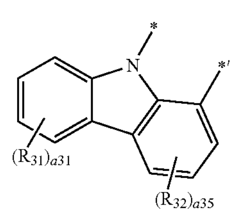
3-23
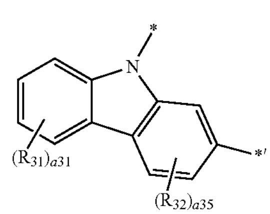

-continued 3-24
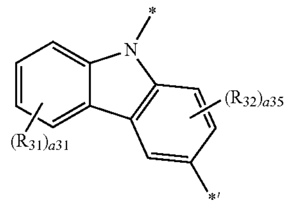

3-25
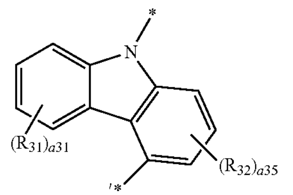

3-26
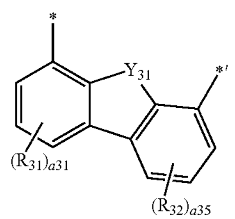

3-27
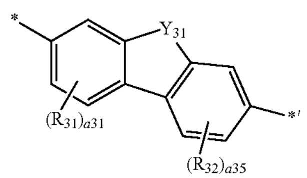

3-28
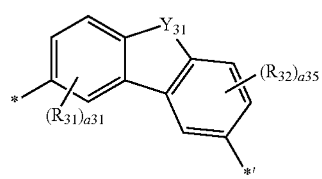

3-29
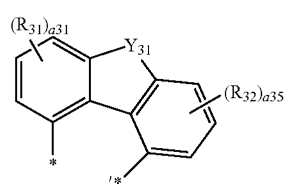

3-30
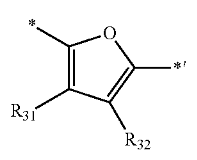

3-31
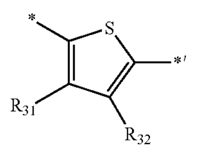

wherein, in Formulae 3-1 to 3-31, $Y_{31}$ is selected from $C(R_{33})(R_{34})$, $N(R_{33})$, O, S, and $Si(R_{33})(R_{34})$;

$R_{31}$ to $R_{34}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 is selected from 1, 2, 3, and 4;

a32 is selected from 1, 2, 3, 4, 5, and 6;

a33 is selected from 1, 2, 3, 4, 5, 6, 7, and 8;

a34 is selected from 1, 2, 3, 4, and 5;

a35 is selected from 1, 2, and 3; and

* and *' each independently indicate a binding site to a neighboring atom.

5. The organic light-emitting device as claimed in claim 1, wherein, a11 to a13, a211 to a213, a221, a231 to a234, and a241 are each independently 0 or 1.

6. The organic light-emitting device as claimed in claim 1, wherein $R_{11}$ to $R_{16}$ are each independently selected from a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group;

a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$; and a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with a $C_1$-$C_{20}$ alkyl group, which is substituted with at least one selected from a deuterium, —F, —Cl, —Br, —I, a cyano group, and a nitro group, wherein $Q_{33}$ to $Q_{35}$ are each independently selected from a $C_1$-$C_{20}$ alkyl group and a $C_6$-$C_{60}$ aryl group.

7. The organic light-emitting device as claimed in claim 1, wherein $R_{11}$ to $R_{16}$ are each independently a group represented by one of Formulae 5-1 to 5-33 below:

5-1

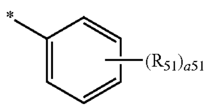

5-2

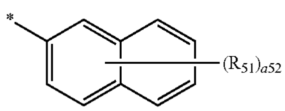

5-3

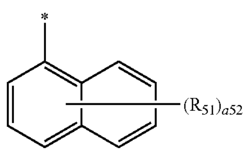

5-4

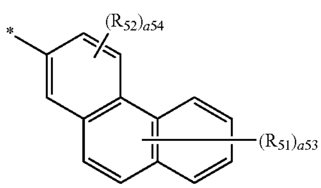

5-5

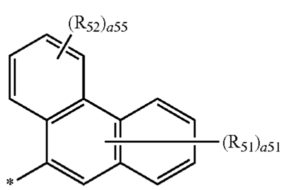

5-6

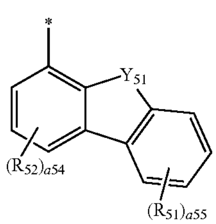

5-7

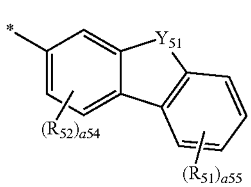

-continued 5-8

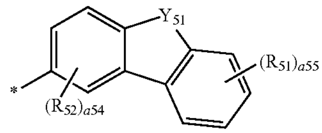

5-9

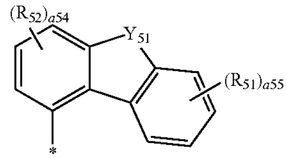

5-10

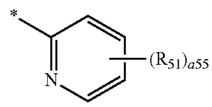

5-11

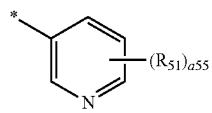

5-12

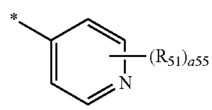

5-13

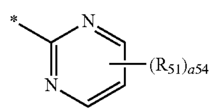

5-14

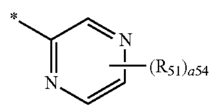

5-15

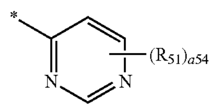

5-16

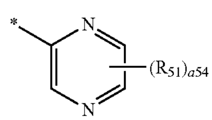

5-17

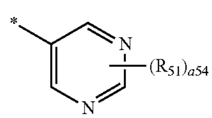

5-18

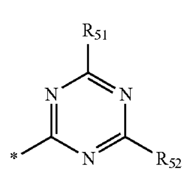

5-19

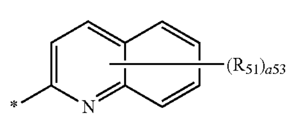

-continued 5-20

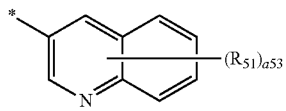

5-21

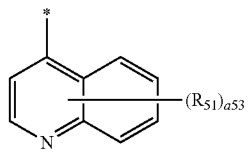

5-22

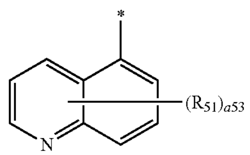

5-23

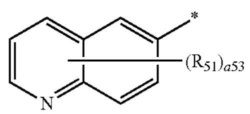

5-24

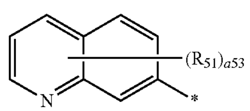

5-25

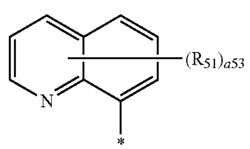

5-26

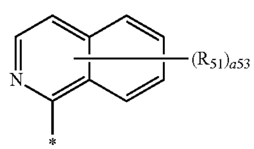

5-27

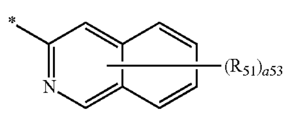

5-28

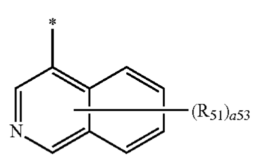

5-29

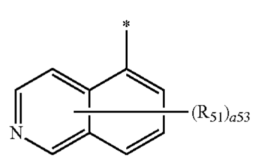

5-30

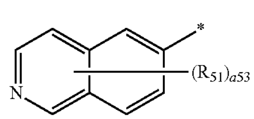

-continued 5-31

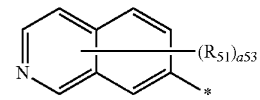

5-32

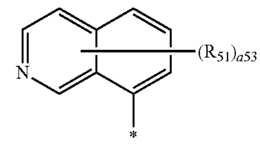

5-33

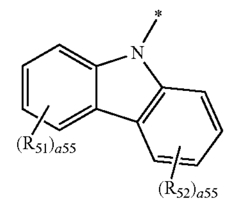

wherein, in Formulae 5-1 to 5-33, $Y_{51}$ is selected from $C(R_{53})(R_{54})$, $N(R_{53})$, O, and S;

$R_{51}$ to $R_{54}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, —$CD_3$, —$CF_3$, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, wherein $Q_{33}$ to $Q_{35}$ are each independently selected from a methyl group, an ethyl group, a tert-butyl group, a phenyl group, and a naphthyl group;

a51 is selected from 1, 2, 3, 4, and 5;

a52 is selected from 1, 2, 3, 4, 5, 6, and 7;

a53 is selected from 1, 2, 3, 4, 5, and 6;

a54 is selected from 1, 2, and 3;

a55 is selected from 1, 2, 3, and 4; and

* indicates a binding site to a neighboring atom.

8. The organic light-emitting device as claimed in claim 1, wherein $R_{231}$ to $R_{234}$ and $R_{241}$ are each independently selected from:

a phenyl group, a naphthyl group, a fluorenyl group, a benzofluorenyl group, a dibenzofluorenyl group, a phenalenyl group, a phenanthrenyl group, an anthracenyl group, a triphenylenyl group, a pyrenyl group, a chrysenyl group, a carbazolyl group, a dibenzofuranyl group, and a dibenzothiophenyl group; and a phenyl group, a naphthyl group, a fluorenyl group, a benzofluorenyl group, a dibenzofluorenyl group, a phenalenyl group, a phenanthrenyl group, an anthracenyl group, a triphenylenyl group, a pyrenyl group, a chrysenyl group, a carbazolyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group.

9. The organic light-emitting device as claimed in claim 1, wherein $R_{231}$ to $R_{234}$ and $R_{241}$ are each independently a group represented by one of Formulae 7-1 to 7-16 below:

7-1

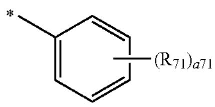

7-2

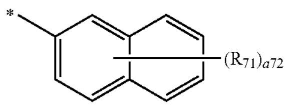

7-3

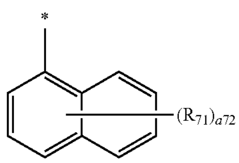

7-4

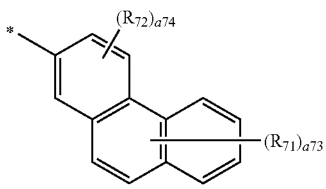

7-5

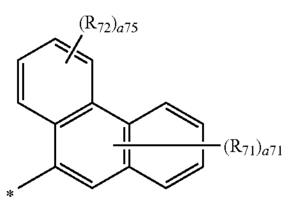

7-6

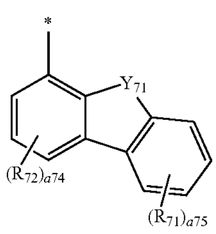

7-7

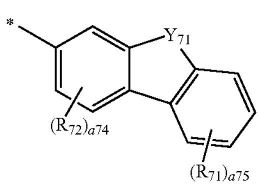

7-8

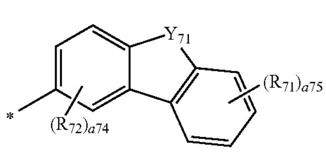

-continued 7-9

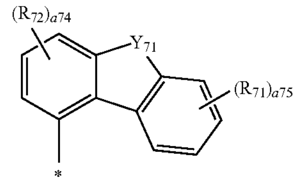

7-10

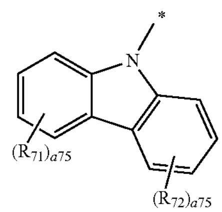

7-11

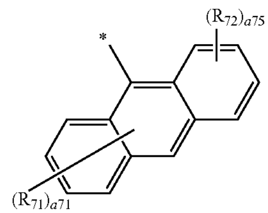

7-12

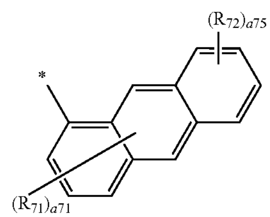

7-13

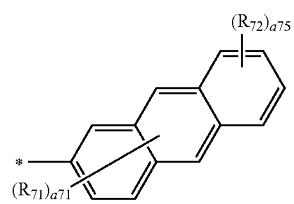

7-14

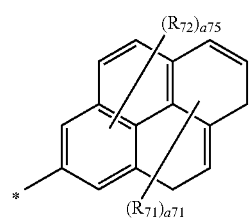

7-15

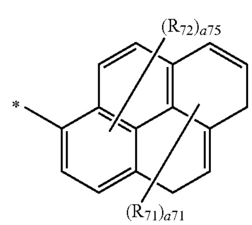

-continued 7-16

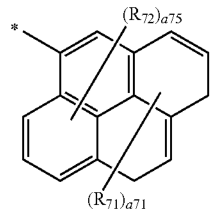

wherein, in Formulae 7-1 to 7-16, $Y_{71}$ is selected from $C(R_{73})(R_{74})$, $N(R_{73})$, O, and S;

$R_{71}$ to $R_{74}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group, a71 is selected from 1, 2, 3, 4, and 5;

a72 is selected from 1, 2, 3, 4, 5, 6, and 7;

a73 is selected from 1, 2, 3, 4, 5, and 6;

a74 is selected from 1, 2, and 3;

a75 is selected from 1, 2, 3, and 4; and

* indicates a binding site to a neighboring atom.

10. The organic light-emitting device as claimed in claim 1, wherein $R_{17}$ to $R_{19}$ are hydrogen.

11. The organic light-emitting device as claimed in claim 1, wherein $R_{211}$, $R_{212}$, $R_{221}$, $R_{222}$, $R_{235}$ to $R_{238}$, and $R_{242}$ are each independently selected from:

a hydrogen, a deuterium, —F, —Cl, —Br, —I, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one selected from a deuterium, —F, —Br, —I, a phenyl group, a naphthyl group, a phenoxy group, a phenylthio group, —$N(Q_{31})(Q_{32})$, —$Si(Q_{33})(Q_{34})(Q_{35})$, and —$B(Q_{36})(Q_{37})$;

a phenoxy group, a phenylthio group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group;

a phenoxy group, a phenylthio group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenoxy group, a phenylthio group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —N($Q_{31}$)($Q_{32}$), —Si($Q_{33}$)($Q_{34}$)($Q_{35}$), and —B($Q_{36}$)($Q_{37}$); or —Si($Q_{211}$)($Q_{212}$)($Q_{213}$), —N($Q_{211}$)($Q_{215}$), and —B($Q_{216}$)($Q_{217}$);

wherein $Q_{31}$ to $Q_{37}$ and $Q_{211}$ to $Q_{217}$ are each independently selected from a $C_1$-$C_{60}$ alkyl group and a $C_6$-$C_{60}$ aryl group.

12. The organic light-emitting device as claimed in claim 1, wherein $R_{211}$, $R_{212}$, $R_{221}$, $R_{222}$, $R_{235}$ to $R_{238}$, and $R_{242}$ are each independently selected from a hydrogen, a deuterium, —F, —Cl, —Br, —I, a methyl group, an ethyl group, an n-propyl group, an iso-propyl group, an n-butyl group, an iso-butyl group, a sec-butyl group, a tert-butyl group, a methoxy group, an ethoxy group, an iso-propoxy group, an n-butoxy group, an iso-butoxy group, a sec-butoxy group, a tert-butoxy group, —$Si(CH_3)_3$, —$Si(Ph)_3$, —$N(Ph_2)_2$, —$B(Ph)_2$, and a group represented by one of Formulae 9-1 to 9-13 below:

9-1

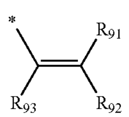

9-2

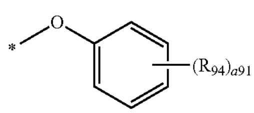

9-3

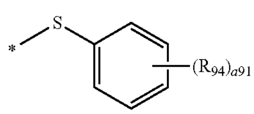

9-4

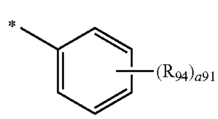

9-5

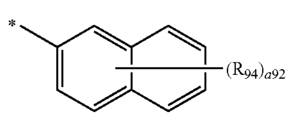

9-6

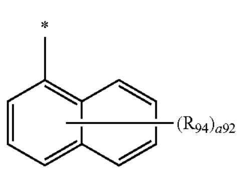

-continued 9-7

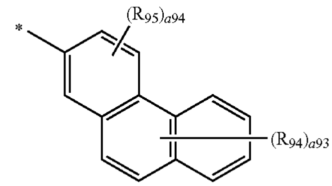

9-8

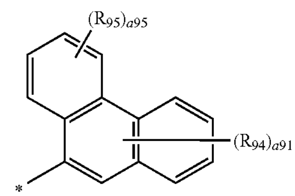

9-9

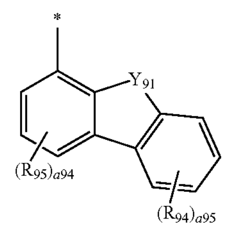

9-10

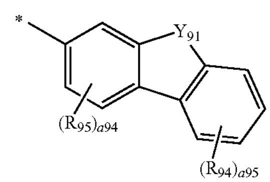

9-11

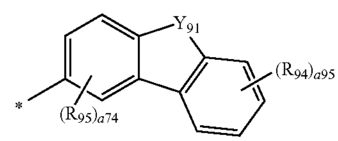

9-12

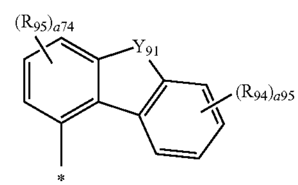

9-13

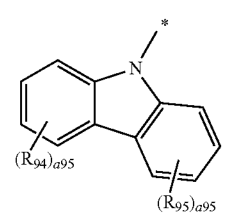

wherein, in Formulae 9-1 to 9-13, $Y_{91}$ is selected from C($R_{96}$)($R_{97}$), N($R_{96}$), O, and S;

$R_{91}$ to $R_{93}$ are each independently selected from a hydrogen, a deuterium, —F, —Cl, —Br, —I, a phenyl group, and a naphthyl group;

$R_{94}$ to $R_{97}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenoxy group, a phenylthio group, a phenyl group, and a naphthyl group;

a91 is selected from 1, 2, 3, 4, and 5;

a92 is selected from 1, 2, 3, 4, 5, 6, and 7;

a93 is selected from 1, 2, 3, 4, 5, and 6;

a94 is selected from 1, 2, and 3;

a95 is selected from 1, 2, 3, and 4; and

* indicates a binding site to a neighboring atom.

13. The organic light-emitting device as claimed in claim 1, wherein $R_{211}$, $R_{212}$, $R_{221}$, $R_{222}$, $R_{235}$ to $R_{238}$, and $R_{242}$ are each independently selected from a hydrogen, a deuterium, —F, —Cl, —Br, —I, a methyl group, an ethyl group, an n-propyl group, an iso-propyl group, an n-butyl group, an iso-butyl group, a sec-butyl group, a tert-butyl group, a methoxy group, an ethoxy group, an iso-propoxy group, an n-butoxy group, an iso-butoxy group, a sec-butoxy group, a tert-butoxy group, —$Si(CH_3)_3$, —$Si(Ph)_3$, —$N(Ph_2)_2$, —$B(Ph)_2$, and a group represented by one of Formulae 10-1 to 10-24 below:

10-1

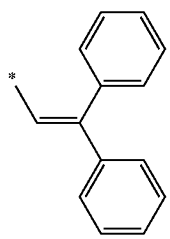

10-2

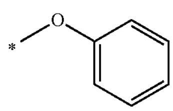

10-3

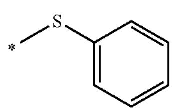

10-4

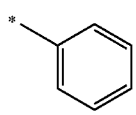

10-5

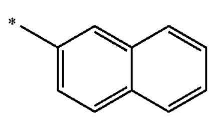

10-6

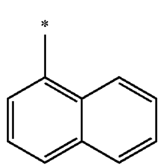

10-7

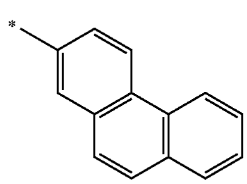

-continued 10-8

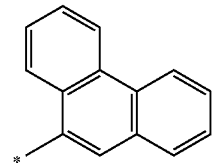

10-9

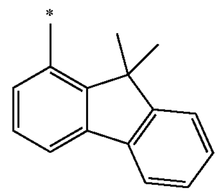

10-10

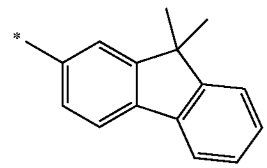

10-11

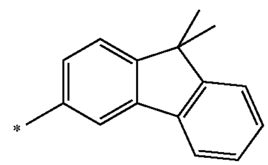

10-12

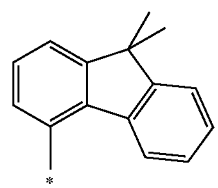

10-13

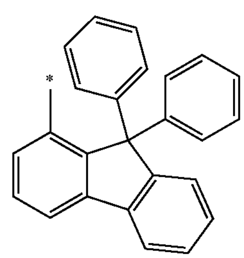

10-14

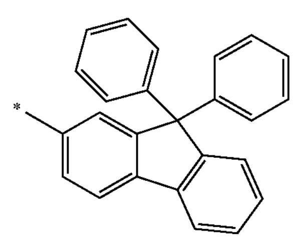

-continued 10-15

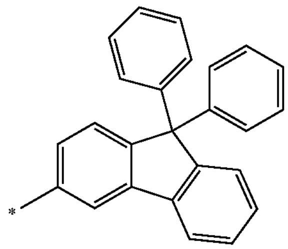

10-16

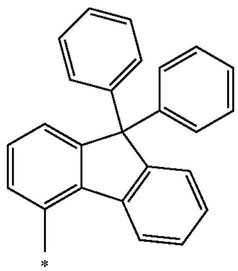

10-17

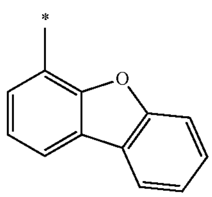

10-18

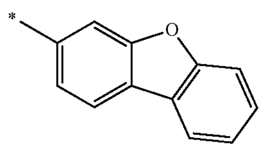

10-19

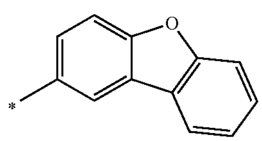

10-20

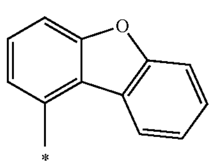

10-21

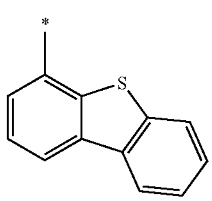

10-22

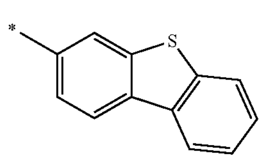

-continued 10-23

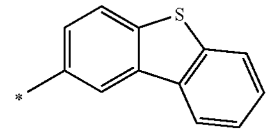

10-24

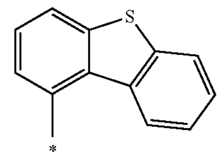

wherein, in Formulae 10-1 to 10-24, * indicates a binding site to a neighboring atom.

14. The organic light-emitting device as claimed in claim 1, wherein the first compound represented by Formula 1 is represented by Formula 1-1 below:

<Formula 1-1>

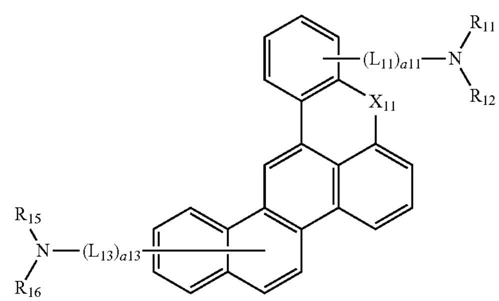

wherein in Formula 1-1, $X_{11}$, $L_{11}$, $L_{13}$, a11, a13, $R_{11}$, $R_{12}$, $R_{15}$, and $R_{16}$ are defined the same as $X_{11}$, $L_{11}$, $L_{13}$, a11, a13, $R_{11}$, $R_{12}$, $R_{15}$, and $R_{16}$ of Formula 1.

15. The organic light-emitting device as claimed in claim 1, wherein the first compound represented by Formula 1 is represented by Formula 1-11 below:

<Formula 1-11>

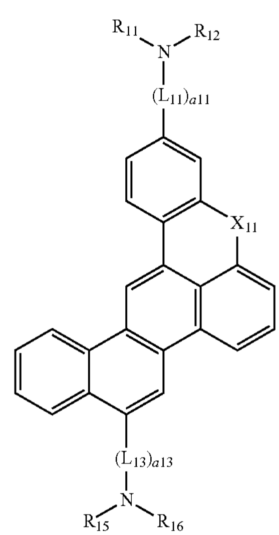

wherein in Formula 1-11, $X_{11}$, $L_{11}$, $L_{13}$, a11, a13, $R_{11}$, $R_{12}$, $R_{15}$, and $R_{16}$ are defined the same as $X_{11}$, $L_{11}$, $L_{13}$, al 1, a13, $R_{11}$, $R_{12}$, $R_{15}$, and $R_{16}$ of Formula.
16. The organic light-emitting device as claimed in claim 1, wherein the first compound represented by Formula 1 one of the following Compounds 1 to 162:
1
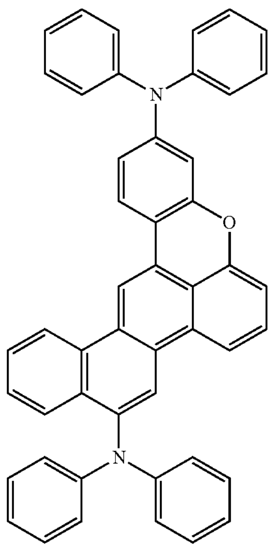
2
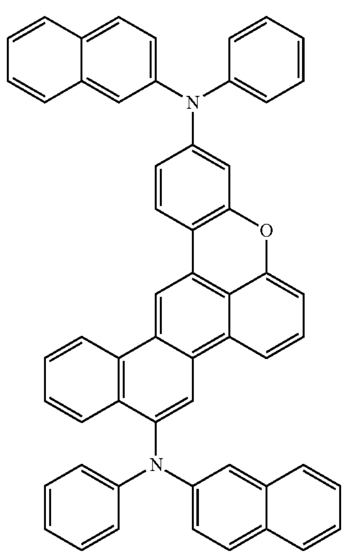
-continued
3
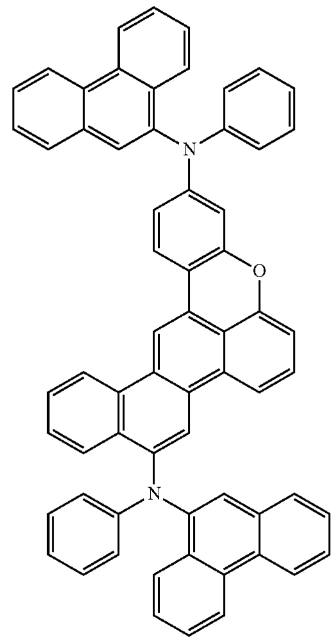
4
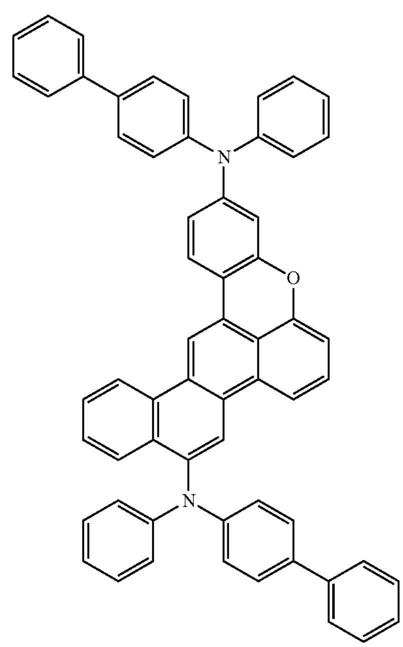

5
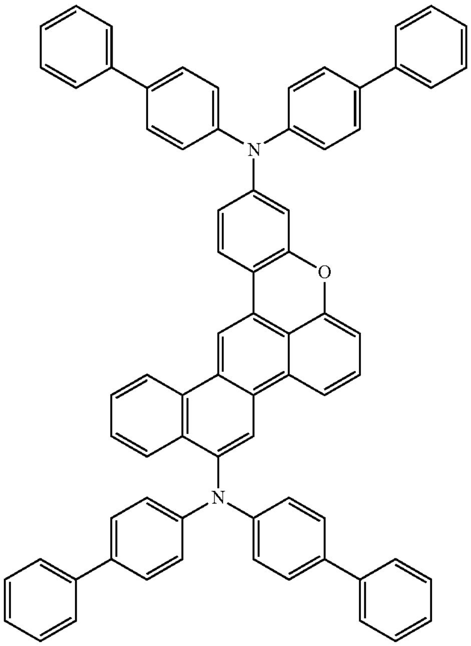
6
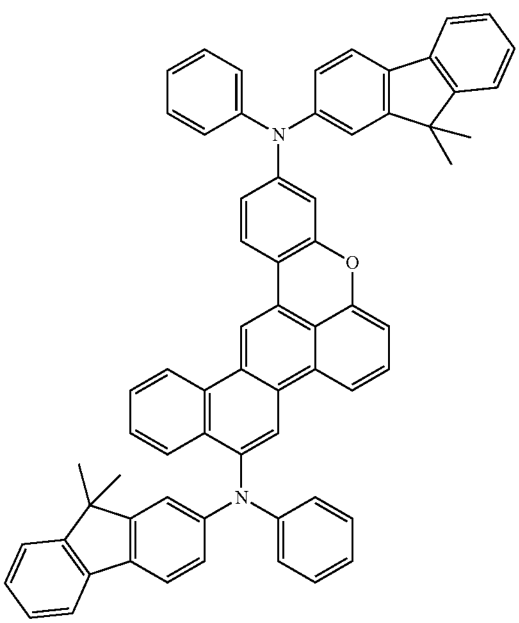
7
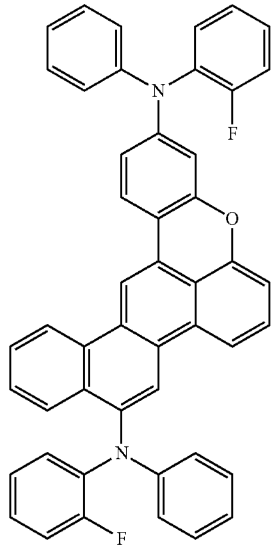
8
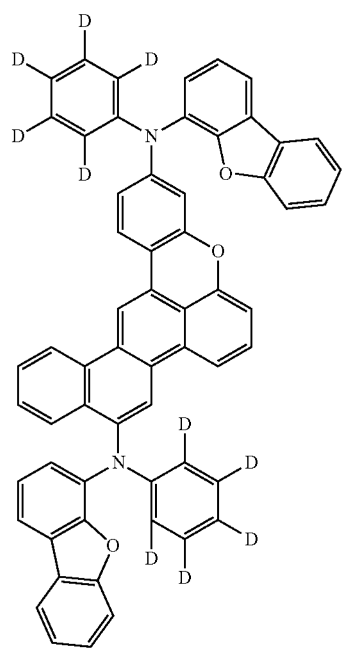

-continued
9
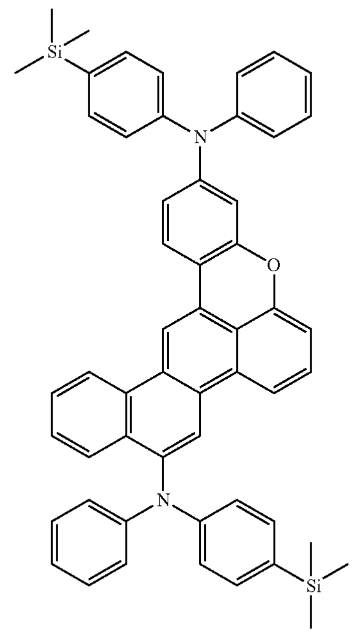
11
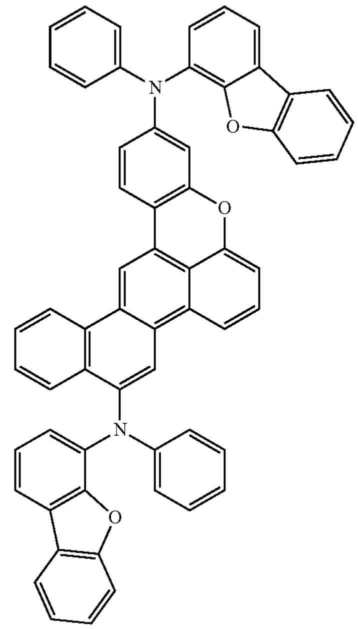
10
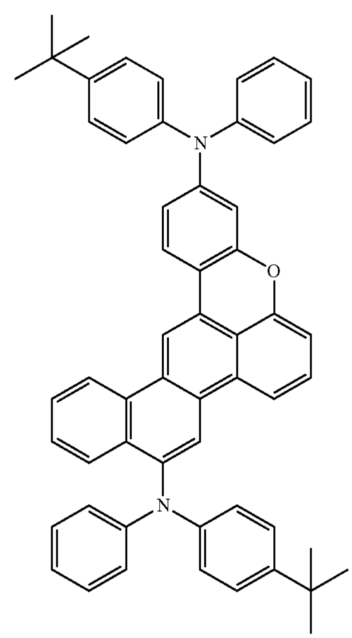
12
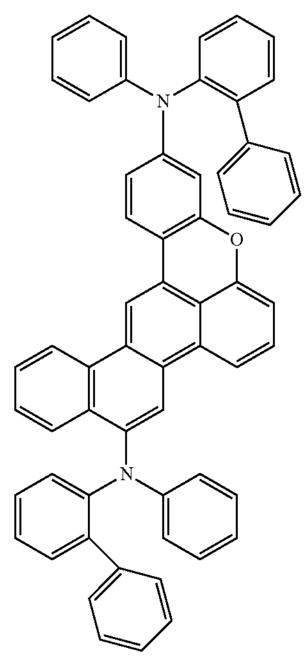

-continued
13
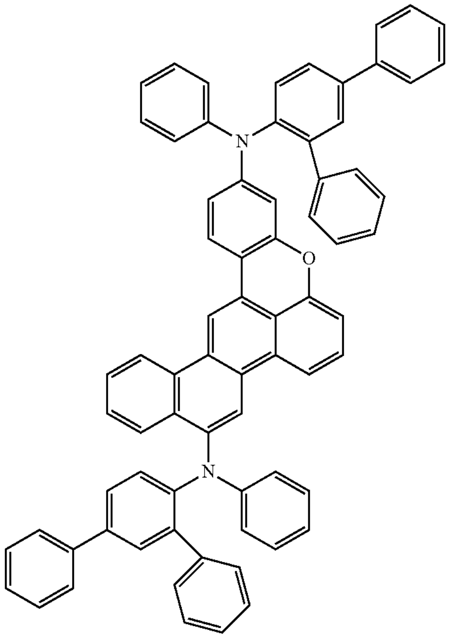
14
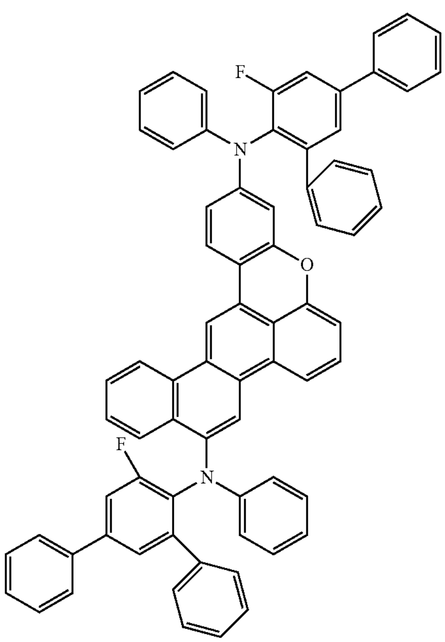
-continued
15
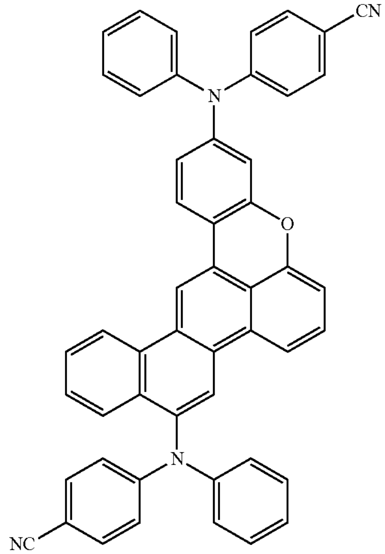
16
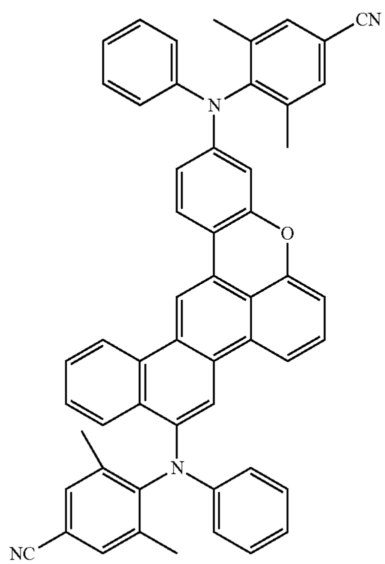
17
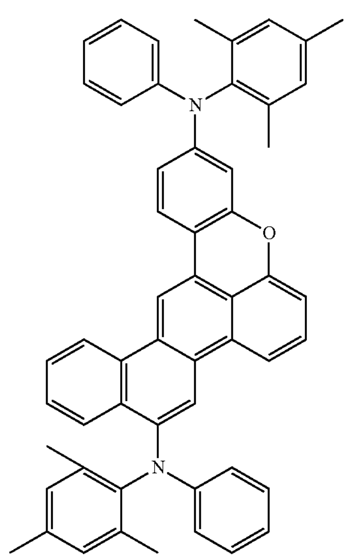

-continued
18
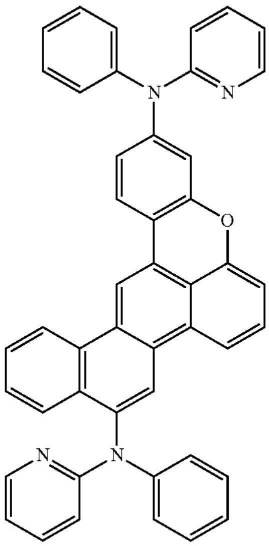
19
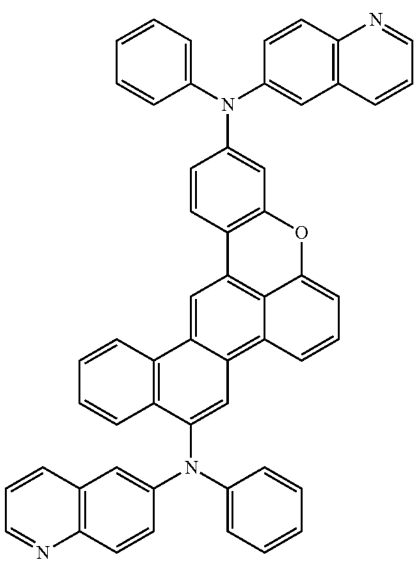
20
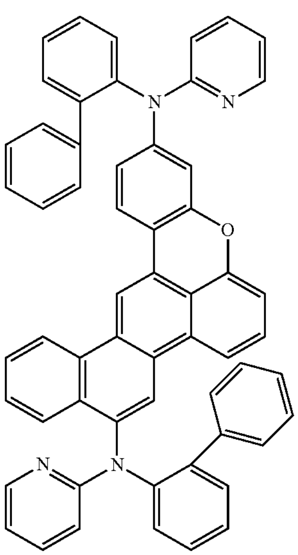
-continued
21
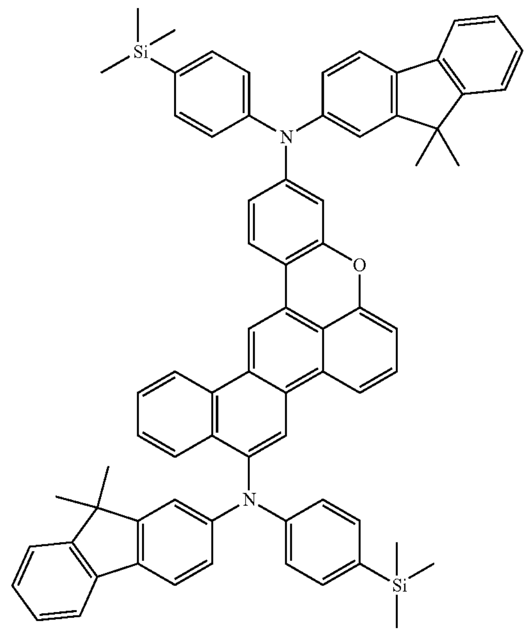
22
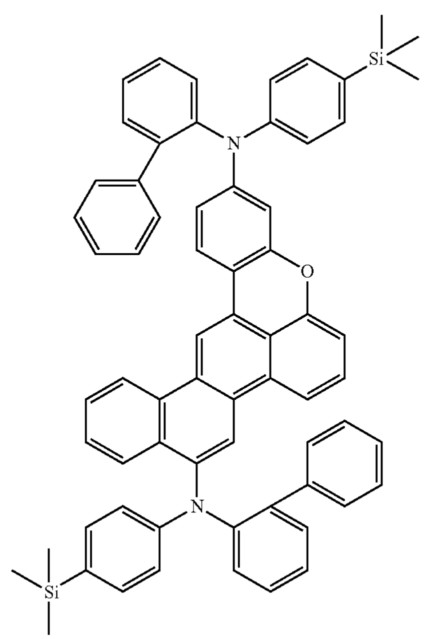

-continued
23
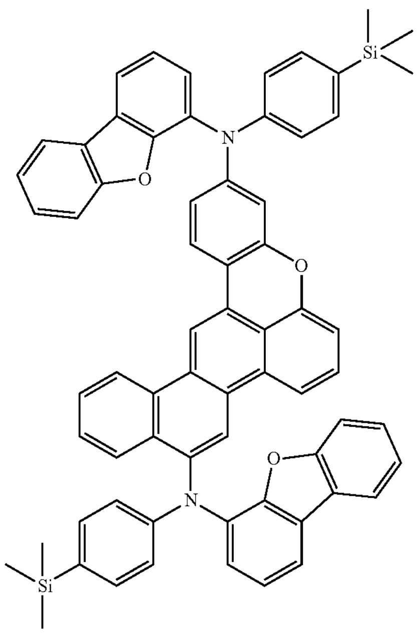
24
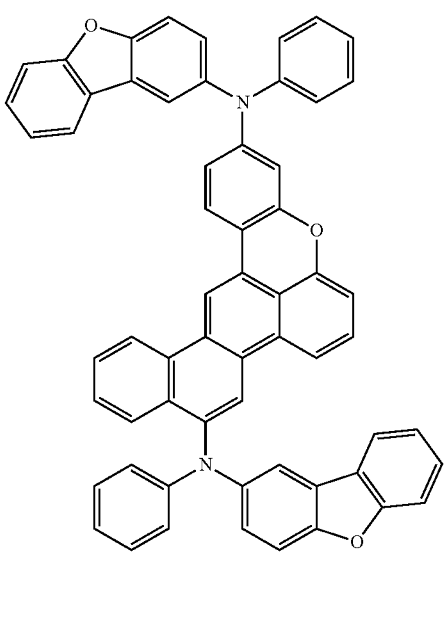
-continued
25
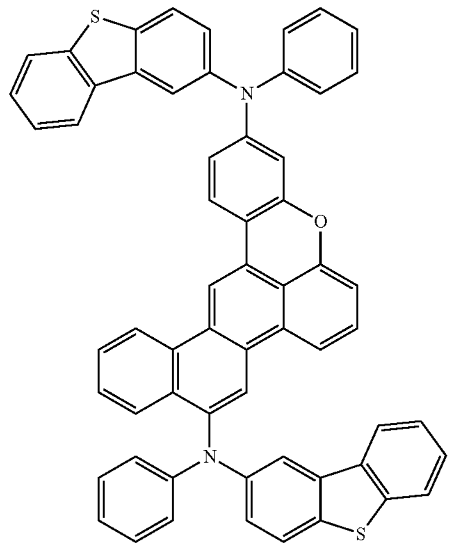
26
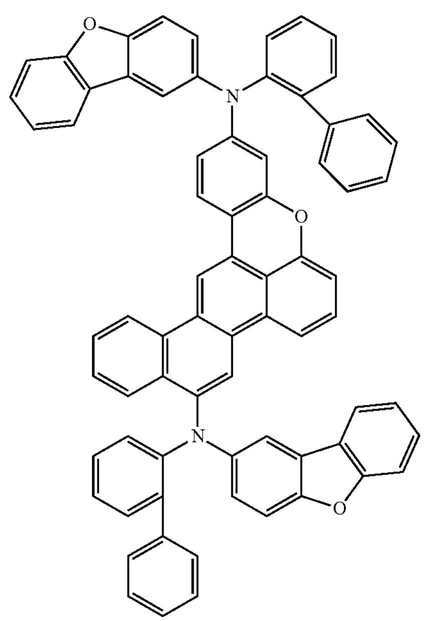

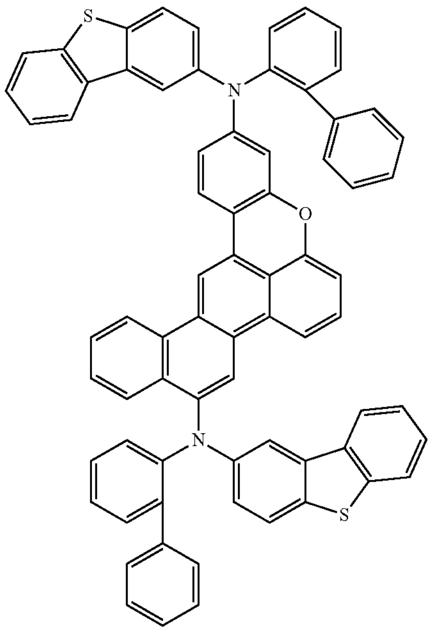
27
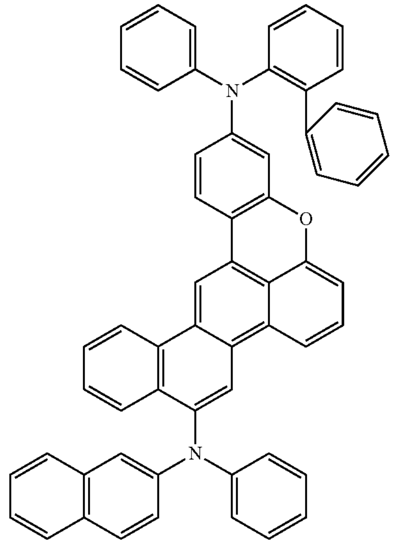
29
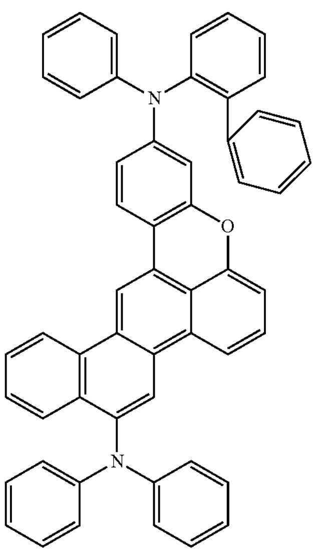
28
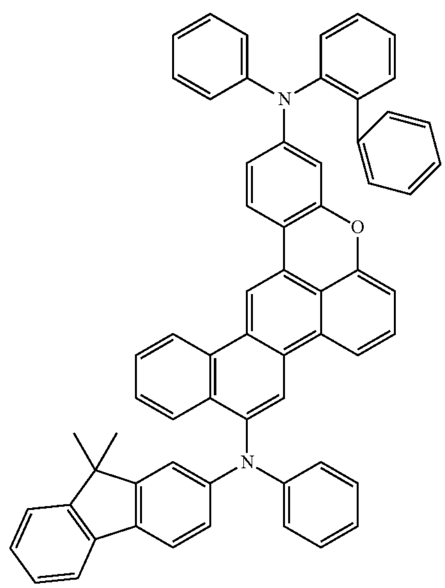
30

-continued
31
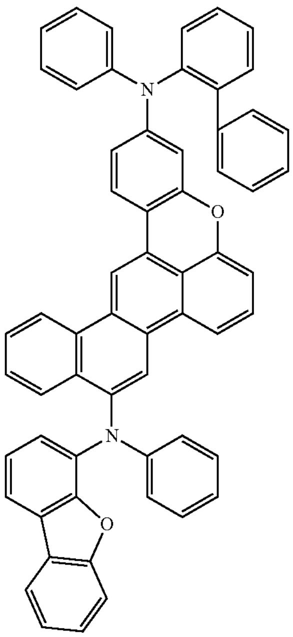
32
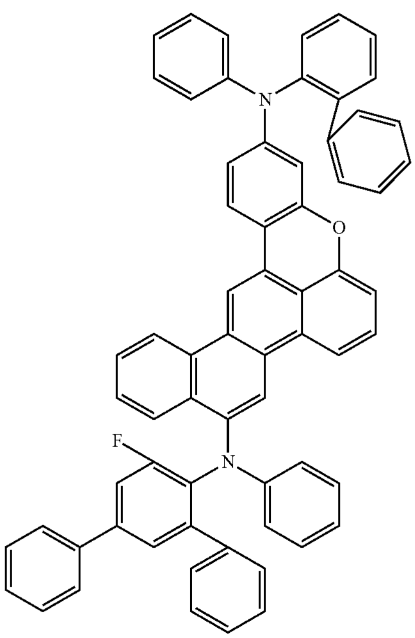
-continued
33
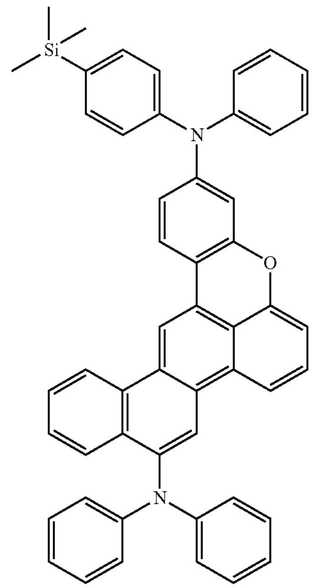
34
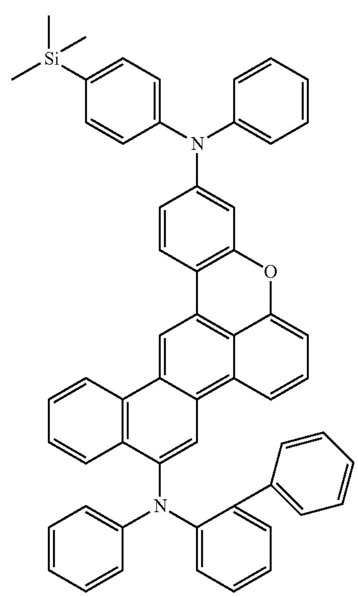

35
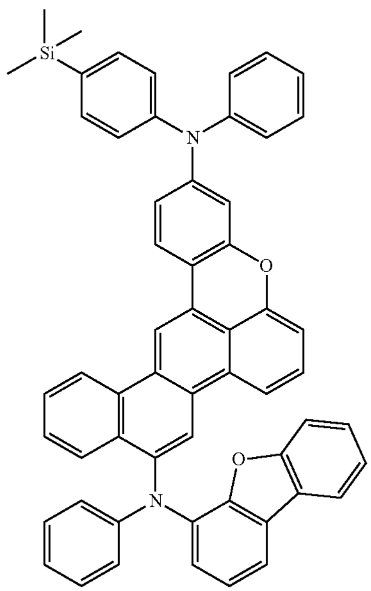
37
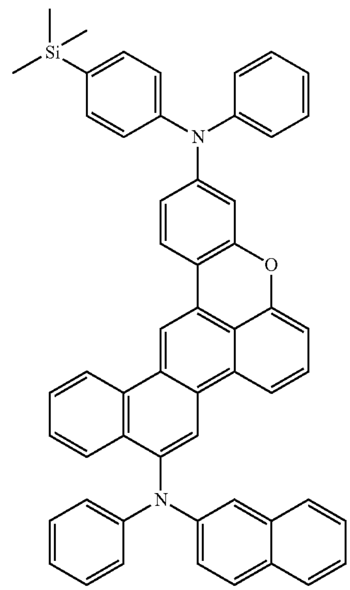
36
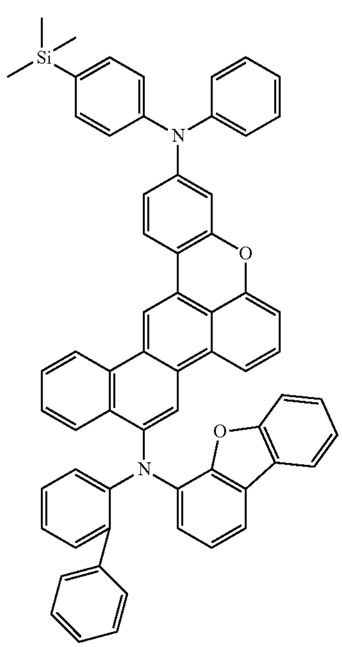
38
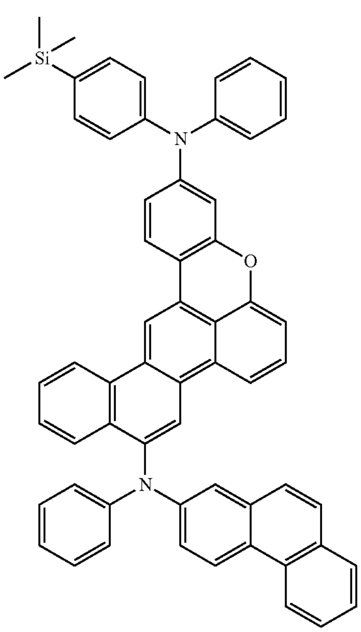

-continued
39
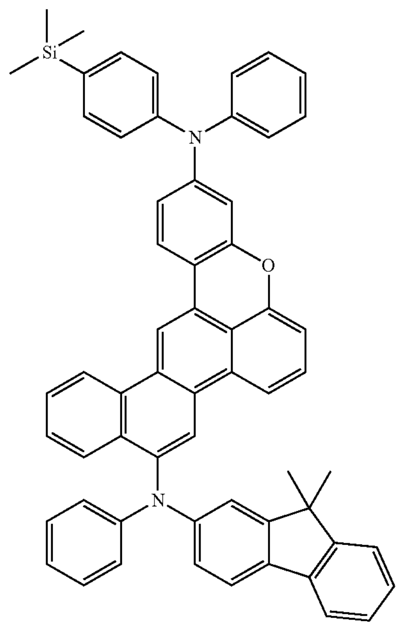
40
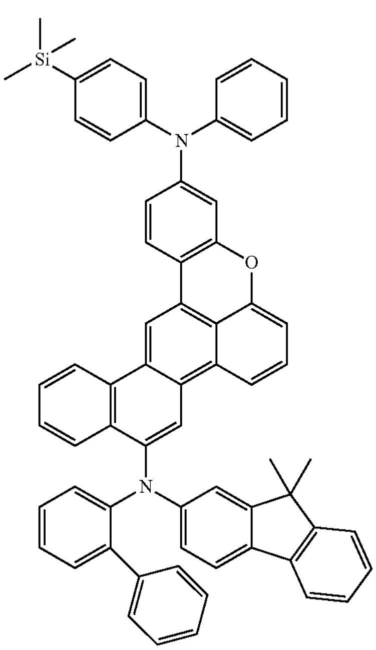
-continued
41
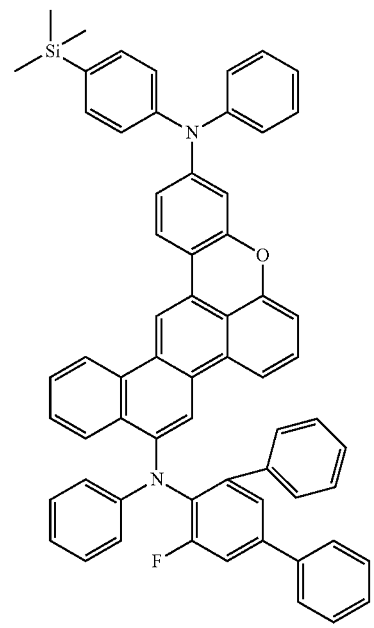
42
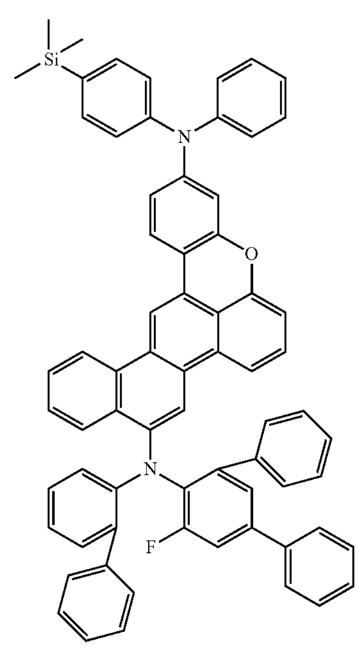

-continued
43
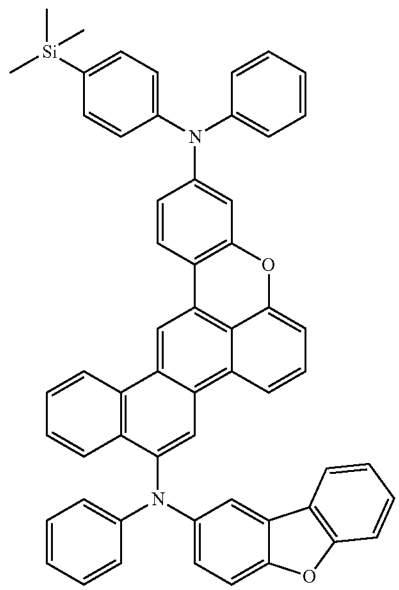
44
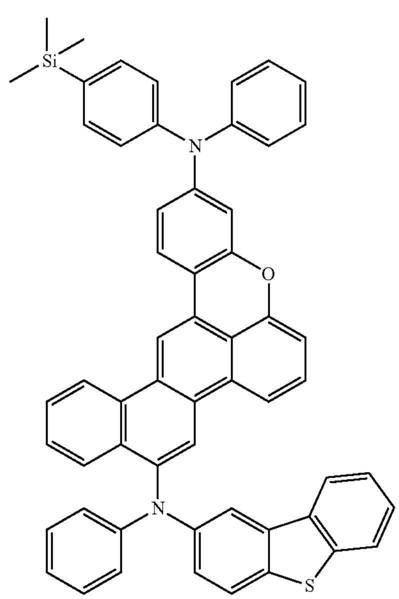
-continued
45
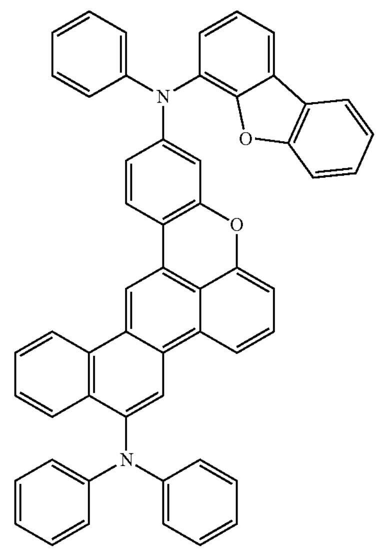
46
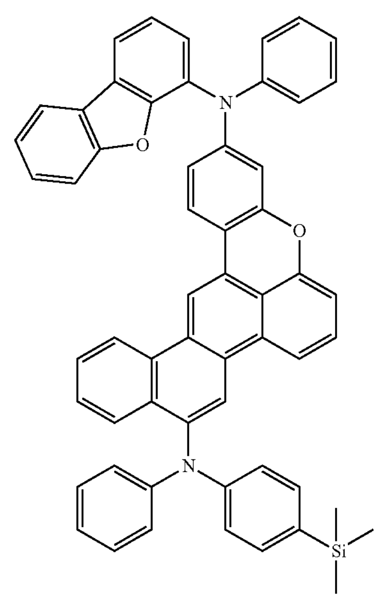

-continued
47
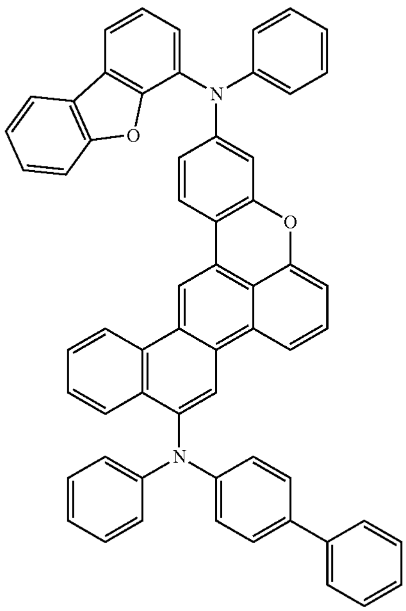
48
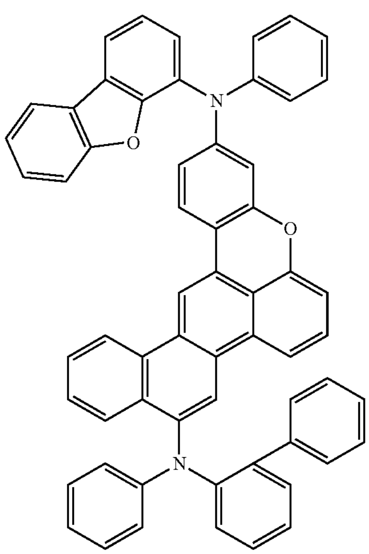
-continued
49
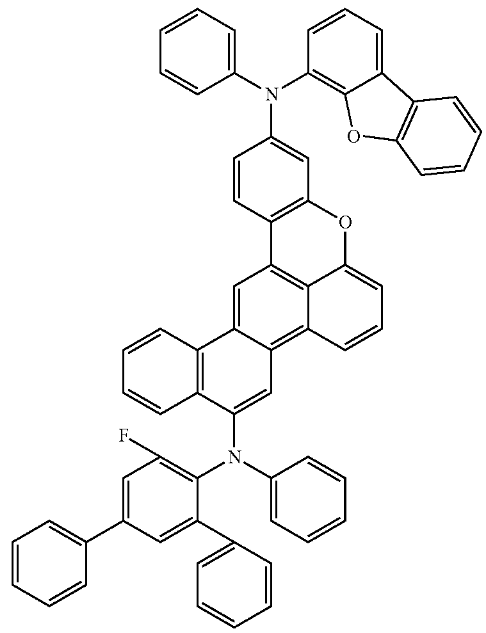
50
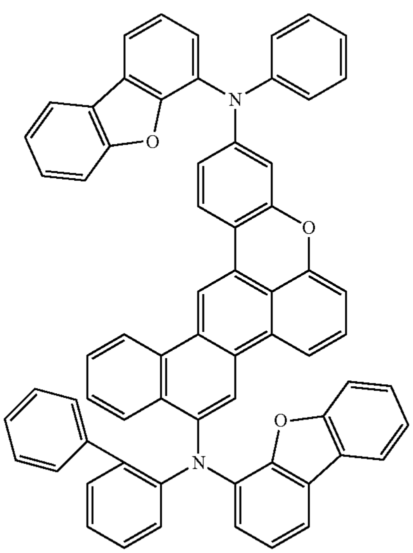

51
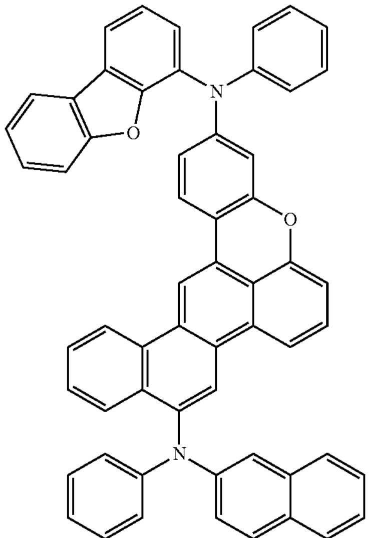
52
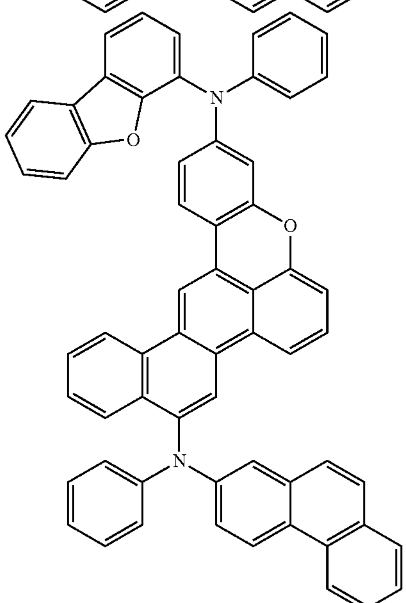
53
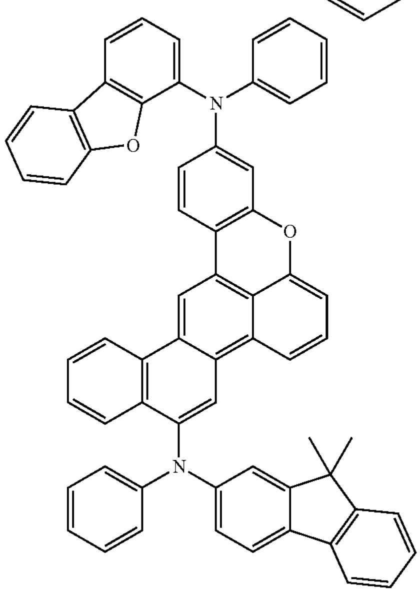
54
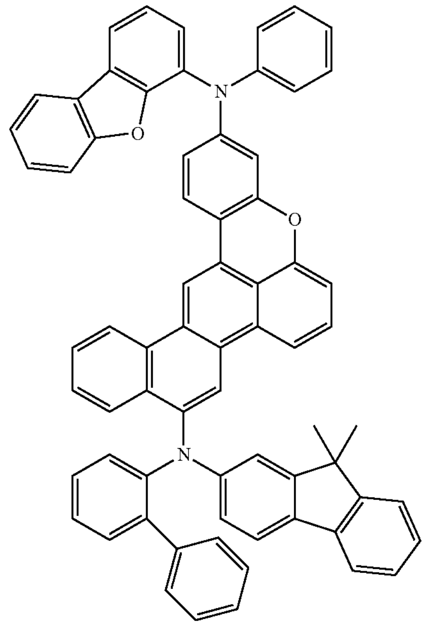
55
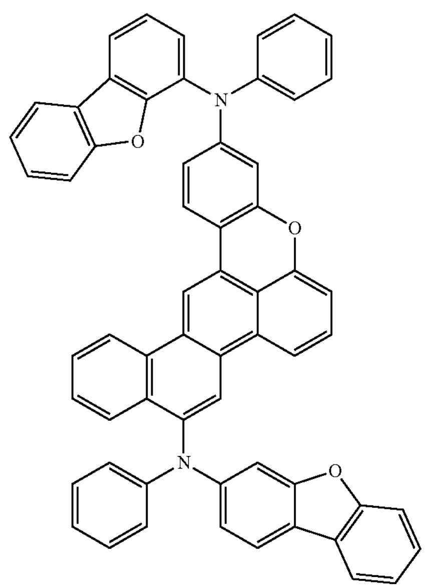

-continued
-continued
56
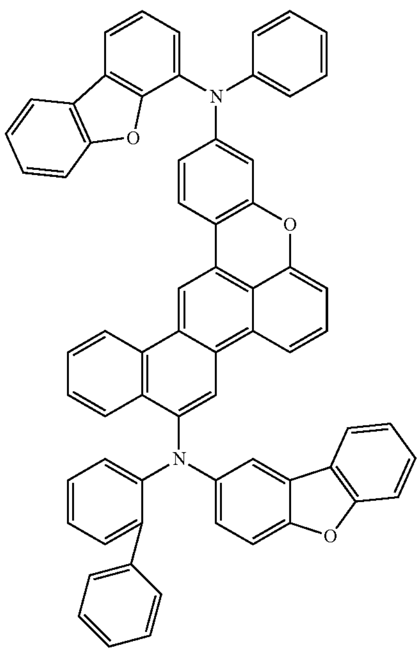
58
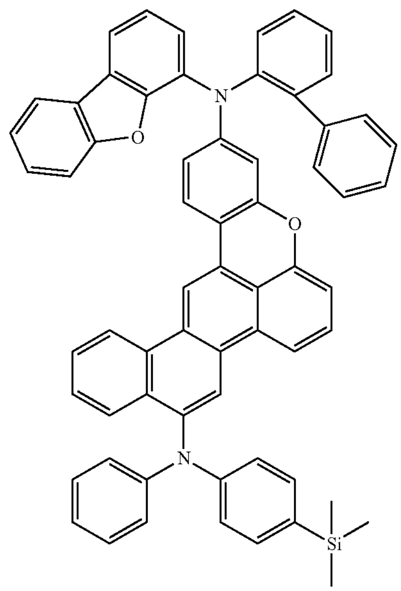
57
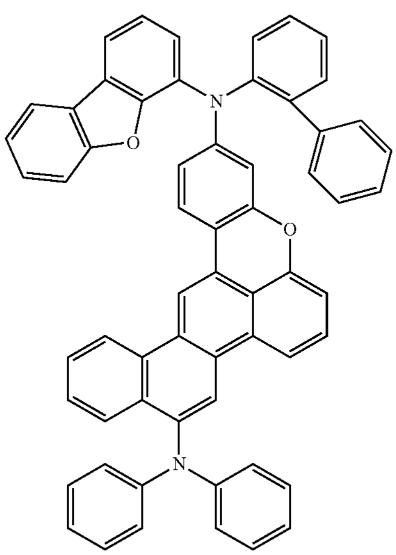
59
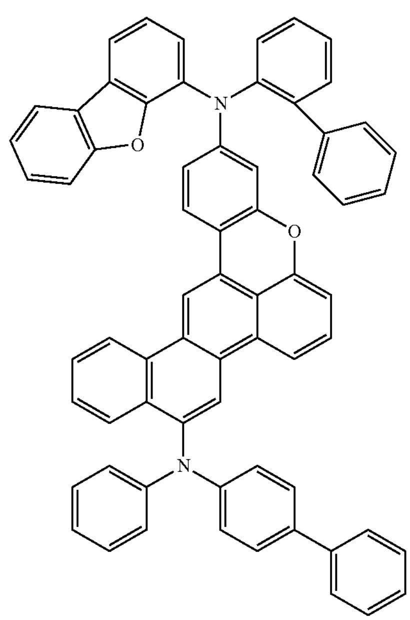

-continued
60
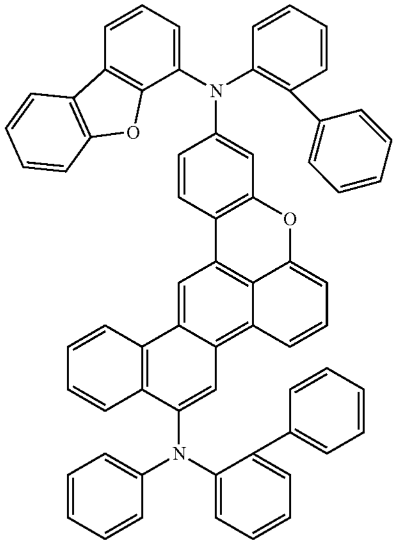
61
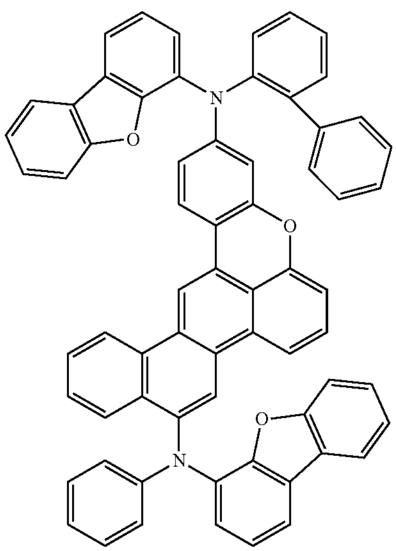
62
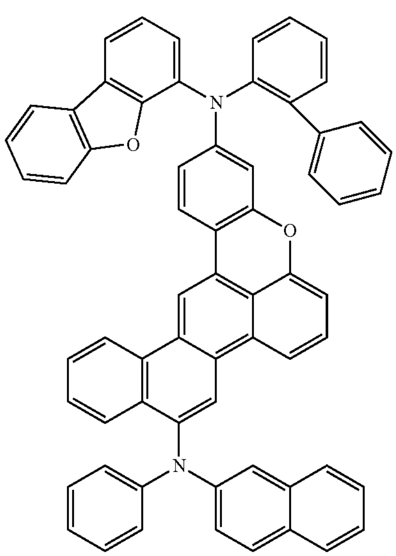
-continued
63
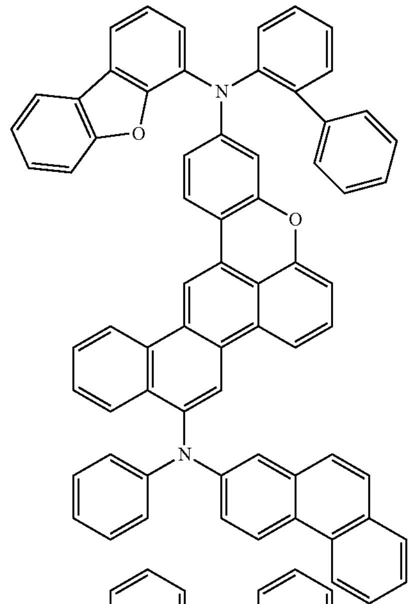
64
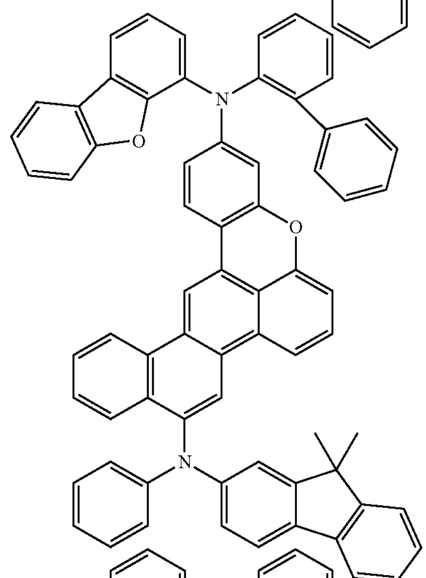
65
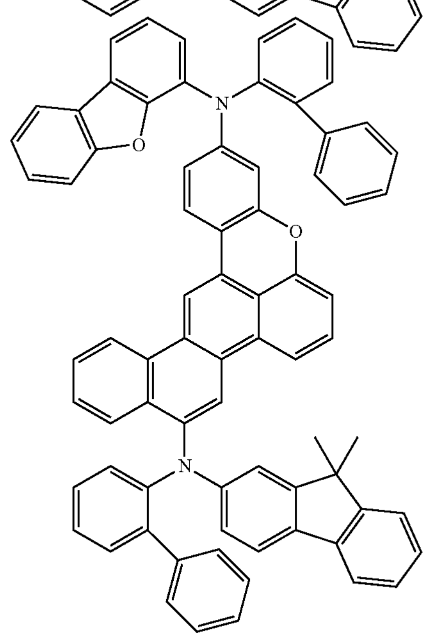

-continued
66
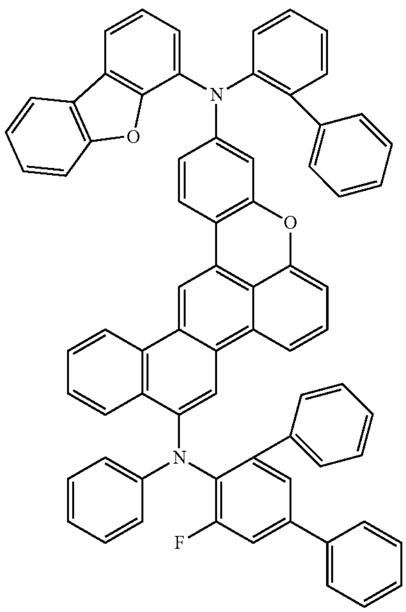
67
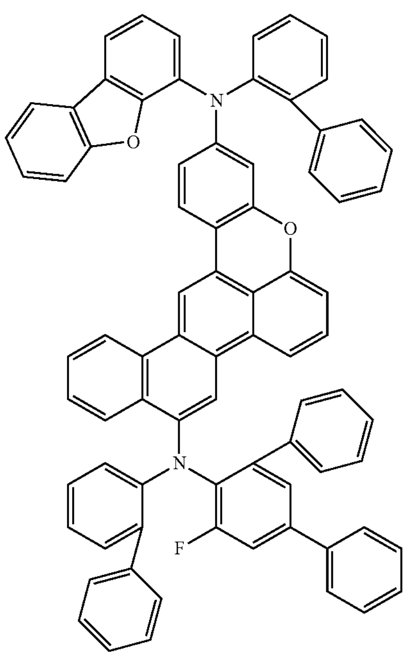
-continued
68
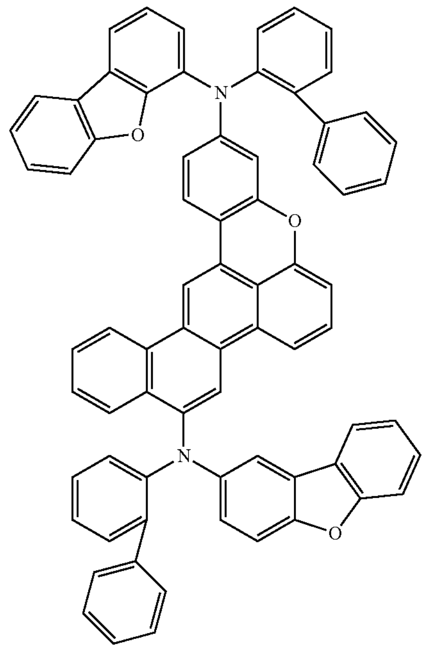
69
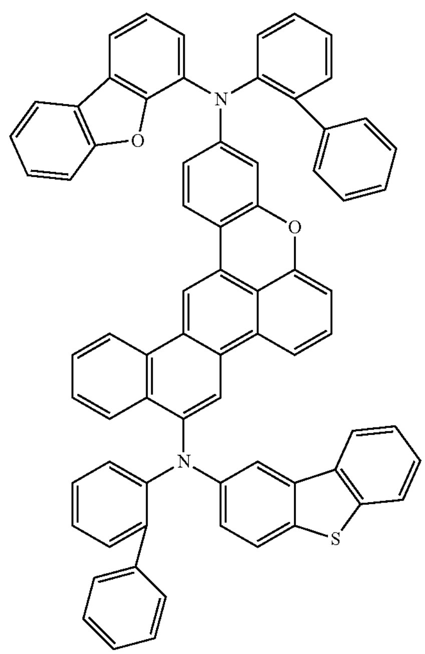

-continued
-continued
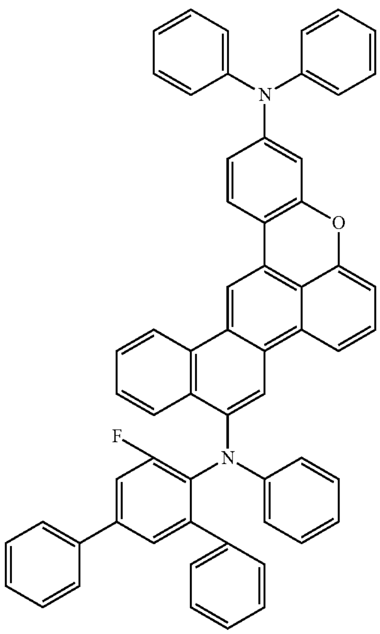
70
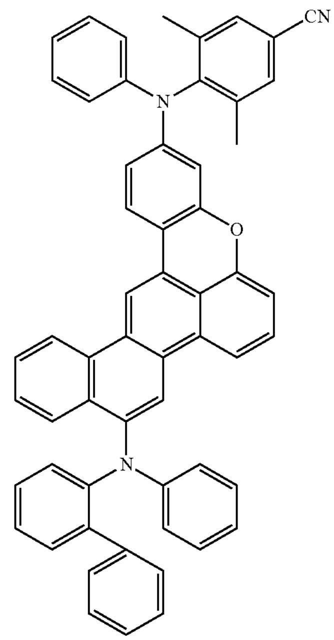
72
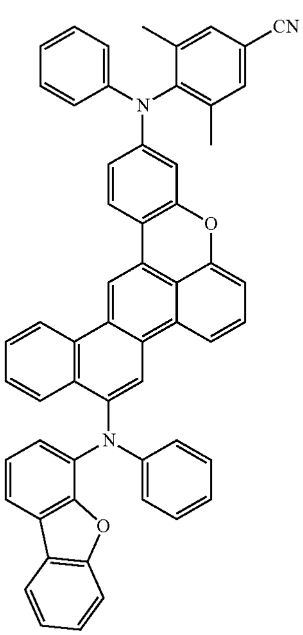
71
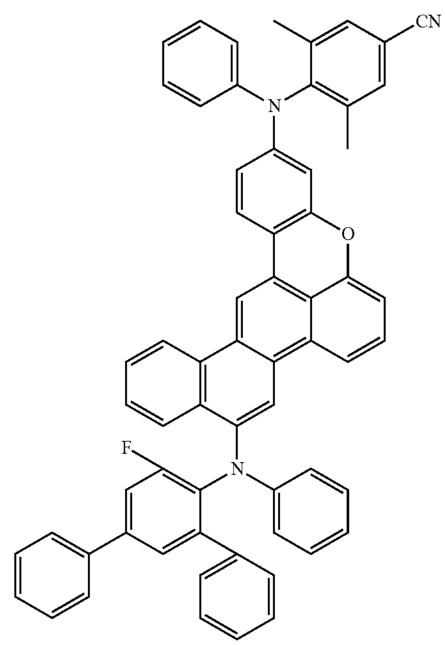
73

-continued
74
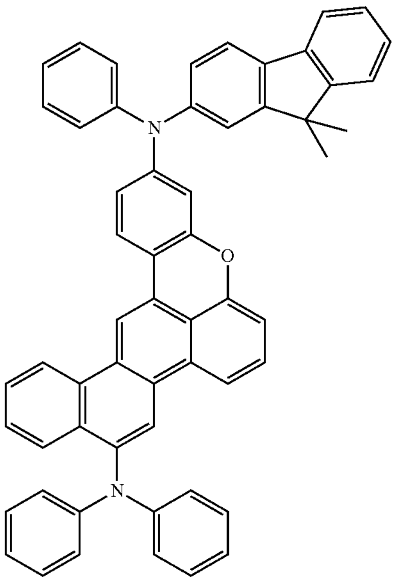
75
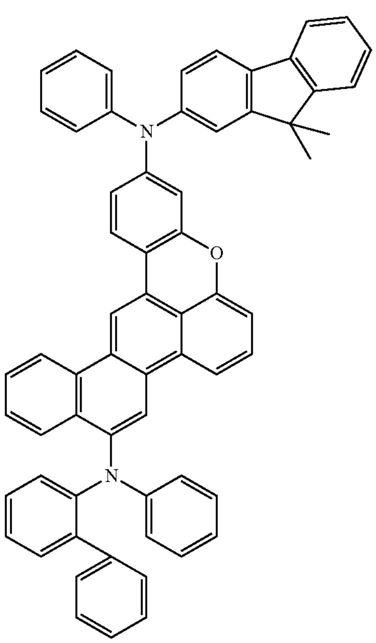
-continued
76
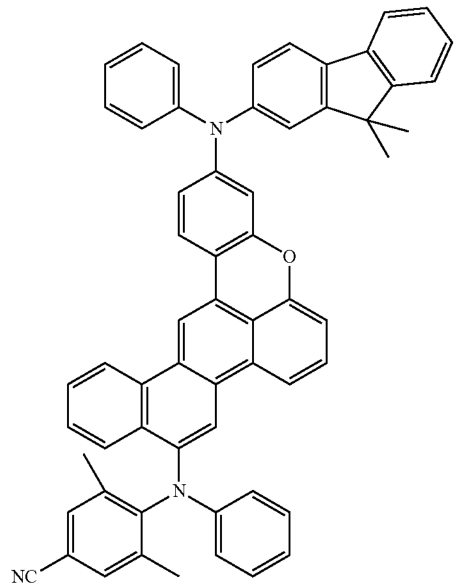
77
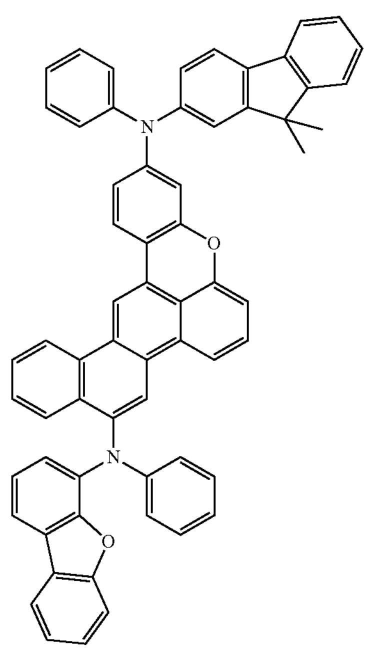

-continued
78
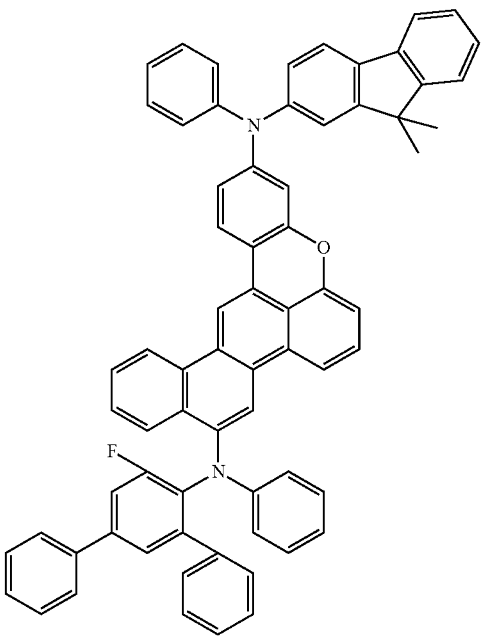
79
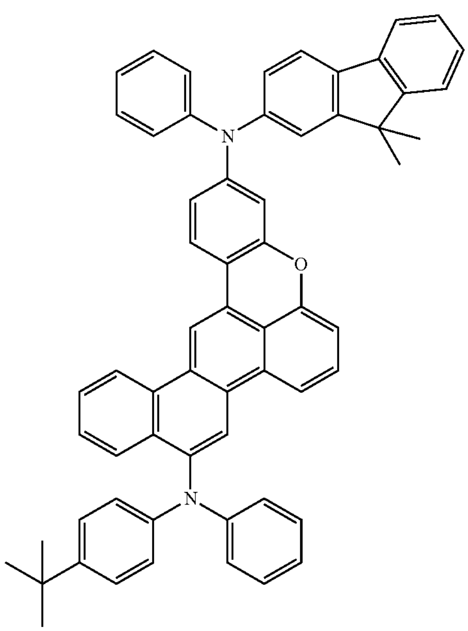
-continued
80
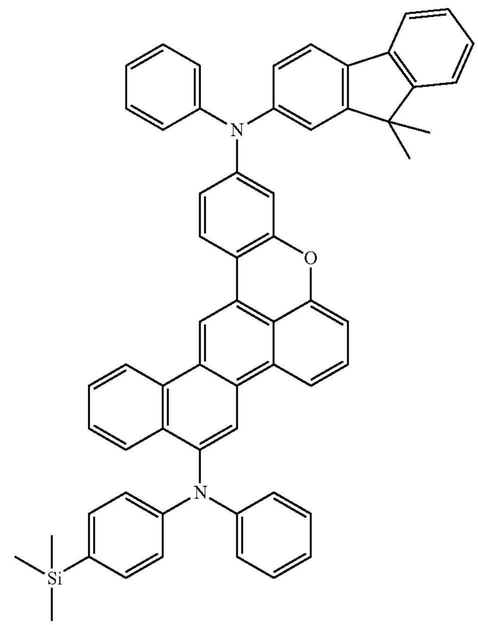
81
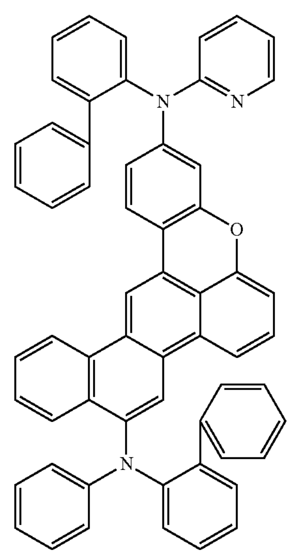

-continued
82
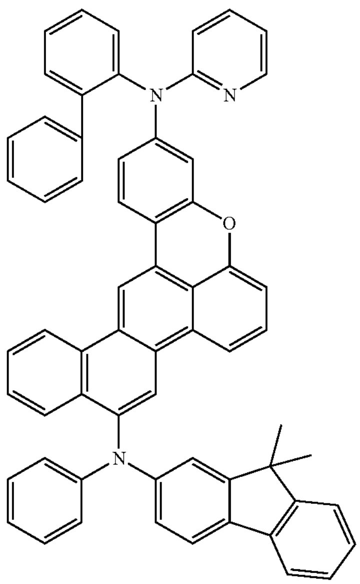
83
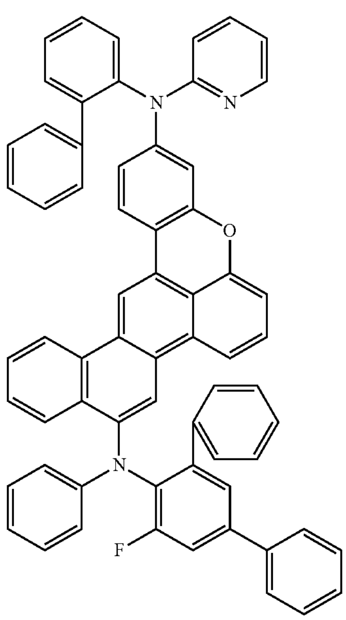
-continued
84
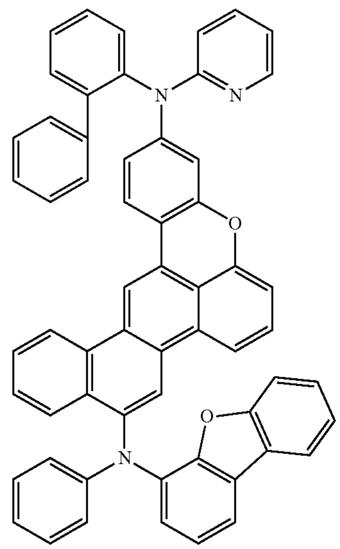
85
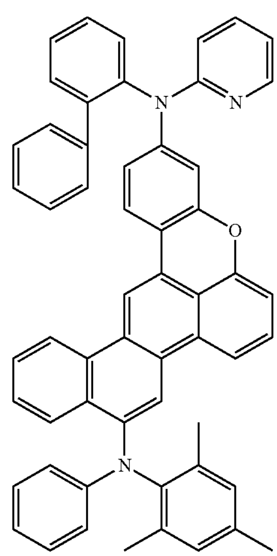

-continued
86
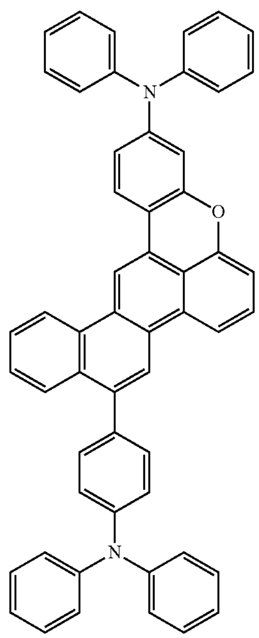
87
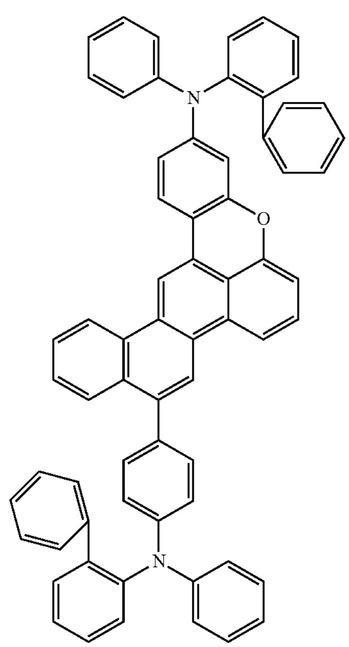
-continued
88
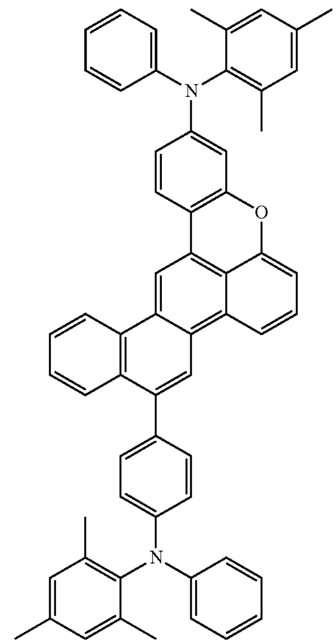
89
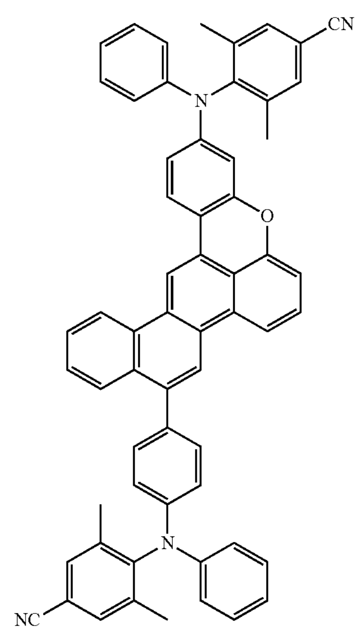

90
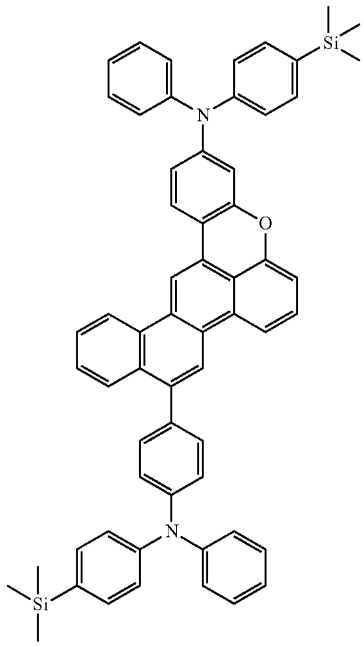
92
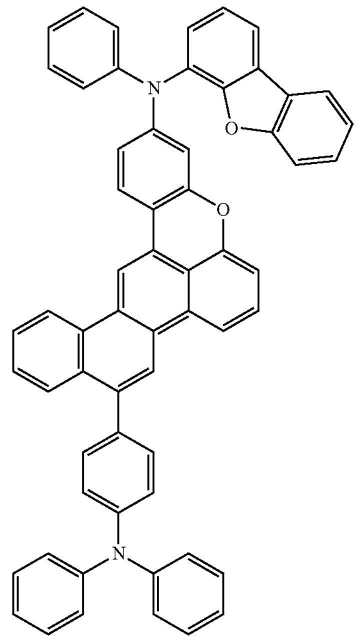
91
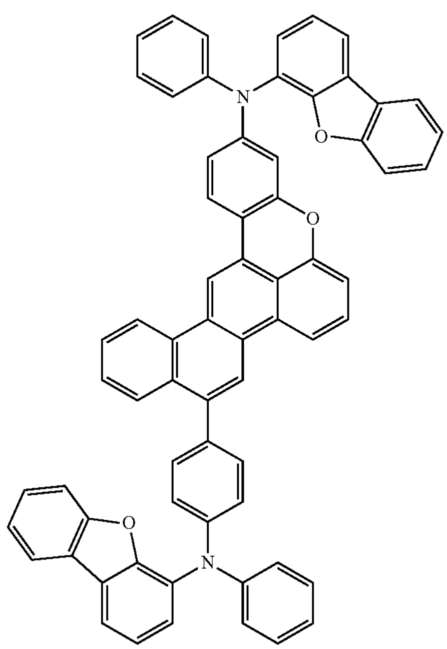
93
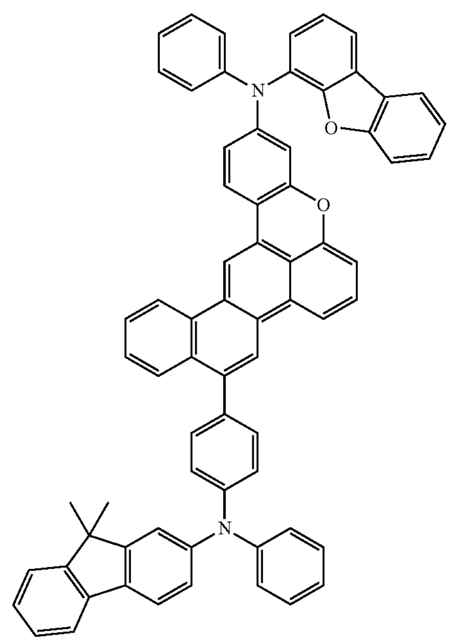

94
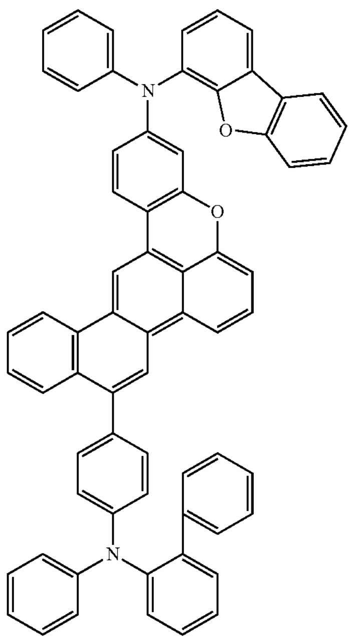
96
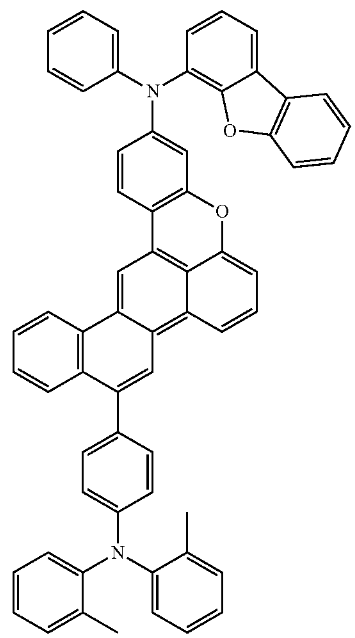
95
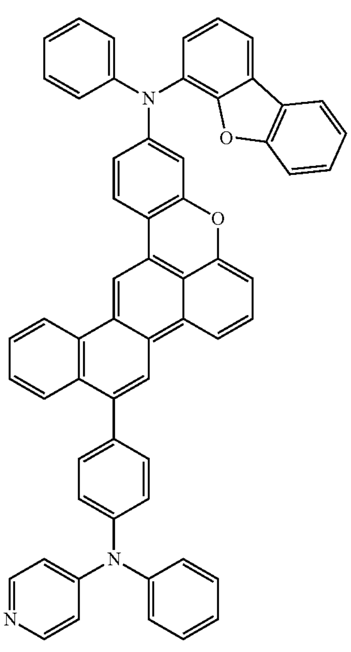
97
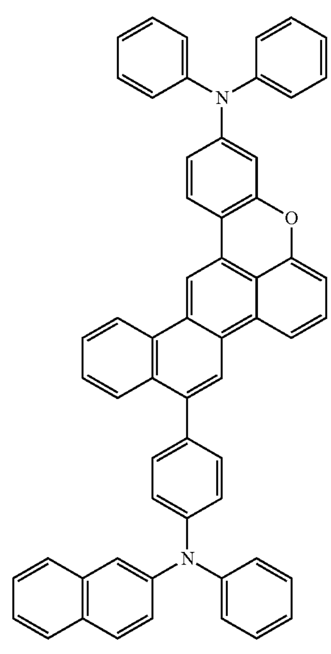

-continued
98
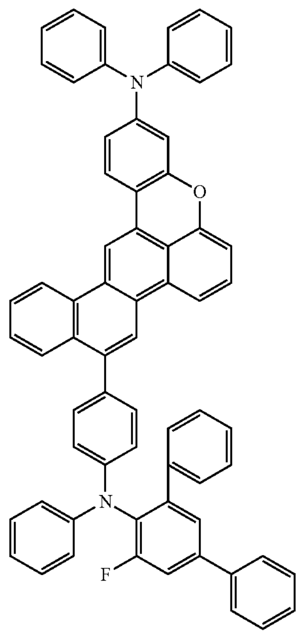
99
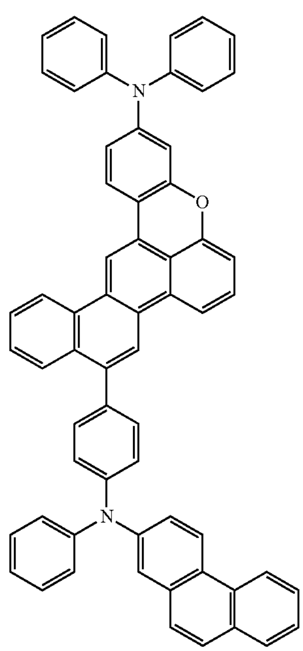
-continued
100
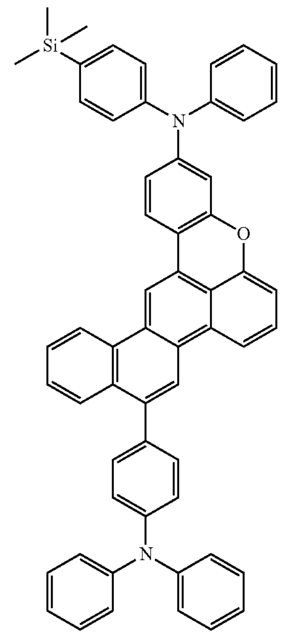
101
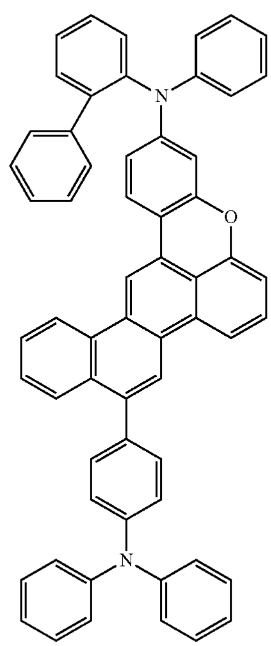

102
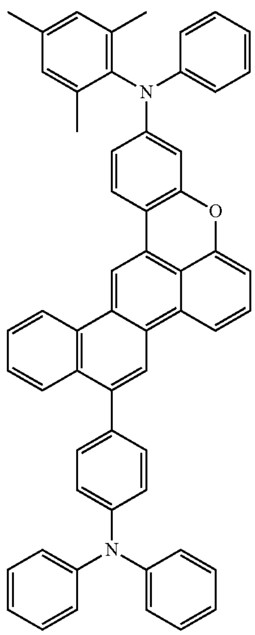
103
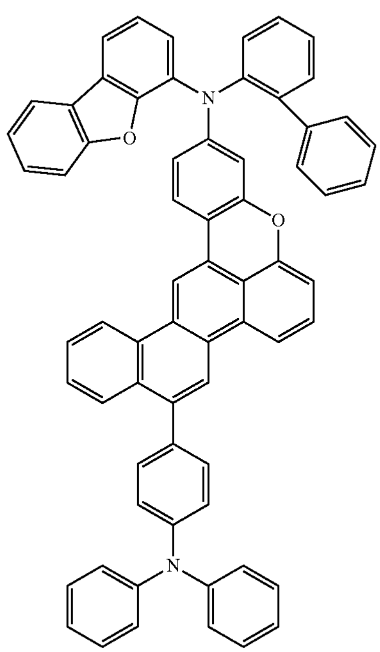
104
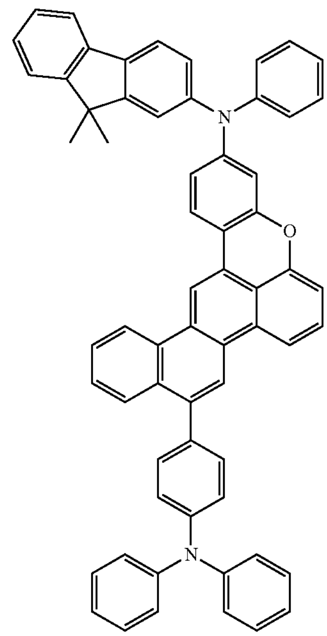
105
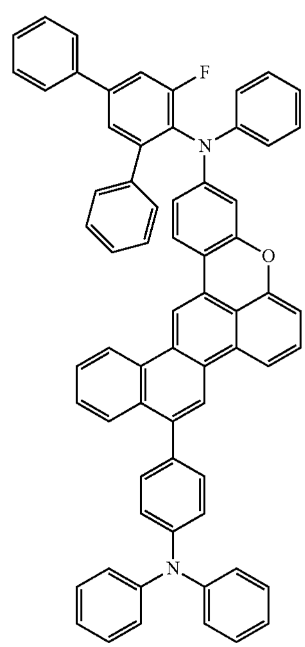

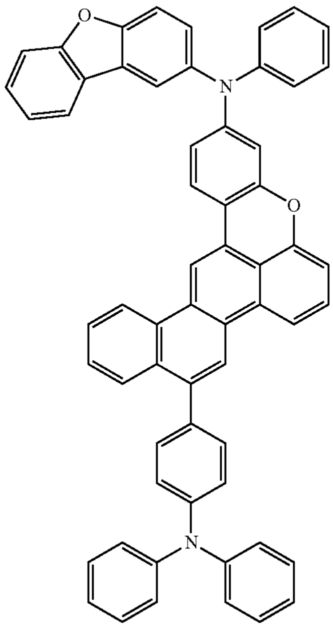
106
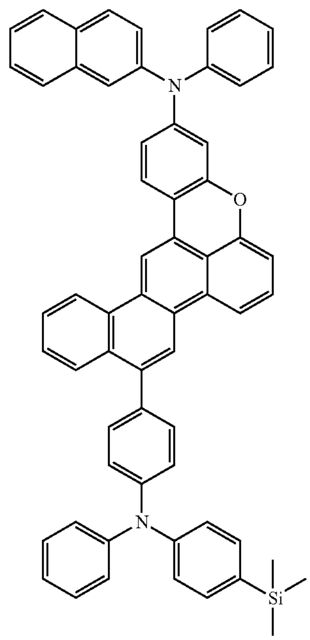
108
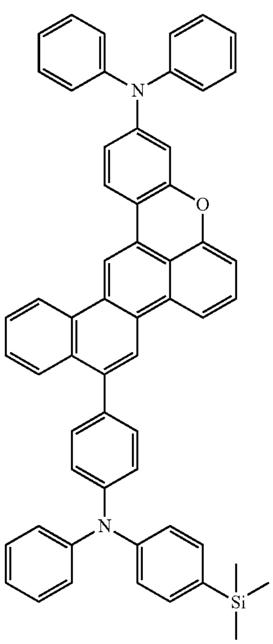
107
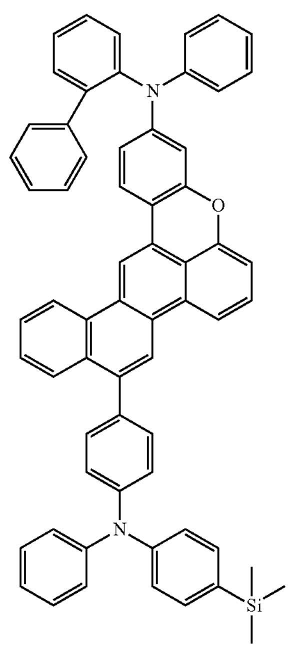
109

-continued
110
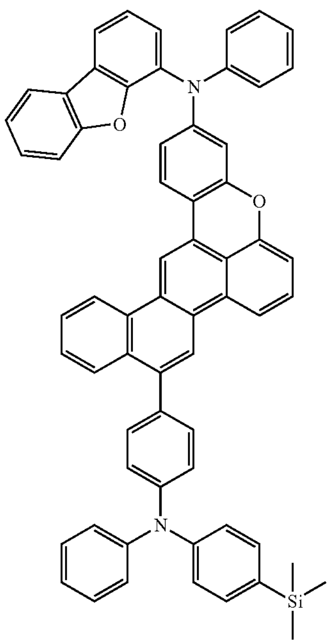
111
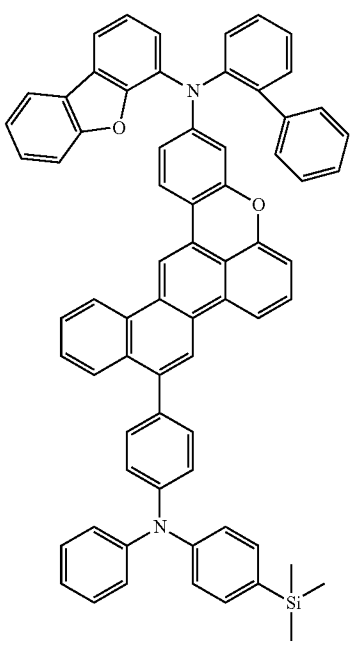
-continued
112
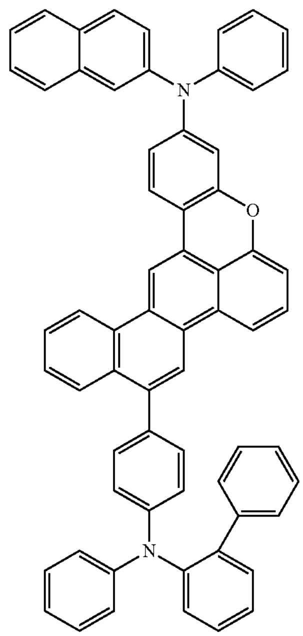
113
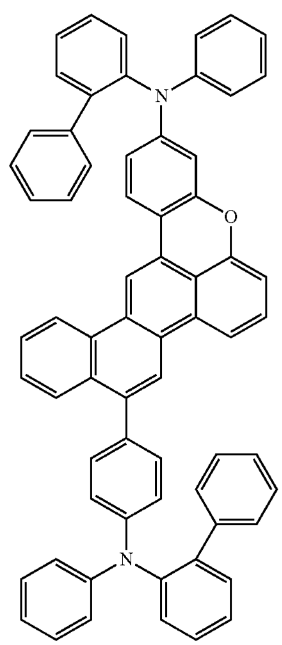

-continued
114
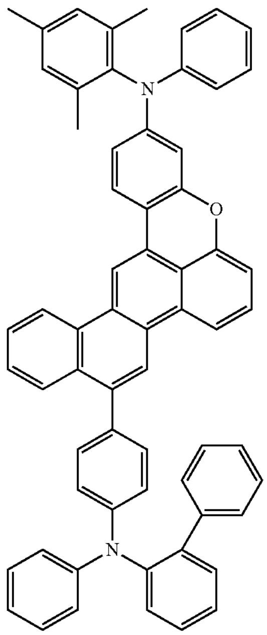
115
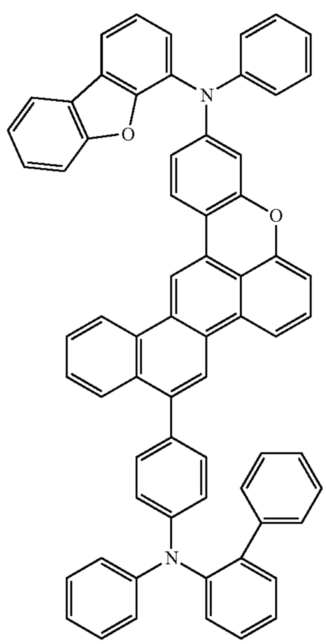
-continued
116
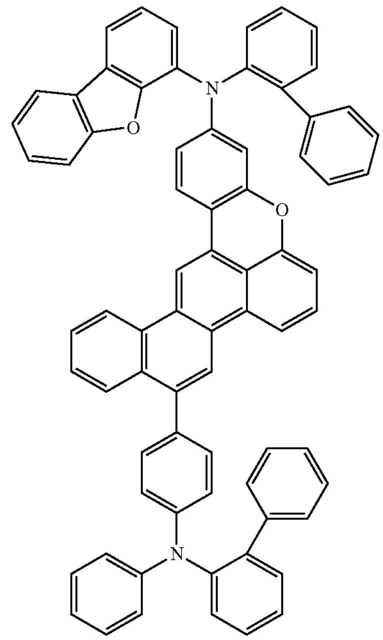
117
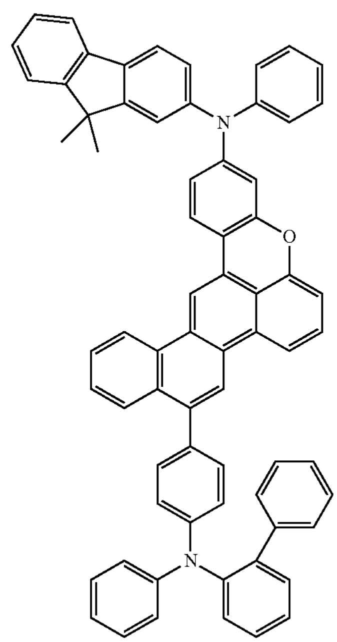

-continued
118
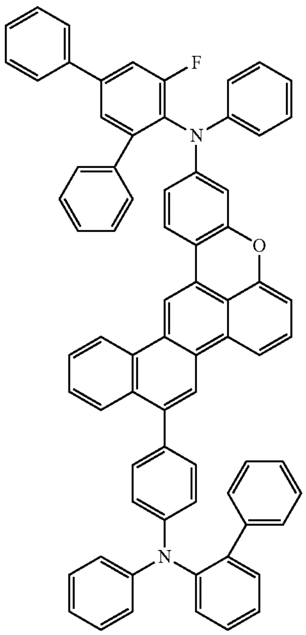
120
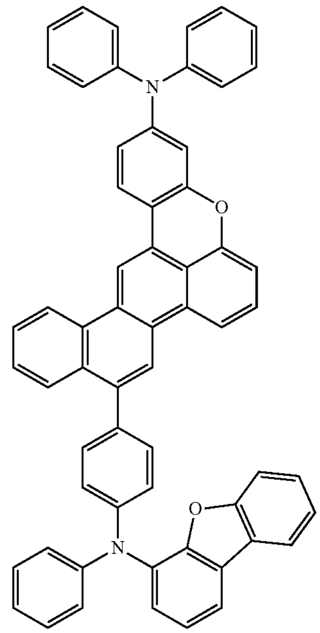
119
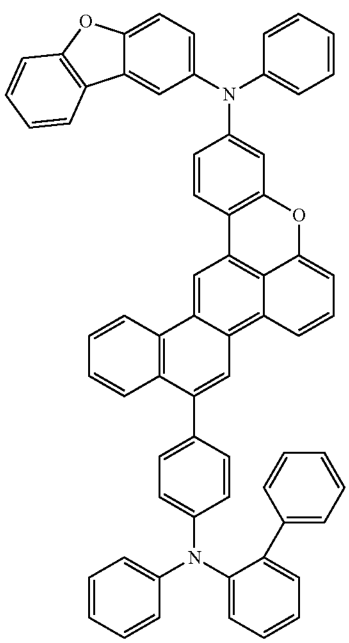
121
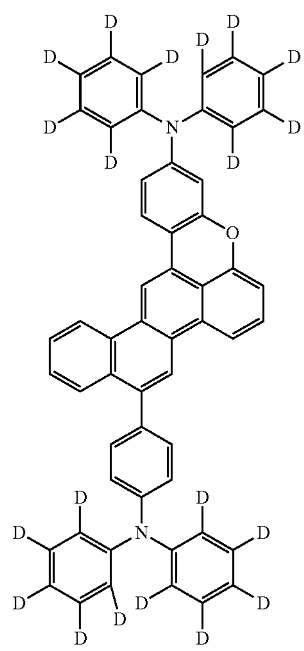

-continued
122
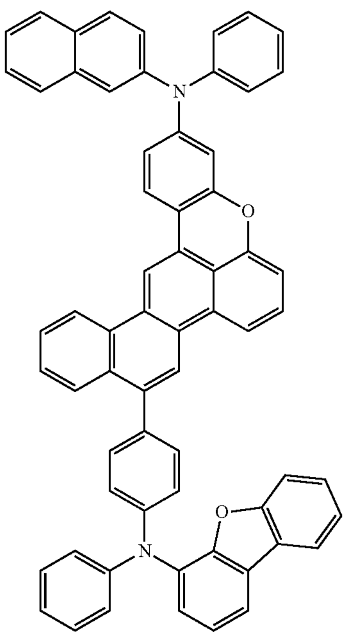
123
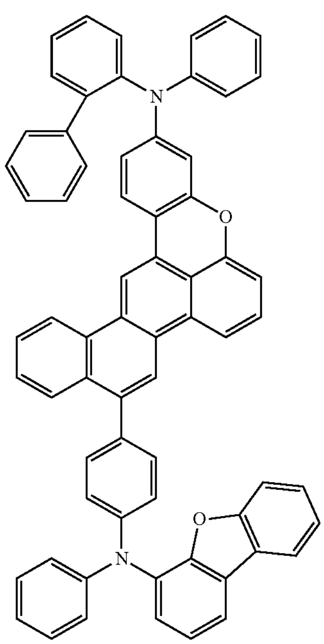
-continued
124
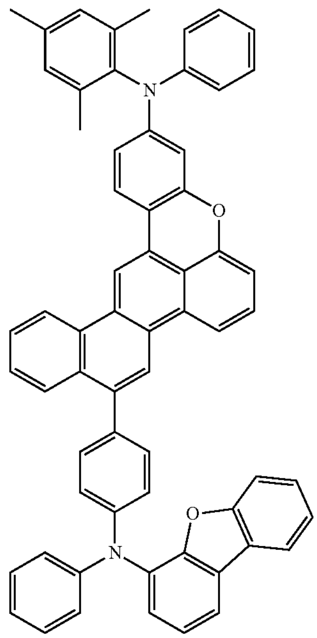
125
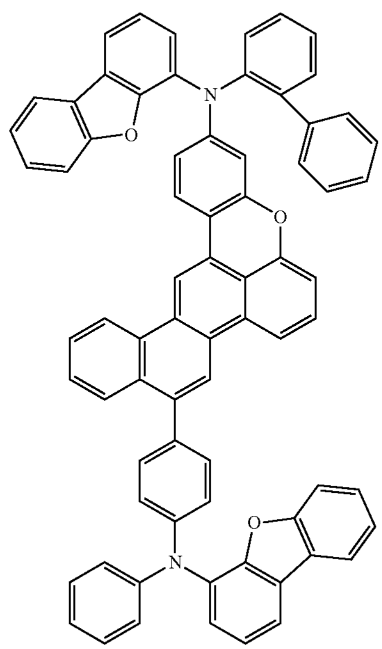

-continued
126
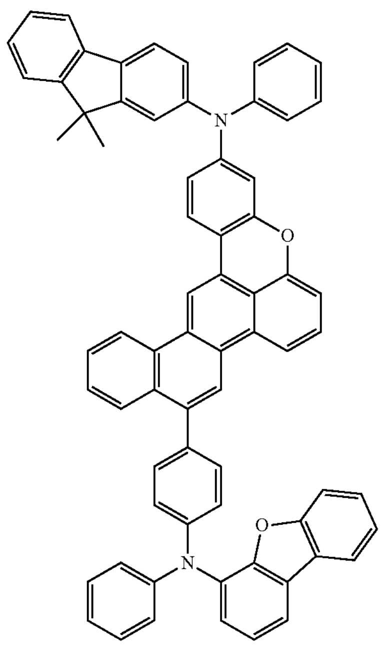
128
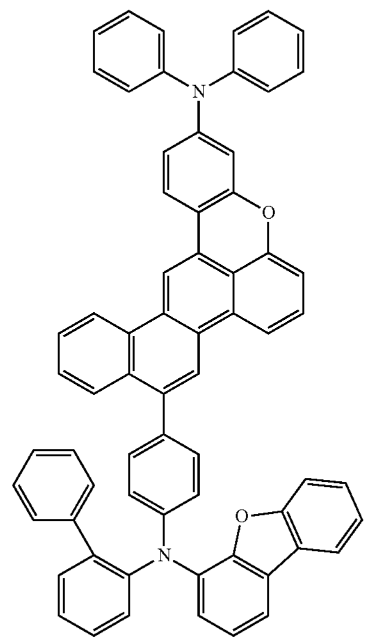
127
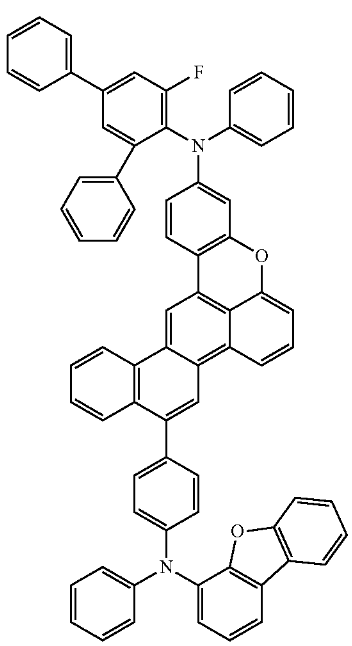
129
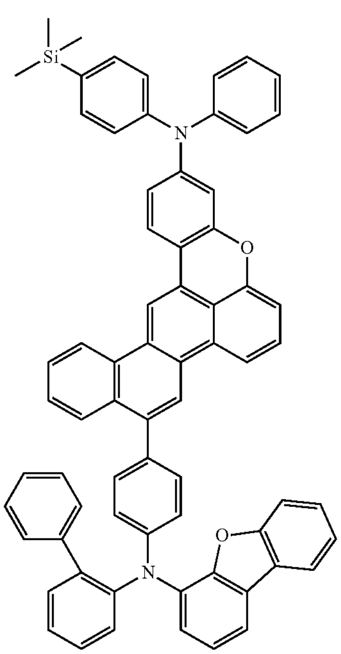

-continued
130
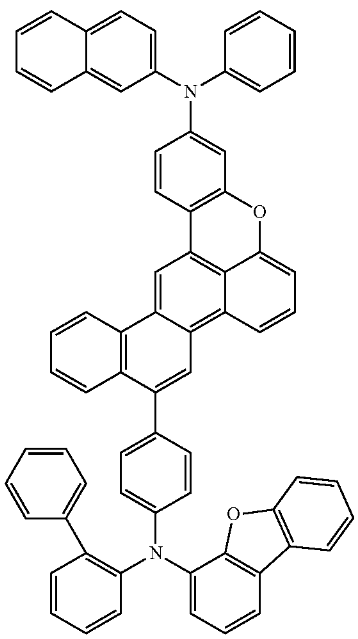
131
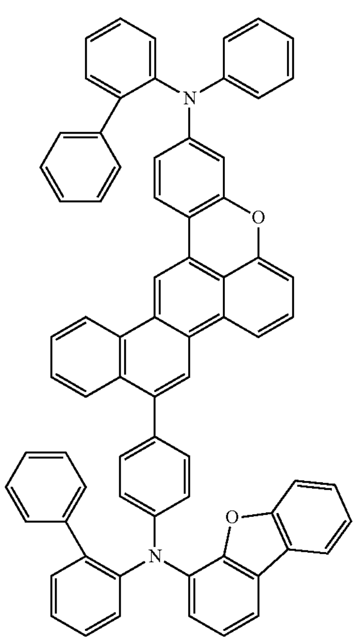
-continued
132
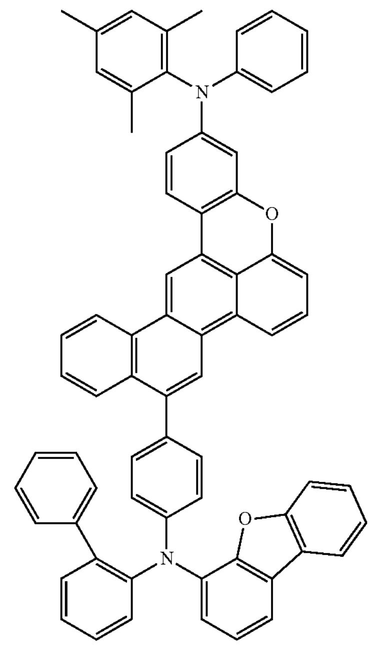
133
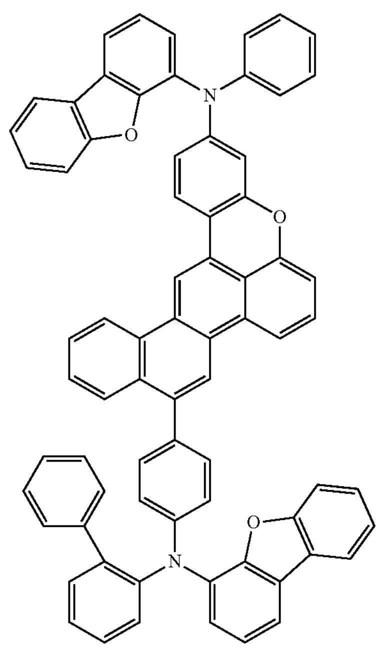

-continued
134
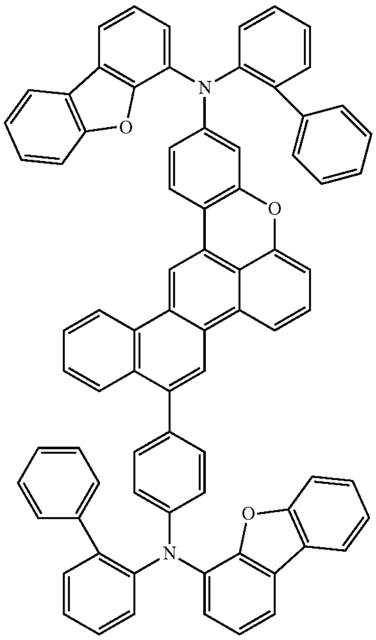
135
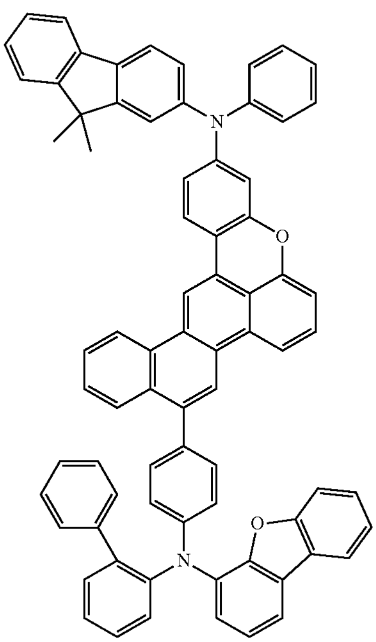
-continued
136
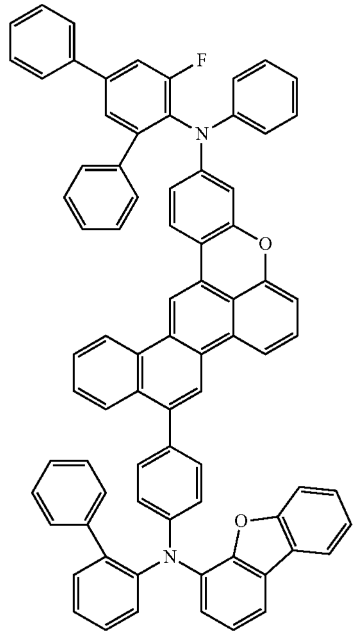
137
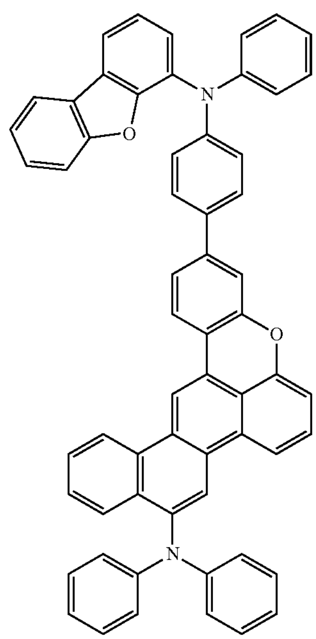

138
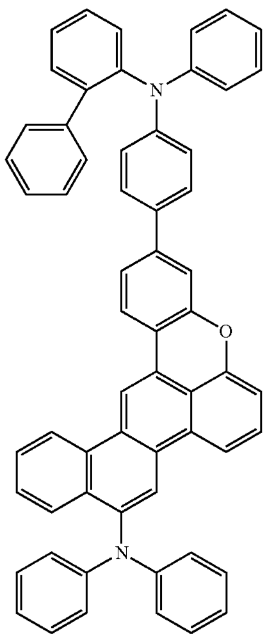
139
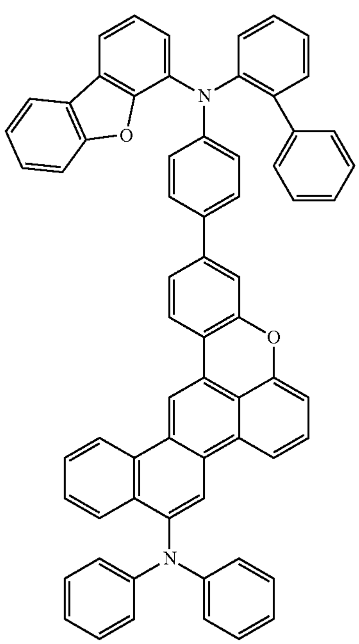
140
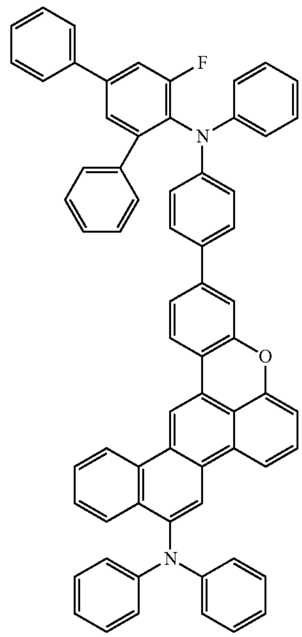
141
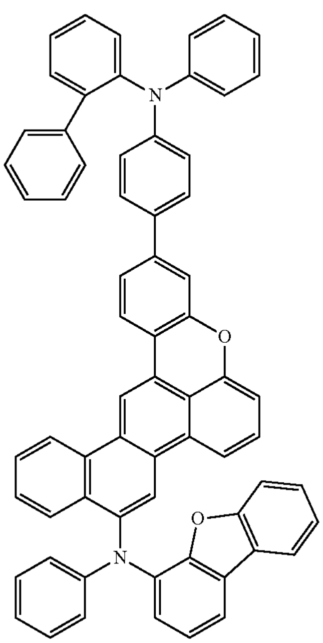

-continued
142
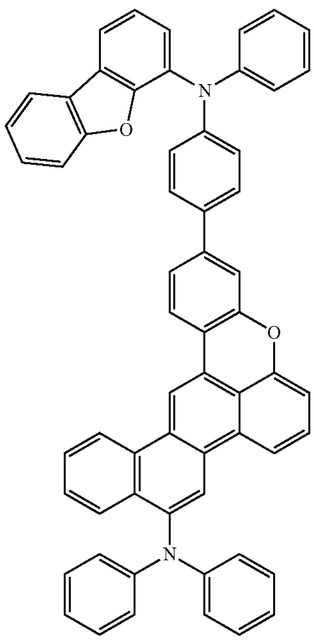
143
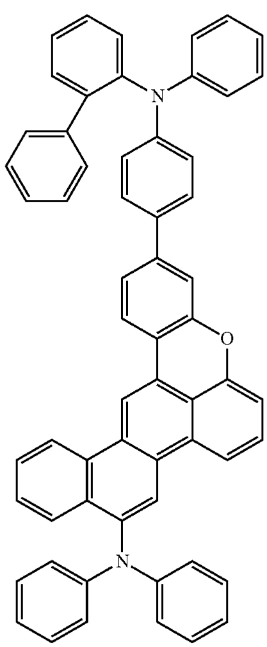
-continued
144
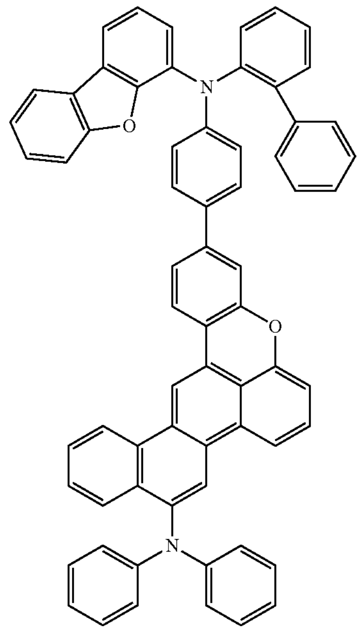
145
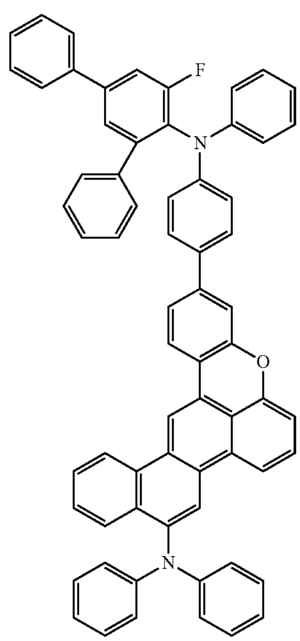

146
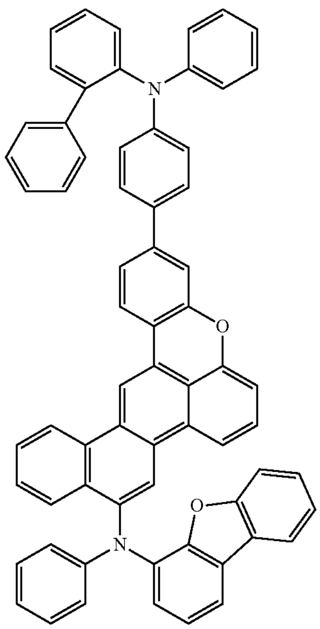
147
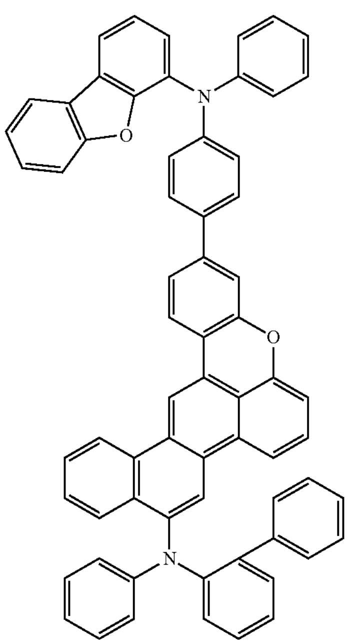
148
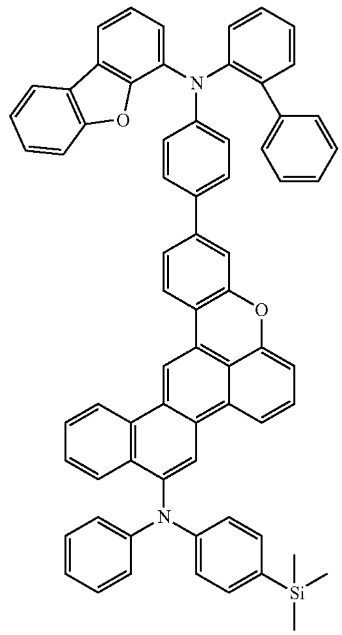
149
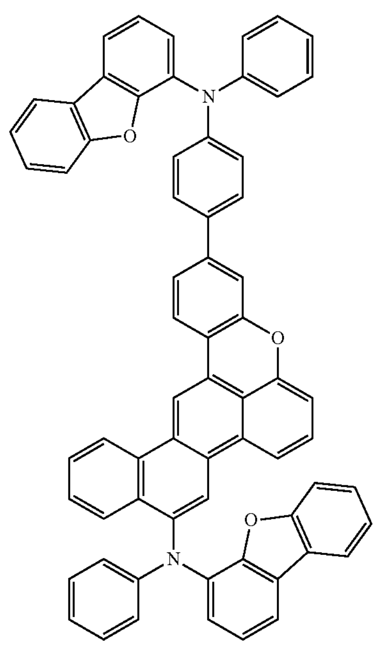

-continued
150
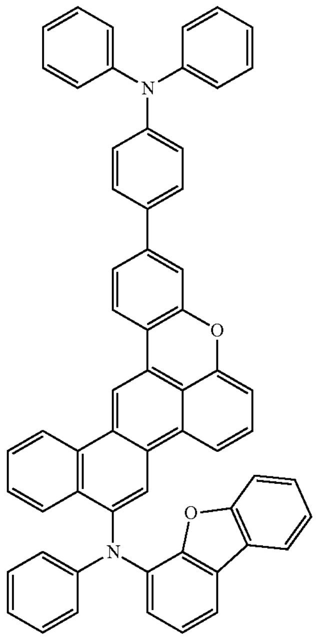
152
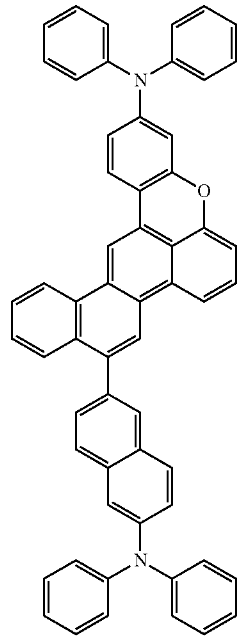
151
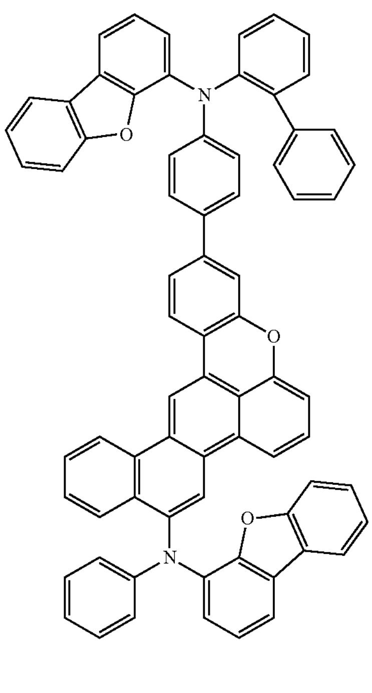
153
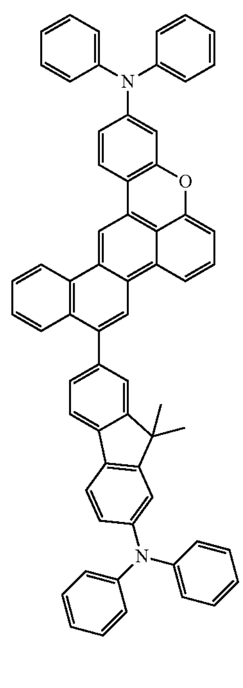

-continued
154
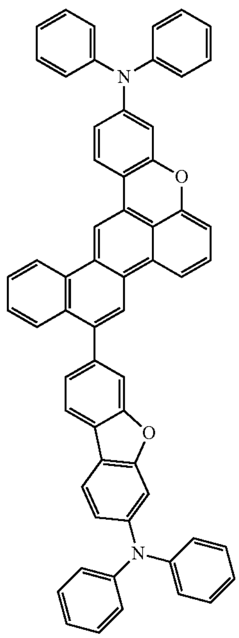
155
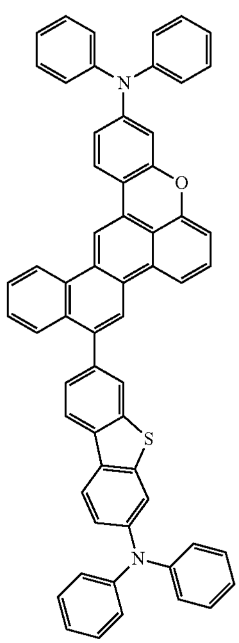
-continued
156
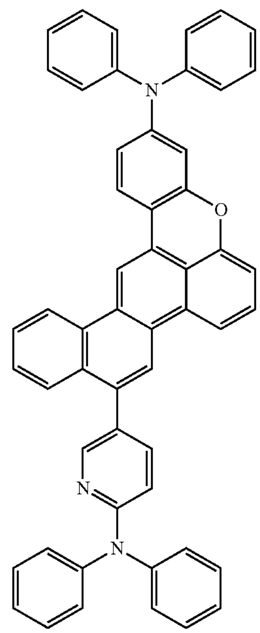
157
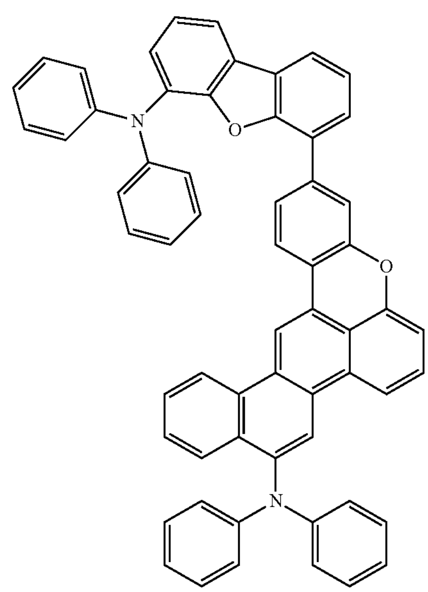

-continued
158
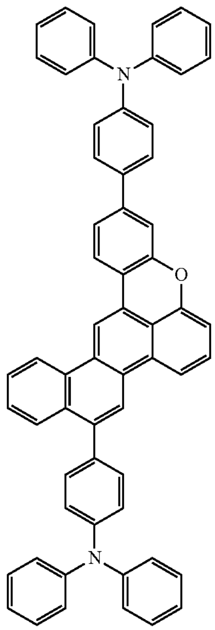
159
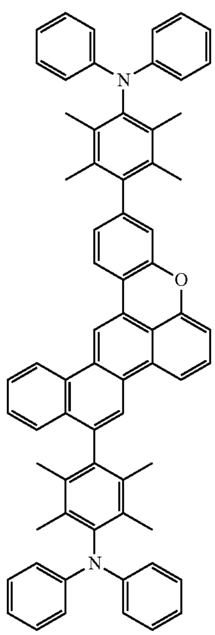
-continued
160
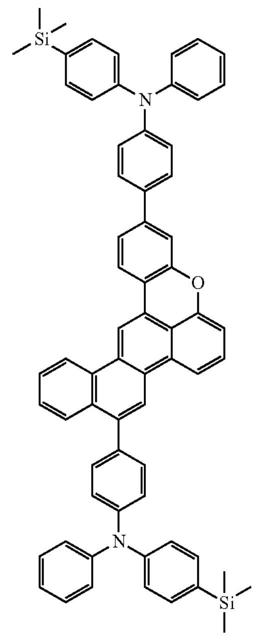
161
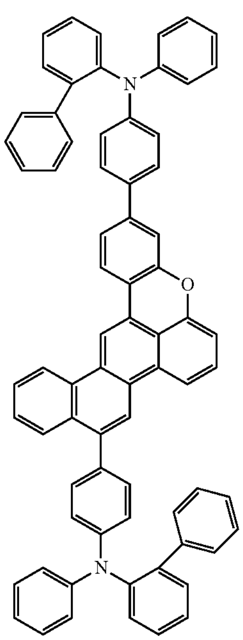

-continued
162
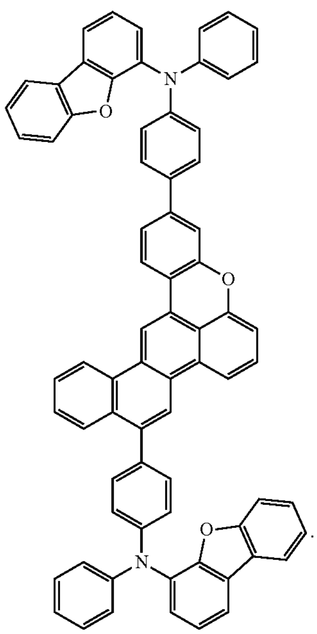
17. The organic light-emitting device as claimed in claim 1, wherein the second compound is represented by one of Formulae 2-11 to 2-16 below:
<Formula 2-11>
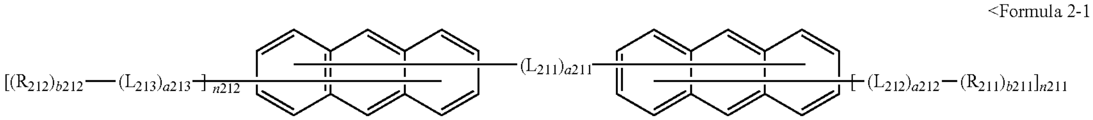
<Formula 2-12>
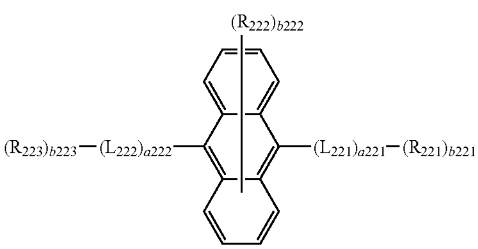
<Formula 2-13>
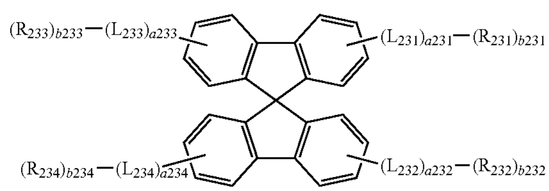
<Formula 2-14>
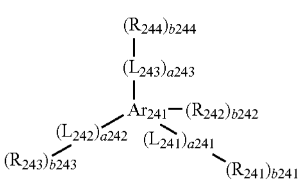
<Formula 2-15>
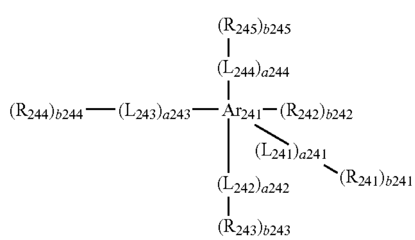
<Formula 2-16>
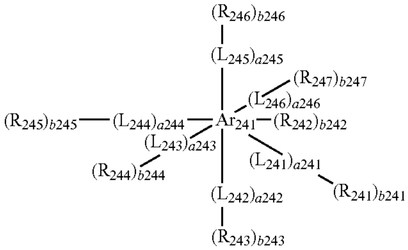

wherein in Formulae 2-11 to 2-16, $Ar_{241}$, $L_{211}$ to $L_{213}$, $L_{221}$, $L_{231}$ to $L_{234}$, $L_{241}$, a211 to a213, a221, a231 to a234, a241, $R_{231}$ to $R_{234}$, $R_{241}$, b231 to b234, b241, $R_{211}$, $R_{212}$, $R_{221}$, $R_{222}$, $R_{242}$, b211, b212, b221, b222, b242, n211, and n212 are defined the same as $Ar_{241}$, $L_{211}$ to $L_{213}$, $L_{221}$, $L_{231}$ to $L_{234}$, $L_{241}$, a211 to a213, a221, a231 to a234, a241, $R_{231}$ to $R_{234}$, $R_{241}$, b231 to b234, b241, $R_{211}$, $R_{212}$, $R_{221}$, $R_{222}$, $R_{242}$, b211, b212, b221, b222, b242, n211, and n212 of Formulae 2-1 to 2-4;

$L_{222}$ is defined the same as $L_{221}$ of Formula 2-2;

a222 is defined the same as a221 of Formula 2-2;

$R_{223}$ is defined the same as $R_{221}$ of Formula 2-2;

b223 is defined the same as b221 of Formula 2-2;

$L_{242}$ to $L_{246}$ are each independently defined the same as $L_{241}$ of Formula 2-4; and a242 to a246 are each independently defined the same as a241 of Formula 2-4.

18. The organic light-emitting device as claimed in claim 1, wherein the second compound is represented by one of Formulae 2-21 to 2-29 below:

<Formula 2-21>

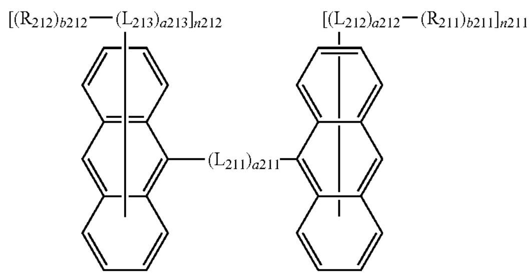

<Formula 2-22>

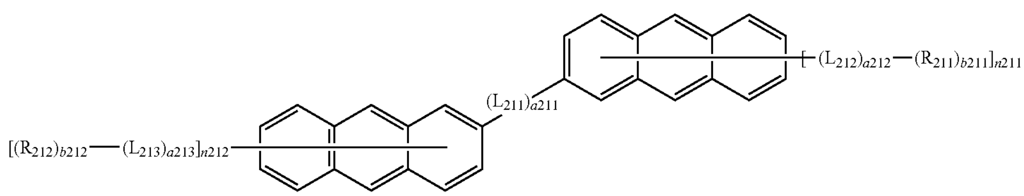

<Formula 2-23>

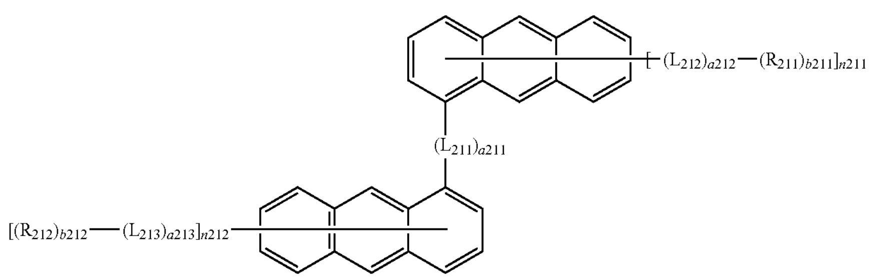

<Formula 2-24>

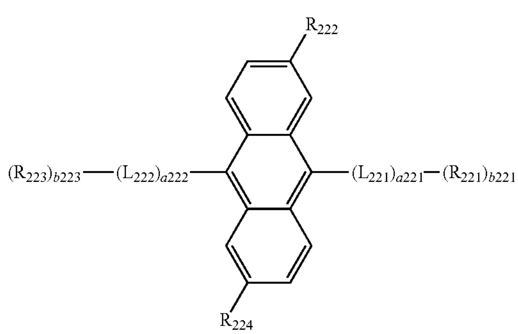

<Formula 2-25>

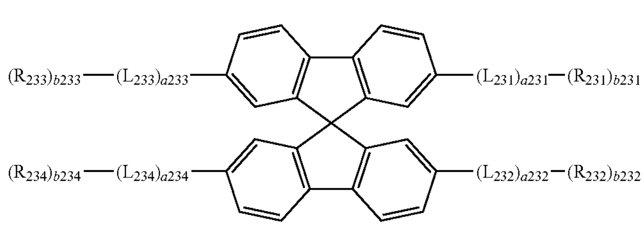

-continued

<Formula 2-26>

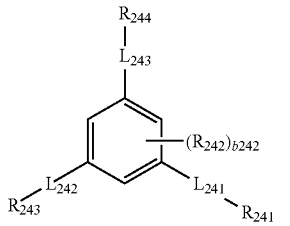

<Formula 2-27>

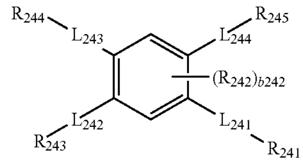

<Formula 2-28>

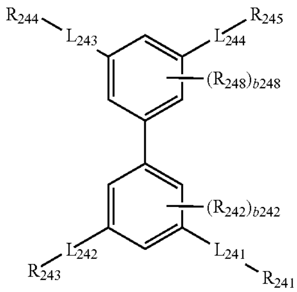

<Formula 2-29>

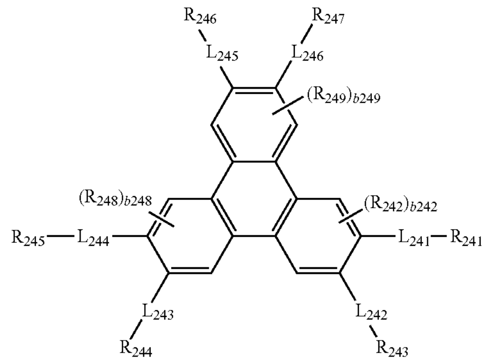

wherein, in Formulae 2-21 to 2-29, $L_{211}$ to $L_{213}$, $L_{221}$, $L_{231}$ to $L_{234}$, $L_{241}$, a211 to a213, a221, a231 to a234, a241, $R_{231}$ to $R_{234}$, $R_{241}$, b231 to b234, b241, $R_{211}$, $R_{212}$, $R_{221}$, $R_{222}$, $R_{242}$, b211, b212, b221, b242, n211, and n212 are defined the same as $L_{211}$ to $L_{213}$, $L_{221}$, $L_{231}$ to $L_{234}$, $L_{241}$, a211 to a213, a221, a231 to a234, a241, $R_{231}$ to $R_{234}$, $R_{241}$, b231 to b234, b241, $R_{211}$, $R_{212}$, $R_{221}$, $R_{222}$, $R_{242}$, b211, b212, b221, b242, n211, and n212 of Formulae 2-1 to 2-4;

$L_{222}$ is defined the same as $L_{221}$ of Formula 2-2;

a222 is defined the same as a221 of Formula 2-2;

$R_{223}$ is defined the same as $R_{221}$ or Formula 2-2;

b223 is defined the same as b221 of Formula 2-2;

$L_{242}$ to $L_{246}$ are each independently defined the same as $L_{241}$ of Formula 2-4;

$R_{248}$ and $R_{249}$ are each independently defined the same as $R_{242}$ of Formula 2-4; and b248 and b249 are each independently defined the same as b242 of Formula 2-4.

19. The organic light-emitting device as claimed in claim 1, wherein the second compound is one of the following Compounds H-1 to H-60:

H-1

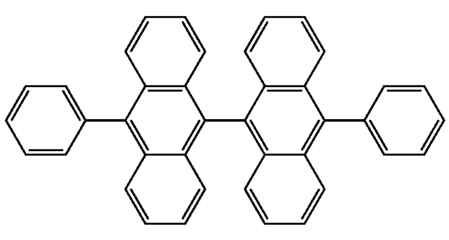

H-2

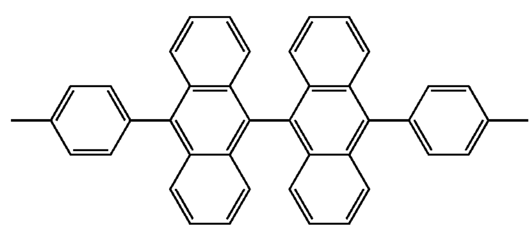

H-3

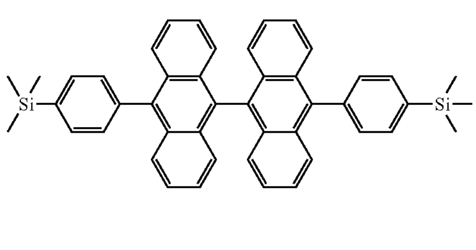

H-4

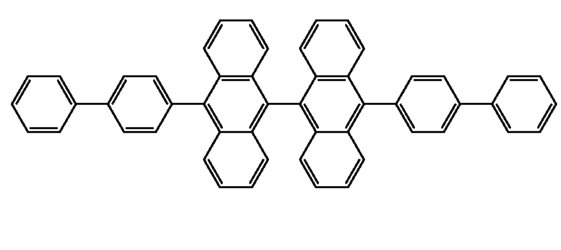

-continued
H-5
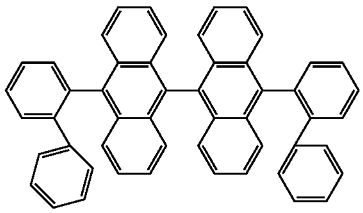
H-6
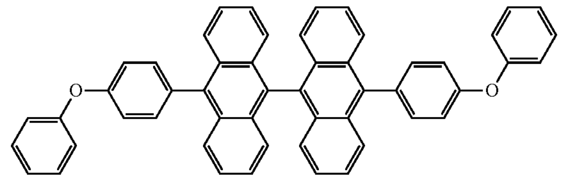
H-7
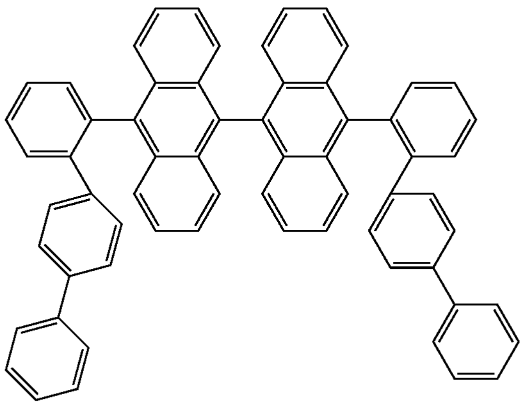
H-8
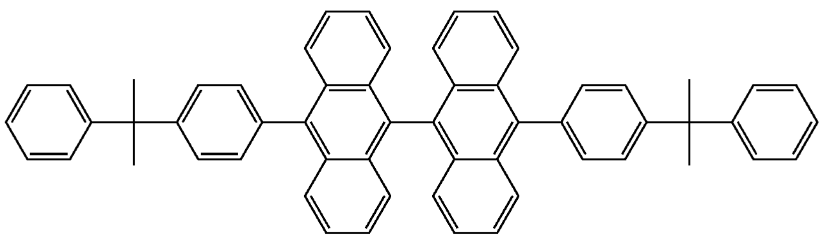
H-9
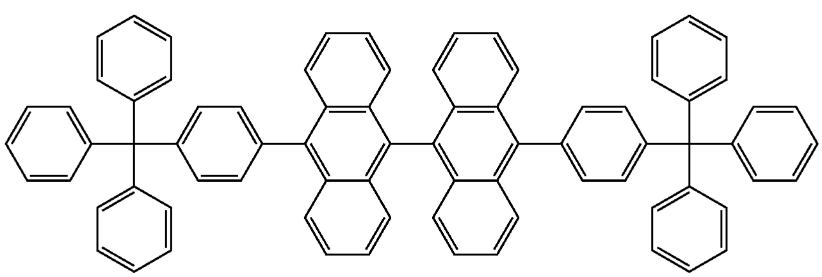
H-10
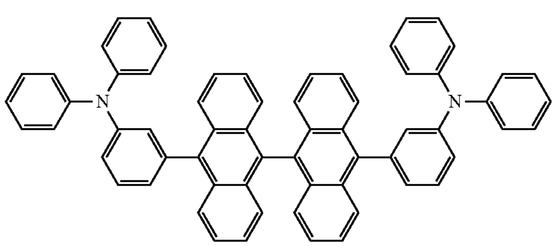
H-11
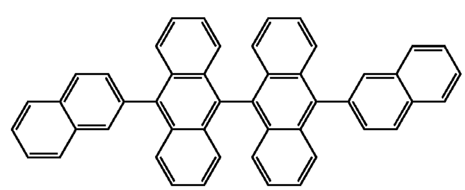

-continued
H-12
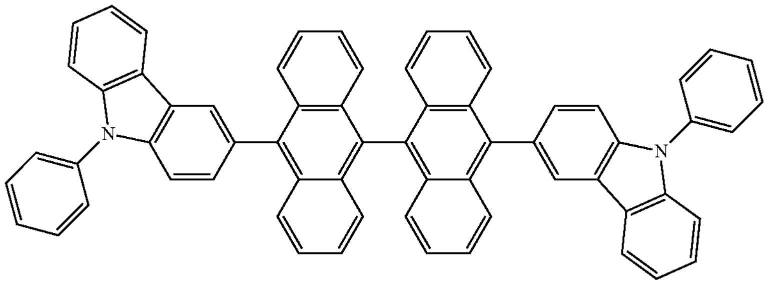
H-13
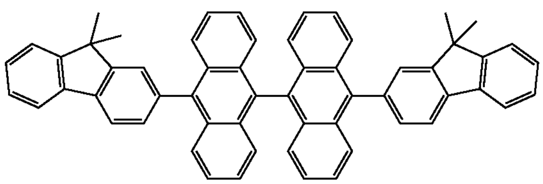
H-14
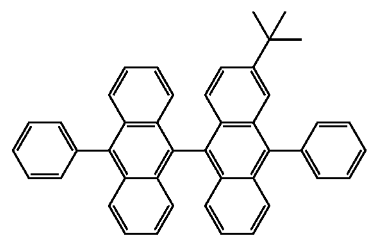
H-15
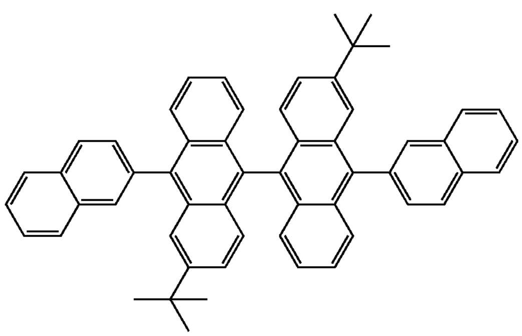
H-16
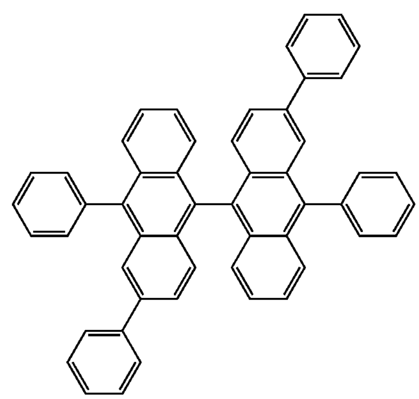
H-17
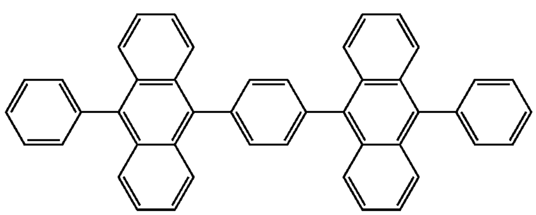
H-18
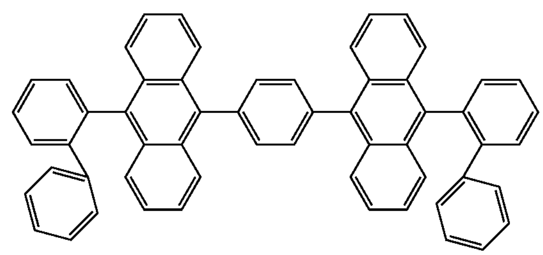
H-19
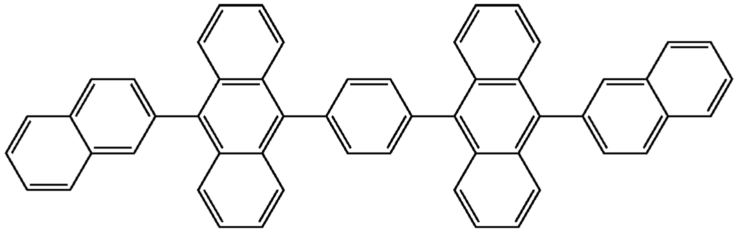

-continued
H-20
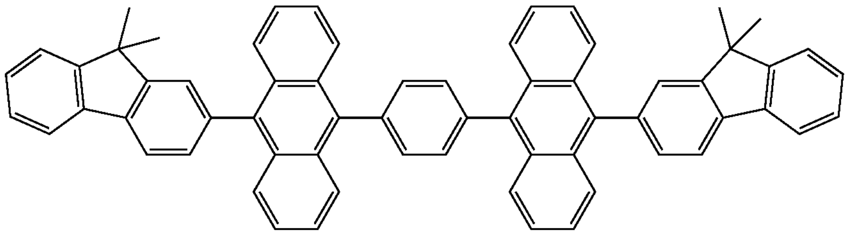
H-21
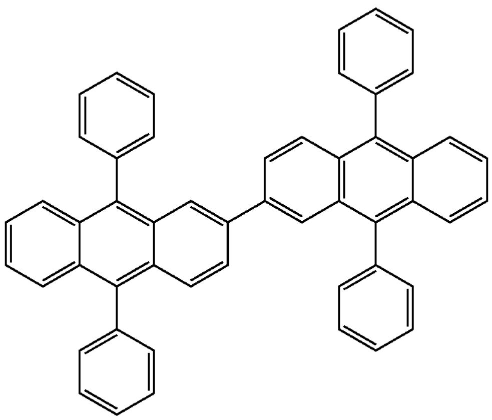
H-22
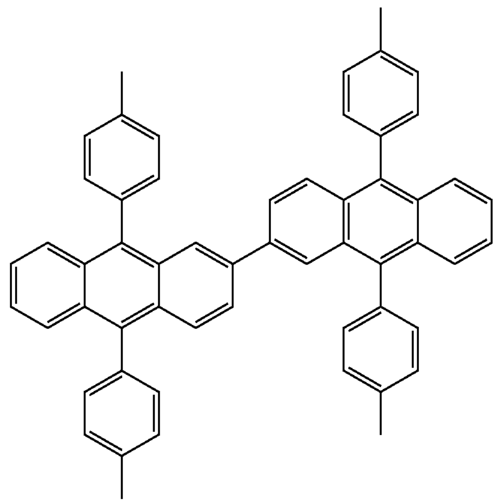
H-23
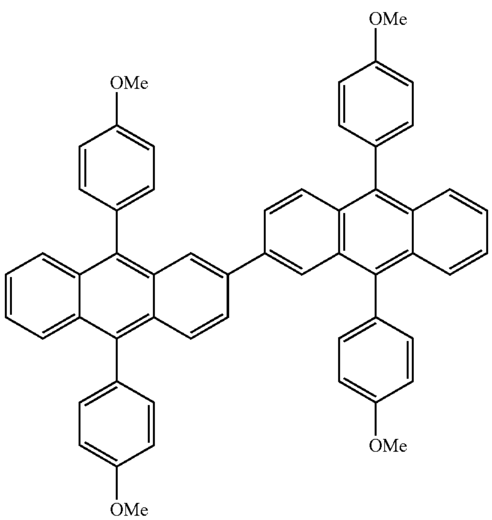
H-24
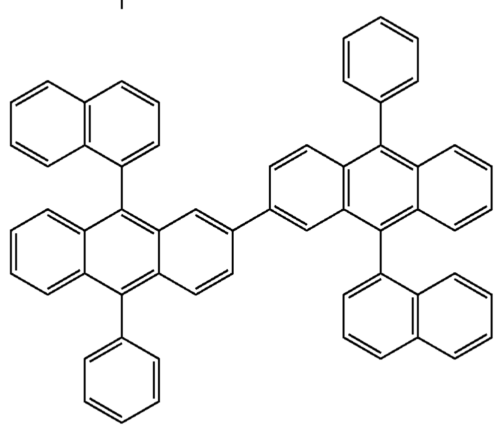
H-25
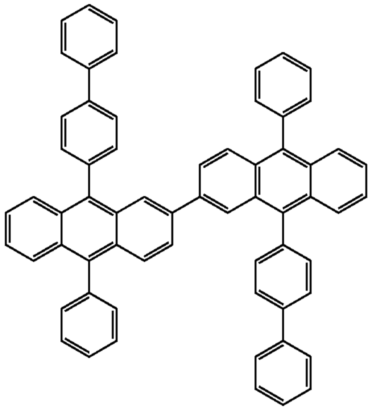
H-26
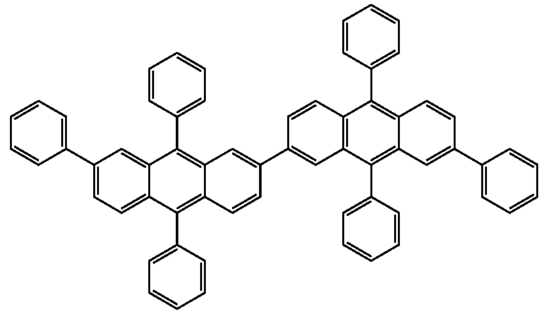

-continued
H-27
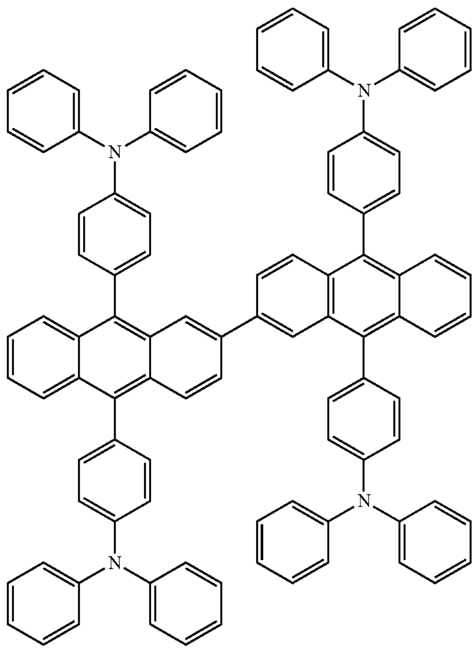
H-28
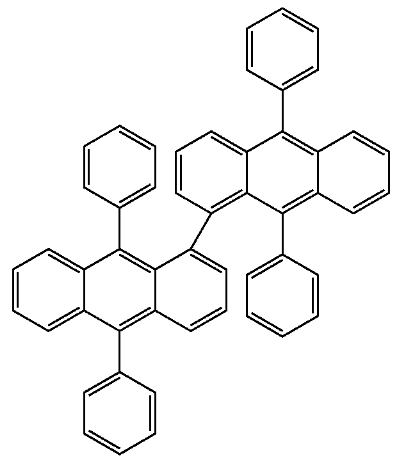
H-29
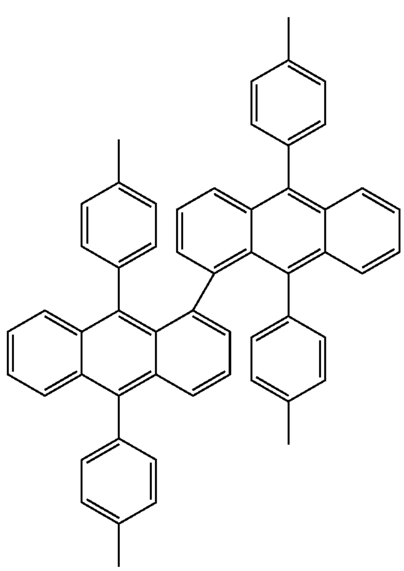
H-30
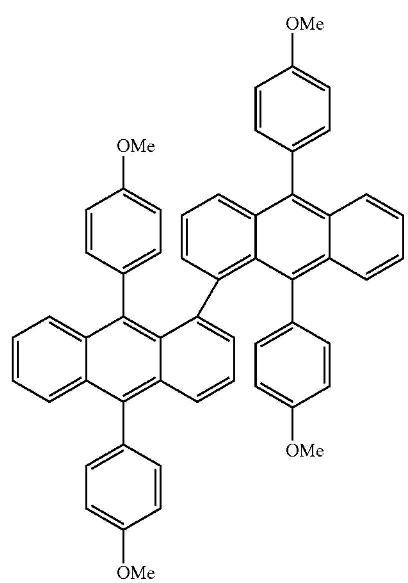

-continued
H-31
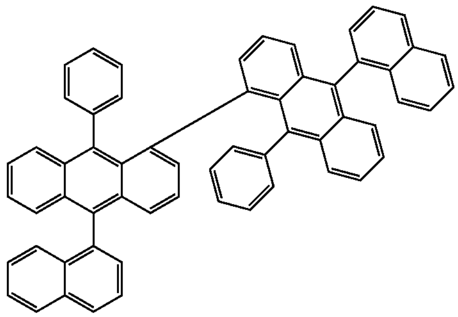
H-32
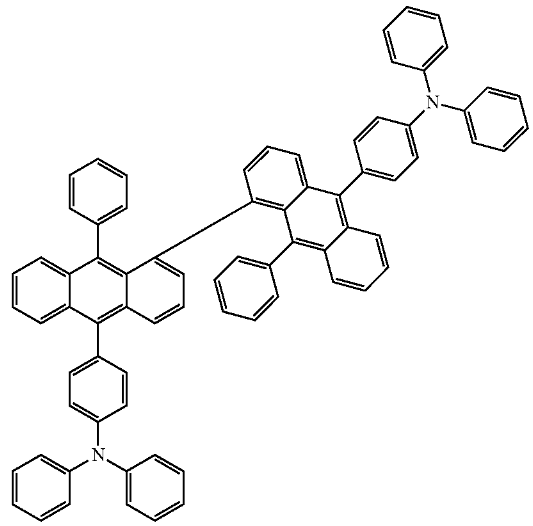
H-33
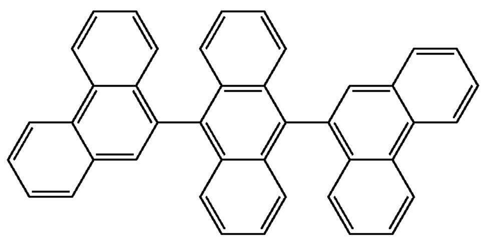
H-34
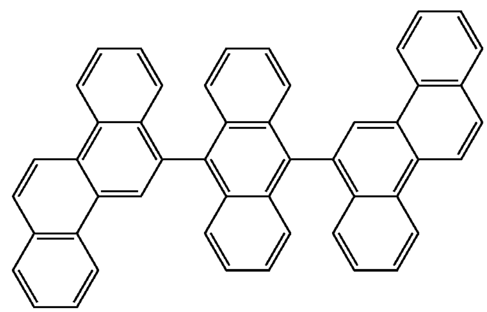
H-35
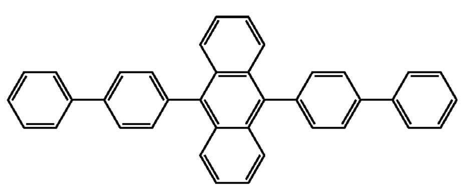
H-36
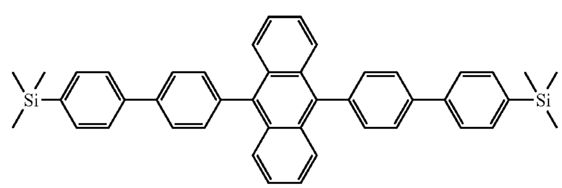
H-37
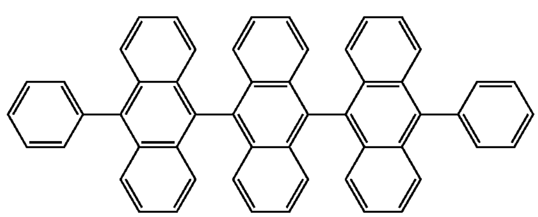
H-38
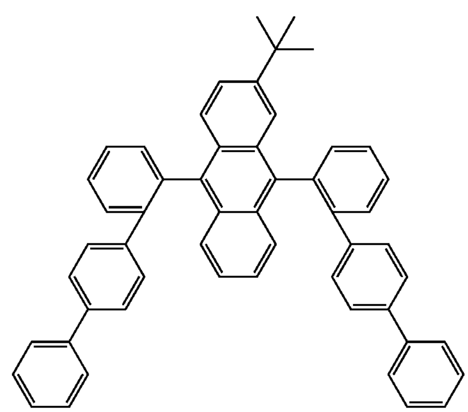

-continued
H-39
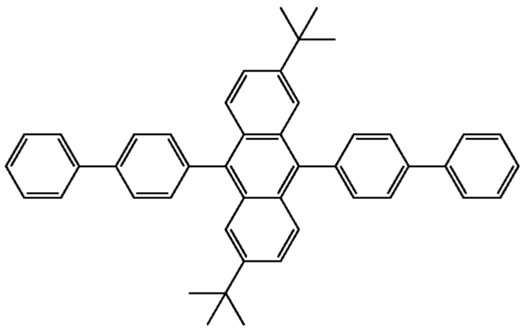
H-40
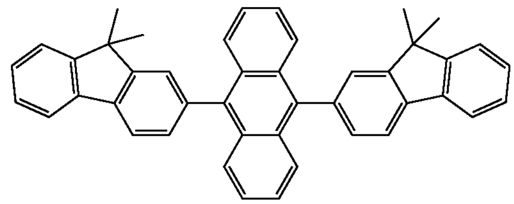
H-41
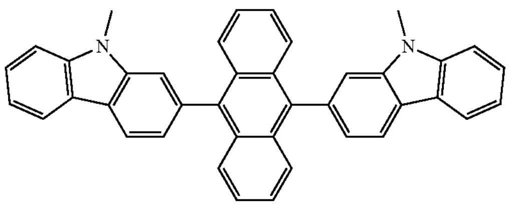
H-42
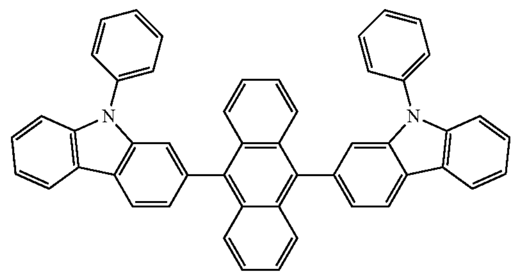
H-43
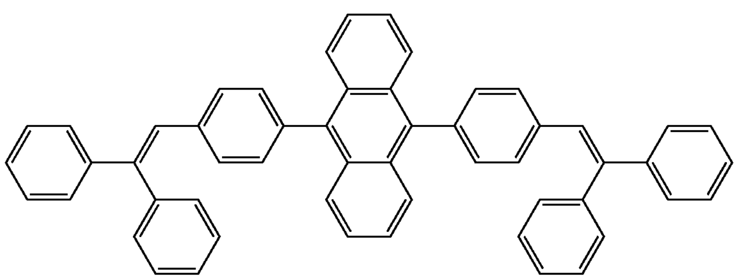
H-44
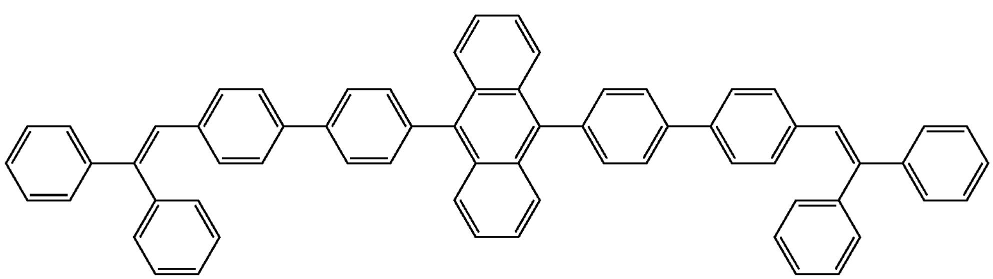
H-45
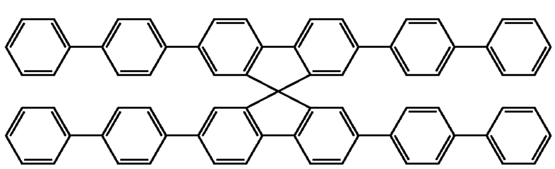
H-46
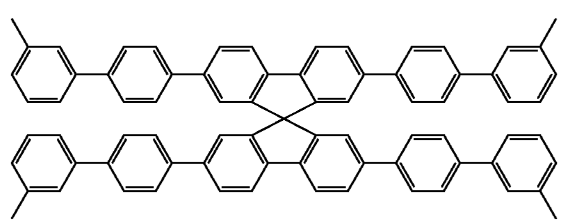

-continued
H-47
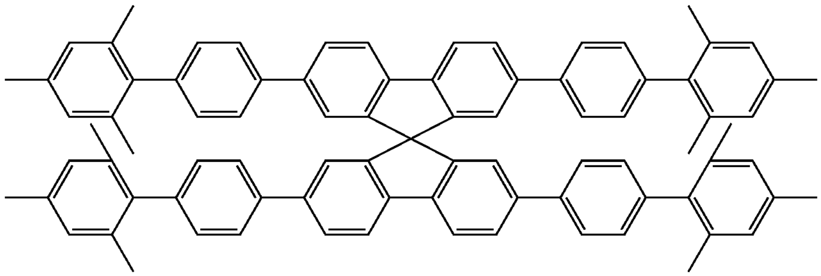
H-48
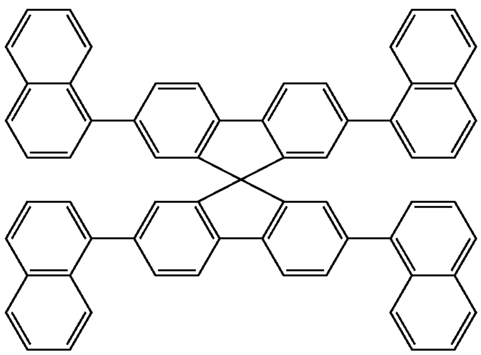
H-49
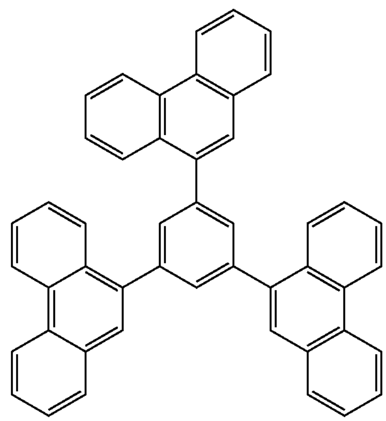
H-50
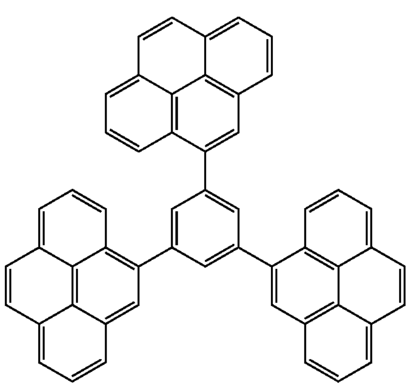
H-51
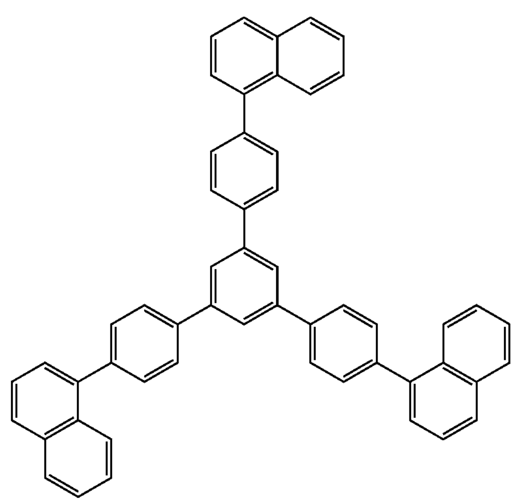

-continued
H-52
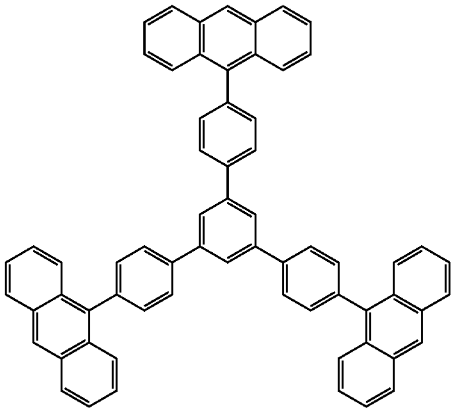
H-53
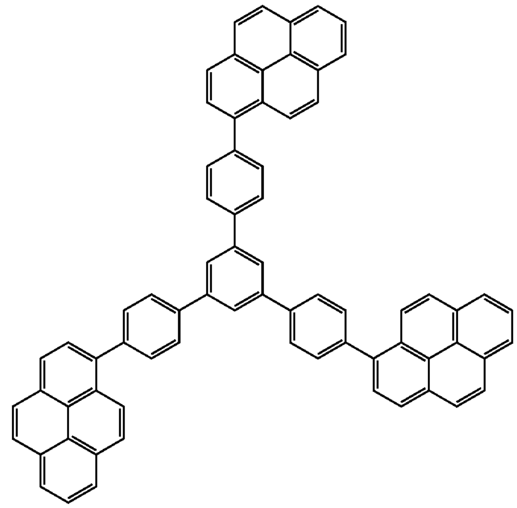
H-54
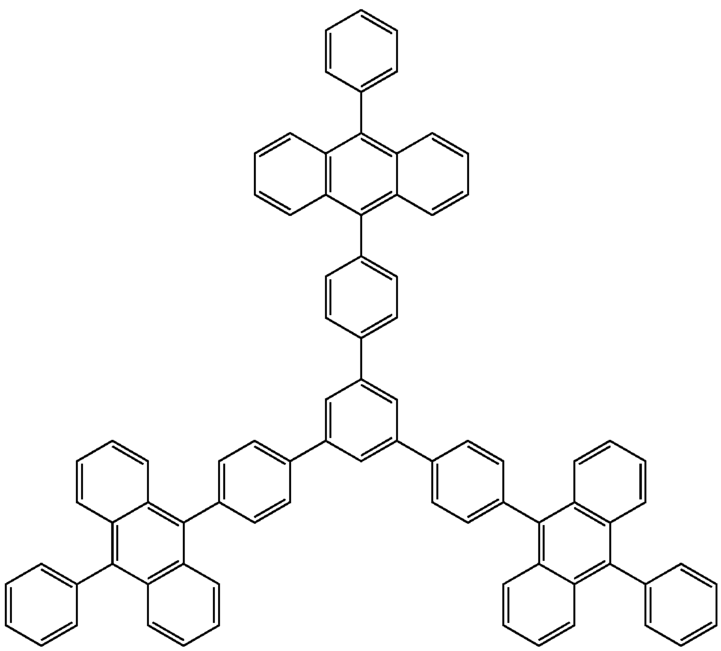
H-55
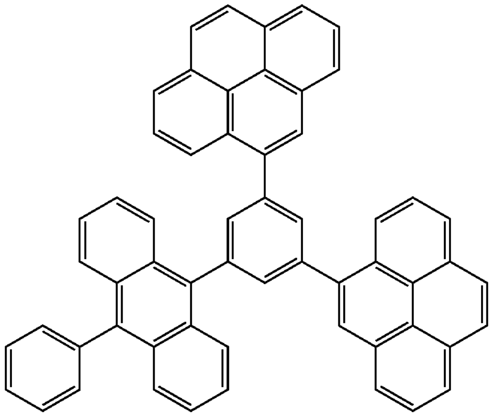
H-56
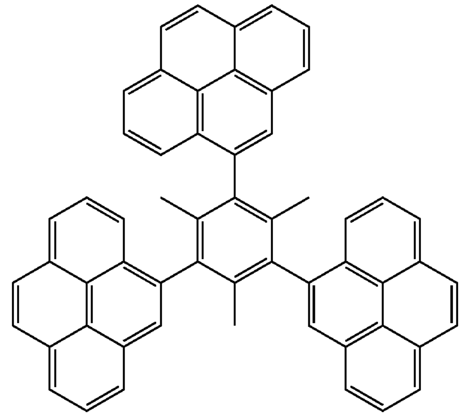

-continued
H-57
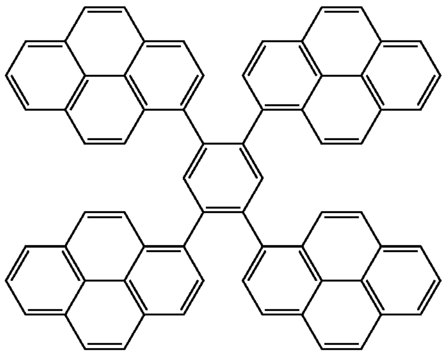
H-58
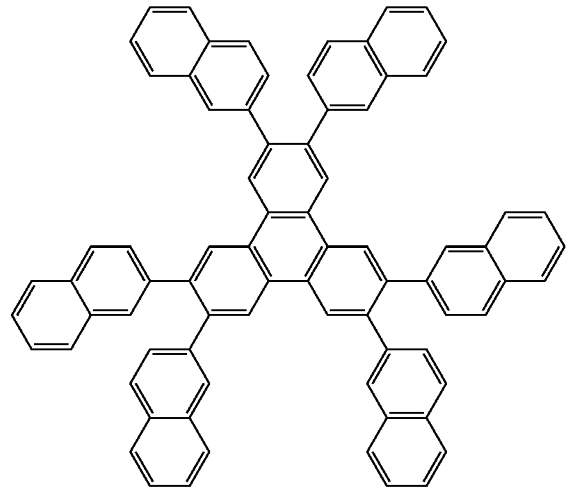
H-59
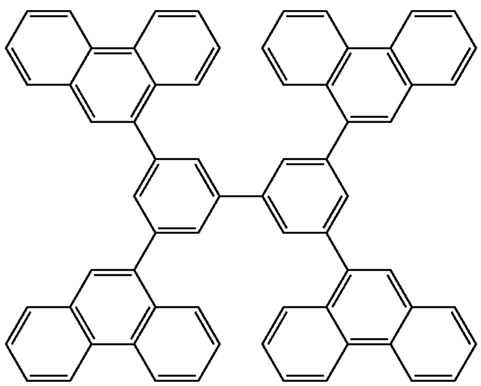
H-60
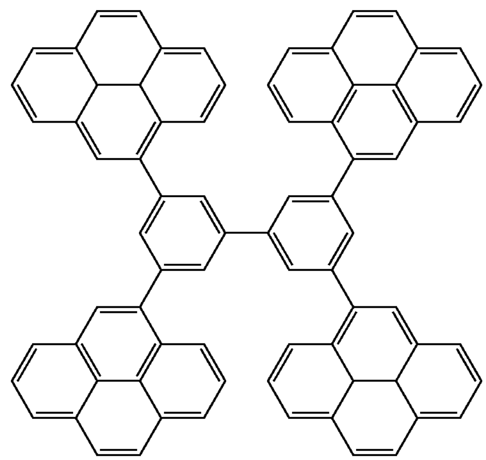
20. The organic light-emitting device as claimed in claim 1, wherein:
the first compound is a dopant, and
the second compound is a host.
* * * * *